US011735511B2

(12) United States Patent
Matsubara et al.

(10) Patent No.: US 11,735,511 B2
(45) Date of Patent: Aug. 22, 2023

(54) SEMICONDUCTOR DEVICE

(71) Applicant: ROHM CO., LTD., Kyoto (JP)

(72) Inventors: Hiroaki Matsubara, Kyoto (JP); Kaori Sumitomo, Kyoto (JP); Maki Moroi, Kyoto (JP); Naoki Kinoshita, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 95 days.

(21) Appl. No.: 17/365,065

(22) Filed: Jul. 1, 2021

(65) Prior Publication Data

US 2022/0020678 A1 Jan. 20, 2022

(30) Foreign Application Priority Data

Jul. 17, 2020 (JP) ................................ 2020-123072

(51) Int. Cl.
*H01L 23/498* (2006.01)

(52) U.S. Cl.
CPC .. *H01L 23/49844* (2013.01); *H01L 23/49811* (2013.01); *H01L 23/49822* (2013.01)

(58) Field of Classification Search
CPC ......... H01L 23/49844; H01L 23/49811; H01L 23/49822
See application file for complete search history.

(56) References Cited

U.S. PATENT DOCUMENTS

| | | | | |
|---|---|---|---|---|
| 9,748,206 | B1 * | 8/2017 | Huang | H01L 23/564 |
| 2021/0066255 | A1 * | 3/2021 | Chen | H01L 21/565 |
| 2021/0175181 | A1 * | 6/2021 | Kim | H01L 23/49822 |
| 2021/0202403 | A1 * | 7/2021 | Eid | H01L 23/49816 |
| 2021/0280521 | A1 * | 9/2021 | Chen | H01L 23/49838 |
| 2021/0296221 | A1 * | 9/2021 | Yang | H01L 21/52 |
| 2021/0305154 | A1 * | 9/2021 | Wang | H01L 23/5226 |
| 2021/0305180 | A1 * | 9/2021 | Huang | H01L 23/3121 |
| 2021/0305699 | A1 * | 9/2021 | Min | H01Q 9/0414 |
| 2021/0313266 | A1 * | 10/2021 | Patil | H01L 23/5383 |
| 2021/0327796 | A1 * | 10/2021 | Chen | H05K 1/14 |

FOREIGN PATENT DOCUMENTS

JP 2001015516 A 1/2001

* cited by examiner

*Primary Examiner* — Nathan W Ha
(74) *Attorney, Agent, or Firm* — Hamre, Schumann, Mueller & Larson, P.C.

(57) ABSTRACT

A semiconductor device includes: a chip; a circuit element formed in the chip; an insulating layer formed over the chip so as to cover the circuit element; a multilayer wiring region formed in the insulating layer and including a plurality of wirings laminated and arranged in a thickness direction of the insulating layer so as to be electrically connected to the circuit element; at least one insulating region which does not include the wirings in an entire region in the thickness direction of the insulating layer and is formed in a region outside the multilayer wiring region in the insulating layer; and at least one terminal electrode disposed over the insulating layer so as to face the chip with the at least one insulating region interposed between the at least one terminal electrode and the chip.

18 Claims, 80 Drawing Sheets

131

191

SEMICONDUCTOR DEVICE

CROSS-REFERENCE TO RELATED APPLICATION

This application is based upon and claims the benefit of priority from Japanese Patent Application No. 2020-123072, filed on Jul. 17, 2020, the entire contents of which are incorporated herein by reference.

TECHNICAL FIELD

The present disclosure relates to a semiconductor device.

BACKGROUND

In the related art, a semiconductor device including a semiconductor substrate, an insulating film, a Cu wiring, a Cu top layer pad, and a connection plug is disclosed. The insulating film is formed over the semiconductor substrate. The Cu wiring is disposed in the insulating film. The Cu top layer pad is disposed over the insulating film. The connection plug is connected to the Cu wiring and the Cu top layer pad in the insulating film.

SUMMARY

Some embodiments of the present disclosure provide a semiconductor device capable of improving the reliability of a terminal electrode.

According to an embodiment of the present disclosure, there is provided a semiconductor device that includes: a chip; a circuit element formed in the chip; an insulating layer formed over the chip so as to cover the circuit element; a multilayer wiring region formed in the insulating layer and including a plurality of wirings laminated and arranged in a thickness direction of the insulating layer so as to be electrically connected to the circuit element at least one insulating region which does not include the wirings in an entire region in the thickness direction of the insulating layer and is formed in a region outside the multilayer wiring region in the insulating layer; and at least one terminal electrode disposed over the insulating layer at a distance from the multilayer wiring region in a plan view so as to face the chip with the at least one insulating region interposed between the at least one terminal electrode and the chip.

According to another embodiment of the present disclosure, there is provided a semiconductor device including: a chip, an insulating layer which covers the chip, a multilayer wiring formed in the insulating layer, and a terminal electrode which is disposed over the insulating layer at a distance from the multilayer wiring in a plan view so as to face the chip with only the insulating layer interposed between the terminal electrode and the chip.

DETAILED DESCRIPTION

Figure 1:
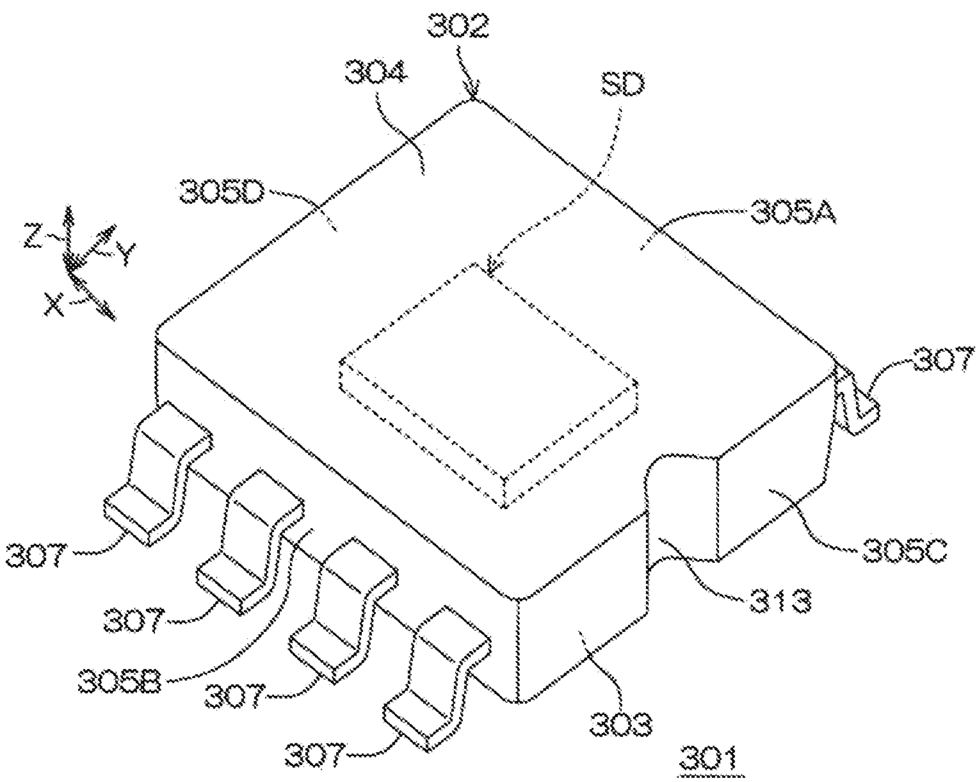
FIG. 1 is a perspective view showing an example of a semiconductor package in which a semiconductor device according to an embodiment of the present disclosure is incorporated.
Figure 2:
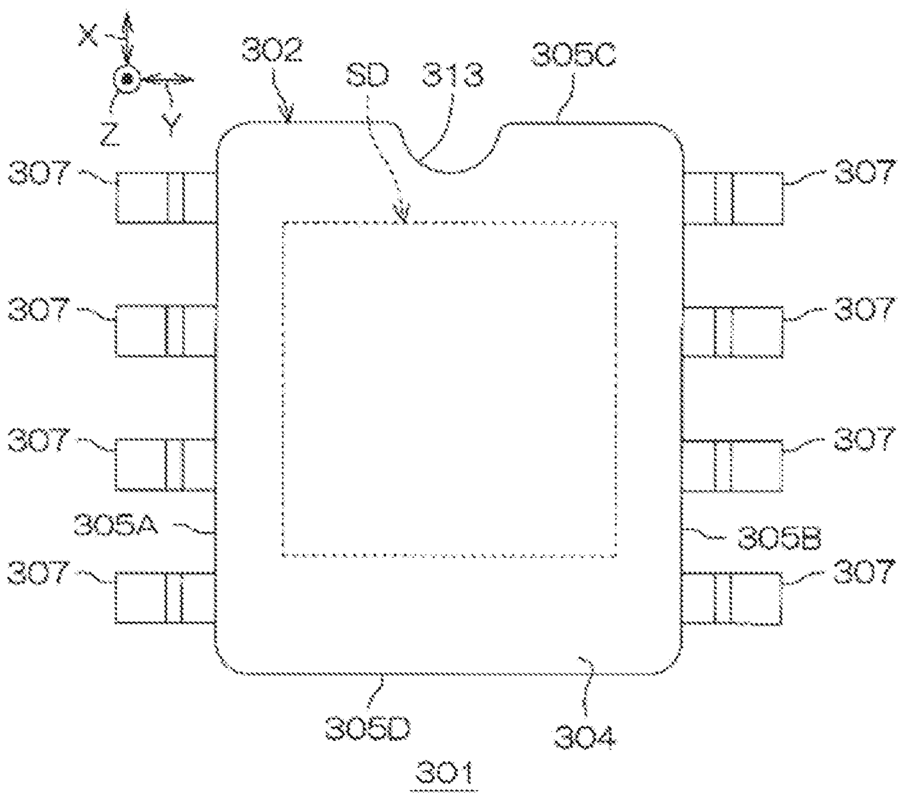
FIG. 2 is a plan view showing the semiconductor package shown in FIG. 1.
Figure 3:
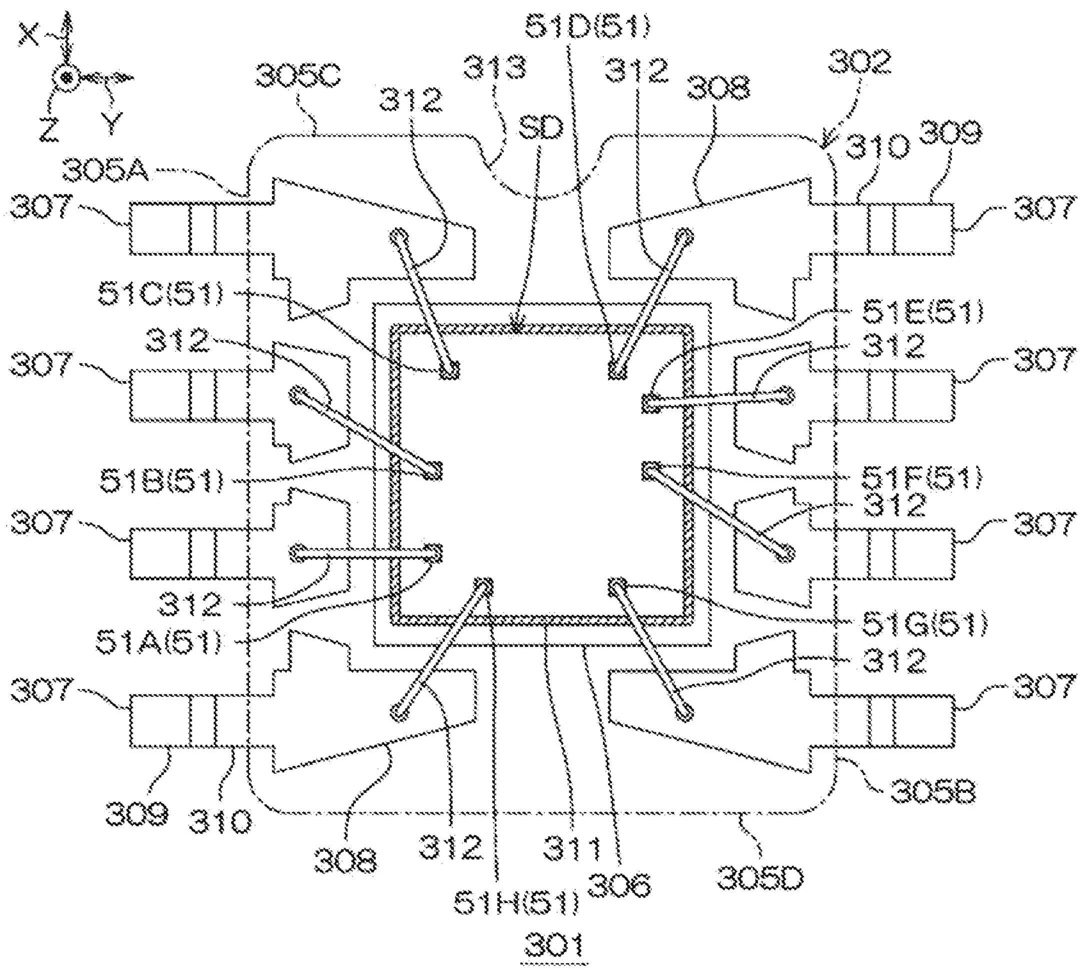
FIG. 3 is a plan view showing an internal structure of the semiconductor package shown in FIG. 1.

Embodiments of the present disclosure will be now described in detail with reference to the accompanying drawings. FIG. 1 is a perspective view showing an example of a semiconductor package 301 in which a semiconductor device SD according to an embodiment of the present disclosure is incorporated. FIG. 2 is a plan view showing the semiconductor package 301 shown in FIG. 1. FIG. 3 is a plan view showing an internal structure of the semiconductor package 301 shown in FIG. 1. Referring to FIGS. 1 to 3, in this example, the semiconductor package 301 is constituted by an 8-terminal type SOP (Small Outline Package). The semiconductor package 301 is not limited to SOP, but may be constituted by TO (Transistor Outline), QFN (Quad For Non Lead Package), DFP (Dual Flat Package), DIP (Dual Inline Package), QFP (Quad Flat Package), SIP (Single Inline Package), SOJ (Small Outline J-leaded Package), or various similar packages.

The semiconductor package 301 includes a package body 302. The package body 302 is made of a mold resin (fir example, an epoxy resin) and is formed in a rectangular parallelepiped shape. The package body 302 has a mounting surface 303 on one side, a non-mounting surface 304 on the other side, and first to fourth side walls 305A to 305D connecting the mounting surface 303 and the non-mounting surface 304.

The mounting surface 303 and the non-mounting surface 304 are formed in a square shape (specifically, a rectangular shape) in a plan view as viewed from their normal direction Z. The mounting surface 303 is a surface facing a connection target in a state where the semiconductor package 301 is mounted on the connection target. A circuit board such as a PCB is exemplified as the connection target. The first side wall 305A and the second side wall 305B extend along the mounting surface 303 in a first direction X and face each other in a second direction Y intersecting (specifically, being orthogonal to) the first direction X. The first side wall 305A and the second side wall 305B form a long side of the package body 302. The third side wall 305C and the fourth side wall 305D extend in the second direction Y and face each other in the first direction X. The third side wall 305C and the fourth side wall 305D form a short side of the package body 302.

The semiconductor package 301 includes a plate-shaped die pad 306 disposed in the package body 302. The die pad 306 contains at least one of copper, a copper-based alloy, iron, and an iron-based alloy. The die pad 306 is disposed on the side of the mounting surface 303 in the package body 302. The die pad 306 is formed in a square shape in the plan view. The semiconductor package 301 includes a plurality of lead terminals 307 (eight lead terminals in this example) drawn from the inside to the outside of the package body 302. Each of the plurality of lead terminals 307 includes at least one of copper, a copper-based alloy, iron, and an iron-based alloy. Four lead terminals 307 are arranged on the first side wall 305A side art intervals from the side of the third side wall 305C toward the side of the fourth side wall 305D.

Four lead terminals 307 are arranged on the side of the second side wall 305B at intervals from the side of the third side wall 305C toward the side of the fourth side wall 3051). The plurality of lead terminals 307 on the side of the second side wall 305B face the plurality of lead terminals 307 on the side of the first side wall 305A, respectively, with the package body 302 interposed therebetween in a plan view. The number, shape, and arrangement of the plurality of lead terminals 307 are optional and are not limited to the number, shape, and arrangement shown in FIGS. 1 to 3.

Each of the plurality of lead terminals 307 has an inner end portion 308, an outer end portion 309, and a lead portion 310. The inner end portion 308 is located inside the package body 302 and has a plate surface parallel to the mounting surface 303 (the non-mounting surface 304). The inner end portions 308 of the four lead terminals 307 arranged at the four corners are each formed in an L shape so as to face two sides of the die pad 306 in a plan view.

The outer end portion 309 is located outside the package body 302 and has a plate surface parallel to the mounting surface 303 (the non-mounting surface 304). The lead portion 310 is drawn from the inner end portion 308 to the outside of the package body 302 and is connected to the outer end portion 309. The lead portion 310 is bent toward the mounting surface 303 outside the package body 302 and is connected to the outer end portion 309 at a height position across the mounting surface 303 in the normal direction Z.

The semiconductor package 301 includes the semiconductor device SD disposed over the die pad 306 in the package body 302. The semiconductor device SD is constituted by any one of semiconductor devices (their reference numerals omitted) according to first to twenty-fourth embodiments. The semiconductor device SD is disposed inside the package body 302 on the side of the non-morning surface 304 with respect to the die pad 306. The semiconductor device SD includes a plurality of terminal electrodes (eight terminal electrodes in this example) 51 formed in one surface of the semiconductor device SD.

The number of terminal electrodes 51 is optional. The plurality of terminal electrodes 51 may include at least a terminal electrode 51 on a low potential side and a terminal electrode 51 on a high potential side. In this example, the plurality of terminal electrodes 51 include first to eighth terminal electrodes 51A to 51H, In this example, the plurality of terminal electrodes 51 are arranged at intervals on the peripheral edge of one surface of the semiconductor device SD. The arrangement of the plurality of terminal electrodes 51 is optional. The semiconductor device SD is disposed over the plate surface of the die pad 306 on the side of the non-mounting surface 304 in a posture in which the plurality of terminal electrodes 51 face the non-mounting surface 304 of the package body 302.

The semiconductor package 301 includes a bonding material 311 that is interposed between the die pad 306 and the semiconductor device SD in the package body 302 and bonds the die pad 306 and the semiconductor device SD (see a hatched portion in FIG. 3). The bonding material 311 is made of an insulating adhesive, a metal adhesive, or solder. The semiconductor package 301 includes a plurality of conducting wires (eight conducting wires in this example) 312 that electrically connect the plurality of terminal electrodes 51 to the corresponding lead terminals 307 (the inner end portion 308) in the package body 302, respectively. The plurality of conducting wires 312 are respectively bonded to the inner portions of the corresponding first to eighth terminal electrodes 51A to 51H at intervals from the peripheral edges to the inner portions of the corresponding first to eighth terminal electrodes 51A to 51H. The plurality of conducting wires 312 are made of bonding wires, respectively. The plurality of conducting wires 312 include at least one of a copper wire, a gold wire, and an aluminum wire. The plurality of conducting wires 312 may be made of a copper wire in some embodiments.

The semiconductor package 301 has a mark 313 indicating an arrangement of the plurality of lead terminals 307 on the package body 302. In this example, the mark 313 is formed by a recess in the third side wall 305C toward the fourth side wall 305D. The recess is formed in an arc shape from the third side wall 305C toward the fourth side wall 305D in a plan view. As a result, the third side wall 305C and the fourth side wall 305D have an asymmetrical shape, and the arrangement of the plurality of lead terminals 307 is determined. The mark 313 may be, in place of or in addition to the recess, a recess formed in the non-mounting surface 304 and/or a mark colored in a color different from that of the semiconductor package 301, in this case, the mark 313 may be formed in the vicinity of any lead terminal 307 in the plan view.

Figure 4:
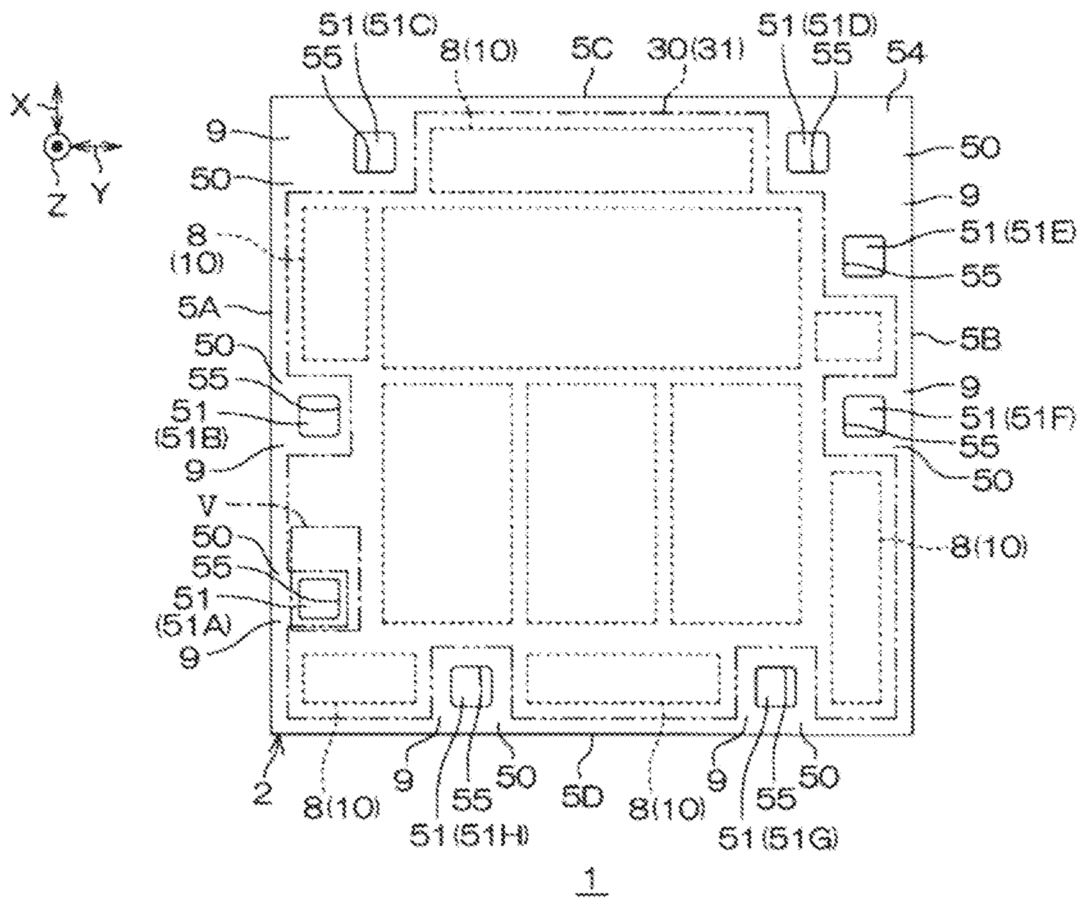
FIG. 4 is a plan view showing a semiconductor device according to a first embodiment of the present disclosure.
Figure 5:
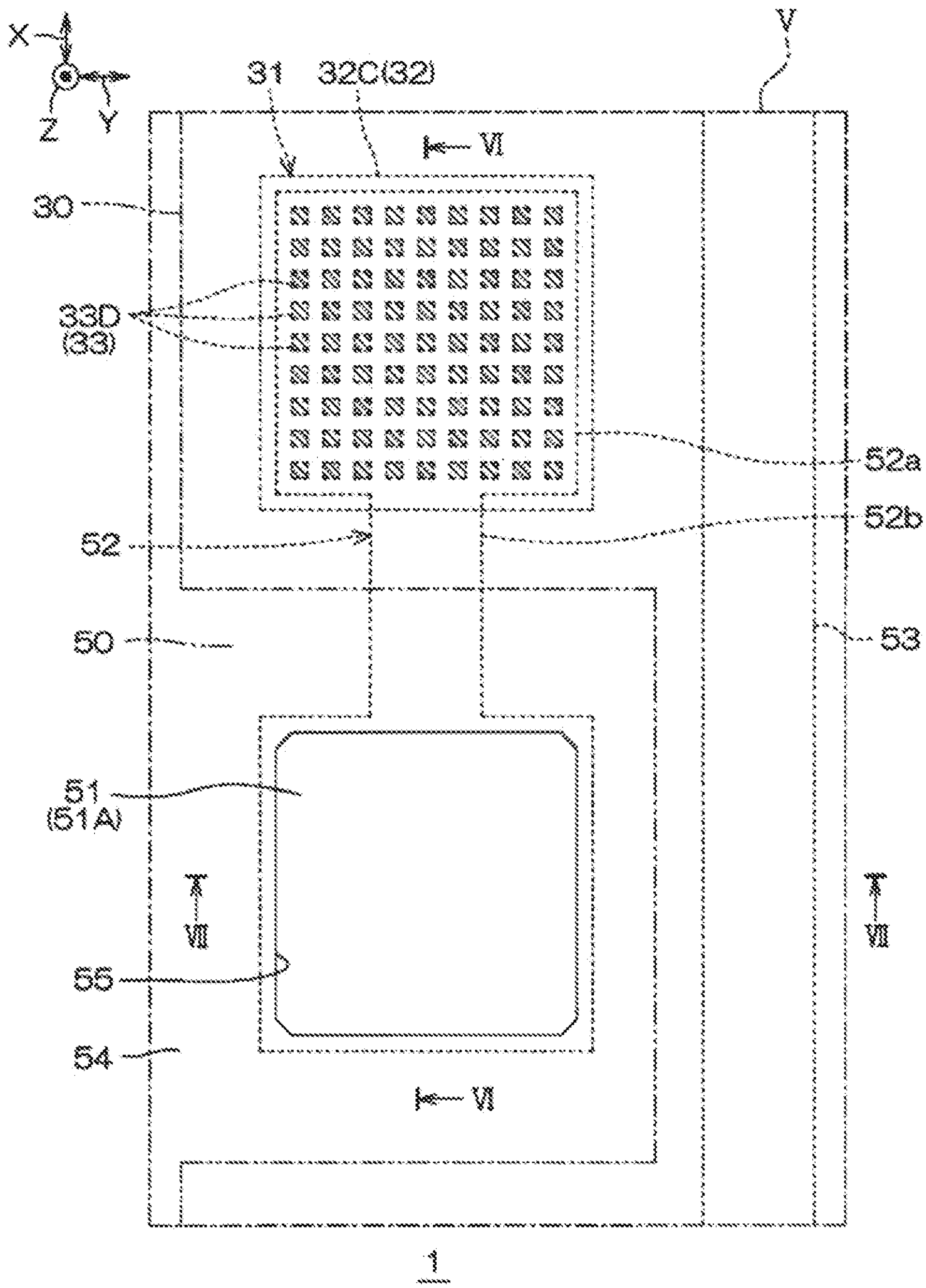
FIG. 5 is an enlarged view of a region V shown in FIG. 4.
Figure 6:
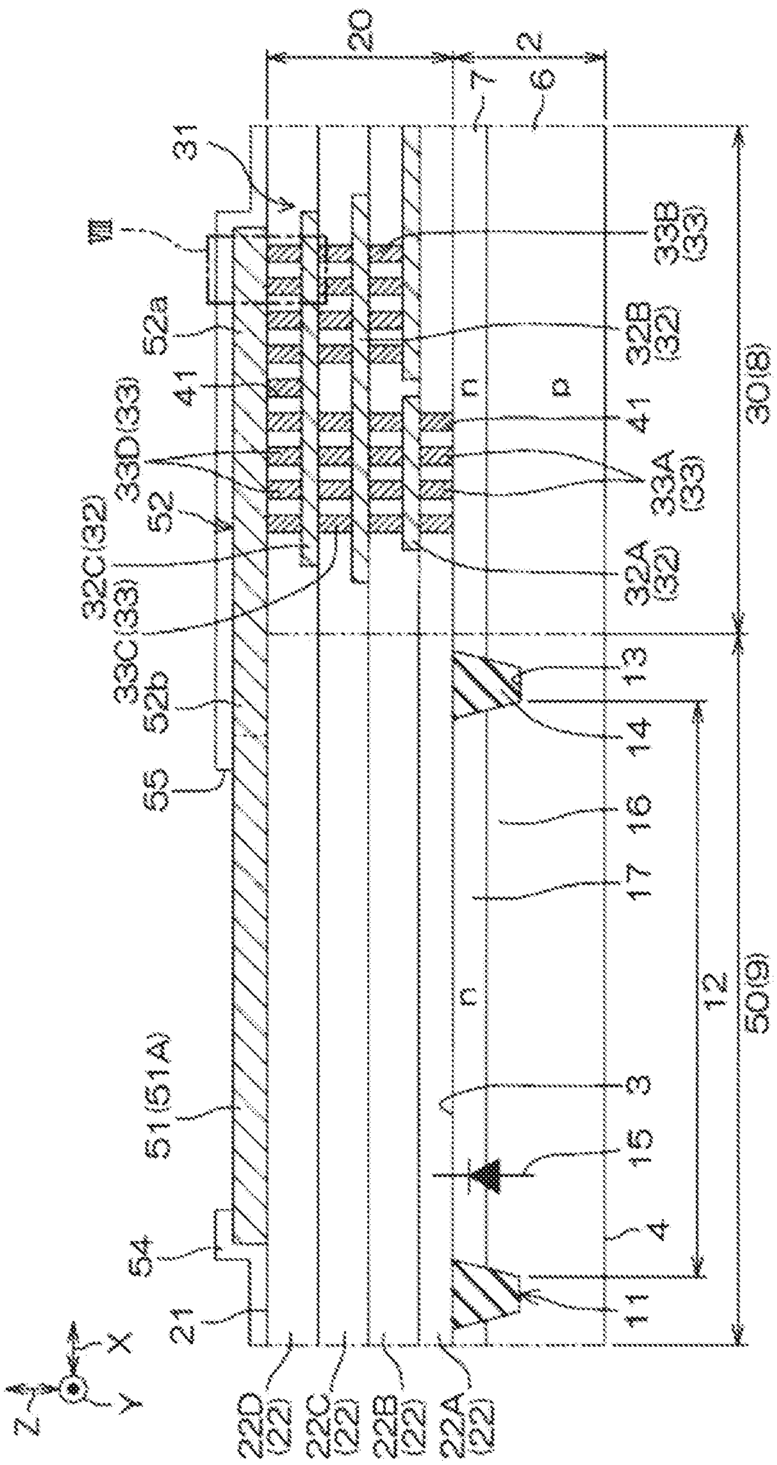
FIG. 6 is a cross-sectional view taken along a line VI-VI shown in FIG. 5.
Figure 7:
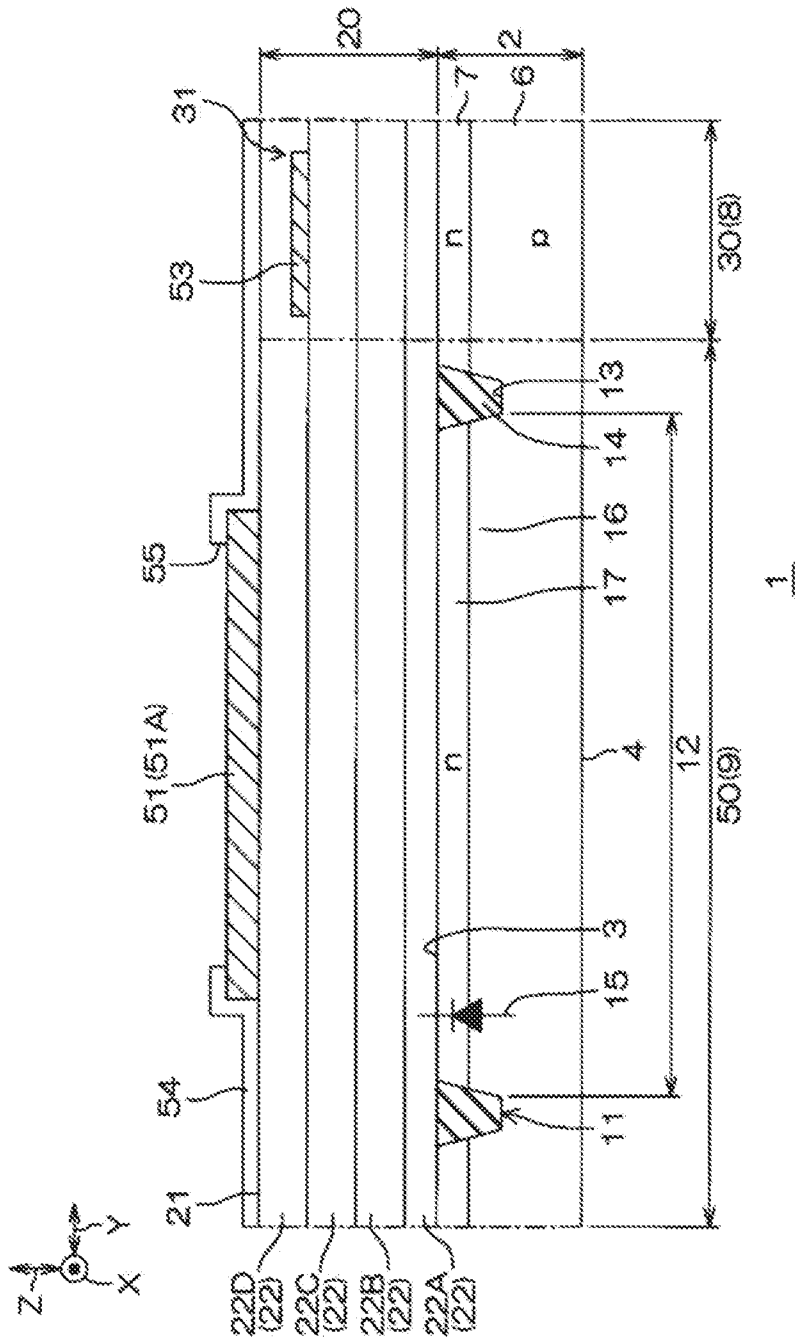
FIG. 7 is a cross-sectional view taken along a line VII-VII, shown in FIG. 5.
Figure 8:
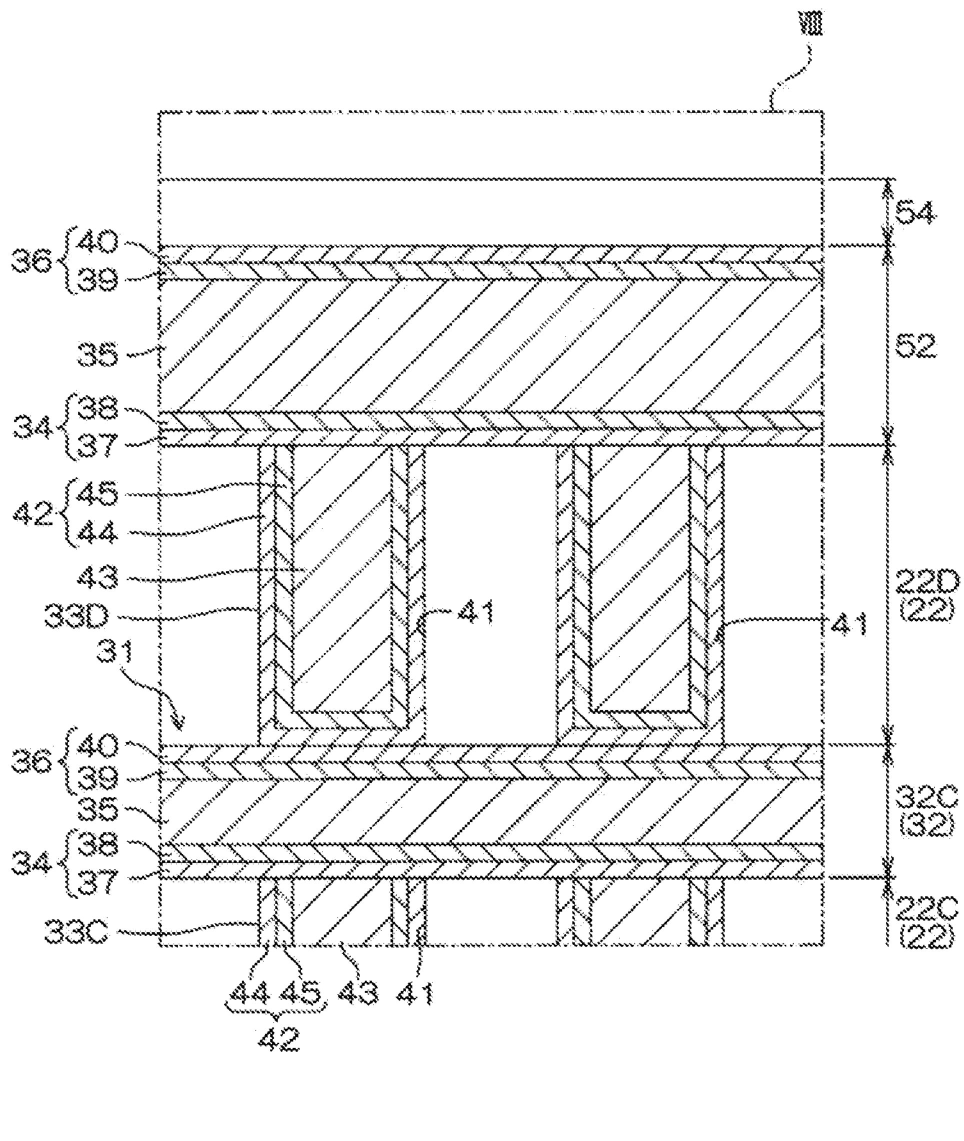
FIG. 8 is an enlarged view of a region VIII shown in FIG. 6.

FIG. 4 is a plan view showing a semiconductor device 1 according to a first embodiment of the present disclosure. FIG. 5 is an enlarged view of a region V shown in FIG. 4. FIG. 6 is a cross-sectional view taken along a line VI-VI shown in FIG. 5. FIG. 7 is a cross-sectional view taken along a line VII-VII shown in FIG. 5. FIG. 8 is an enlarged view of a region VIII shown in FIG. 6. Referring to FIGS. 4 to 8, the semiconductor device 1 includes a rectangular parallelepiped semiconductor chip 2 (chip). In this embodiment, the semiconductor chip 2 is formed of a silicon chip. The semiconductor chip 2 has a first main surface 3 on one side (see FIG. 7), a second main surface 4 on the other side, and first to fourth side surfaces 5A to 5D connecting the first main surface 3 and the second main surface 4.

The first main surface 3 and the second main surface 4 are formed in a square shape in a plan view as viewed from a normal direction Z. The first side surface 5A and the second side surface 5B extend along the first main surface 3 in the first direction X and face each other in the second direction Y intersecting (specifically, being orthogonal to) the first direction X. The third side surface 5C and the fourth side surface SD extend in the second direction and face each other in the first direction X.

The semiconductor device 1 includes a p-type first semiconductor region 6 formed in a surface layer portion of the second main surface 4 of the semiconductor chip 2. The first semiconductor region 6 is formed over the entire surface layer portion of the second main surface 4 and is exposed from the second main surface 4 and the first to fourth side surfaces 5A to 5D. That is, the first semiconductor region 6 has portions of the first to fourth side surfaces 5A to 5D and the second main surface 4. In this embodiment, the first semiconductor region 6 is formed by a p-type semiconductor substrate.

The semiconductor device 1 includes an n-type second semiconductor region 7 formed in a surface layer portion of the first main surface 3 of the semiconductor chip 2. The second semiconductor region 7 is formed over the entire surface layer portion of the first main surface 3 and is exposed from the first main surface 3 and the first to fourth side surfaces 5A to 5D. That is, the second semiconductor region 7 has portions of the first to fourth side surfaces 5A to 5D and the first main surface 3. In this embodiment, the second semiconductor region 7 is formed by an n-type epitaxial layer.

The semiconductor device 1 includes at least one device region 8 (see dotted line portions in FIG. 4) partitioned on the first main surface 3, and an outer region 9 outside the device region 8. The device region 8 is a circuit region including a circuit device 10 (circuit element) formed by using the first main surface 3 and/or the surface layer portion of the first main surface 3. The circuit device 10 refers to a device that contributes to the main electrical characteristics of the semiconductor device 1. In FIG. 4, the circuit device 10 is shown by reference numeral only.

The number, arrangement, and shape of the device regions 8 are optional and are not limited to a particular number, arrangement, and shape. In this embodiment, a plurality of device regions 8 are partitioned into inner portions of the first main surface 3 at intervals from the first to fourth side surfaces 5A to 5D in a plan view. The circuit device 10 may include at least one of a semiconductor switching device, a semiconductor rectifying device, and a passive device.

The semiconductor switching device may include at least one of MISFET (Metal Insulator Semiconductor Field Effect Transistor), BJT (Bipolar Junction Transistor), IGBT (Insulated Gate Bipolar Junction Transistor), and JFET (Junction Field Effect Transistor), The semiconductor rectifying device may include at least one of a pn junction diode, a pin junction diode, a Zener diode, a Schottky barrier diode, and a fast recovery diode. The passive device may include at least one of a resistor, a capacitor, and an inductor.

The circuit device 10 may include a circuit network in which at least two of the semiconductor switching device, the semiconductor rectifying device, and the passive device are combined. The circuit network may be an integrated circuit such as LSI (Large Scale Integration), SSI (Small Scale Integration), MSI (Medium Scale Integration), VLSI (Very Large Scale Integration), ULSI (Ultra-Very Large Scale Integration), or the like.

The outer region 9 is a region that does not include the circuit device 10 and, in this embodiment, is selectively formed in the peripheral edge of the first main surface 3. The number, arrangement, and shape of the outer regions 9 are adjusted according to the aspects of the device region 8 and are not limited to a particular number, arrangement, and shape. The semiconductor device 1 includes at least one isolation structure H formed in a region (the outer region 9) outside the device region 8 on the first main surface 3. In this embodiment, a plurality of isolation structures 11 are formed in a plurality of outer regions 9. The plurality of isolation structures 11 electrically isolate a portion of the semiconductor chip 2 from the plurality of device regions 8 to partition the portion of the semiconductor chip 2 as an isolation region 12. The plurality of isolation structures 11 may be formed in an annular shape surrounding the portion of the semiconductor chip 2 in a plan view.

In this embodiment, each of the plurality of isolation structures 11 has a trench isolation structure including a trench 13 and an insulator 14. The trench 13 is dug down from the first main surface 3 toward the second main surface 4. Specifically, the trench 13 penetrates the second semiconductor region 7 so as to reach the first semiconductor region 6. The trench 13 has a bottom wall located within the first semiconductor region 6. The trench 13 may be formed in a tapered shape whose opening width narrows from the first main surface 3 toward the bottom wall.

The insulator 14 is buried in the trench 13. The insulator 14 may be buried in the trench 13 so as to protrude above the first main surface 3. The insulator 14 may contain at least one of silicon oxide and silicon nitride. The plurality of isolation structures 11 may include a region-isolation insulating film in place of or in addition to the trench isolation structure. The region-isolation insulating film may include a LOCOS (Local Oxidation Of Silicon) film made of oxide of the semiconductor chip 2.

The semiconductor device 1 includes at least one outer diode 15 (rectifier/floating rectifier) formed in a region (the outer region 9) outside the plurality of device regions 8 on the surface layer portion of the first main surface 3. In this embodiment, a plurality of outer diodes 15 are formed in a plurality of outer regions 9. The plurality of outer diodes 15 are formed in an electrically floating state and are electrically separated from the plurality of circuit devices 10. That is, the plurality of outer diodes 15 are devices that do not directly contribute to the main electrical characteristics of the semiconductor device 1.

Each of the plurality of outer diodes 15 is formed in a region (the isolation region 12) surrounded by the plurality of isolation structures 11 on the surface layer portion of the first main surface 3. The plurality of outer diodes 15 are connected in reverse bias to the semiconductor chip 2 (plurality of device regions 8), The plurality of outer diodes 15 shield a current path from the outer region 9 to the plurality of device regions 8.

Specifically, each of the plurality of outer diodes 15 includes an anode region 16 formed in the surface layer portion of the first main surface 3 in the isolation region 12 and a cathode region 17 formed in the surface layer portion of the anode region 16. The anode region 16 is formed by using a portion of the first semiconductor region 6 and is in contact with the trench 13. The cathode region 17 is formed by using a portion of the second semiconductor region 7 and is in contact with the trench 13. The cathode region 17 is electrically insulated from the second semiconductor region 7 located outside the isolation structure 11 by the isolation structure 11. The cathode region 17 is formed in an electrically floating state.

In this embodiment, an example in which the isolation region 12 (the outer diode 15) is electrically isolated from the other regions by the isolation structure 11 has been described. However, when the portion forming the outer region 9 in the semiconductor chip 2 is formed in the electrically floating state due to the structure on the side of the plurality of device regions 8, the isolation structure 11 may be removed. In this case, the portion forming the outer region 9 in the semiconductor chip 2 in the electrically floating state may be used as the outer diode 15.

Further, the anode region 16 may be a p-type semiconductor region formed in the surface layer portion of the first main surface 3 and may not be formed by using a portion of the first semiconductor region 6 (the p-type semiconductor substrate). The anode region 16 may be formed of a p-type impurity diffusion region formed by diffusion of p-type impurities. Further, the cathode region 17 may be an n-type semiconductor region formed in the surface layer portion of the first main surface 3 (the anode region 16) and may not be formed by using a portion of the second semiconductor region 7 (the n-type epitaxial layer). The cathode region 17 may be formed of an n-type impurity diffusion region formed by diffusion of n-type impurities.

The semiconductor device 1 includes an insulating layer 20 that is laminated on the first main surface 3 and collectively covers the plurality of device regions 8 and the outer region 9. That is, the insulating layer 20 collectively covers the plurality of circuit devices 10 in the plurality of device regions 8 and collectively covers the plurality of isolation regions 12 (outer diodes 15) in the outer region 9. The insulating layer 20 has a flat insulating main surface 21. The insulating main surface 21 extends in parallel to the first main surface 3.

In this embodiment, the insulating layer 20 has a laminated structure including a plurality of interlayer insulating films (here, four interlayer insulating films) 22. The plurality of interlayer insulating films 22 include first to fourth interlayer insulating films 22A to 22D laminated in this order from the side of the first main surface 3. The first interlayer insulating film 22A forms a bottom interlayer insulating film 22. The second and third interlayer insulating films 22B and 22C form an intermediate interlayer insulating film 22. The fourth interlayer insulating film 22D forms a top interlayer insulating film 22. The number of laminated layers of the interlayer insulating film 22 is optional and is not limited to a specific number of layers. The insulating layer 20 may have a laminated structure in which two or more interlayer insulating films 22 are laminated, and may have a laminated structure in which four or more interlayer insulating films 22 are laminated.

Each of the first to fourth interlayer insulating films 22A to 22D includes at least one of a silicon oxide film and a silicon nitride film. Each of the first to fourth interlayer insulating films 22A to 22D may have a single-layer structure including a silicon oxide film or a silicon nitride film. Each of the first to fourth interlayer insulating films 22A to 22D may have a laminated structure in which a plurality of silicon oxide films or a plurality of silicon nitride films are laminated.

Each of the first to fourth interlayer insulating films 22A to 22D may have a laminated structure in which one or more silicon oxide films and one or more silicon nitride films are laminated in any order. Each of the first to fourth interlayer insulating films 22A to 22D may have a thickness of 0.5 μm or more and 5 μm or less. The first to fourth interlayer insulating films 22A to 22D may not have the same thickness, but may have different thicknesses.

The semiconductor device 1 includes a multilayer wiring region 30 firmed in the insulating layer 20. In FIGS. 4 and 5, the multilayer wiring region 30 is indicated by a two-dot chain line. The multilayer wiring region 30 is formed in a portion of the insulating layer 20 that covers at least one device region 8. In this embodiment, the multilayer wiring region 30 is formed in a portion of the insulating layer 20 that covers the plurality of device regions 8 so as to overlap the plurality of device regions 8 in a plan view. The multilayer wiring region 30 is further formed at intervals from the peripheral edge to an inner portion of the first main surface 3 so as to expose the peripheral edge of the first main surface 3 in the plan view. The multilayer wiring region 30 may overlap a portion of the outer region 9 so as to expose a portion of the outer region 9 in the plan view.

The multilayer wiring region 30 includes at least one multilayer wiring 31 formed in the insulating layer 20 so as to be electrically connected to at least one circuit device 10. The multilayer wiring region 30 may include a plurality of multilayer wirings 31. The plurality of multilayer wirings 31 may be electrically independent of each other or may be electrically connected to each other. That is, one or more multilayer wirings 31 may be electrically connected to one circuit device 10. Further, one multilayer wiring 31 may be electrically connected to a plurality of circuit devices 10.

The multilayer wiring 31 includes a plurality of wirings 32 laminated and arranged in the insulating layer 20 in the thickness direction of the insulating layer 20, and a plurality of wirings via electrodes 33 that electrically connect the plurality of wirings 32 in the insulating layer 20. In other words, the plurality of wirings 32 form the multilayer wiring 31 in the insulating layer 20 and are electrically connected to at least one circuit device 10 via the plurality of wirings via electrodes 33.

The number of laminated layers of the plurality of wirings 32 is adjusted according to the number of laminated layers of the interlayer insulating film 22. An arrangement and a routing form of the plurality of wirings 32 are optional and are not limited to a specific arrangement and a specific routing form. Further, an arrangement and a connection destination of the plurality of wirings via electrodes 33 are optional and are not limited to a specific arrangement and a specific connection destination. Hereinafter, one configuration example of the multilayer wiring 31 will be described with reference to FIGS. 6 and 8.

In this embodiment, the plurality of wirings 32 include first to third wirings 32A to 32C. The first wiring 32A is formed of a bottom wiring formed over the first interlayer insulating film 22A and is covered with the second interlayer insulating film 22B. The second wiring 32B is formed of an intermediate wiring formed over the second interlayer insulating film 22B and is covered with the third interlayer insulating film 22C. The third wiring 32C is formed of a top wiring formed over the third interlayer insulating film 22C and is covered with the fourth interlayer insulating film 22D. The first to third wirings 32A to 32C are respectively routed on the first to third interlayer insulating films 22A to 22C in an optional manner.

Each of the first to third wirings 32A to 32C includes a first barrier film 34, a main wiring film 35, and a second barrier film 36, which are laminated in this order from the side of the semiconductor chip 2. The first barrier film 34 is formed of a Ti-based metal film formed in the form of a film. In this embodiment, the first barrier film 34 has a laminated structure including a Ti film 37 and a TiN film 38 laminated in this order from the side of the semiconductor chip 2. The first barrier film 34 may have a single-layer structure including the Ti film 37 or the TiN film 38. The first barrier film 34 may have a thickness of 0.01 μm or more and 0.5 μm or less.

The main wiring film 35 is formed of an Al-based metal film formed in the form of a film on the first barrier film 34. The main wiring film 35 may include at least one of a pure Al (Al having a purity of 99% or more) film, an AlCu alloy film, an AlSi alloy film, and an AlSiCu alloy film. The main wiring film 35 has a thickness exceeding the thickness of the first barrier film 34. The thickness of the main wiring film 35 may be 0.5 μm or more and 5 μm or less.

The second harrier film 36 is formed of a Ti-based metal film formed in the form of a film on the main wiring film 35. In this embodiment, the second barrier film 36 has a laminated structure including a Ti fila 39 and a TiN film 40 laminated in this order from the side of the main wiring film 35. The second barrier film 36 may have a single-layer structure composed of the Ti film 39 or the TiN film 40. The second barrier film 36 has a thickness less than the thickness of the main wiring film 35. The second barrier film 36 may have a thickness of 0.01 μm or more and 0.5 μm or less.

In this embodiment, the plurality of wirings via electrodes 33 include first to fourth wiring via electrodes 33A to 33D and are buried in a plurality of via openings 41 formed in the insulating layer 20, respectively. An example in which a plurality of first wiring via electrodes 33A, a plurality of second wiring via electrodes 33B, a plurality of third wiring via electrodes 33C, and a plurality of fourth wiring via electrodes 33D are formed is shown in FIGS. 5 and 6. In FIG. 5, the fourth wiring via electrodes 33D are shown by hatching. The number and arrangement of first to fourth wiring via electrodes 33A to 33D are optional.

Each of the plurality of first wiring via electrodes 33A is formed of a bottom via electrode and is buried in the first interlayer insulating film 22A so as to be electrically connected to the semiconductor chip 2 (the circuit device 10) and the first wiring 32A. Each of the plurality of second wiring via electrodes 33B is formed of a first intermediate via electrode and is buried in the second interlayer insulating film 22B so as to be electrically connected to the first wiring 32A and the second wiring 32B.

Each of the plurality of third wiring via electrodes 33C is formed of a second intermediate via electrode and is buried in the third interlayer insulating film 22C so as to be electrically connected to the second wiring 32B and the third wiring 32C. Each of the plurality of fourth wiring via electrodes 33D is formed of a top via electrode and is buried in the fourth interlayer insulating film 22D so as to be electrically connected to the third wiring 32C and also be exposed from the insulating layer 20 (the insulating main surface 21).

Each of the first to fourth wiring via electrodes 33A to 33D includes a via harmer film 42 and a via main electrode 43 laminated in this order from the inner wall side of the via opening 41. The via barrier film 42 is formed of a Ti-based metal film formed in the form of a film along the inner wall of the via opening 41, in this embodiment, the via barrier film 42 has a laminated structure including a Ti film 44 and a TiN film 45 laminated in this order from the inner wall side of the via opening 41. The via barrier film 42 may have a single-layer structure including the Ti film 44 or the TiN film 45. The via barrier film 42 may have a thickness of 0.01 μm or more and 0.5 μm or less.

The via main electrode 43 is buried in the via opening 41 with the via barrier film 42 interposed therebetween. The via main electrode 43 contains at least one of aluminum, copper, and tungsten, in this embodiment, the via main electrode 43 contains tungsten. That is, in this embodiment, each of the first to fourth wiring via electrodes 33A to 33D is formed of a tungsten plug electrode. The semiconductor device 1 includes an insulating region 50 formed in a region outside the multilayer wiring region 30 in the insulating layer 20, in this embodiment, a plurality of insulating regions 50 are formed in the insulating layer 20. Each of the plurality of insulating regions 50 is formed of a region that do not have the multilayer wiring 31 (a plurality of wirings 32) in the entire region of the insulating layer 20 in the thickness direction. That is, each of the plurality of insulating regions 50 is formed of a laminated region in which the plurality of interlayer insulating films 22 (the first to fourth interlayer insulating films 22A to 22D) are laminated.

Each of the plurality of insulating regions 50 is formed in a portion of the insulating layer 20 that covers a region (the outer region 9) outside the device region 8. Specifically, the plurality of insulating regions 50 are respectively formed in the portions of the insulating layer 20 that cover the plurality of isolation regions 12 (the outer diodes 15), and fix the plurality of outer diodes 15 in an electrically floating state. Referring to FIGS. 5 to 7, the semiconductor device 1 includes a plurality of terminal electrodes 51 (first to eighth terminal electrodes 51A to 51H) arranged over the insulating main surface 21 of the insulating layer 20. The first terminal electrode 51A is shown in FIGS. 5 to 7. The plurality of terminal electrodes 51 are external terminal electrodes to which the plurality of conducting wires 312 are respectively connected, as shown in FIG. 3. Any potentials from the plurality of conducting wires 312 are applied to the plurality of terminal electrodes 51, respectively.

In this embodiment, each of the plurality of terminal electrodes 51 is disposed over the peripheral edge of the insulating main surface 21 in a plan view. Specifically, each of the plurality of terminal electrodes 51 is disposed over the corresponding insulating region 50 apart from the multilayer wiring region 30 in a plan view. The plurality of terminal electrodes 51 may be arranged on the corresponding insulating regions 50 in a one-to-one correspondence. At least two of the plurality of terminal electrodes 51 may be arranged over one insulating region 50.

Each of the plurality of terminal electrodes 51 faces a region (the outer region 9) outside the plurality of device regions 8 with the corresponding insulating region 50 interposed therebetween. That is, each of the plurality of terminal electrodes 51 is disposed over the insulating layer 20 apart from the plurality of wirings 32 in the plan view and faces the semiconductor chip 2 with only the insulating layer 20 interposed therebetween. Each of the plurality of terminal electrodes 51 further faces a region (the isolation region 12) surrounded by the plurality of isolation structures 11 in the plan view.

That is, the plurality of terminal electrodes 51 respectively face the plurality of outer diodes 15 with only the insulating region 50 interposed therebetween. Each of the plurality of terminal electrodes 51 may face the isolation region 12, spaced inward from the isolation structure 11 in the plan view. In a region directly below the plurality of terminal electrodes 51, current paths connecting the plurality of terminal electrodes 51 and the semiconductor chip 2 in the thickness direction of the insulating layer 20 are respectively shielded by the plurality of insulating regions 50 and the plurality of outer diodes 15.

Like the plurality of wirings 32, each of the plurality of terminal electrodes 51 include a first harrier film 34, a main wiring film 35, and a second barrier film 36, which are laminated in this order from the side of the insulating main surface 21. The plurality of terminal electrodes 51 may have a thickness exceeding thicknesses of the first to third wirings 32A to 32C in some embodiments. The main wiring film 35 of the plurality of terminal electrodes 51 may have a thickness exceeding the thickness of the main wiring film 35 of the first to third wirings 32A to 32C in some embodiments. In this embodiment, each of the plurality of terminal electrodes 51 is formed in a square shape in a plan view. Each terminal electrode 51 has an optional planar shape and may be formed in a circular shape or a polygonal shape.

The semiconductor device 1 includes a plurality of lead-out electrodes 52 respectively led out from the plurality of terminal electrodes 51 toward the multilayer wiring region 30 on the insulating main surface 21. Specifically, the plurality of lead-out electrodes 52 are led out from the plurality of terminal electrodes 51 toward the multilayer wiring region 30, respectively, so as to cover the top wiring via electrodes 33 (the plurality of fourth wiring via electrodes 33D). The plurality of lead-out electrodes 52 are electrically connected to the multilayer wiring 31 (specifically, the third wiring 32C) in the multilayer wiring region 30, and are electrically connected to the plurality of terminal electrodes 51 in the insulating region 50, respectively. That is, a state without the multilayer wiring 31 is maintained in a region directly below the plurality of terminal electrodes 51 (the insulating region 50).

Specifically, each of the plurality of lead-out electrodes 52 includes a connection portion 52*a* and a line portion 52*b*. The connection portion 52*a* covers the plurality of fourth wiring via electrodes 33D and is electrically connected to the plurality of fourth wiring via electrodes 33D. The connection portion 52*a* may be connected to all the fourth wiring via electrodes 33D. The width and planar shape of the connection portion 52*a* are optional and are not limited to a specific width and planar shape. The line portion 52*h* extends in a line shape between the terminal electrode 51 and the connection portion 52*a* and electrically connects the terminal electrode 51 and the connection portion 52*a*.

The width and routing form of the line portion 52*b* are optional and are not limited to a specific width and routing form. The line portion 52*b* may be respectively led out in a line shape having a width less than the width of the terminal electrode 51 in some embodiments. Like the plurality of terminal electrodes 51, each of the plurality of lead-out electrodes 52 includes a first barrier film 34, a main wiring film 35, and a second barrier film 36, which are laminated in this order from the side of the insulating main surface 21.

Referring to FIG. 7, the semiconductor device 1 includes a different potential wiring 53 routed in the vicinity of the insulating region 50 in the multilayer wiring region 30. The different potential wiring 53 is formed of a portion of the multilayer wiring 31 (one of the third wirings 32C in this embodiment) and a potential different from that of the adjacent terminal electrode 51 is applied to the different potential wiring 53. For example, when a first potential is applied to the terminal electrode 51, a second potential different from the first potential is applied to the different potential wiring 53 adjacent to the terminal electrode 51. The first potential may be a positive potential, a negative potential, or a ground potential. The second potential may be a positive potential, a negative potential, or a ground potential. In this embodiment, the different potential wiring 53 is routed in an optional manner on the intermediate third interlayer insulating film 22C located directly below the top fourth interlayer insulating film 22D.

The different potential wiring 53 may be disposed at a distance of 1 μm or more and 20 μm or less from the plurality of terminal electrodes 51 that are close to each other in a plan view. The different potential wiring 53 may be disposed at a distance of 10 μm or less from the plurality of terminal electrodes 51 that are close to each other in the plan view. FIG. 7 shows an example in which a portion of the multilayer wiring 31 is not formed in a region directly below the different potential wiring 53 in the insulating layer 20, Of course, a portion of the multilayer wiring 31 may be formed in the region directly below the different potential wiring 53 in the insulating layer 20.

The semiconductor device 1 includes a top insulating film 54 that selectively covers the plurality of terminal electrodes 51 on the insulating layer 20. In this embodiment, the top insulating film 54 selectively exposes the plurality of terminal electrodes 51 on the insulating layer 20 and covers the entire region of the plurality of lead-out electrodes 52. The top insulating film 54 is formed of an inorganic insulator having a relatively high density and has a barrier property (shielding property) against water (moisture). The top insulating film 54 may be referred to as a passivation film.

In this embodiment, the top insulating film 54 has a single-layer structure including an inorganic insulating film. The top insulating film 54 may be formed of an insulator different from that of the top fourth interlayer insulating film 22D in some embodiments. The top insulating film 54 may contain at least one of a silicon nitride (SiN) film and a silicon oxynitride (SiON) film in some embodiments. In this embodiment, the top insulating film 54 has a single-layer structure including a silicon nitride film. The thickness of the top insulating film 54 may be 0.05 μm or more and 5 μm or less.

The top insulating film 54 has a plurality of pad openings 55 that expose the plurality of terminal electrodes 51, respectively. The plurality of pad openings 55 expose the corresponding terminal electrodes 51 in a one-to-one correspondence. The plurality of pad openings 55 expose the inner portions of the plurality of corresponding terminal electrodes 51 at intervals from the electrode side walls to the inner portions of the plurality of corresponding terminal electrodes 51. The plurality of pad openings 55 may be formed in parallel to the peripheral edges of the plurality of terminal electrodes 51 in some embodiments. In this embodiment, each of the plurality of pad openings 55 is formed in a square shape in a plan view. A planar shape of each of the pad openings 55 may be optional and may be formed in a circular shape or a polygonal shape.

As described above, the semiconductor device 1 includes the semiconductor chip 2 (chip), the circuit device 10 (circuit element), the insulating layer 20, the multilayer wiring region 30, the insulating region 50, and the terminal electrode 51. The circuit device 10 is formed in the semiconductor chip 2. The insulating layer 20 covers the circuit device 10 on the semiconductor chip 2. The multilayer wiring region 30 is formed in the insulating layer 20. The multilayer wiring region 30 includes the multilayer wiring 31 electrically connected to the circuit device 10.

The multilayer wiring 31 includes the plurality of wirings 32 laminated and arranged in the thickness direction of the insulating layer 20. The insulating region 50 is formed in a region outside the multilayer wiring region 30 in the insulating layer 20. The insulating region 50 does not include the wirings 32 in the entire region of the insulating layer 20 in the thickness direction. The terminal electrode 51 is disposed over the insulating layer 20, separated from the multilayer wiring region 30 in a plan view, so as to face the semiconductor chip 2 with the insulating region 50 interposed therebetween.

According to this structure, a portion of the insulating layer 20 located directly below the terminal electrode 51 may be thickened. That is, the portion of the insulating layer 20 located directly below the terminal electrode 51 is thicker than a portion of the insulating layer 20 located between any two of the plurality of wirings 32 adjacent to each other in the vertical direction due to the structure in which none of the wirings 32 is formed. This can result in an increase of the resistance to stress at the time of connecting the conducting wires 312. As a result, it is possible to suppress the occurrence of cracks in the terminal electrode 51 due to the stress at the time of connecting the conducting wires 312. Therefore, the reliability of the terminal electrode 51 can be improved.

According to the semiconductor device 1, the reliability of the terminal electrode 51 and its surroundings can be improved. For example, according to this structure, it is possible to prevent cracks starting from the terminal electrode 51 from occurring in the insulating region 50. Further, according to this structure, the multilayer wiring 31 is not formed directly below the terminal electrode 51, Therefore, it is possible to suppress the occurrence of cracks in the multilayer wiring 31. Further, according to this structure, since cracks of the terminal electrode 51 can be suppressed, it is possible to suppress the electric influence caused by the cracks from occurring between the terminal electrode 51 and the multilayer wiring 31.

The multilayer wiring region 30 may be formed in a portion of the insulating layer 20 that covers the circuit device 10 in some embodiments. The insulating region 50 may be formed in a portion of the insulating layer 20 that covers the outside of the circuit device 10 in some embodiments. In this structure, the terminal electrode 51 may face a region outside the circuit device 10 in the semiconductor chip 2 in some embodiments. According to this structure, the circuit device 10 can be protected from stress at the time of connecting the conducting wires 312. Further, even in a case where cracks occur starting from the terminal electrode 51, it is possible to suppress the physical influence and the electrical influence caused by the cracks from occurring in the circuit device 10.

The semiconductor device 1 may further include the outer diode 15 (rectifier/floating rectifier) in some embodiments. The outer diode 15 includes the anode region 16 formed in a region outside the circuit device 10 on the surface layer portion of the semiconductor chip 2, and the cathode region 17 formed in the surface layer portion of the anode region 16. In this case, the insulating region 50 may be formed in a portion of the insulating layer 20 that covers the outer diode 15 in some embodiments. Further, the terminal electrode 51 may face the outer diode 15 with the insulating region 50 interposed therebetween in some embodiments.

According to this structure, the outer diode 15 is connected in reverse bias to the semiconductor chip 2 (the device region 8). That is, the outer diode 15 shields the current path from the outer region 9 to the device region 8. According to this structure, even when an unintended current path is formed between the terminal electrode 51 and the semiconductor chip 2 in the insulating layer 20, the current path can be shielded by the outer diode 15.

The unintended current path may include an undesired current path due to cracks. In this structure, the cathode region 17 may be formed in an electrical floating state in some embodiments. That is, the outer diode 15 may be formed as a floating diode in some embodiments. According to this structure, the shielding effect of the current path can be appropriately enhanced. The semiconductor device 1 may further include the lead-out electrode 52 and the wiring via electrode 33 (the fourth wiring via electrode 33D) in some embodiments. The lead-out electrode 52 is led out from the terminal electrode 51 onto the insulating layer 20 so as to face a portion of the multilayer wiring 31 with a portion of the insulating layer 20 interposed therebetween. The wiring via electrode 33 is interposed between the lead-out electrode 52 and a portion of the multilayer wiring. 31 in the insulating layer 20 and electrically connects the lead-out electrode 52 and the multilayer wiring 31. According to this structure, the terminal electrode 51 can be electrically connected to a portion of the multilayer wiring 31 while maintaining the state where the multilayer wiring 31 is not present in a region (the insulating region 50) directly below the terminal electrode 51.

The semiconductor device 1 may further include the top insulating film 54. The top insulating film 54 may have the pad opening 55 that exposes the terminal electrode 51, and cover the entire region of the lead-out electrode 52 in some embodiments. According to this structure, the conducting wire 312 can be electrically connected to the terminal electrode 51 while suppressing the conducting wire 312 from coming into contact with the lead-out electrode 52. The semiconductor device 1 may include the different potential wiring 53. The different potential wiring 53 is formed of a portion of the multilayer wiring 31 routed in the vicinity of the insulating region 50 in the multilayer wiring region 30, and a potential different from that of the adjacent terminal electrode 51 is applied to the different potential wiring 53. According to this structure, the different potential wiring 53 can be protected from the stress at the time of connecting the conducting wires 312. Further, even in a case where cracks occur starting from the terminal electrode 51, it is possible to suppress the physical influence and the electrical influence caused by the cracks from occurring between the terminal electrode 51 and the different potential wiring 53. As an example, it is possible to prevent the terminal electrode 51 from being short-circuited with the different potential wiring 53 due to the cracks.

Figure 9:
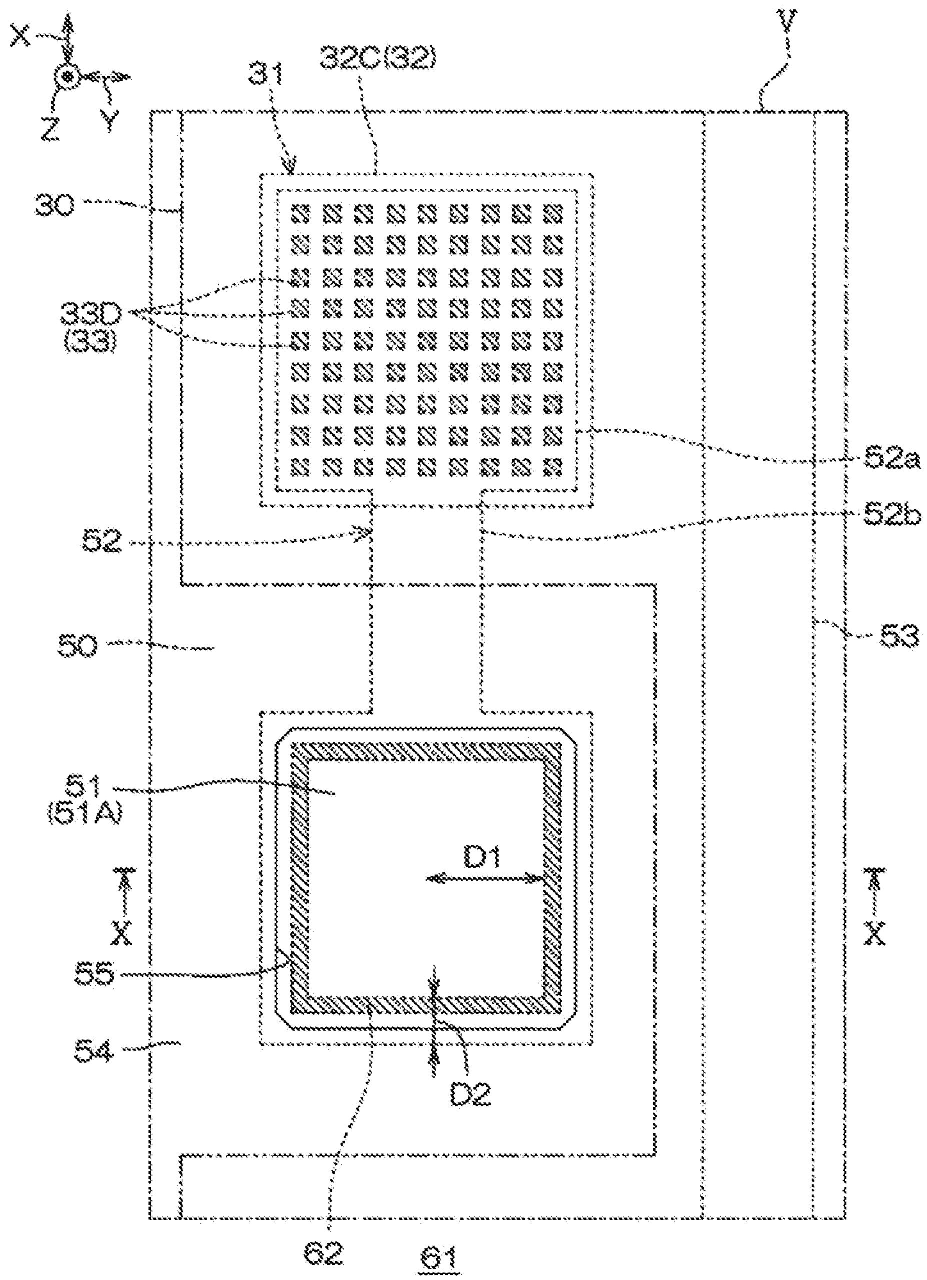
FIG. 9 corresponds to FIG. 5 and is an enlarged view showing a semiconductor device according to a second embodiment of the present disclosure together with an inner dummy wiring according to a first configuration example.
Figure 10:
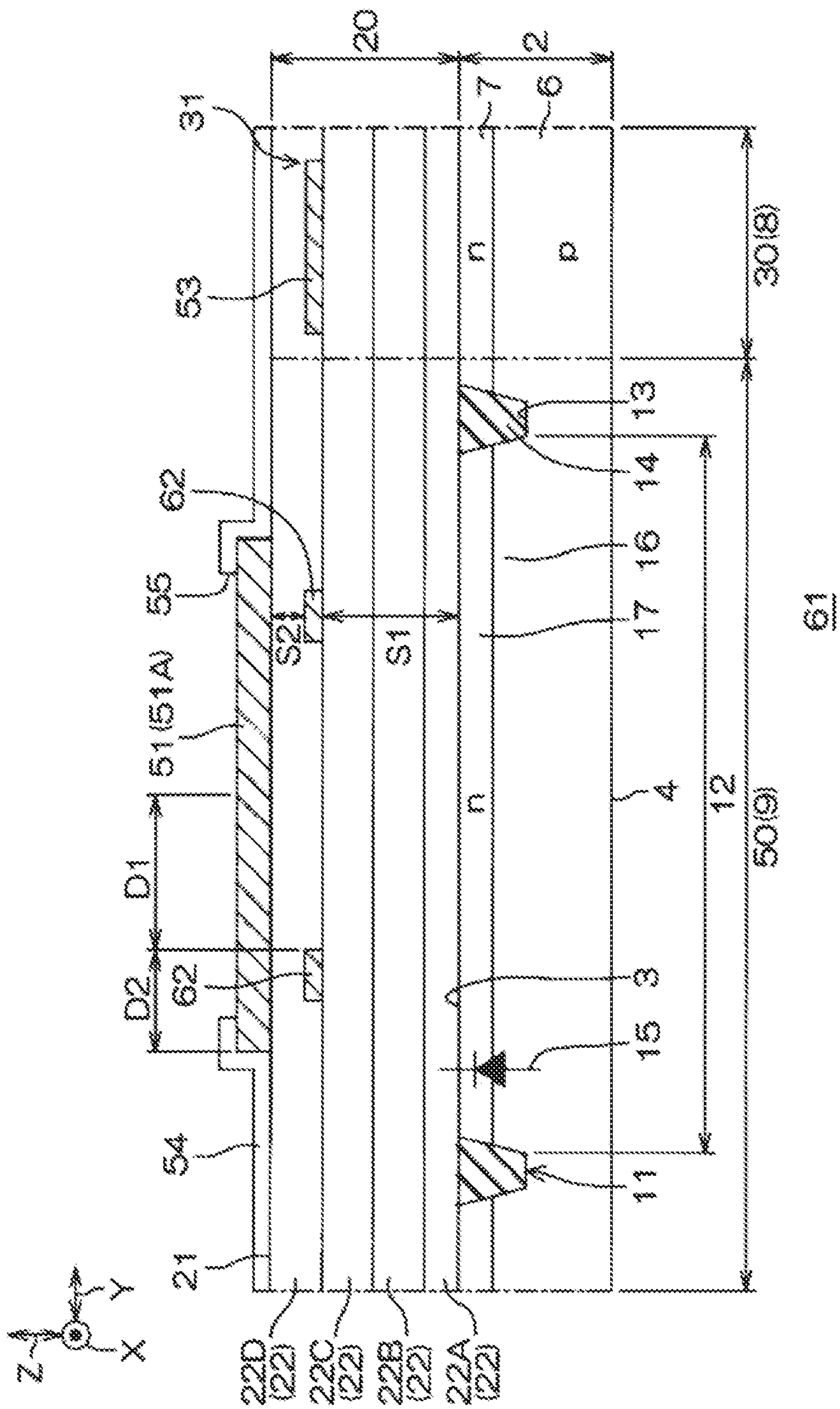
FIG. 10 is a cross-sectional view taken alone line X-X shown in FIG. 9.

FIG. 9 corresponds to FIG. 5 and is an enlarged view showing a semiconductor device 61 according to a second embodiment of the present disclosure together with an inner dummy wiring 62 according to a first configuration example. FIG. 10 is a cross-sectional view taken along a line XX shown in FIG. 9. Hereinafter, structures corresponding to the structures described for the semiconductor device 1 are denoted by the same reference numerals, and explanation thereof will not be repeated. Referring to FIGS. 9 and 10, the semiconductor device 61 includes a plurality of inner dummy wirings 62 (dummy wirings) respectively arranged in a region directly below the plurality of terminal electrodes 51 in the insulating region 50. One inner dummy wiring 62 disposed directly below one terminal electrode 51 (the first terminal electrode 51A) is shown in FIGS. 9 and 10. Further, in FIG. 9, the inner dummy wiring 62 is shown by hatching. Hereinafter, one inner dummy wiring 62 will be described as an example.

The inner dummy wiring 62 is disposed in the insulating region 50, apart from the multilayer wiring region 30 (the plurality of wirings 32), and is electrically independent from the multilayer wiring 31 (the plurality of wirings 32) and the terminal electrode 51. That is, the inner dummy wiring 62 is also electrically independent from the plurality of device regions 8. Specifically, the inner dummy wiring 62 is formed in an electrical floating state. The inner dummy wiring 62 partially faces the terminal electrode 51 with a portion of the insulating layer 20 interposed therebetween. The inner dummy wiring 62 faces the semiconductor chip 2 with only a portion of the insulating region 50 (the insulating layer 20) interposed therebetween. The inner dummy wiring 62 may face a region (the outer region 9) outside the device region 8 with a portion of the insulating region 50 interposed therebetween in a plan view in some embodiments.

The inner dummy wiring 62 may face a region (the isolation region 12) surrounded by the isolation structure 11 in a plan view. That is, the inner dummy wiring 62 may face the outer diode 15 in the plan view. The inner dummy wiring 62 may face the isolation region 12 while being spaced inward from the isolation structure 11 plan view. Further, the inner dummy wiring 62 may face the isolation structure 11 in the plan view.

The inner dummy wiring 62 may be disposed in a region close to the terminal electrode 51 with respect to the semiconductor chip 2 in the insulating region 50. That is, the inner dummy wiring 62 may be disposed with a first space S1 from the semiconductor chip 2 in the thickness direction of the insulating layer 20 and may be disposed with a second space S2, which is less than the first space S1 (S2<S1), from the terminal electrode 51 in the thickness direction of the insulating layer 20. In this embodiment, the inner dummy wiring 62 is formed in the form of a film on the third interlayer insulating film 22C located directly below the top interlayer insulating film 22 (the fourth interlayer insulating film 22D).

The inner dummy wiring 62 is disposed at an interval from the inner portion to the peripheral edge of the terminal electrode 51 so as to face the peripheral edge of the terminal electrode 51 in a plan view. The inner dummy wiring 62 may be disposed in a region close to the peripheral edge of the terminal electrode 51 with respect to the center of the terminal electrode 51. That is, the inner dummy wiring 62 may be disposed at a first distance D1 from the center to the peripheral edge of the terminal electrode 51 and may be disposed at a second distance D2, which is less than the first distance D1 (D2<D1), from the peripheral edge to the center of the terminal electrode 51. The first distance D1 and the second distance D2 are based on the inner edge of the inner dummy wiring 62 on the side of the inner portion of the terminal electrode 51.

The inner dummy wiring 62 is formed in a line shape extending along the peripheral edge of the terminal electrode 51 in the plan view. The inner dummy wiring 62 may be formed in at least a portion along the multilayer wiring region 30 (the different potential wiring 53) in the plan view. In this embodiment, the inner dummy wiring 62 is formed in an annular shape (a square annular shape in this embodiment) extending along the peripheral edge of the terminal electrode 51 so as to surround the inner portion of the terminal electrode 51 in the plan view.

Figure 11A:
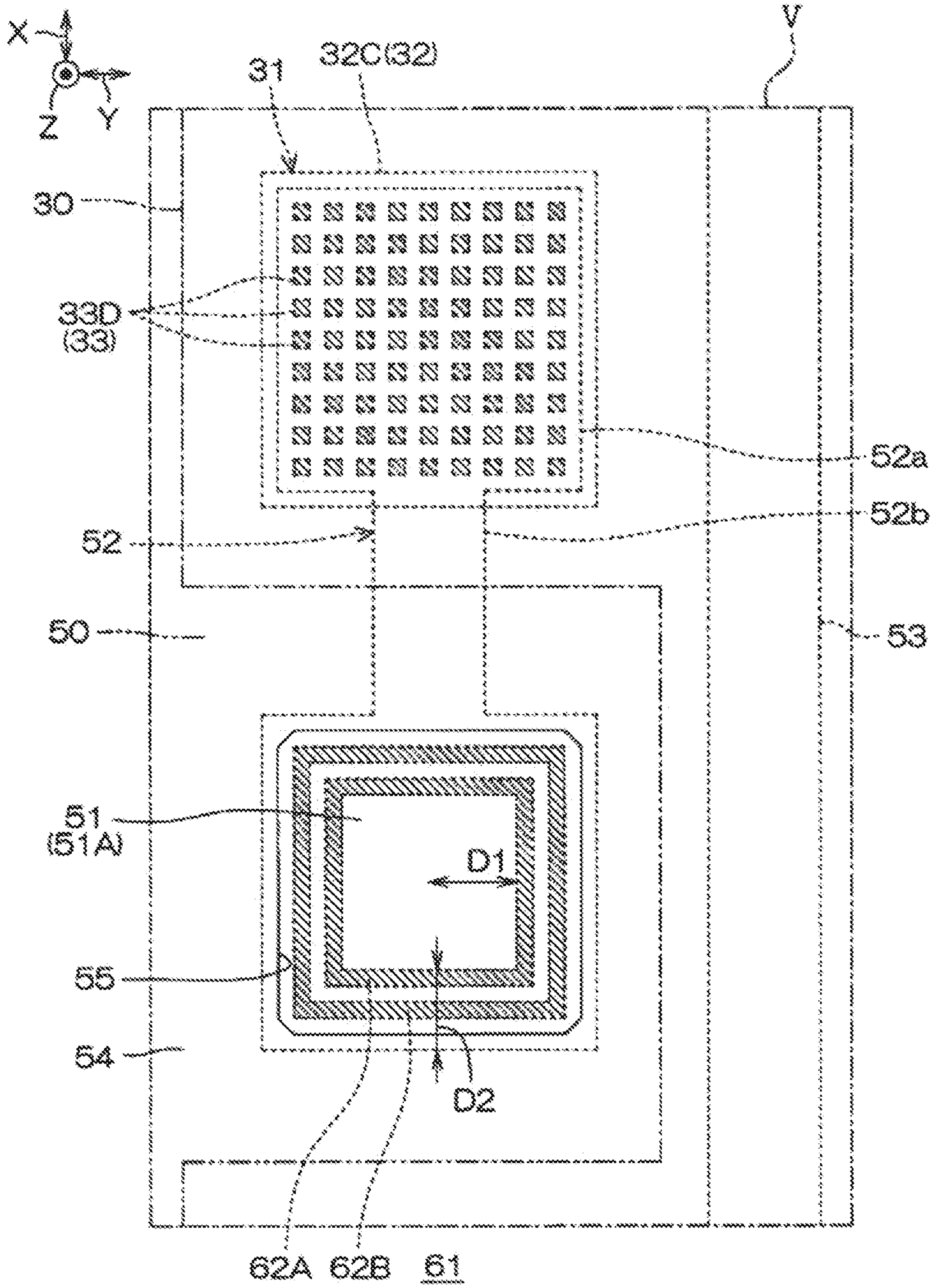
FIG. 11A is an enlarged view showing the semiconductor device shown in FIG. 9 together with an inner dummy wiring according to a second configuration example.

Like the plurality of wirings 32, the inner dummy wiring 62 includes a first barrier film 34, a main wiring film 35, and a second barrier film 36 laminated in this order from the side of the first main surface 3. The thickness of the inner dummy wiring 62 may be substantially equal to the thickness of the wiring 32 (the third wiring 32C in this embodiment) disposed in the same layer. The inner dummy wiring 62 may take various forms shown in FIGS. 11A to 11C. FIG. 11A is an enlarged view showing the semiconductor device 61 shown in FIG. 9 together with an inner dummy wiring 62 according to a second configuration example. Referring to FIG. 11A, in the second configuration example, a plurality of inner dummy wirings 62 (two inner dummy wirings in this embodiment) are formed. The plurality of inner dummy wirings 62 include a first inner dummy wiring 62A and a second inner dummy wiring 62B.

The first and second inner dummy wirings 62A and 62B are arranged in this order with an interval from the inner portion to the side of the peripheral edge of the terminal electrode 51 so as to face the peripheral edge of the terminal electrode 51 in a plan view. The first and second inner dummy wirings 62A and 62B may be arranged in a region close to the peripheral edge of the terminal electrode 51 with respect to the center of the terminal electrode 51. In this case, the innermost inner dummy wiring 62 (the first inner dummy wiring 62A) may be disposed at a first distance D1 from the center to the peripheral edge of the terminal electrode 51 and may be disposed at a second distance D2, which is less than the first distance D1 (D2<D1), from the peripheral edge to the center of the terminal electrode 51. The first distance D1 and the second distance D2 are based on the inner edge of the first inner dummy wiring 62A on the side of the inner portion of the terminal electrode 51.

In this embodiment, the first inner dummy wiring 62A is formed in a line shape extending along the peripheral edge of the terminal electrode 51 in a plan view. Specifically, the first inner dummy wiring 62A is formed in an annular shape (a square annular shape in this embodiment) that surrounds the inner portion of the terminal electrode 51 in the plan view. In this embodiment, the second inner dummy wiring 62B is interposed between the peripheral edge of the terminal electrode 51 and the first inner dummy wiring 62A in the plan view and is formed in a line shape extending along the peripheral edge of the terminal electrode 51. Specifically, the second inner dummy wiring 62B is formed in an annular shape (a square annular shape in this embodiment) surrounding the first inner dummy wiring 62A in the plan view.

In this embodiment, an example in which the first and second inner dummy wirings 62A and 62B are arranged over the same layer (the third interlayer insulating film 22C) has been described. However, the first and second inner dummy wirings 62A and 62B may be arranged in different layers. For example, the first inner dummy wiring 62A may be disposed over the third interlayer insulating film 22C, while the second inner dummy wiring 62B may be disposed over the second interlayer insulating film 22B.

Figure 11B:
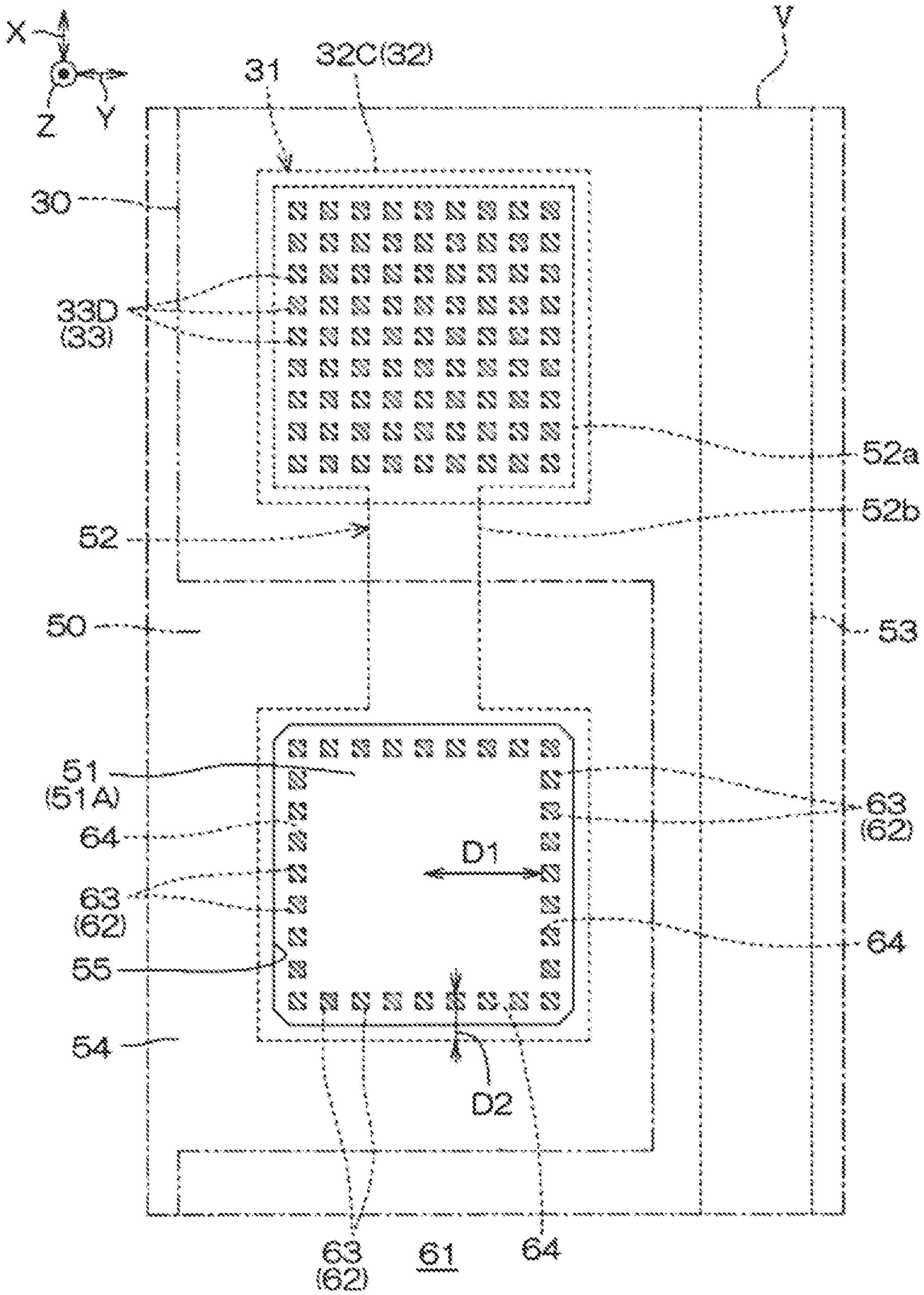
FIG. 11B is an enlarged view showing the semiconductor device shown in FIG. 9 together with an inner dummy wiring according to a third configuration example.

Further, the first inner dummy wiring 62A may be disposed over the second interlayer insulating film 22B, while the second inner dummy wiring 62B may be disposed over the third interlayer insulating film 22C. Even in these cases, the first and second inner dummy wirings 62A and 62B may be arranged so as to be close to the terminal electrode 51 with respect to the semiconductor chip 2. FIG. 11B is an enlarged view showing the semiconductor device 61 shown in FIG. 9 together with an inner dummy wiring 62 according to a third configuration example. Referring to FIG. 11B, in this embodiment, the inner dummy wiring 62 according to the third configuration example includes a plurality of segment portions 63 arranged in a dot shape at intervals along the peripheral edge of the terminal electrode 51.

It can be considered that the inner dummy wiring 62 according to the second configuration example has a form in which the inner dummy wiring 62 according to the first configuration example is divided into a plurality of segment portions 63 by a plurality of removal portions 64. The plurality of segment portions 63 are arranged side by side in a row along the peripheral edge of the terminal electrode 51. Each segment portion 63 is formed in a square shape in a plan view. Each segment portion 63 has an optional planar shape and may be formed in a circular shape or a polygonal shape.

Figure 11C:
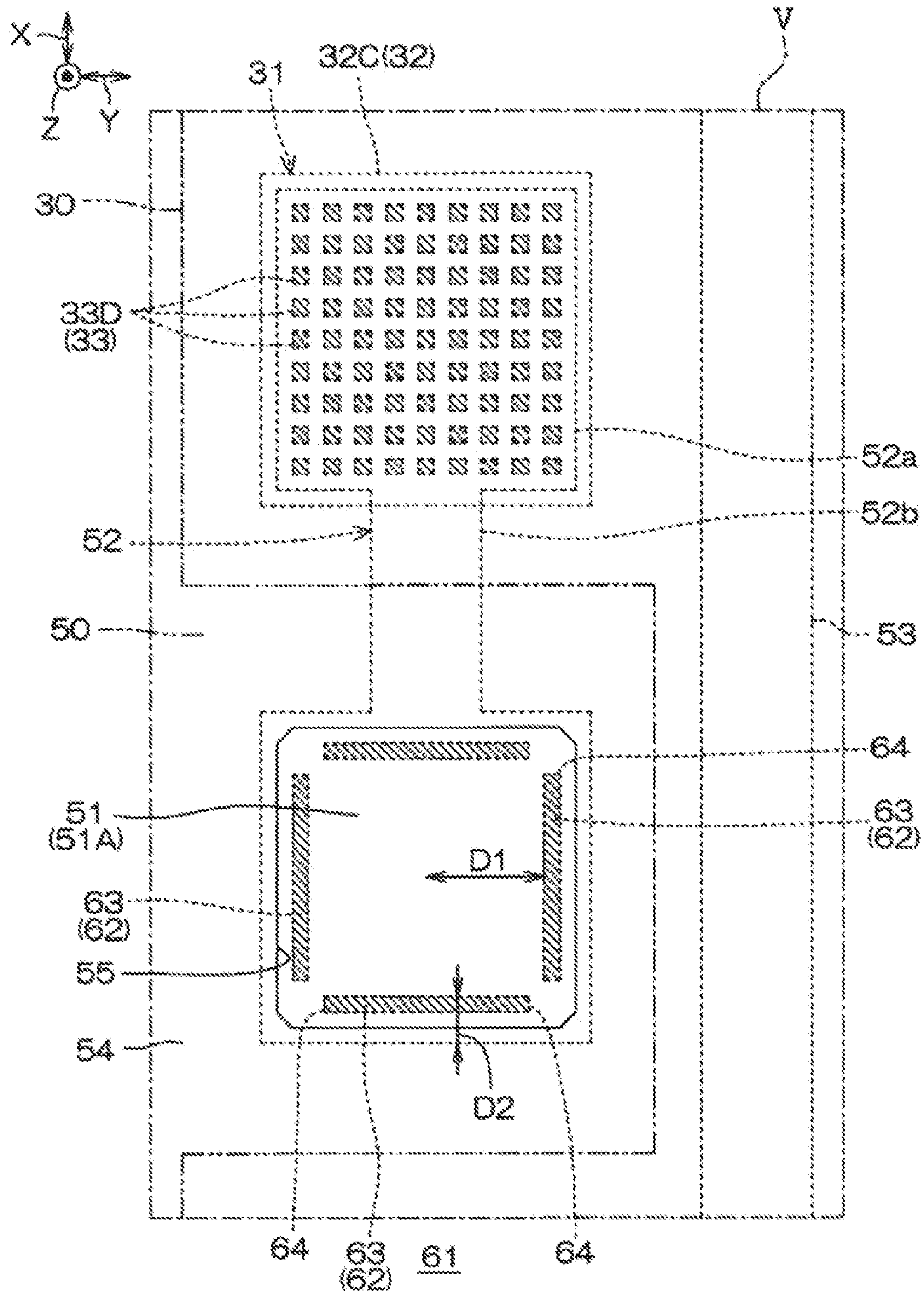
FIG. 11C is an enlarged view showing the semiconductor device shown in FIG. 9 together with an inner dummy wiring according to a fourth configuration example.

FIG. 11C is an enlarged view showing the semiconductor device 61 shown in FIG. 9 together with an inner dummy wiring 62 according to a fourth configuration example. Referring to FIG. 11C, in this embodiment, the inner dummy wiring 62 according to the fourth configuration example includes a plurality of segment portions (four segment portions in this embodiment) 63 arranged in a line shape at intervals along the peripheral edge of the terminal electrode 51. It can be considered that the inner dummy wiring 62 according to the fourth configuration example has a form in which the inner dummy wiring 62 according to the first configuration example is divided into a plurality of segment portions 63 by a plurality of removal portions 64. In this embodiment, the plurality of removal portions 64 are formed at the corners (specifically, four corners) of the inner dummy wiring 62, and each segment portion 63 is f med in a line shape extending along each side of the terminal electrode 51.

An inner dummy wiring 62 having a form in which the features of at least two of the inner dummy wirings 62 according to the first to fourth configuration examples are combined may be adopted. As described above, the semiconductor device 61 can also exhibit the same effects as those described for the semiconductor device 1. Further, the semiconductor device 61 includes the inner dummy wiring 62 (dummy wiring). The inner dummy wiring 62 is disposed in the insulating region 50 so as to partially face the terminal electrode 51, and is electrically independent from the multilayer wiring 31 (the plurality of wirings 32). According to this structure, the terminal electrode 51 faces the inner dummy wiring 62 with a portion of the insulating region 50 interposed therebetween, and faces the semiconductor chip 2 with the insulating region 50 interposed therebetween.

Therefore, a portion of the insulating layer 20 located between the terminal electrode 51 and the semiconductor chip 2 is thicker than a portion of the insulating layer 20 located between the terminal electrode 51 and the inner dummy wiring 62. That is, the portion of the insulating layer 20 located between the terminal electrode 51 and the semiconductor chip 2 is further thickened. This can result in an increase of the resistance to stress at the time of connecting the conducting wires 312. As a result, it is possible to suppress the occurrence of cracks in the terminal electrode 51 due to the stress at the time of connecting the conducting wires 312.

Further, even in a case where cracks occur in the insulating region 50, the cracks can be terminated by the inner dummy wiring 62. As a result, the expansion of cracks to the outside of the terminal electrode 51 can be suppressed in the plan view. That is, the expansion of cracks from the insulating region 50 to the multilayer wiring region 30 can be suppressed by the inner dummy wiring 62. Therefore, even in a case where cracks occur starting from the terminal electrode 51, it is possible to suppress the electrical influence caused by the cracks from occurring between the multilayer wiring 31 (the different potential wiring 53) and the terminal electrode 51.

Further, in the insulating region 50, a thin film portion formed of a portion of the insulating layer 20 is formed between the terminal electrode 51 and the inner dummy wiring 62. Therefore, the location of cracks can be controlled by this thin film portion. That is, by generating cracks on the side of the thin film portion, the stress at the time of connecting the conducting wires 312 can be relaxed, so that cracks outside the thin film portion can be suppressed. The inner dummy wiring 62 may be disposed in the insulating region 50 in a region close to the terminal electrode 51 with respect to the semiconductor chip 2. According to this structure, cracks can be appropriately terminated in the region close to the terminal electrode 51 with respect to the semiconductor chip 2. The inner dummy wiring 62 may be formed at intervals from the inner portion to the peripheral edge side of the terminal electrode 51 in the plan view. According to this structure, the generation of cracks starting from the inner portion of the terminal electrode 51 can be suppressed, and at the same time, the expansion of cracks can be suppressed at the peripheral edge of the terminal electrode 51.

The inner dummy wiring 62 may be formed in a dot shape, a line shape, or an annular shape along the peripheral edge of the terminal electrode 51 in the plan view. In this case, the inner dummy wiring 62 may be formed in a line shape extending along the peripheral edge of the terminal electrode 51 in the plan view. The inner dummy wiring 62 may be formed in an annular shape surrounding the inner portion of the terminal electrode 51 in the plan view. According to this structure, the expansion of cracks can be suppressed over the entire circumference of the peripheral edge of the terminal electrode 51.

The inner dummy wiring 62 may be electrically independent from the terminal electrode 51. According to this structure, it is possible to suppress the electric influence caused by the inner dummy wiring 62 from occurring in the terminal electrode 51 and the multilayer wiring 31. The inner dummy wiring 62 may be formed in an electrically floating state. According to this structure, the electrical influence caused by the inner dummy wiring 62 can be appropriately suppressed.

Figure 12:
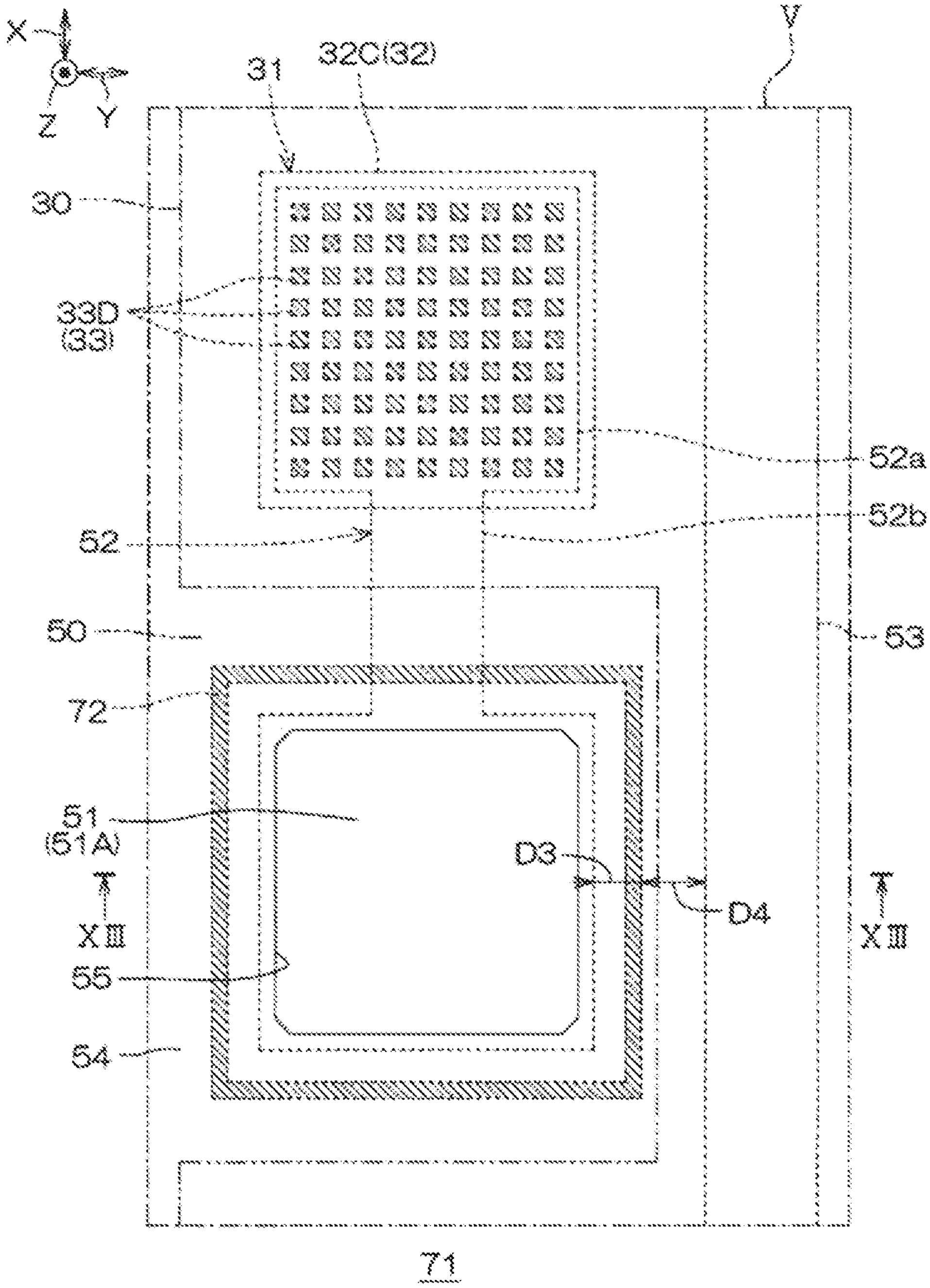
FIG. 12 corresponds to FIG. 5 and is an enlarged view showing a semiconductor device according to a third embodiment of the present disclosure together with an outer dummy wiring according to a first configuration example.
Figure 13:
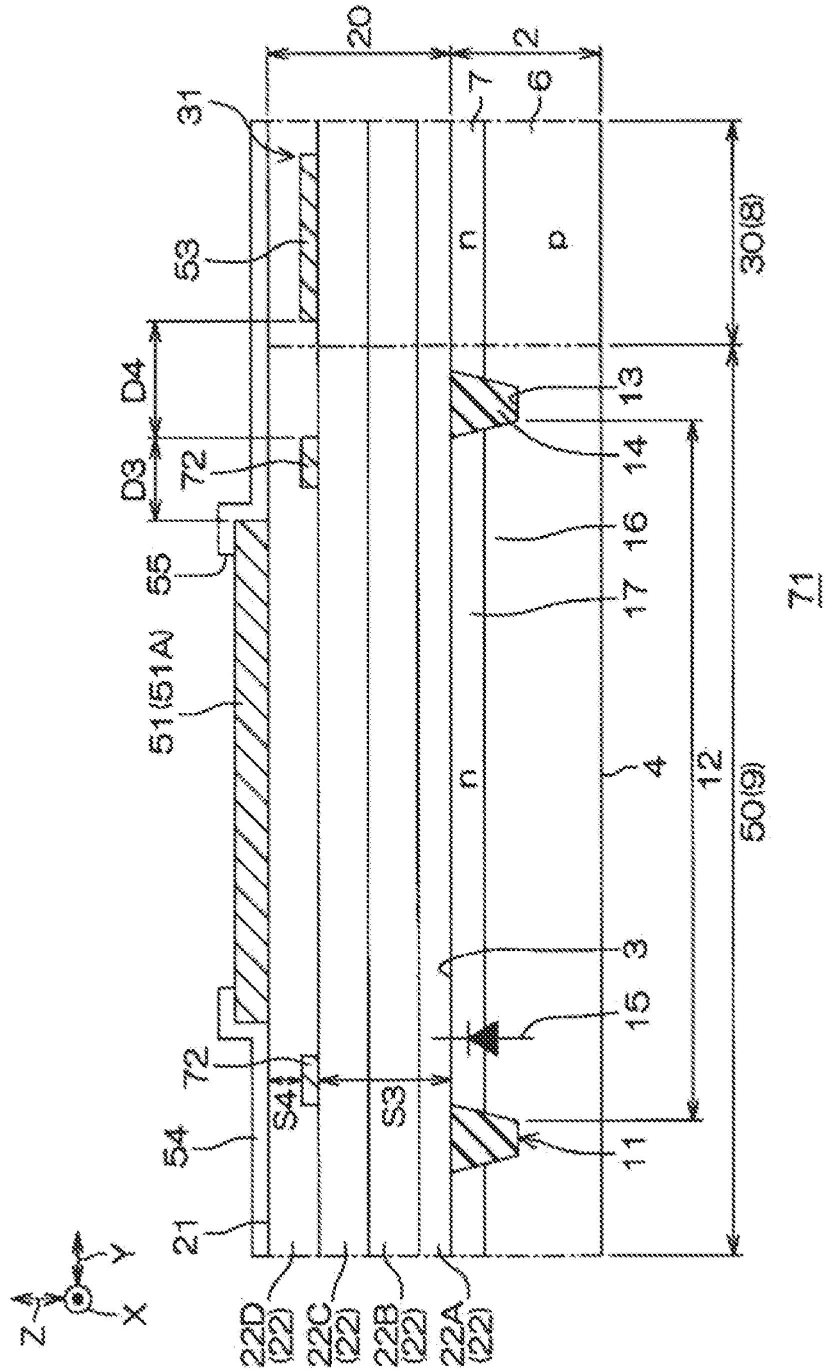
FIG. 13 is a cross-sectional view taken along a line XIII-XIII shown in FIG. 12.

FIG. 12 corresponds to FIG. 5 and is an enlarged view showing a semiconductor device 71 according to a third embodiment of the present disclosure together with an outer dummy wiring 72 according to a first configuration example. FIG. 13 is a cross-sectional view taken along a line XIII-XIII shown in FIG. 12. Hereinafter, structures corresponding to the structures described for the semiconductor device 1 and the like are denoted by the same reference numerals, and explanation thereof will not be repeated. Referring to FIGS. 12 and 13, the semiconductor device 71 includes the outer dummy wiring 72 (dummy wiring) disposed in the insulating region 50 so as to be located in at least a region between the terminal electrode 51 and the multilayer wiring region 30 in a plan view. FIGS. 12 and 13 show a form in which one outer dummy wiring 72 is disposed below one terminal electrode 51 (the first terminal electrode 51A). Further, in FIG. 12, the outer dummy wiring 72 is shown by hatching. Hereinafter, one outer dummy wiring 72 will be described as an example.

The outer dummy wiring 72 is disposed apart from the multilayer wiring region 30 (the plurality of wirings 32) and the terminal electrode 51 in the plan view and is electrically independent from the multilayer wirings 31 (the plurality of wirings 32) and the terminal electrode 51, That is, the outer dummy wiring 72 is also electrically independent from the plurality of device regions 8. Specifically, the outer dummy wiring 72 is formed in an electrical floating state.

The outer dummy wiring 72 faces the semiconductor chip 2 with only a portion of the insulating layer 20 (the insulating region 50) interposed therebetween. The outer dummy wiring 72 may face a region (the isolation region 12) surrounded by the isolation structure 11 in the plan view. That is, the outer dummy wiring 72 may face the outer diode 15 with only a portion of the insulating region 50 interposed therebetween. The outer dummy wiring 72 may face the isolation region 12 spaced inward from the isolation structure 11 in the plan view. The outer dummy wiring 72 may face the isolation structure 11 in the plan view.

The outer dummy wiring 72 may be disposed in the insulating region 50 in a region close to the terminal electrode 51 with respect to the semiconductor chip 2. That is, the outer dummy wiring 72 may be disposed with a third space S3 from the semiconductor chip 2 in the thickness direction of the insulating layer 20 and may be disposed with a fourth space S4, which is less than the third space S3 (S4<S3), from the terminal electrode 51 in the thickness direction of the insulating layer 20. In this embodiment, the outer dummy wiring 72 is formed in the form of a film on the third interlayer insulating film 22C located directly below the top interlayer insulating film 22 (the fourth interlayer insulating film 22D).

The outer dummy wiring 72 may be disposed in a region close to the terminal electrode 51 with respect to the multilayer wiring 31. That is, the outer dummy wiring 72 may be disposed at a third distance D3 from the terminal electrode 51 on the side of the multilayer wiring 31 and may be disposed at a fourth distance D4, which exceeds the third distance D3 (D3<D4), from the multilayer wiring 31 to the terminal electrode 51. The third distance D3 and the fourth distance D4 are based on the outer edge of the outer dummy wiring 72 on the side of the multilayer wiring region 30.

In this embodiment, the outer dummy wiring 72 is formed in a line shape extending along the terminal electrode 51 in the plan view. The outer dummy wiring 72 may be formed in at least a portion along the multilayer wiring region 30 (the different potential wiring 53) in the plan view. In this embodiment, the outer dummy wiring 72 overlaps the lead-out electrode 52 in the plan view. Specifically, the outer dummy wiring 72 extends in a line shape so as to intersect (specifically, be orthogonal to) the lead-out electrode 52 in the plan view.

In this embodiment, the outer dummy wiring 72 is formed in an annular shape (a square annular shape in this embodiment) extending along the terminal electrode 51 so as to surround the terminal electrode 51 in the plan view. Like the plurality of wirings 32, the outer dummy wiring 72 includes a first barrier film 34, a main wiring film 35, and a second barrier film 36 laminated in this order from the side of the first main surface 3. The thickness of the outer dummy wiring 72 may be substantially equal to the thickness of the wiring 32 (the third wiring 32C in this embodiment) disposed in the same layer.

Figure 14A:
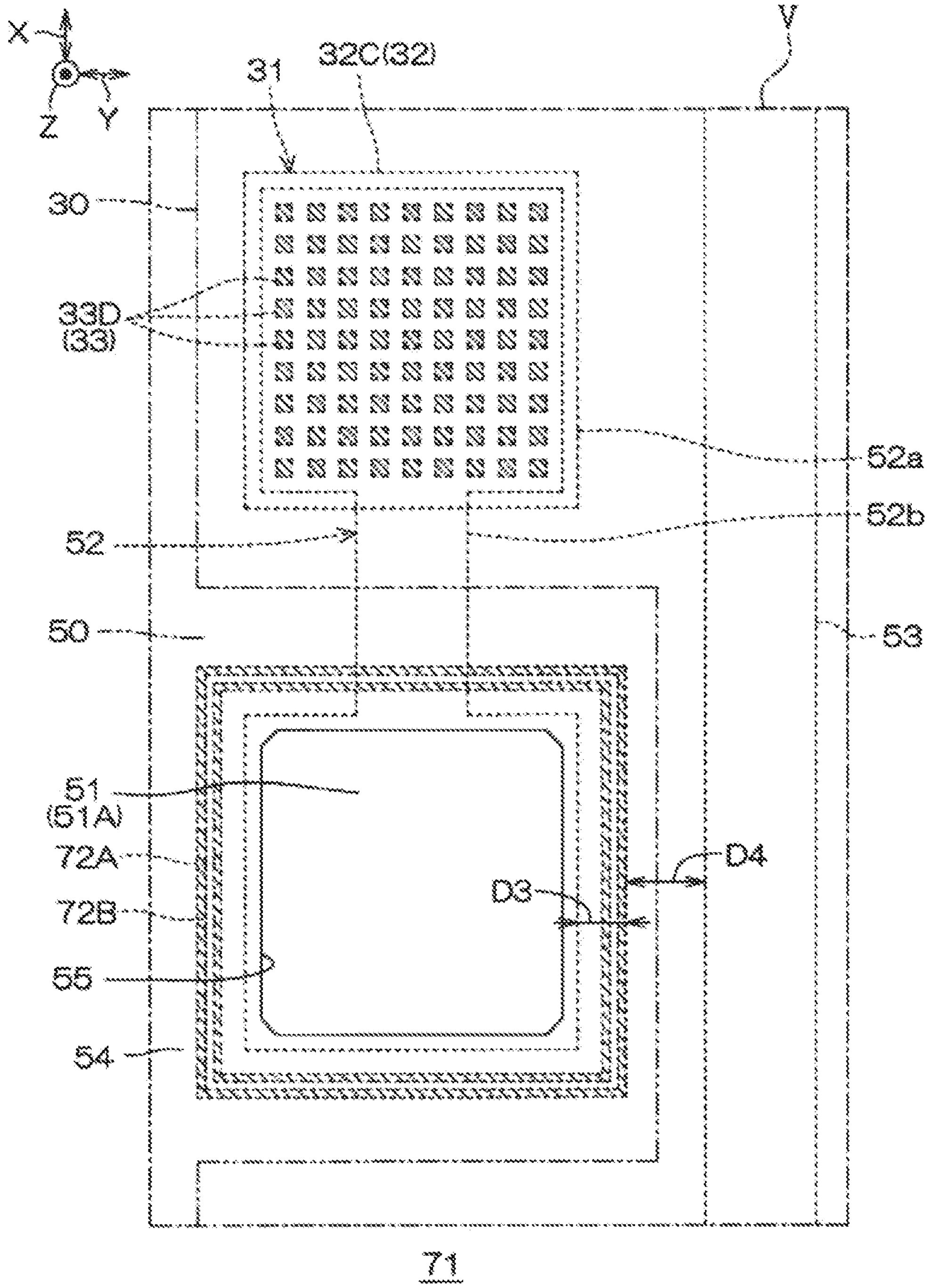
FIG. 14A is an enlarged view showing the semiconductor device shown in FIG. 12 together with an outer dummy wiring according to a second configuration example.
Figure 14B:
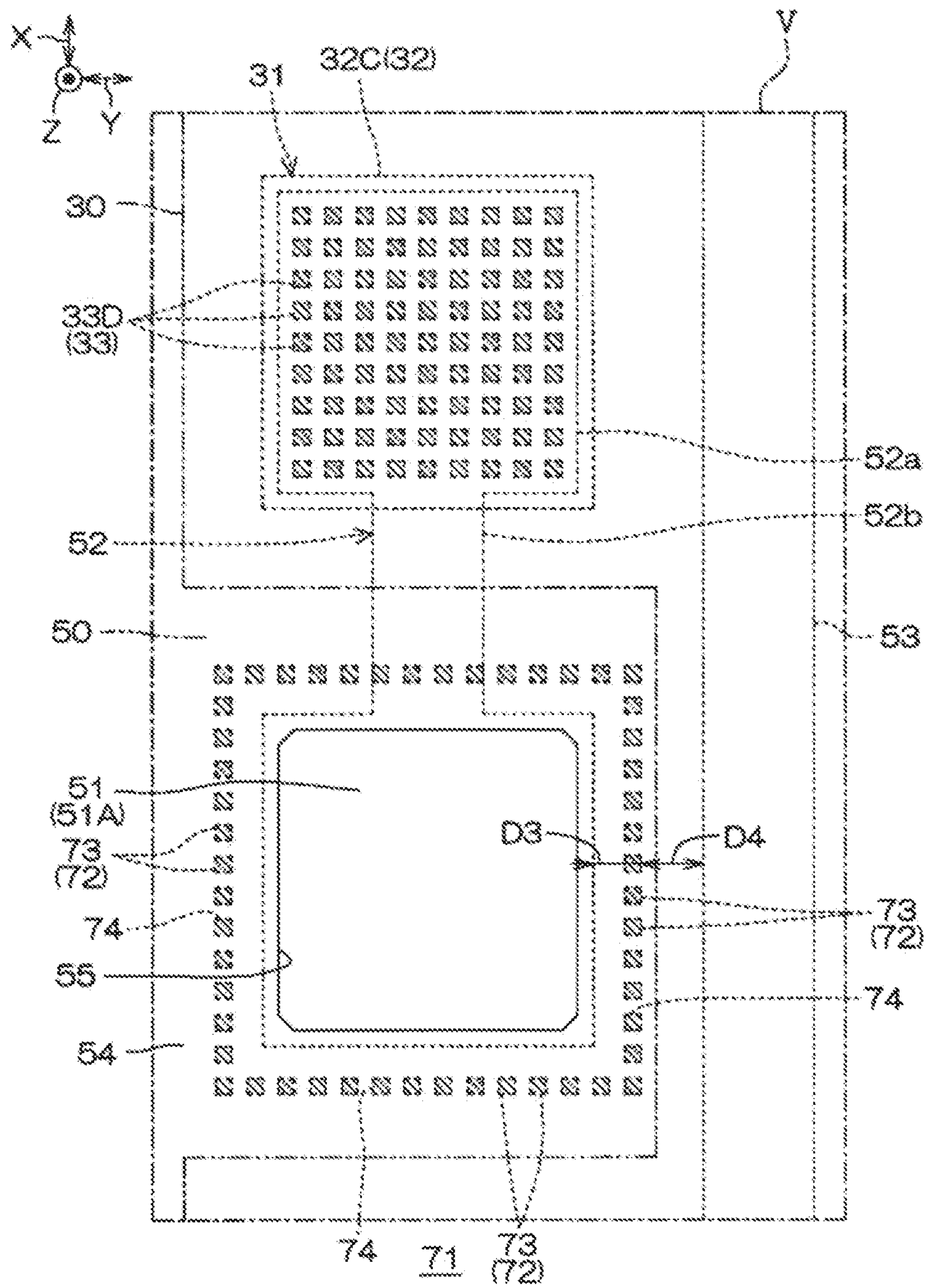
FIG. 14B is an enlarged view showing the semiconductor device shown in FIG. 12 together with an outer dummy wiring according to a third configuration example.
Figure 14C:
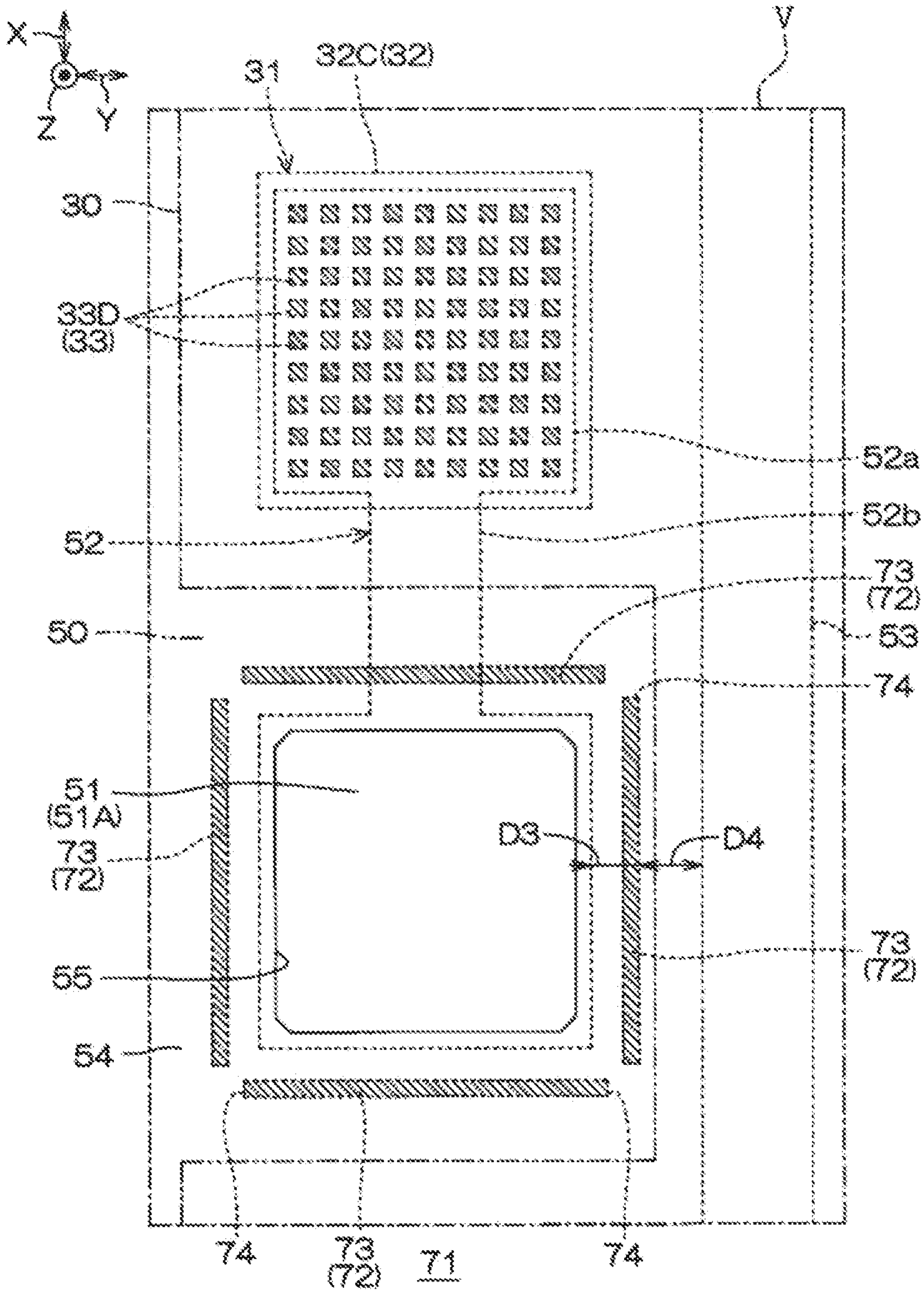
FIG. 14C is an enlarged view showing the semiconductor device shown in FIG. 12 together with an outer dummy wiring according to a fourth configuration example.

The outer dummy wiring 72 may take various forms shown in FIGS. 14A to 14C. FIG. 14A is an enlarged view showing the semiconductor device 71 shown in FIG. 12 together with an outer dummy wiring 72 according to a second configuration example. Referring to FIG. 14A, in the second configuration example, a plurality of outer dummy wirings (two outer dummy wirings in this embodiment) 72 are formed. The plurality of outer dummy wirings 72 include a first outer dummy wiring 72A and a second outer dummy wiring 72B.

Each of the first and second outer dummy wirings 72A and 72B is disposed in the insulating region 50 so as to be located in at least a region between the terminal electrode 51 and the multilayer wiring region 30 in the plan view. The first and second outer dummy wirings 72A and 72B are arranged in this order from the terminal electrode 51 toward the multilayer wiring region 30. The first and second outer dummy wirings 72A and 72B may be arranged in a region close to the terminal electrode 51 with respect to the multilayer wiring 31. That is, the second outer dummy wiring 72B may be disposed at a third distance D3 from the terminal electrode 51 on the side of the multilayer wiring 31 and may be disposed at a fourth distance D4, which exceeds the third distance D3 (D3<D4), from the multilayer wiring 31 on the side of the terminal electrode 51. The third distance D3 and the fourth distance D4 are based on the outer edge of the second outer dummy wiring 72B on the side of the multilayer wiring region 30.

In this embodiment, the first outer dummy wiring 72A is formed in a line shape extending along the terminal electrode 51 in the plan view. Specifically, the first outer dummy wiring 72A is formed in an annular shape (in this embodiment, a square annular shape) surrounding the terminal electrode 51 in the plan view. In this embodiment, the second outer dummy wiring 72B is formed in a line shape extending along the terminal electrode 51. Specifically, the second outer dummy wiring 72B is formed in an annular shape (in this embodiment, a square annular shape) surrounding the first outer dummy wiring 72A in the plan view.

In this embodiment, an example in which the first and second outer dummy wirings 72A and 72B are arranged over the same layer (the third interlayer insulating film 22C) has been described. However, the first and second outer dummy wirings 72A and 72B may be arranged in different layers. For example, the first outer dummy wiring 72A may be disposed over the third interlayer insulating film 22C, while the second outer dummy wiring 72B may be disposed over the second interlayer insulating film 22B.

Further, the first outer dummy wiring 72A may be disposed over the second interlayer insulating film 22B, while the second outer dummy wiring 72B may be disposed over the third interlayer insulating film 22C. Even in these cases, the first and second outer dummy wirings 72A and 72B may be arranged so as to be close to the terminal electrode 51 with respect to the semiconductor chip 2. FIG. 14B is an enlarged view showing the semiconductor device 71 shown in FIG. 12 together with an outer dummy wiring 72 according to a third configuration example. Referring to FIG. 14B, in this embodiment, the outer dummy wiring 72 according to the third configuration example includes a plurality of segment portions 73 arranged in a dot shape at intervals along the terminal electrodes 51 in a plan view.

It can be considered that the outer dummy wiring 72 according to the third configuration example has a form in which the outer dummy wiring 72 according to the first configuration example is divided into a plurality of segment portions 73 by a plurality of removal portions 74. The plurality of segment portions 73 are arranged side by side in a row along the terminal electrode 51. Each segment portion 73 is formed in a square shape in the plan view. Each segment portion 73 has an optional planar shape and may be formed in a circular shape or a polygonal shape.

FIG. 14C is an enlarged view showing the semiconductor device 71 shown in FIG. 12 together with an outer dummy wiring 72 according to a fourth configuration example. Referring to FIG. 14C, in this embodiment, the outer dummy wiring 72 according to the fourth configuration example includes a plurality of segment portions (four segment portions in this embodiment) 73 arranged in a line shape at intervals along the peripheral edge of the terminal electrode 51. It can be considered that the outer dummy wiring 72 according to the fourth configuration example has a form in which the outer dummy wiring 72 according to the first configuration example is divided into a plurality of segment portions 73 by a plurality of removal portions 74. In this embodiment, the plurality of removal portions 74 are formed at the corners (specifically, tour corners) of the outer dummy wiring 72, and each segment portion 73 is f med in a line shape extending along each side of the terminal electrode 51.

An outer dummy wiring 72 having a form in which the features of at least two of the outer dummy wirings 72 according to the first to fourth configuration examples are combined may be adopted. As described above, the semiconductor device 71 can also exhibit the same effects as those described for the semiconductor device 1. Further, the semiconductor device 71 includes the outer dummy wiring. 72 (dummy wiring). The outer dummy wiring 72 is disposed in the insulating region 50 so as to be located in at least a region between the terminal electrode 51 and the multilayer wiring region 30 in a plan view and is electrically independent from the multilayer wiring 31 (the plurality of wirings 32).

According to this structure, even in a case where cracks occur starting from the terminal electrode 51, the cracks can be terminated by the outer dummy wiring 72, As a result, it is possible to suppress the expansion of cracks to the outside of the insulating region 50 in the plan view. That is, the expansion of cracks from the insulating region 50 to the multilayer wiring region 30 can be suppressed by the outer dummy wiring 72. Therefore, even in the case where cracks occur starting from the terminal electrode 51, it is possible to prevent the electrical influence caused by the cracks from occurring between the multilayer wiring 31 (the different potential wiring 53) and the terminal electrode 51.

The outer dummy wiring 72 may be disposed in a region close to the terminal electrode 51 with respect to the multilayer wiring 31 in the plan view. According to this structure, the cracks can be appropriately terminated in the region close to the terminal electrode 51 with respect to the multilayer wiring 31. The outer dummy wiring 72 may be disposed in the insulating region 50 in a region close to the terminal electrode 51 with respect to the semiconductor chip 2. According to this structure, the cracks can be appropriately terminated in the region close to the terminal electrode 51 with respect to the semiconductor chip 2.

The outer dummy wiring 72 may be formed in a dot shape, a line shape, or an annular shape along the terminal electrode 51 in the plan view. In this case, the outer dummy wiring 72 may be formed in a line shape extending along the peripheral edge of the terminal electrode 51 in the plan view. The outer dummy wiring 72 may be formed in an annular shape surrounding the terminal electrode 51 in the plan view. According to this structure, the expansion of cracks can be suppressed over the entire circumference of the peripheral edge of the terminal electrode 51.

The outer dummy wiring 72 may be electrically independent from the terminal electrode 51. According to this structure, it is possible to suppress the electric influence caused by the outer dummy wiring 72 from occurring in the terminal electrode 51 and the multilayer wiring 31. The outer dummy wiring 72 may be formed in an electrical floating state, According to this structure, the electrical influence caused by the outer dummy wiring 72 can be appropriately suppressed.

Figure 15:
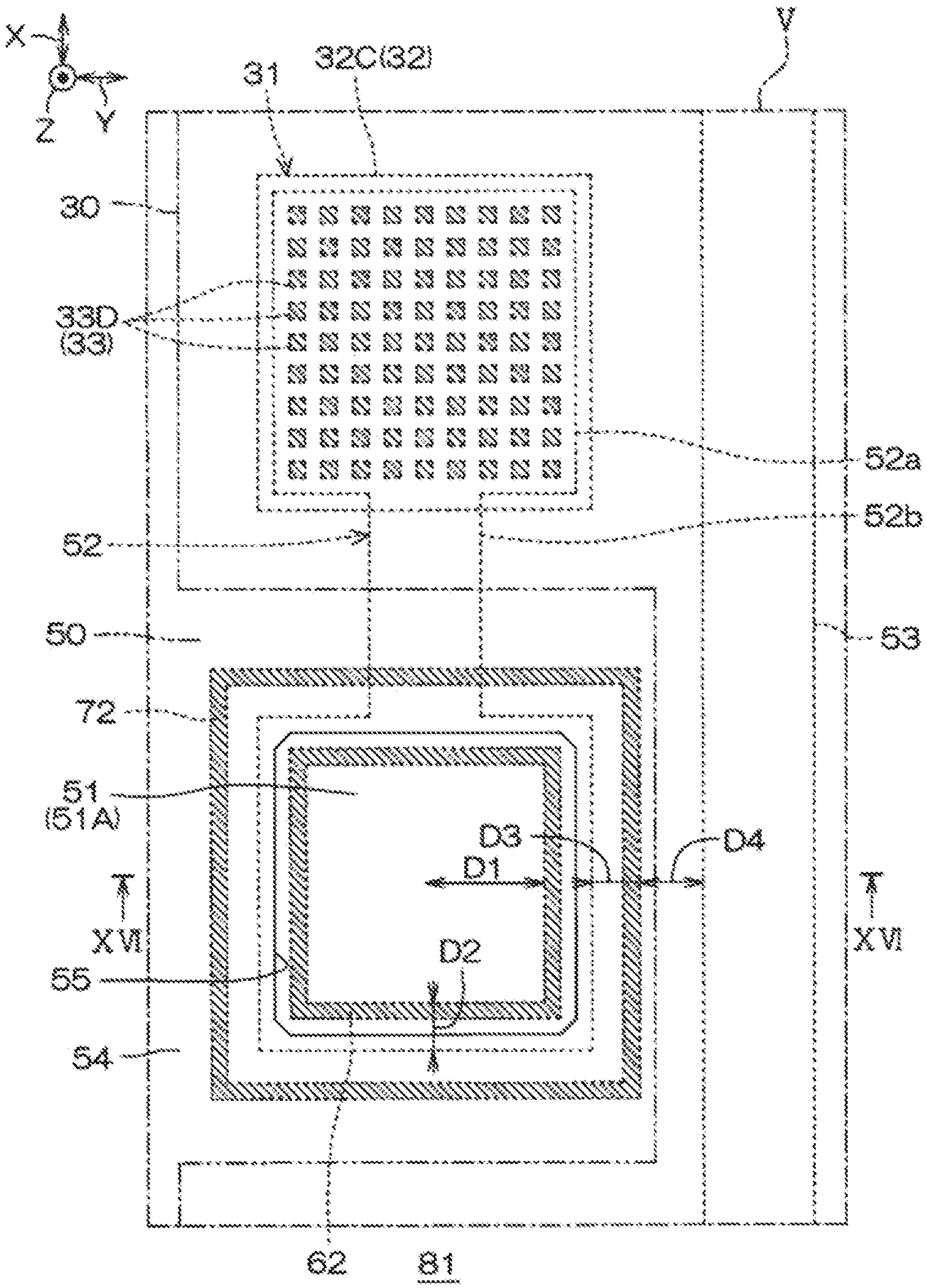
FIG. 15 corresponds to FIG. 5 and is an enlarged view showing a semiconductor device according to a fourth embodiment of the present disclosure together with an inner dummy wiring according to a first configuration example and an outer dummy wiring according to the first configuration example.
Figure 16:
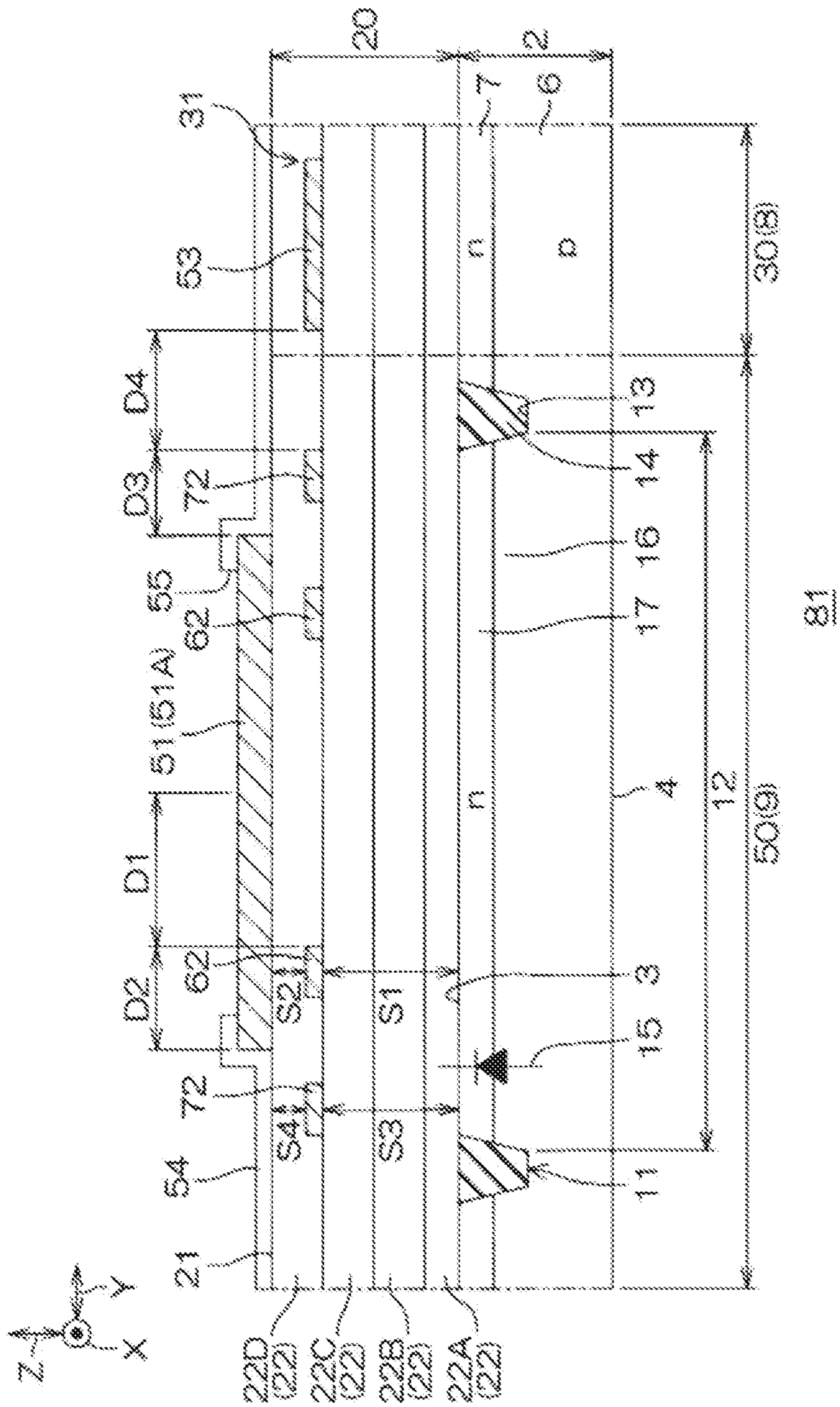
FIG. 16 is a cross-sectional view taken along a line XVI-XVI shown in FIG. 15, FIG. 17 corresponds to FIG. 10 and is a cross-sectional view showing a semiconductor device according to a fifth embodiment of the present disclosure together with an inner dummy wiring according to a first configuration example.

FIG. 15 corresponds to FIG. 5, and is an enlarged view showing a semiconductor device 81 according to a fourth embodiment of the present disclosure together with an inner dummy wiring 62 according to a first configuration example and an outer dummy wiring 72 according to the first configuration example. FIG. 16 is a cross-sectional view taken along a line XVI-XVI shown in FIG. 15. Hereinafter, strictures corresponding to the structures described for the semiconductor device 1 and the like are denoted by the same reference numerals, and explanation thereof will not be repeated. Referring to FIGS. 15 and 16, the semiconductor device 81 includes the inner dummy wiring 62 (see FIG. 9) according to the second embodiment and the outer dummy wiring 72 (see FIG. 12) according to the third embodiment. In this embodiment, the semiconductor device 81 includes the inner dummy wiring 62 according to the first configuration example and the outer dummy wiring 72 according to the first configuration example. The outer dummy wiring 72 is disposed over the same layer (the third interlayer insulating film 22C) as the inner dummy wiring 62, The outer dummy wiring 72 is disposed in the insulating region 50 so as to face the inner dummy wiring 62 with the peripheral edge of the terminal electrode 51 interposed therebetween in a plan view.

The semiconductor device 81 may include one of the inner dummy wirings 62 (see FIGS. 11A to 11C) according to the second to fourth configuration examples, instead of the inner dummy wirings 62 according to the first configuration example. Further, the semiconductor device 81 may include an inner dummy wiring 62 having a form in which the features of at least two of the inner dummy wirings 62 according to the first to fourth configuration examples are combined, instead of the inner dummy wiring 62 according to the first configuration example.

Further, the semiconductor device 81 may include one of the outer dummy wirings 72 (see FIGS. 14A to 14C) according to the second to fourth configuration examples, instead of the outer dummy wirings 72 according to the first configuration example. Further, the semiconductor device 81 may include an outer dummy wiring 72 having a form in which the features of at least two of the outer dummy wirings 72 according to the first to fourth configuration examples are combined, instead of the outer dummy wiring 72 according to the first configuration example.

In this embodiment, an example in which the outer dummy wiring 72 is disposed over the same layer (the third interlayer insulating film 22C) as the inner dummy wiring 62 has been described. However, the outer dummy wiring 72 may be disposed in a layer different from that of the inner dummy wiring 62. For example, the inner dummy wiring 62 may be disposed over the third interlayer insulating film 22C, while the outer dummy wiring 72 may be disposed over the second interlayer insulating film 22B.

Further, the inner dummy wiring 62 may be disposed over the second interlayer insulating film 22B, while the outer dummy wiring 72 may be disposed over the third interlayer insulating film 22C. Even in these cases, the inner dummy wiring 62 and the outer dummy wiring 72 may be arranged so as to be close to the terminal electrode 51 with respect to the semiconductor chip 2. As described above, according to the semiconductor device 81, the same effects as those described for the semiconductor device 61 according to the second embodiment and those described for the semiconductor device 71 according to the third embodiment can be obtained.

Figure 17:
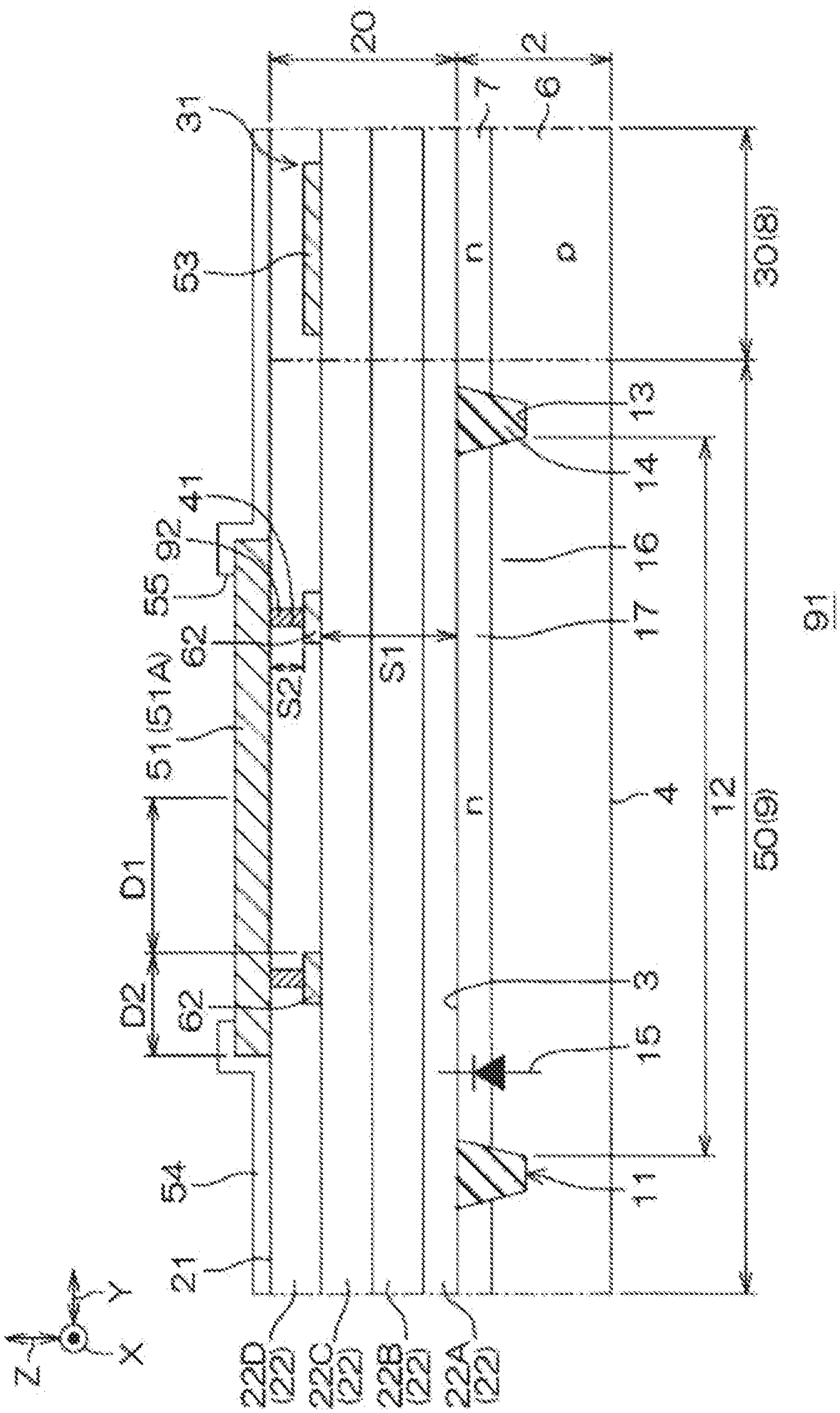

FIG. 17 corresponds to FIG. 10 and is a cross-sectional view showing a semiconductor device 91 according to a fifth embodiment of the present disclosure together with an inner dummy wiring 62 according to a first configuration example. Hereinafter, structures corresponding to the structures described for the semiconductor device 71 and the like according to the second embodiment are denoted by the same reference numerals, and explanation thereof will not be repeated. The semiconductor device 91 includes an inner dummy via electrode 92 disposed in the insulating region 50 in addition to the inner dummy wiring 62 according to the first configuration example. The inner dummy via electrode 92 is buried in the via opening 41 formed in the insulating region 50. The inner dummy via electrode 92 is interposed between the peripheral edge of the terminal electrode 51 and the inner dummy wiring 62 in the insulating region 50 and electrically connects the terminal electrode 51 and the inner dummy wiring 62. That is, in this embodiment, the inner dummy wiring 62 is fixed at the same potential as the terminal electrode 51.

In this embodiment, the inner dummy via electrode 92 is formed in a line shape extending along the inner dummy wiring 62 in a plan view. The inner dummy via electrode 92 may be formed in an annular shape (in this embodiment, a square annular shape) surrounding the inner portion of the terminal electrode 51 in the plan view. Although not shown in detail, the inner dummy via electrode 92 may have a plurality of segment portions separated and arranged in a dot shape at intervals along the inner dummy wiring 62. Further, the inner dummy via electrode 92 may have a plurality of segment portions separated and arranged in a line shape at intervals along the inner dummy wiring 62.

Like the wiring via electrode 33, the inner dummy via electrode 92 includes a via barrier film 42 and a via main electrode 43 laminated in this order from the side of the inner wall of the via opening 41. In this embodiment, the inner dummy via electrode 92 is formed of a tungsten plug electrode, like the wiring via electrode 33. In this embodiment, an example in which the semiconductor device 91 includes the inner dummy wiring 62 according to the first configuration example has been described. However, the semiconductor device 91 may include one of the inner dummy wirings 62 (see FIGS. 11A to 11C) according to the second to fourth configuration examples, instead of the inner dummy wirings 62 according to the first configuration example. In this case, the inner dummy via electrode 92 may be formed in a line shape, an annular shape, or a dot shape along the inner dummy wiring 62.

Further, the semiconductor device 91 may include an inner dummy wiring 62 having a form in which the features of at least two of the inner dummy wirings 62 according to the first to fourth configuration examples are combined, instead of the inner dummy wiring 62 according to the first configuration example. In this case, the inner dummy via electrode 92 may be formed in a line shape, an annular shape, or a dot shape along the inner dummy wiring 62.

As described above, the semiconductor device 91 can also exhibit the same effects as those described for the semiconductor device 71 according to the second embodiment. Further, the semiconductor device 91 includes the inner dummy via electrode 92 disposed in the insulating region 50 in addition to the inner dummy wiring 62. The inner dummy via electrode 92 is interposed between the peripheral edge of the terminal electrode 51 and the inner dummy wiring 62 in the insulating region 50 and electrically connects the terminal electrode 51 and the inner dummy wiring 62. According to this structure, even in the case where cracks occur starting from the terminal electrode 51, the cracks can be terminated by the inner dummy wiring 62. The inner dummy via electrode 92 can also be applied to the semiconductor device 81 according to the fourth embodiment.

Figure 18:
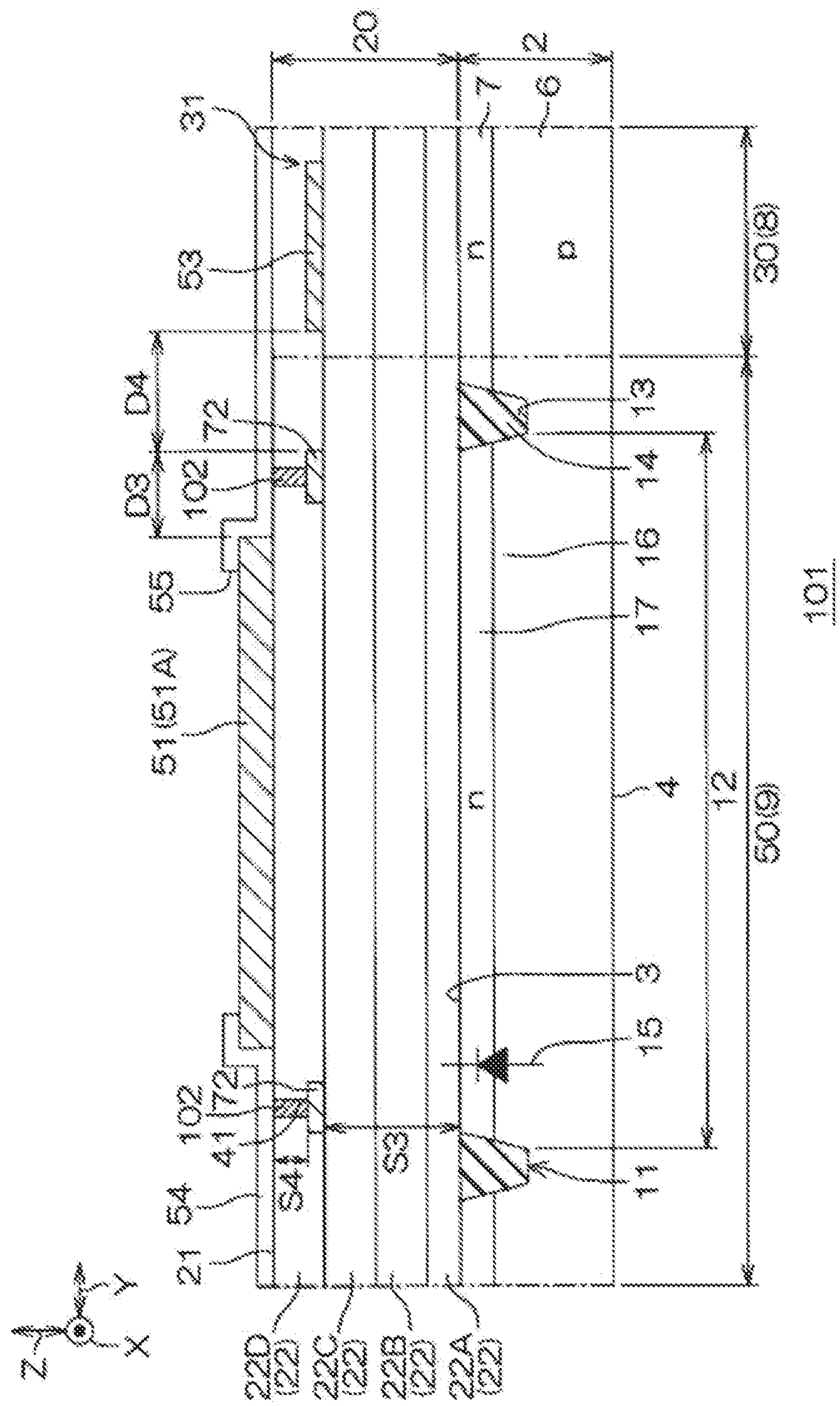
FIG. 18 corresponds to FIG. 13 and is a cross-sectional view showing a semiconductor device according to a sixth embodiment of the present disclosure together with an outer dummy wiring according to a first configuration example.

FIG. 18 corresponds to FIG. 13 and is a cross-sectional view showing a semiconductor device 101 according to a sixth embodiment of the present disclosure together with an outer dummy wiring 72 according to a first configuration example. Hereinafter, structures corresponding to the structures described for the semiconductor device 81 and the like according to the third embodiment are denoted by the same reference numerals, and explanation thereof will not be repeated. The semiconductor device 101 includes an outer via electrode 102 disposed in the insulating region 50 in addition to the outer dummy wiring 72 according to the first configuration example. The outer via electrode 102 may be referred to as an outer dummy via electrode or an outer seal via electrode. In this embodiment, the outer via electrode 102 is buried in the via opening 41 formed in the insulating region 50.

The outer via electrode 102 is buried at a thickness position between the terminal electrode 51 and the outer dummy wiring 72 so as to be connected to the outer dummy wiring 72 in the insulating region 50. The outer via electrode 102 is not connected to the terminal electrode 51, The outer via electrode 102 may be formed in an electrical floating state. That is, the outer via electrode 102 may fix the outer dummy wiring 72 in an electrical floating state.

In this embodiment, the outer via electrode 102 is formed in a line shape extending along the outer dummy wiring 72 in a plan view. The outer dummy wiring 72 may be formed in at least a portion along the multilayer wiring region 30 (the different potential wiring 53) in the plan view. The outer via electrode 102 may be formed at an interval from the lead-out electrode 52 in the plan view.

The outer via electrode 102 may be formed in an annular shape (in this embodiment, a square annular shape) surrounding the terminal electrode 51 in the plan view. In this case, the outer via electrode 102 may be electrically connected to the lead-out electrode 52. That is, the outer dummy wiring 72 and the outer via electrode 102 may be fixed at the same potential as the terminal electrode 51, Although not shown in detail, the outer via electrode 102 may have a plurality of segment portions separated and arranged in a dot shape at intervals along the outer dummy wiring 72. Further, the outer via electrode 102 may have a plurality of segment portions separated and arranged in a line shape at intervals along the outer dummy wiring 72.

Like the wiring via electrode 33, the outer via electrode 102 includes a via barrier film 42 and a via main electrode 43 laminated in this order from the inner wall side of the via, opening 41. In this embodiment, the outer via electrode 102 is formed of a tungsten plug electrode, like the wiring via electrode 33. In this embodiment, the top insulating film 54 covers the entire region of the outer via electrode 102 on the insulating layer 20.

In this embodiment, an example in which the semiconductor device 101 includes the outer dummy wiring 72 according to the first configuration example has been described. However, the semiconductor device 101 may include one of the outer dummy wirings 72 (see FIGS. 14A to 14C) according to the second to fourth configuration examples, instead of the outer dummy wirings 72 according to the first configuration example. In this case, the outer via electrode 102 may be formed in a line shape, an annular shape, or a dot shape along the outer dummy wiring 72.

Further, the semiconductor device 101 may include an outer dummy wiring 72 having a form in which the features of at least two of the outer dummy wirings 72 according to the first to fourth configuration examples are combined, instead of the outer dummy wiring 72 according to the first configuration example. In this case, the outer via electrode 102 may be formed in a line shape, an annular shape, or a dot shape along the outer dummy wiring 72.

As described above, the semiconductor device 101 can also exhibit the same effects as those described for the semiconductor device 71 according to the second embodiment. Further, the semiconductor device 101 includes the outer via electrode 102 disposed in the insulating region 50 in addition to the outer dummy wiring 72. The outer via electrode 102 is buried at a thickness position between the terminal electrode 51 and the outer dummy wiring 72 so as to be connected to the outer dummy wiring 72 in the insulating region 50. According to this structure, even in the case where cracks occur starting from the terminal electrode 51, the cracks can be terminated by the outer dummy wiring 72. The outer via electrode 102 can also be applied to the semiconductor device 81 according to the fourth embodiment.

Figure 19:
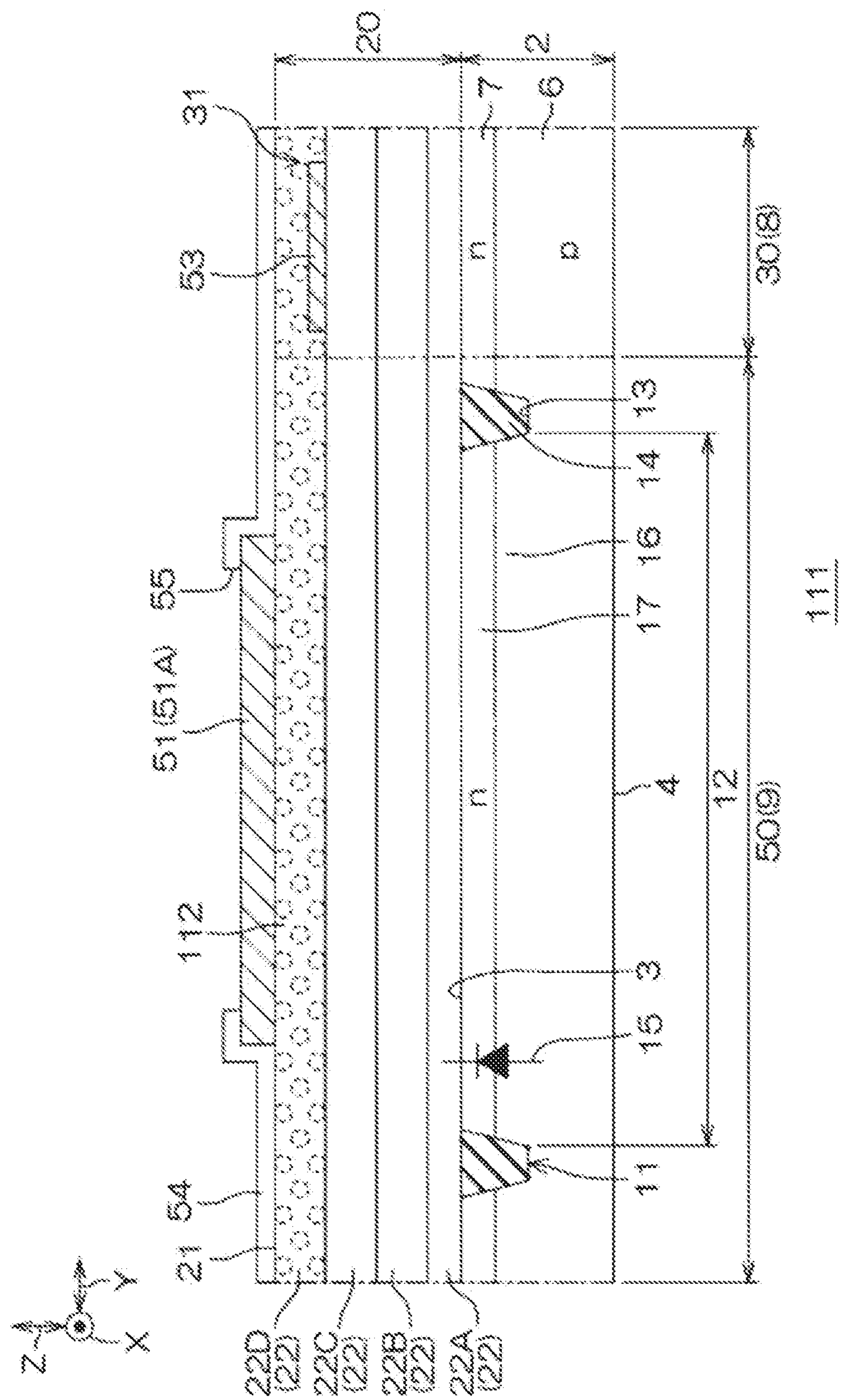
FIG. 19 corresponds to FIG. 7 and is a cross-sectional view showing a semiconductor device according to a seventh embodiment of the present disclosure together with a porous region according to a first configuration example.

FIG. 19 corresponds to FIG. 7 and is a cross-sectional view showing a semiconductor device 111 according to a seventh embodiment of the present disclosure together with a porous region 112 according to a first configuration example. Hereinafter, structures corresponding to the structures described for the semiconductor device 1 and the like are denoted by the same reference numerals, and explanation thereof will not be repeated. The semiconductor device 111 includes the porous region 112 formed in the surface layer portion of the insulating layer 20. The porous region 112 is formed of a region in which a plurality of pores are introduced in the insulating layer 20 and, in this embodiment, is formed by using the top interlayer insulating film 22 (the fourth interlayer insulating film 22D). That is, the porous region 112 is formed in the surface layer portion of the multilayer wiring region 30 and the surface layer portion of the insulating region 50.

The plurality of pores are formed in the surface layer portion of the insulating layer 20 at intervals in the thickness direction and the surface direction of the insulating layer 20. That is, the plurality of pores are formed in the top interlayer insulating film 22 (the fourth interlayer insulating film 22D) at intervals in the thickness direction and the width direction of the top interlayer insulating film 22. The plurality of pores have uneven sizes in a range of 1 nm or more and 500 nm or less. The porous region 112 may have a plurality of pores that fall within a range of 1 nm or more and 100 nm or less. Specifically, the porous region 112 may have a plurality of pores that fall within a range of 1 nm or more and 10 nm or less.

The interlayer insulating film 22 including the porous region 112 is formed of a so-called SOG (Spin on Glass) film and is formed by a spin coating method. Specifically, the interlayer insulating film 22 including the porous region 112 is formed through a step of coating an SOG solution, a step of adding sublimable particles, and a step of overheating the SOG solution. In the SOG solution-coating step, the SOG solution is coated on an object (in this embodiment, the third interlayer insulating film 22C) by the spin coating method to form an SOG solution film formed of the SOG solution on the object. The SOG solution includes an organic SOG solution containing an organic component in a silicon compound. The SOG solution may include an organic SOG solution containing silsesquioxane having a cage structure.

In the sublimable particle-adding step, the sublimable particles are added to the SOG solution at a temperature lower than a sublimation temperature of the sublimable particles. The sublimable particle-adding step may be carried out in parallel with the SOG solution-coating step. As a result, the SOG solution film containing the sublimable particles is formed over the object. The sublimable particles may include at least one of carbon dioxide particles, iodine particles, naphthalene particles, and metal nanocomplexes.

In the SOG solution-overheating step, the SOG solution film is heated at a temperature exceeding the sublimation temperature of the sublimable particles. As a result, the SOG solution film is cured to form an SOG film. Further, the sublimable particles are separated from the SOG solution film by sublimation to form a plurality of pores in the SOG film. Through steps including the aforementioned steps, the interlayer insulating film 22 having the porous region 112 is formed. The terminal electrode 51 is disposed over a portion of the insulating region 50 where the porous region 112 is formed. In this embodiment, the terminal electrode 51 faces a portion of the insulating region 50 that does not have the porous region 112 with the porous region 112 interposed therebetween. That is, the terminal electrode 51 faces the semiconductor chip 2 with the porous region 112 and the portion having no porous region 112 interposed therebetween. The terminal electrode 51 may have a thickness less than the thickness of the porous region 112.

A step of forming the terminal electrode 51 is carried out after a step of forming the insulating layer 20. The terminal electrode 51 is formed through a step of forming a base electrode film which is a base of the terminal electrode 51 and a step of patterning the base electrode film. In the base electrode film-forming step, the base electrode film is formed over the insulating layer 20 so as to cover the entire region of the insulating main surface 21. In this embodiment, the base electrode film includes a first barrier film 34 (Ti-based metal film), a main wiring film 35 (Al-based metal film), and a second barrier film 36 (Ti-based metal film). The first barrier film 34, the main wiring film 35, and the second barrier film 36 may be respectively formed by a sputtering method and/or a vapor deposition method.

In the base electrode film-patterning step, a resist mask having a predetermined pattern is formed over a base electrode. The resist mask covers a region of the base electrode film in which the terminal electrode 51 is to be formed, and exposes the other regions. Next, unnecessary portions of the base electrode film are removed by an etching method in which the resist mask is used. The resist mask is then removed. Through the aforementioned steps, the terminal electrode 51 is formed over the porous region 112.

Figure 20:
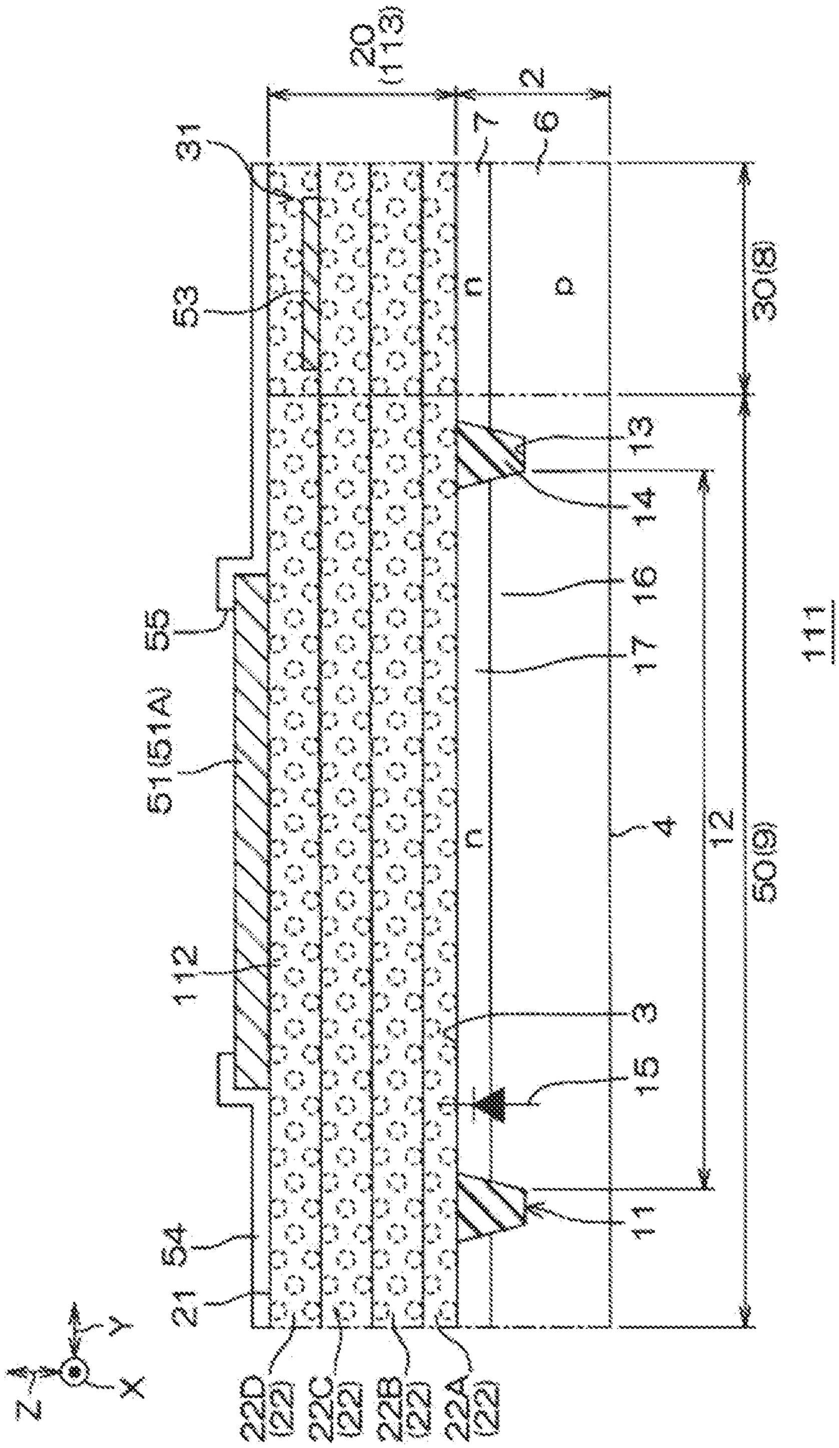
FIG. 20 is a cross-sectional view showing the semiconductor device shown in FIG. 19 together with a porous region according to a second configuration example.

The porous region 112 may take a form shown in FIG. 20. FIG. 20 is a cross-sectional view showing the semiconductor device 111 shown in FIG. 19 together with a porous region 112 according to a second configuration example. The porous region 112 according to the second configuration example is formed in the entire region of the insulating layer 20 in the thickness direction. That is, the insulating layer 20 is formed of a porous insulating layer 113. The multilayer wiring region 30 is formed in the porous insulating layer 113, and the insulating region 50 is formed in the porous insulating layer 113. The terminal electrode 51 faces the semiconductor chip 2 with the insulating region 50 including a portion of the porous insulating layer 113 interposed therebetween.

As described above, the semiconductor device 111 can also exhibit the same effects as those described for the semiconductor device 1. Further, the semiconductor device 111 includes at least the porous region 112 formed in the surface layer portion of the insulating layer 20. The porous region 112 is formed of the region in which the plurality of pores are introduced in the insulating layer 20. According to this structure, an elastic modulus of the insulating layer 20 can be reduced by the porous region 112.

As a result, the stress to the terminal electrode 51 at the time of connecting the conducting wires 312 can be relaxed by the porous region 112. Further, even in the case where cracks occur starting from the terminal electrode 51, an impact caused by the cracks can be released (relaxed) by the plurality of pores to terminate the cracks. As a result, the expansion of cracks can be suppressed. The porous region 112 according to the seventh embodiment can be applied not only to the first embodiment but also to the second to sixth embodiments.

Figure 21:
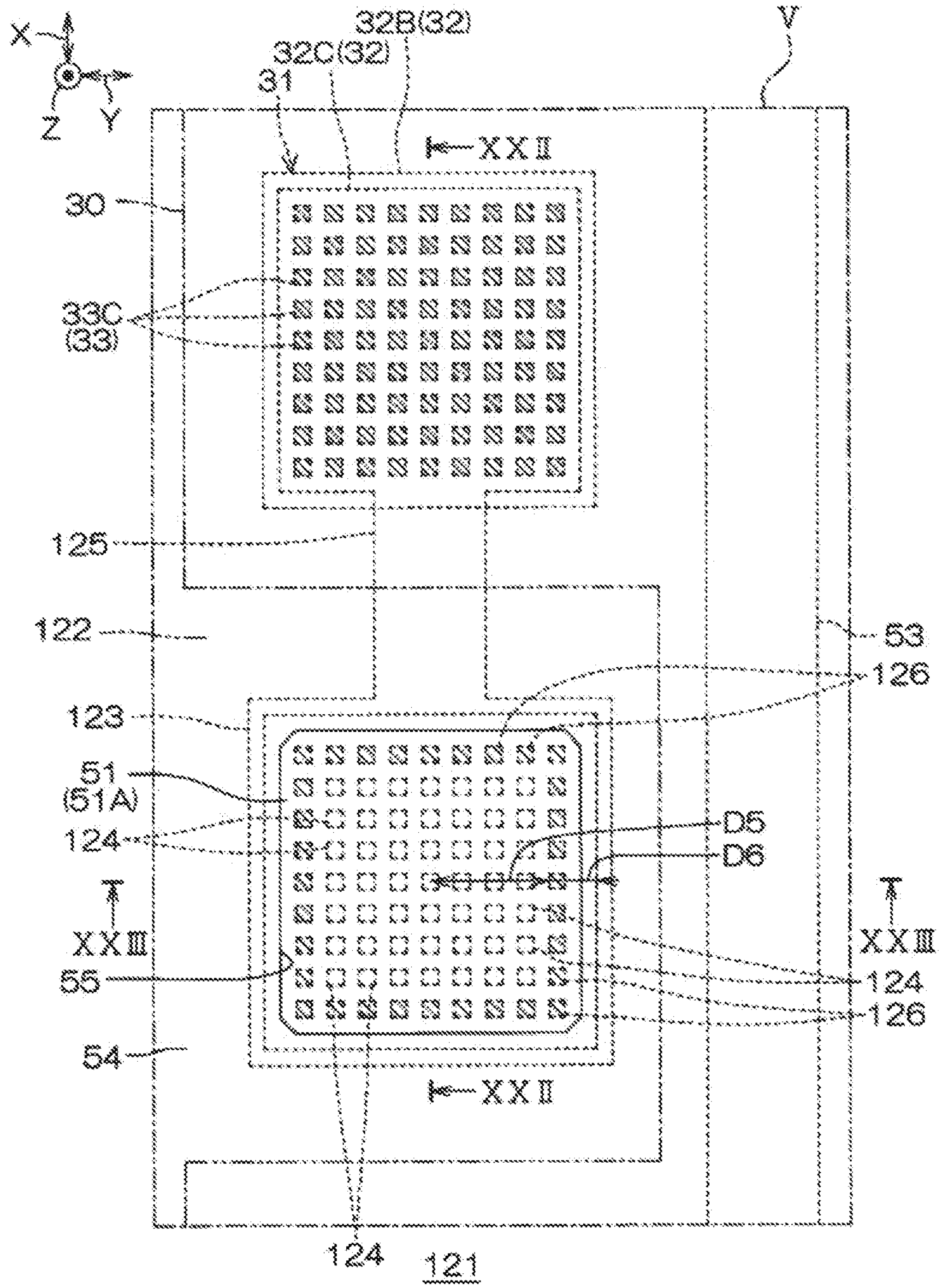
FIG. 21 corresponds to FIG. 5 and is an enlarged view showing a semiconductor device according to an eighth embodiment of the present disclosure together with a through-hole according to a first configuration example.
Figure 22:
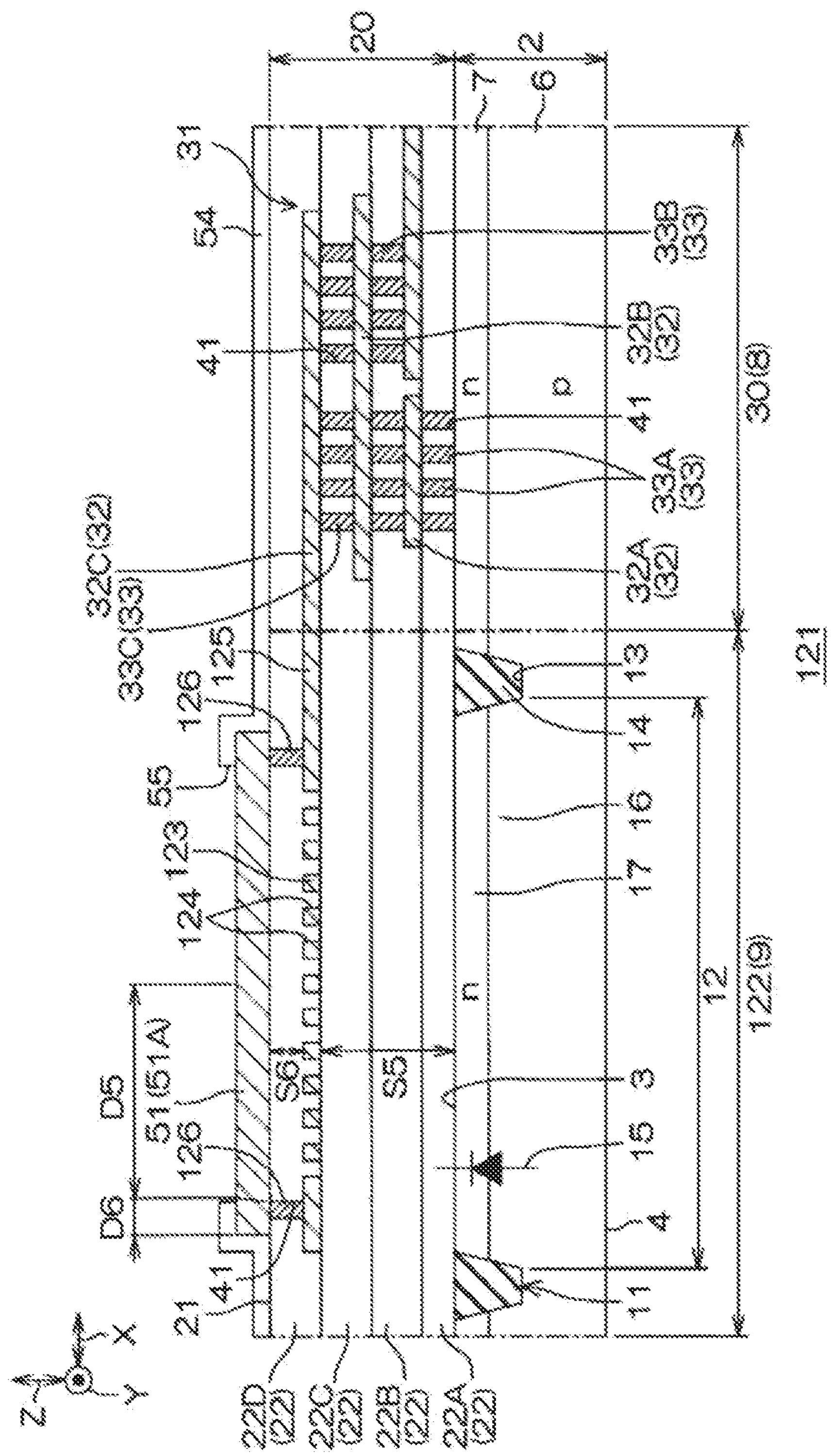
FIG. 22 is a cross-sectional view taken along a line XXII-XXII shown in FIG. 21.
Figure 23:
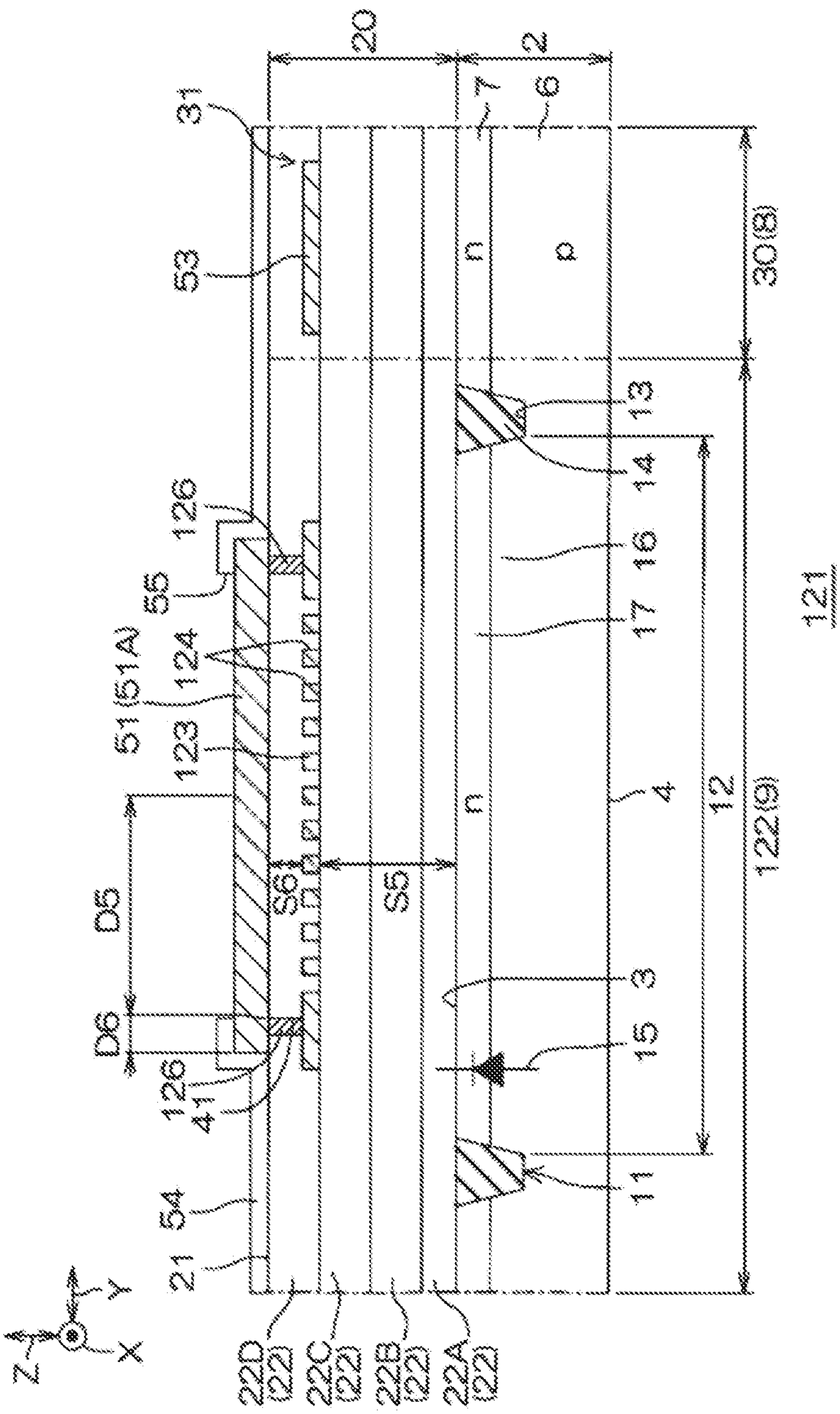
FIG. 23 is a cross-sectional view taken along a line shown in FIG. 21.

FIG. 21 corresponds to FIG. 5 and is an enlarged view showing a semiconductor device 121 according to an eighth embodiment of the present disclosure together with a through-hole 124 according to a first configuration example. FIG. 22 is a cross-sectional view taken along line XXII-XXII shown in FIG. 21. FIG. 23 is a cross-sectional view taken along line XXIII-XXIII shown in FIG. 21, Hereinafter, structures corresponding to the structures described for the semiconductor device 1 and the like are denoted by the same reference numerals, and explanation thereof will not be repeated.

In this embodiment, the semiconductor device 121 includes a connection region 122 instead of the insulating region 50. In this embodiment, a plurality of connection regions 122 are formed in the insulating layer 20. Each of the connection regions 122 is formed of a portion of the multilayer wiring region 30 and is a region for externally connecting a portion of the multilayer wiring 31. The plurality of connection regions 122 have a laminated structure in which a plurality of interlayer insulating films 22 (the first to fourth interlayer insulating films 22A to 22D) are laminated.

Each of the plurality of connection regions 122 is formed in a region (the outer region 9) of the insulating layer 20 outside the device region 8. In this embodiment, the plurality of connection regions 122 are formed at intervals from the plurality of device regions 8 in a plan view. Specifically, each of the plurality of connection regions 122 is formed in a portion of the insulating layer 20 that covers a plurality of isolation regions 12 (the outer diodes 15), and fixes the plurality of outer diodes 15 in an electrically floating state.

Each of the plurality of connection regions 122 includes a connection wiring 123. Each connection region 122 may include one connection wiring 123 or may include a plurality of connection wirings 123. The connection wiring 123 may be disposed in the connection region 122 in a region close to the insulating main surface 21 with respect to the semiconductor chip 2. That is, the connection wiring 123 may be disposed with a fifth space S5 from the semiconductor chip 2 in the thickness direction of the insulating layer 20 and is disposed with a sixth space S6, which is less than the fifth space S5 (S6<S5), from the insulating main surface 21 in the thickness direction of the insulating layer 20. In this embodiment, the connection wiring 123 is disposed over the third interlayer insulating film 22C as one of the top wirings and is covered with the top fourth interlayer insulating film 22D.

The connection wiring 123 faces a region (the outer region 9) outside the plurality of device regions 8 in the plan view. In this embodiment, the connection wiring 123 faces a region (the isolation region 12) surrounded by the plurality of isolation structures 11 in the plan view. That is, the connection wiring 123 faces the outer diode 15 in the plan view. The connection wiring 123 may face the isolation region 12 spaced inward from the isolation structure 11 in the plan view.

The connection wiring 123 may face the semiconductor chip 2 (the outer diode 15) with only a portion of the insulating layer 20 interposed therebetween. That is, a portion of the multilayer wiring 31 may not be formed in a region directly below the connection wiring 123 in the connection region 122. In the region directly below the connection wiring 123, a current path connecting the connection wiring 123 and the semiconductor chip 2 in the thickness direction of the insulating layer 20 is shielded by a portion of the insulating layer 20 and the outer diode 15. Of course, the portion of the multilayer wiring 31 may be formed in the region directly below the connection wiring 123 in the connection region 122. In this case, the bottom wiring 32 (the first wiring 32A) of the multilayer wiring 31 may not be formed directly above the outer diode 15.

In this embodiment, the connection wiring 123 is formed in a square shape in the plan view. The connection wiring 123 has an optional planar shape and may be formed in a circular shape or a polygonal shape. Like the plurality of wirings 32, the connection wiring 123 includes a first barrier film 34, a main wiring film 35, and a second barrier film 36 laminated in this order from the side of the semiconductor chip 2. The semiconductor device 121 includes a plurality of through-holes 124 formed in the connection wiring 123. In FIG. 21, the plurality of through-holes 124 are indicated by broken lines. Each of the plurality of through-holes 124 is formed of a removed portion of the connection wiring 123 and is filled therein with a portion of the insulating layer 20, A portion (the fourth interlayer insulating film 22D) of the insulating layer 20 located in the plurality of through-holes 124 is in contact with a portion (the third interlayer insulating film 22C) of the insulating layer 20 located directly below the connection wiring 123.

The plurality of through-holes 124 are arranged at intervals from the inner portion of the connection wiring 123 toward the entire circumference of the peripheral edge thereof in a plan view. Specifically, the plurality of through-holes 124 are arranged at intervals along the electrode surface of the connection region 122 in the first direction X and the second direction Y. In this embodiment, the plurality of through-holes 124 are arranged in the form of a matrix so that a plurality of crossroad portions are partitioned on the connection wiring 123. The plurality of through-holes 124 may be arranged at equal intervals in the first direction X and the second direction Y.

In this embodiment, each of the plurality of through-holes 124 is formed in a square shape in the plan view. Each through-hole 124 has an optional planar shape and may be formed in a circular shape or a polygonal shape. Each through-hole 124 may have an opening width of 0.1 μm or more and 5 μm or less in the plan view. The opening width of each through-hole 124 is defined by the narrowest opening width of the opening widths of the through-holes 124. The plurality of through-holes 124 may be formed at intervals of 0.1 μm or more and 5 μm or less.

The plurality of through-holes 124 may be arranged so that an occupancy ratio of the plurality of through-holes 124 to the connection wiring 123 is 20% or more and 80% or less. The occupancy ratio may be 50% or more and 80% or less. The occupancy ratio is a ratio of a total area of the plurality of through-holes 124 occupying the plane area of the connection wiring 123 to the plane area of the connection wiring 123 in the plan view. The plane area of the connection wiring 123 is the plane area of a region surrounded by the peripheral edge of the connection wiring 123. The total area of the plurality of through-holes 124 is the total value of the opening areas of the through-holes 124.

The semiconductor device 121 includes a plurality of lead-out wiring 125 led out from the plurality of connection wirings 123 to the multilayer wiring region 30 so as to be electrically connected to a portion of the multilayer wiring 31 (at least one of the plurality of wirings 32). In this embodiment, the plurality of lead-out wirings 125 are led out from the plurality of connection wirings 123 onto the third interlayer insulating film 22C, as one of the top wirings, and are covered with the top fourth interlayer insulating film 22D.

In this embodiment, the plurality of lead-out wirings 125 are electrically connected to the third wiring 32C of the corresponding multilayer wiring 31. As a result, the plurality of lead-out wirings 125 electrically connect the corresponding multilayer wirings 31 with the corresponding connection wirings 123, respectively. The plurality of lead-out wirings 125 do not have through-holes 124. Each of the plurality of lead-out wirings 125 may be formed in a line shape having a width less than the width of the plurality of connection wirings 123. The width, shape, and routing form of the plurality of lead-out wirings 125 are optional and are not limited to a specific width, shape, and routing form. Like the plurality of connection wirings 123, each of the plurality of lead-out wirings 125 includes a first barrier film 34, a main wiring film 35, and a second barrier film 36 laminated in this order from the side of the semiconductor chip 2.

Similar to the case of the first embodiment, the semiconductor device 121 includes a plurality of terminal electrodes 51 (the first to eighth terminal electrodes 51A to 51H) arranged over the insulating main surface 21 of the insulating layer 20. In this embodiment, the plurality of terminal electrodes 51 are arranged on the peripheral edge of the insulating main surface 21 in the plan view. Specifically, the plurality of terminal electrodes 51 are arranged on the corresponding connection regions 122, respectively, apart from the multilayer wiring region 30 in the plan view.

The plurality of terminal electrodes 51 are arranged on the plurality of connection regions 122, respectively, so as to face the corresponding connection wirings 123 in a one-to-one correspondence. Each of the plurality of terminal electrodes 51 is disposed a sixth space S6, which is less than a fifth space S5 (S6<S5), from the corresponding connection wiring 123 in the thickness direction of the insulating layer 20. Each terminal electrode 51 may face all of the plurality of through-holes 124 formed in the connection wiring 123 in the plan view. Each terminal electrode 51 may be disposed in a region surrounded by the peripheral edge of the connection wiring 123 at an interval inward from the peripheral edge of the connection wiring 123. That is, the entire region of each terminal electrode 51 may face the connection wiring 123 in the thickness direction of the insulating layer 20. Each terminal electrode 51 may be disposed so as to cover the entire region of the connection wiring 123 in the plan view. That is, the peripheral edge of each terminal electrode 51 may surround the peripheral edge of each connection wiring 123 in the plan view.

Each of the plurality of terminal electrodes 51 faces a region (the outer region 9) outside the plurality of device regions 8 with the corresponding connection wiring 123 interposed therebetween. That is, each of the plurality of terminal electrodes 51 is disposed over the insulating layer 20, apart from the plurality of wirings 32 in the plan view, and faces the semiconductor chip 2 with the insulating layer 20 and the connection wiring 123 interposed therebetween. Further, each of the plurality of terminal electrodes 51 faces a region (the isolation region 12) surrounded by the plurality of isolation structures 11 in the plan view.

That is, the plurality of terminal electrodes 51 face the plurality of outer diodes 15, respectively, with the insulating layer 20 and the connection wiring 123 interposed therebetween. Each of the plurality of terminal electrodes 51 may face the isolation region 12 spaced inward from the isolation structure 11 in the plan view. In a region directly below the plurality of terminal electrodes 51, a current path connecting the plurality of terminal electrodes 51 and the semiconductor chip 2 in the thickness direction of the insulating layer 20 is shielded by a portion of the insulating layer 20 and the outer diode 15.

The semiconductor device 121 includes an inner via electrode 126 (via electrode) interposed between a connection wiring 123 and a terminal electrode 51 in pair in the insulating layer 20. In this embodiment, a plurality of inner via electrodes 126 are arranged between the connection wiring 123 and the terminal electrode 51 so as to electrically connect the connection wiring 123 and the terminal electrode 51. In FIG. 21, the inner via electrodes 126 are shown by hatching. The plurality of inner via electrodes 126 are buried in the plurality of via openings 41 formed in the insulating layer 20, respectively.

In this embodiment, the plurality of inner via electrodes 126 connect the connection wiring 123 and the terminal electrode 51 in pair in a one-to-one correspondence. That is, directly below each terminal electrode 51, one connection wiring 123 having the same potential is disposed, and the different potential wiring 53 is not disposed. The plurality of inner via electrodes 126 are connected to the connection wiring 123 at intervals from the plurality of through-holes 124 in the plan view. Specifically, the plurality of inner via electrodes 126 are connected to the peripheral edge of the terminal electrode 51 at intervals from the inner portion to the side of the peripheral edge of the connection wiring 123 (the terminal electrode 51) in the plan view. In this embodiment, the plurality of inner via electrodes 126 are arranged side by side in a row along the peripheral edge of the terminal electrode 51 in the plan view and surround a region in which the plurality of through-holes 124 are formed in the connection wiring 123.

Each of the inner via electrodes 126 may be disposed in a region close to the peripheral edge of the terminal electrode 51 with respect to the center of the terminal electrode 51. That is, the inner via electrode 126 may be disposed at a fifth distance D5 from the center of the terminal electrode 51 to the peripheral edge of the terminal electrode 51 and is disposed at a sixth distance D6, which is less than the fifth distance D5 (D6<D5), from the peripheral edge of the terminal electrode 51 to the center of the terminal electrode 51, The fifth distance D5 and the sixth distance D6 are based on the inner edge of the inner via electrode 126 on the side of the inner portion of the terminal electrode 51.

In this embodiment, each of the plurality of inner via electrodes 126 is formed in a square shape in the plan view. Each inner via electrode 126 has an optional planar shape and may be formed in a circular shape or a polygonal shape. Like the wiring via electrode 33, each of the plurality of inner via electrodes 126 includes a via barrier film 42 and a via main electrode 43 laminated in this order from the side of the inner wall of the via opening 41. In this embodiment, each of the plurality of inner via electrodes 126 is formed of a tungsten plug electrode, like the wiring via electrodes 33.

Figure 24A:
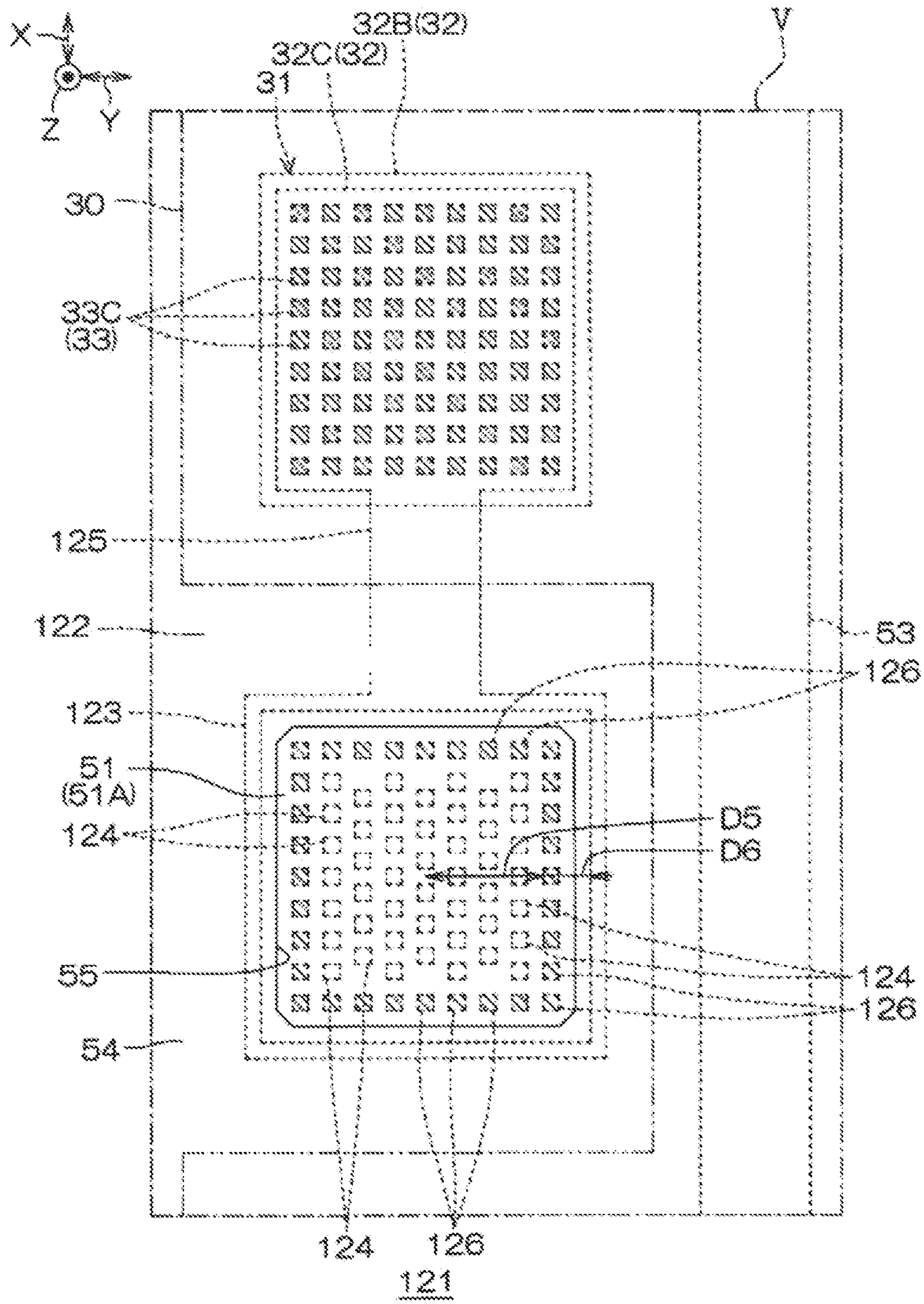
FIG. 24A is an enlarged view showing the semiconductor device shown in FIG. 21 together with a through-hole according to a second configuration example.
Figure 24B:
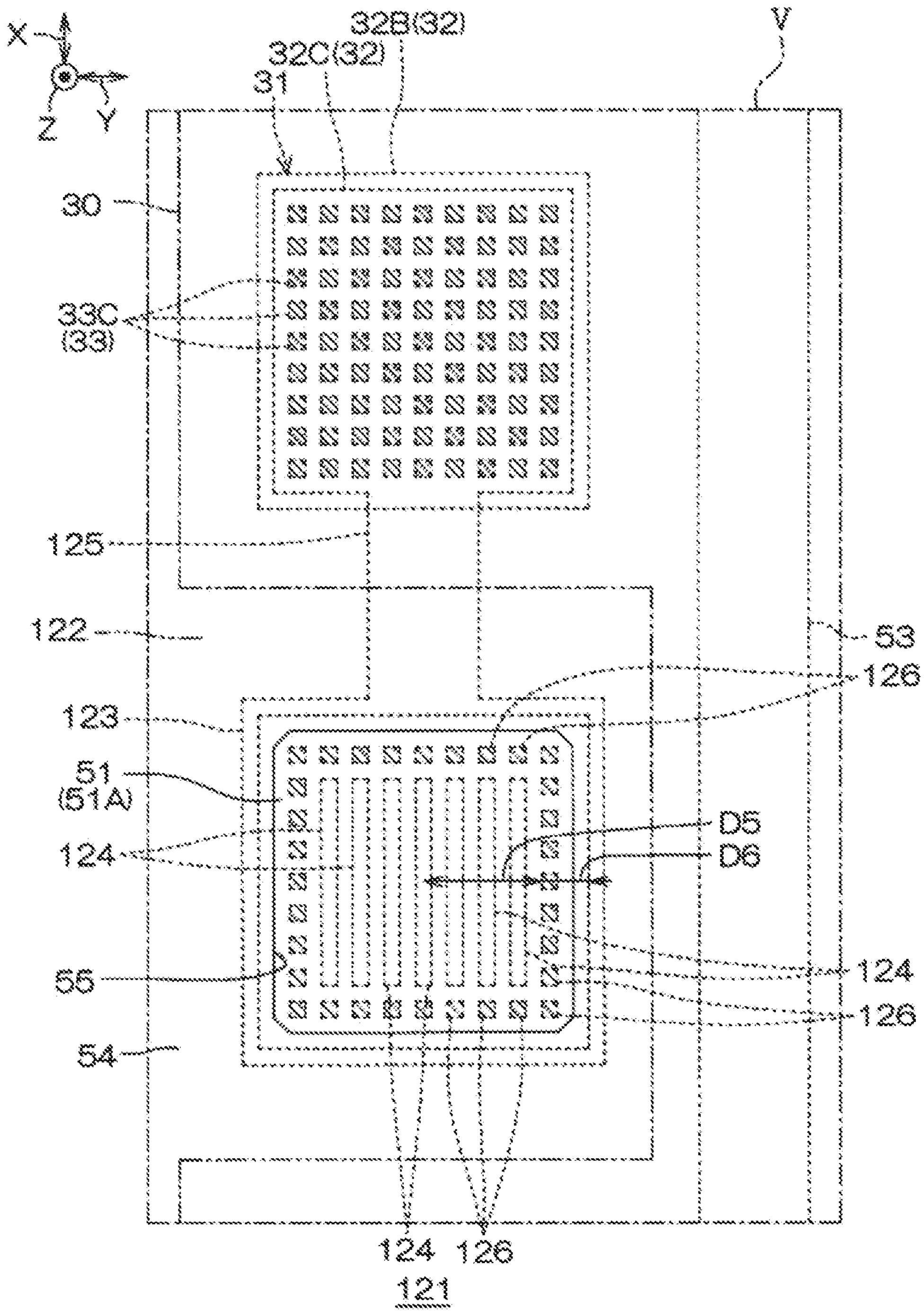
FIG. 24B is an enlarged view showing the semiconductor device shown in FIG. 21 together with a through-hole according to a third configuration example.
Figure 24C:
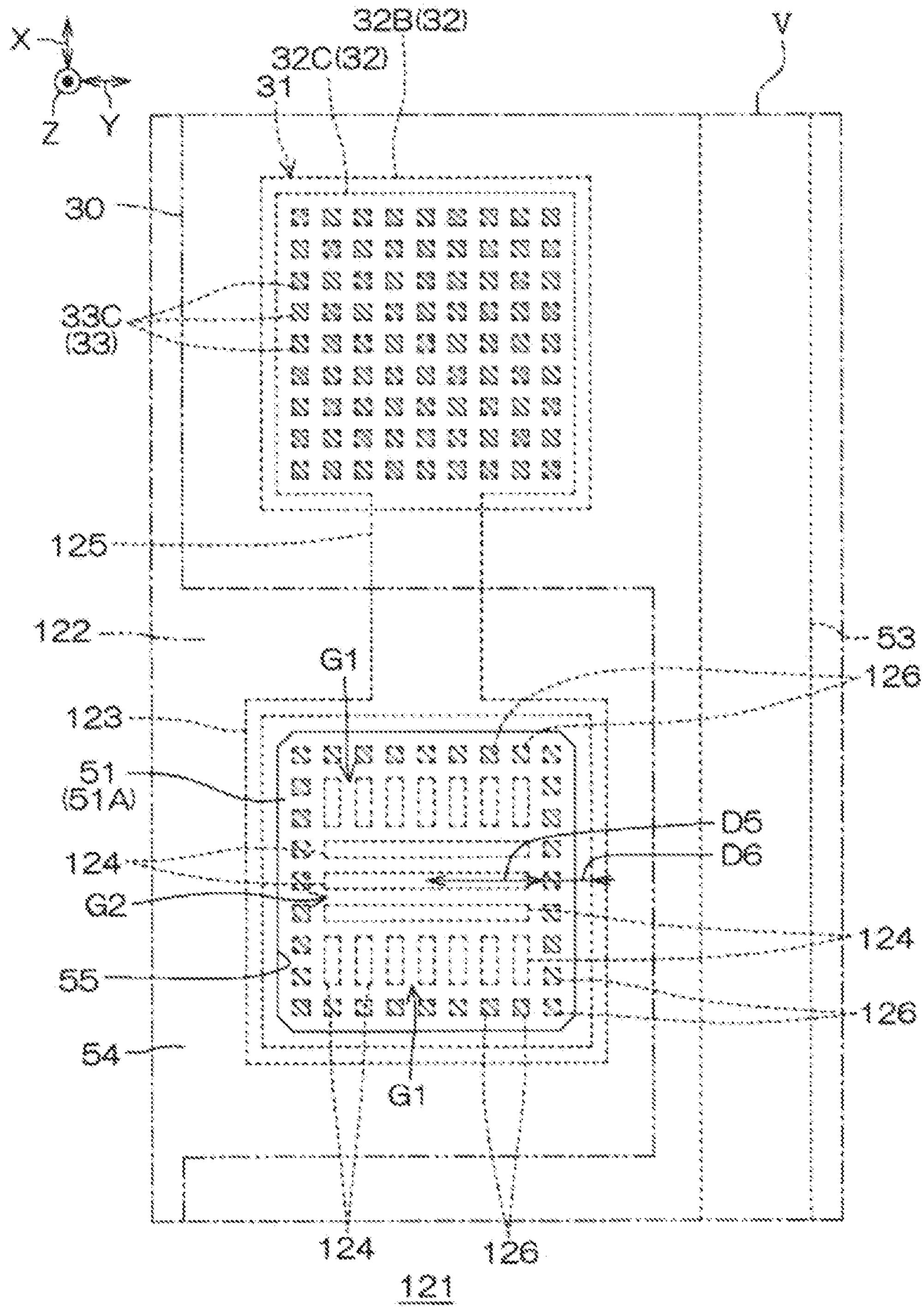
FIG. 24C is an enlarged view showing the semiconductor device shown in FIG. 21 together with a through-hole according to a fourth configuration example.

The plurality of through-holes 124 may take various forms shown in FIGS. 24A to 24C. FIG. 24A is an enlarged view showing the semiconductor device 121 shown in FIG. 21 together with a through-hole 124 according to a second configuration example. Referring to FIG. 24A, a plurality of through-holes 124 are arranged in a staggered manner so that a plurality of T-shaped road portions are partitioned on the connection wiring 123 in a plan view. The plurality of through-holes 124 may be arranged at equal intervals in the first direction X and the second direction Y. In this embodiment, each of the plurality of through-holes 124 is formed in a square shape in the plan view. Each of the plurality of through-holes 124 has an optional planar shape and may be formed in a circular shape or a polygonal shape. Further, the plurality of through-holes 124 may partition a plurality of Y-shaped road portions on the connection wiring 123 according to the planar shape.

FIG. 24B is an enlarged view showing the semiconductor device 121 shown in FIG. 21 together with a through-hole 124 according to a third configuration example. Referring to FIG. 24B, in this embodiment, a plurality of through-holes 124 are formed in a stripe shape extending in one direction so that a stripe portion extending in one direction is partitioned on the connection wiring 123 in a plan view. In this embodiment, the plurality of through-holes 124 are respectively formed in a stripe shape extending in the first direction X and are formed at intervals in the second direction Y. Of course, the plurality of through-holes 124 may be formed in a stripe shape extending in the second direction Y. The plurality of through-holes 124 may be arranged at equal intervals.

FIG. 24C is an enlarged view showing the semiconductor device 121 shown in FIG. 21 together with a through-hole 124 according to a fourth configuration example. Referring to FIG. 24C, in this embodiment, a plurality of through-holes 124 are arranged in a plurality of stripe shapes extending in different directions in a plan view. The plurality of through-holes 124 partition a plurality of stripe portions extending in different directions on the connection region 122 in the plan view.

The plurality of through-holes 124 include a first group G1 extending in one direction (the first direction X) and a second group G2 extending in an intersection direction (the second direction Y) intersecting the one direction at an interval from the first group G1 in the plan view. The number and arrangement of first groups G1 and second groups G2 are optional. The plurality of through-holes 124 may be arranged at equal intervals.

As described above, the semiconductor device 121 includes the semiconductor chip 2, the insulating layer 20, the connection wiring 123, the plurality of through-holes 124, and the terminal electrode 51. The insulating layer 20 is formed over the semiconductor chip 2. The connection wiring 123 is disposed in the insulating layer 20. The plurality of through-holes 124 are formed in the connection wiring 123. The terminal electrode 51 is disposed over the insulating layer 20 so as to face the connection wiring 123.

According to this structure, the elastic modulus of the connection wiring 123 can be reduced by the plurality of through-holes 124. This can result in relaxation of the stress to the terminal electrode 51 at the time of connecting the conducting wires 312. As a result, cracks in the terminal electrode 51 due to the stress at the time of connecting the conducting wires 312 can be suppressed. Therefore, the reliability of the terminal electrode 51 can be improved. According to the semiconductor device 121, the reliability of the terminal electrode 51 and its surroundings can be improved. For example, according to this structure, it is possible to prevent cracks starting from the terminal electrode 51 from occurring in the insulating layer 20. Further, according to this structure, since cracks of the terminal electrode 51 can be suppressed, it is possible to suppress the electric influence caused by the cracks from occurring around the terminal electrode 51. Further, even in the case where cracks occur starting from the terminal electrode 51, the cracks can be terminated by the plurality of through-holes 124. As a result, the expansion of cracks to the outside of the terminal electrode 51 can be suppressed in the plan view.

The terminal electrode 51 may face all of the plurality of through-holes 124. The plurality of through-holes 124 may be formed in the inner portion of the connection wiring 123. According to this structure, the expansion of cracks can be suppressed in the inner portion of the connection wiring 123. The entire region of the terminal electrode 51 may face the connection wiring 123 in the plan view. The terminal electrode 51 may be disposed in a region surrounded by the peripheral edge of the connection wiring 123 in the plan view. The connection wiring 123 may be disposed with a fifth space S5 from the semiconductor chip 2 in the thickness direction of the insulating layer 20 and is disposed with a sixth space S6, which is less than the fifth space S5 (S6<S5), from the connection wiring 123 in the thickness direction of the insulating layer 20.

The plurality of through-holes 124 may be arranged at intervals from the inner portion of the connection wiring 123 toward the entire circumference of the peripheral edge thereof in the plan view. The plurality of through-holes 124 may be arranged at intervals along the electrode surface of the connection wiring 123 in the first direction X and the second direction Y. The plurality of through-holes 124 may be arranged so that at least one pattern of a plurality of crossroad portions, a plurality of T-shaped road portions, and a plurality of stripe portions is partitioned in the connection wiring 123.

The plurality of through-holes 124 may be arranged so that the ratio of the total area to the plane area of the region surrounded by the peripheral edge of the connection wiring 123 is 20% or more and 80% or less. According to this structure, it is possible to suppress the occurrence and expansion of cracks while suppressing an increase in the resistance value of the connection wiring 123. The semiconductor device 121 may include the inner via, electrode 126. The inner via electrode 126 is interposed between the connection wiring 123 and the terminal electrode 51 in the insulating layer 20 and electrically connects the connection wiring 123 and the terminal electrode 51. According to this structure, cracks can be suppressed by the plurality of through-holes in a state where the connection wiring 123 and the terminal electrode 51 are electrically connected.

In this case, the inner via electrode 126 may be formed in the peripheral edge of the terminal electrode 51 at intervals from the plurality of through-holes 124 in the plan view. According to this structure, the expansion of cracks can be suppressed by the inner via electrode 126 at the peripheral edge of the connection wiring 123. A plurality of inner via electrodes 126 may be arranged side by side in a row along the peripheral edge of the terminal electrode 51 in the plan view.

The semiconductor device 121 may include the circuit device 10 and the multilayer wiring 31. The circuit device 10 is formed in the semiconductor chip 2. The multilayer wiring 31 includes a plurality of wirings 32 laminated and arranged in the thickness direction of the insulating layer 20 so as to be electrically connected to the circuit device 10. In this case, the connection wiring 123 may be electrically connected to at least one of the plurality of wirings 32.

According to this structure, the terminal electrode 51 can be electrically connected to the multilayer wiring 31 while suppressing the occurrence of cracks starting from the terminal electrode 51. Further, according to this structure, since the expansion of cracks can be suppressed by the plurality of through-holes 124, the terminal electrode 51 can be prevented from being short-circuited with the multilayer wiring 31 due to the cracks. The terminal electrode 51 may be disposed over the connection wiring 123 at an interval from the multilayer wiring 31 (the plurality of wirings 32) in the plan view. The connection wiring 123 may face the semiconductor chip 2 with only the insulating layer 20 interposed therebetween.

The multilayer wiring 31 may be formed in a portion of the insulating layer 20 that covers the circuit device 10. The connection wiring 123 may be firmed in a portion of the insulating layer 20 that covers the outside of the circuit device 10. In this structure, the connection wiring 123 and the terminal electrode 51 may face a region outside the circuit device 10 in the semiconductor chip 2. According to this structure, the circuit device 10 can be protected from the stress at the time of connecting the conducting wires 312. Further, even in the case where cracks occur in the terminal electrode 51, it is possible to suppress the physical influence and the electrical influence caused by the cracks from occurring in the circuit device 10.

The semiconductor device 121 may include the outer diode 15 (rectifier/floating rectifier). The outer diode 15 includes an anode region 16 formed in a region outside the circuit device 10 on the surface layer portion of the semiconductor chip 2 and a cathode region 17 formed in the surface layer portion of the anode region 16. In this case, the connection wiring 123 may be formed in a portion of the insulating layer 20 that covers the outer diode 15.

According to this structure, the outer diode 15 is reverse-biased to the semiconductor chip 2 (the device region 8). That is, the outer diode 15 shields the current path from the outer region 9 to the device region 8. According to this structure, even when an unintended current path is formed between the terminal electrode 51 and the semiconductor chip 2 in the insulating layer 20, the current path can be shielded by the outer diode 15.

The unintended current paths may include an undesired current path due to cracks. In this structure, the cathode region 17 may be formed in an electrically floating state. That is, the outer diode 15 may be formed as a floating diode. According to this structure, the shielding effect of the current path can be appropriately enhanced. The semiconductor device 121 may include the different potential wiring 53. The different potential wiring 53 is formed of a portion of the multilayer wiring 31 routed in the vicinity of the connection wiring 123 in the insulating layer 20, and a potential different from that of the adjacent terminal electrode 51 is applied to the different potential wiring 53. According to this structure, the different potential wiring 53 can be protected from the stress at the time of connecting the conducting wires 312. Further, even in the case where cracks occur starting from the terminal electrode 51, it is possible to suppress the physical influence and the electrical influence caused by the cracks from occurring between the terminal electrode 51 and the different potential wiring 53. As an example, it is possible to prevent the terminal electrode 51 from being short-circuited with the different potential wiring 53 due to the cracks.

Figure 25:
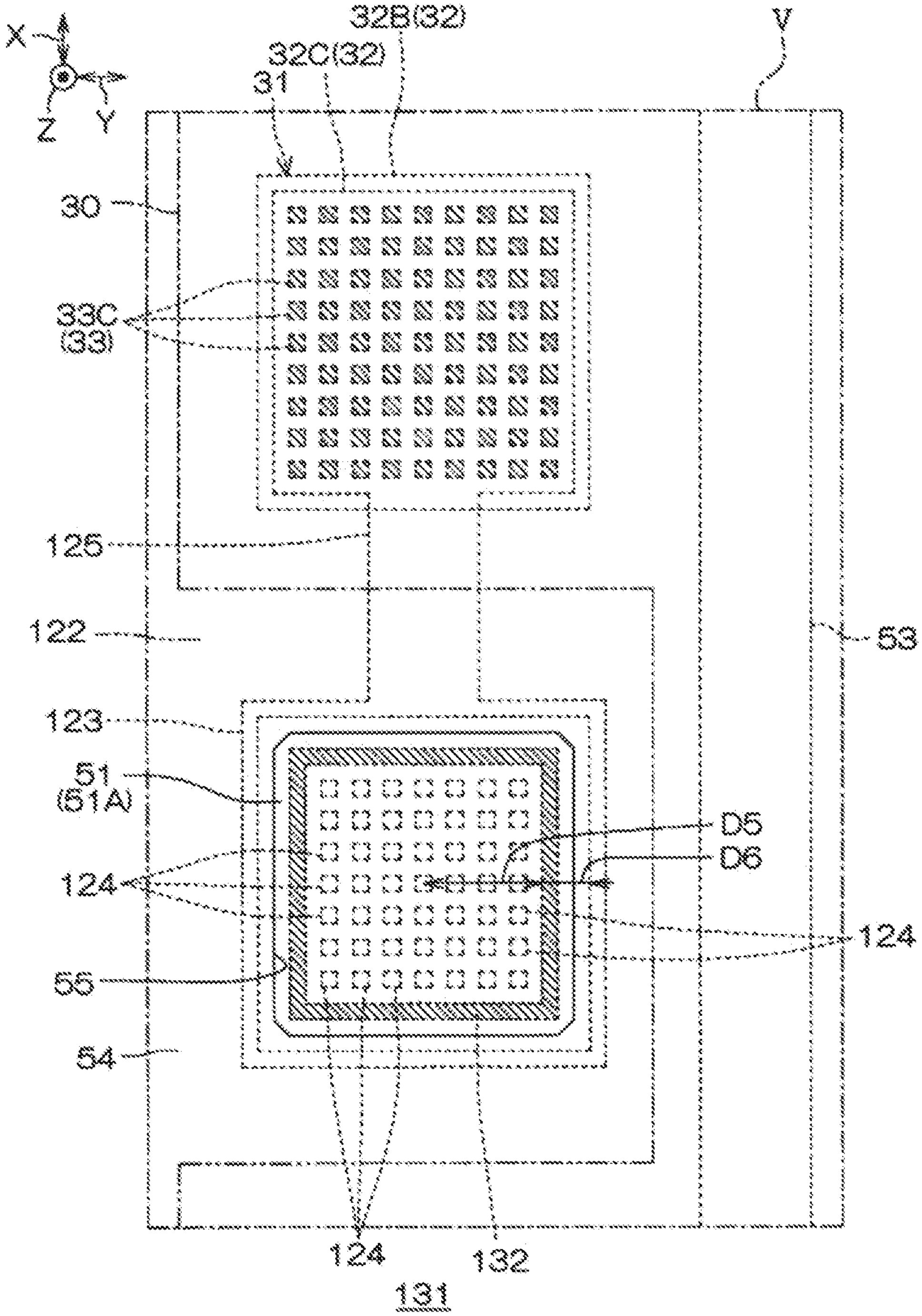
FIG. 25 corresponds to FIG. 21 and is an enlarged view showing a semiconductor device according to a ninth embodiment of the present disclosure together with a seal via electrode according to a first configuration example.

FIG. 25 corresponds to FIG. 21 and is an enlarged view showing a semiconductor device 131 according to a ninth embodiment of the present disclosure together with a seal via electrode 132 according to a first configuration example. Through-holes 124 according to the first configuration example are shown in FIG. 25. Of course, the semiconductor device 131 may include any one of the through-holes 124 (see FIGS. 24A to 24C) according to the second to fourth configuration examples, instead of the through-holes 124 according to the first configuration example.

Further, the semiconductor device 131 may include through-holes 124 having a form in which the features of at least two of the through-holes 124 according to the first to fourth configuration examples are combined, instead of the through-holes 124 according to the first configuration example. Hereinafter, structures corresponding to the structures described for the semiconductor device 121 and the like according to the eighth embodiment are denoted by the same reference numerals, and explanation thereof will not be repeated.

The semiconductor device 131 includes the seal via electrode 132 instead of the inner via electrode 126. The seal via electrode 132 is interposed between the connection wiring 123 and the peripheral edge of the terminal electrode 51 in the insulating layer 20 so as to be connected to the connection wiring 123 and the terminal electrode 51 and is formed in a stripe shape extending along the peripheral edge of the terminal electrode 51 in a plan view. The seal via electrode 132 is buried in the via opening 41 formed in the insulating layer 20 and is formed of a single connection member connecting the connection wiring 123 and the terminal electrode 51.

The seal via electrode 132 is disposed at an interval from the inner portion to the side of the peripheral edge side of the terminal electrode 51 so as to face the peripheral edge of the terminal electrode 51 in the plan view. The seal via electrode 132 extends in parallel along the side of the terminal electrode 51 in the plan view. The seal via electrode 132 is interposed between the peripheral edge of the connection wiring 123 and the peripheral edge of the terminal electrode 51 in the plan view. In this embodiment, the seal via electrode 132 is formed in an annular shape (in this embodiment, a square annular shape) surrounding the inner portion of the terminal electrode 51 in the plan view and surrounds a region in which the plurality of through-holes 124 are formed in the connection wiring 123.

The seal via electrode 132 may be disposed in a region close to the peripheral edge of the terminal electrode 51 with respect to the center of the terminal electrode 51. That is, the seal via electrode 132 may be disposed at a fifth distance D5 from the center of the terminal electrode 51 to the peripheral edge of the terminal electrode 51 and is disposed at a sixth distance D6, which is less than the fifth distance D5 (D6<D5), from the peripheral edge of the terminal electrode 51 to the center of the terminal electrode 51. The fifth distance D5 and the sixth distance D6 are based on the inner edge of the seal via electrode 132 on the side of the inner portion of the terminal electrode 51.

Figure 26A:
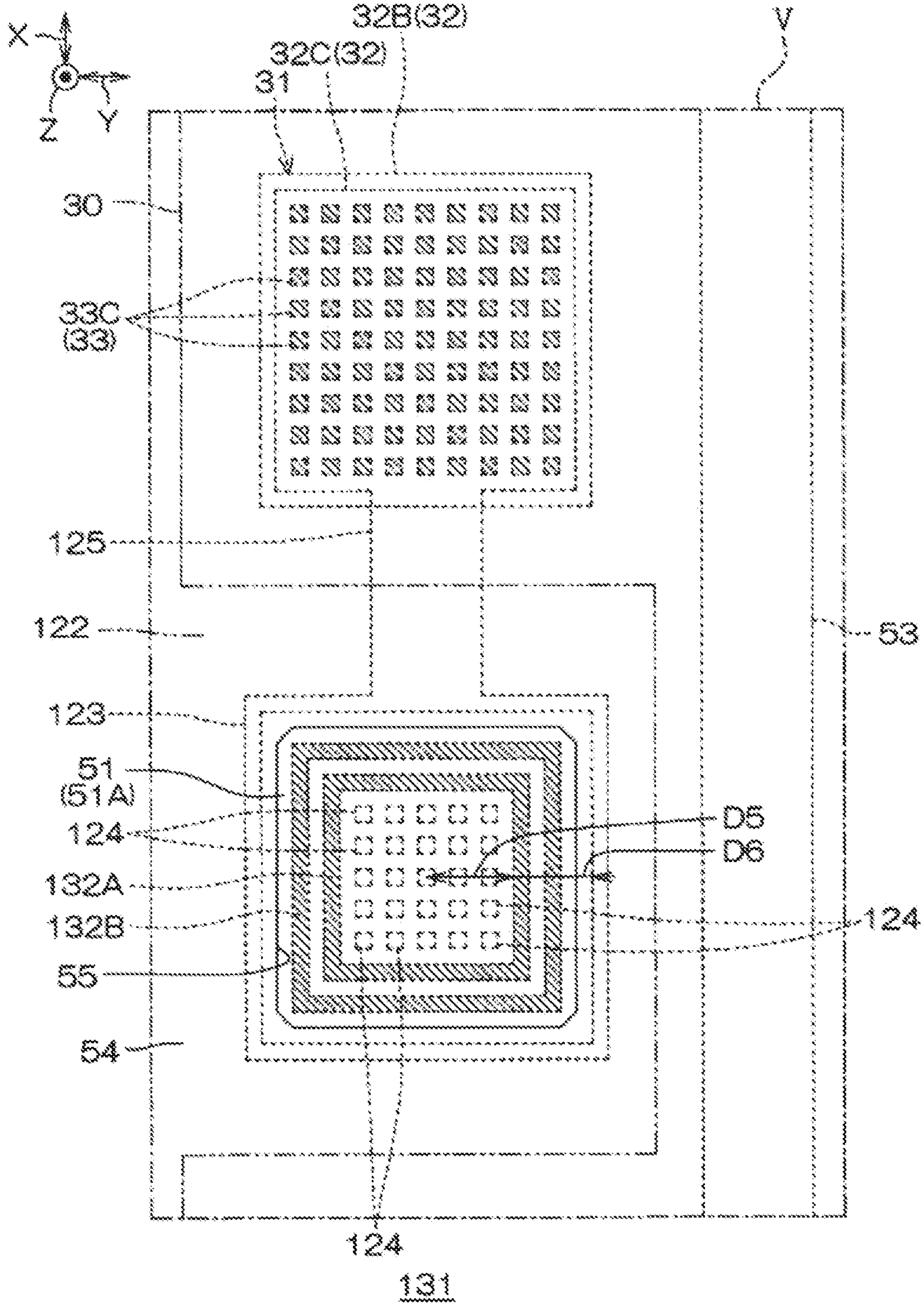
FIG. 26A is an enlarged view showing the semiconductor device shown in FIG. 25 together with a seal via electrode according to a second configuration example.
Figure 26B:
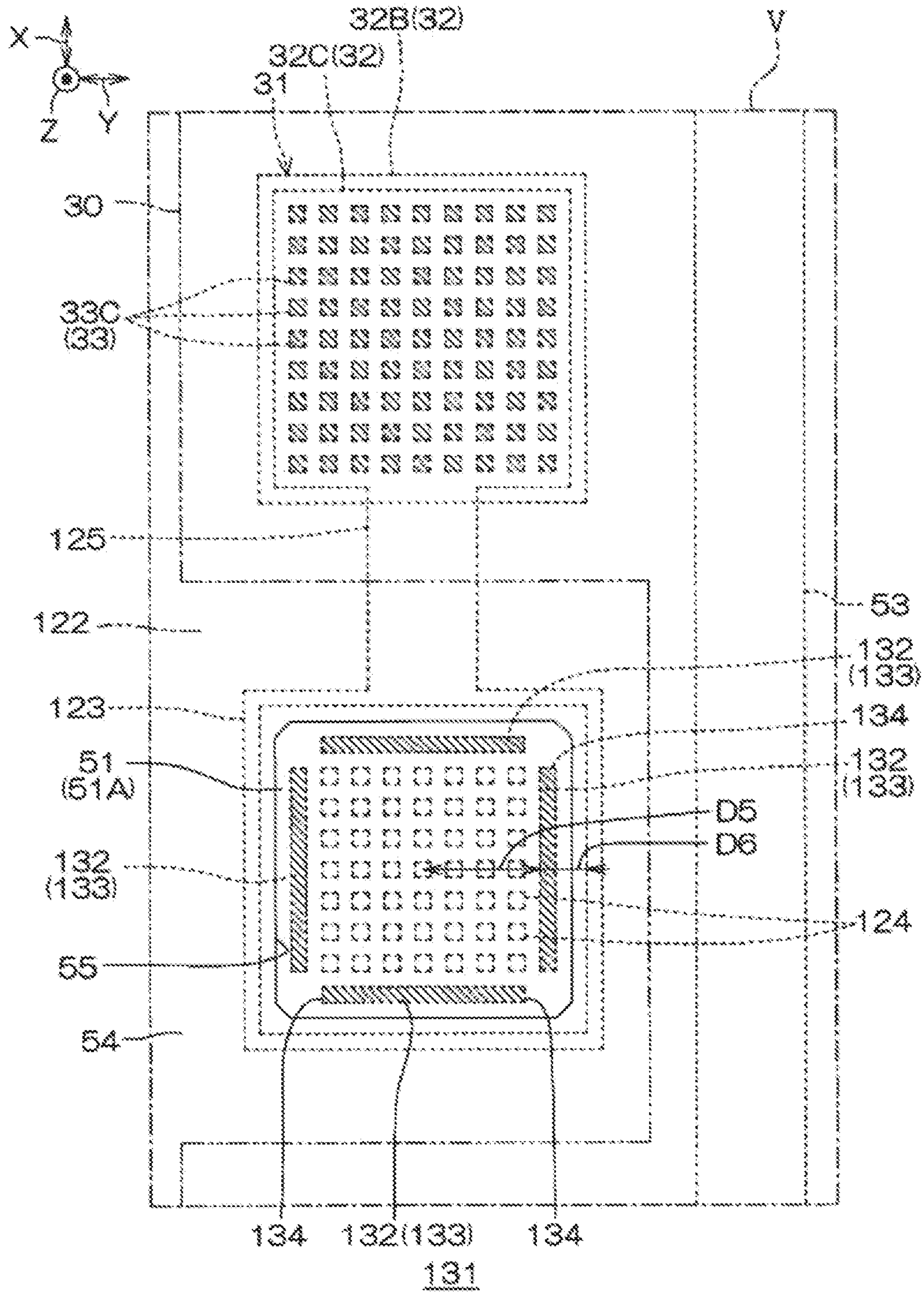
FIG. 26B is an enlarged view showing the semiconductor device shown in FIG. 25 together with a seal via electrode according to a third configuration example, FIG. 27 corresponds to FIG. 21 and is an enlarged view showing a semiconductor device according to a tenth embodiment of the present disclosure together with an outer dummy wiring according to a first configuration example.

Like the wiring via electrode 33, the seal via electrode 132 includes a via barrier film 42 and a via main electrode 43 laminated in this order from the inner wall side of the via opening 41. In this embodiment, like the wiring via electrode 33, the seal via electrode 132 is formed of a tungsten plug electrode. The seal via electrode 132 can take various forms shown in FIGS. 26A and 26B, FIG. 26A is an enlarged view showing the semiconductor device 131 shown in FIG. 25 together with a seal via electrode 132 according to a second configuration example. Referring to FIG. 26A, in the second configuration example, a plurality of seal via electrodes (in this embodiment, two seal via electrodes) 132 are formed. The plurality of seal via electrodes 132 include a first seal via electrode 132A and a second seal via electrode 132B.

The first and second seal via electrodes 132A and 132B are arranged in this order with interval from the inner portion to the peripheral edge side of the terminal electrode 51 so as to face the peripheral edge of the terminal electrode 51 in a plan view. The first seal via electrode 132A is formed in a line shape extending along the peripheral edge of the terminal electrode 51 at an interval from the plurality of through-holes 124 in the plan view. Specifically, the first seal via electrode 132A is formed in an annular shape (in this embodiment, a square annular shape) surrounding the inner portion of the terminal electrode 51 in the plan view and surrounds a region in which the plurality of through-holes 124 are formed in the connection wiring 123.

The second seal via electrode 132B is interposed between the peripheral edge of the terminal electrode 51 and the first seal via electrode 132A in the plan view and is formed in a line shape extending along the peripheral edge of the terminal electrode 51. Specifically, the second seal via electrode 132B is formed in an annular shape (in this embodiment, a square annular shape) surrounding the first seal via electrode 132A in the plan view. The first and second seal via electrodes 132A and 132B may be arranged in a region close to the peripheral edge of the terminal electrode 51 with respect to the center of the terminal electrode 51. The first seal via electrode 132A may be disposed at a fifth distance D5 from the center of the terminal electrode 51 to the peripheral edge of the terminal electrode 51 and may be disposed at a sixth distance D6, which is less than the fifth distance D5 (D6<D5), from the peripheral edge of the terminal electrode 51 to the center of the terminal electrode 51. The fifth distance D5 and the sixth distance D6 are based on the inner edge of the first seal via electrode 132A on the side of the inner portion of the terminal electrode 51.

FIG. 26B is an enlarged view showing the semiconductor device 131 shown in FIG. 25 together with a seal via electrode 132 according to a third configuration example. Referring to FIG. 26B, in this embodiment, the seal via electrode 132 according to the third configuration example includes a plurality of segment portions (in this embodiment, four segment portions) 133 arranged in a line shape at intervals along the peripheral edge of the terminal electrode 51. It can be considered that the seal via electrode 132 according to the third configuration example has a form in which the seal via electrode 132 according to the first configuration example is divided into a plurality of segment portions 63 by a plurality of removal portions 134. In this embodiment, the plurality of removal portions 134 are formed at the corners (specifically, four corners) of the seal via electrode 132, and each segment portion 133 is formed in a line shape extending along each side of the terminal electrode 51.

A seal via electrode 132 having a form in which the features of at least two of the seal via electrodes 132 according to the first to third configuration examples are combined may be adopted. As described above, the semiconductor device 131 can also exhibit the same effects as those described for the semiconductor device 121 according to the eighth embodiment. Further, the semiconductor device 131 includes the seal via electrode 132. The seal via electrode 132 is interposed between the connection wiring 123 and the peripheral edge of the terminal electrode 51 in the insulating layer 20 so as to be connected to the connection wiring 123 and the terminal electrode 51 and is formed in a stripe shape extending along the peripheral edge of the terminal electrode 51 in the plan view.

According to this structure, even in the case where cracks occur starting from the terminal electrode 51, the cracks can be terminated by the seal via electrode 132. As a result, the expansion of cracks to the outside of the terminal electrode 51 in the plan view can be suppressed. The seal via electrode 132 may be formed in an annular shape surrounding the inner portion of the terminal electrode 51 in the plan view.

According to this structure, the expansion of cracks can be suppressed over the entire circumference of the terminal electrode 51.

Figure 27:
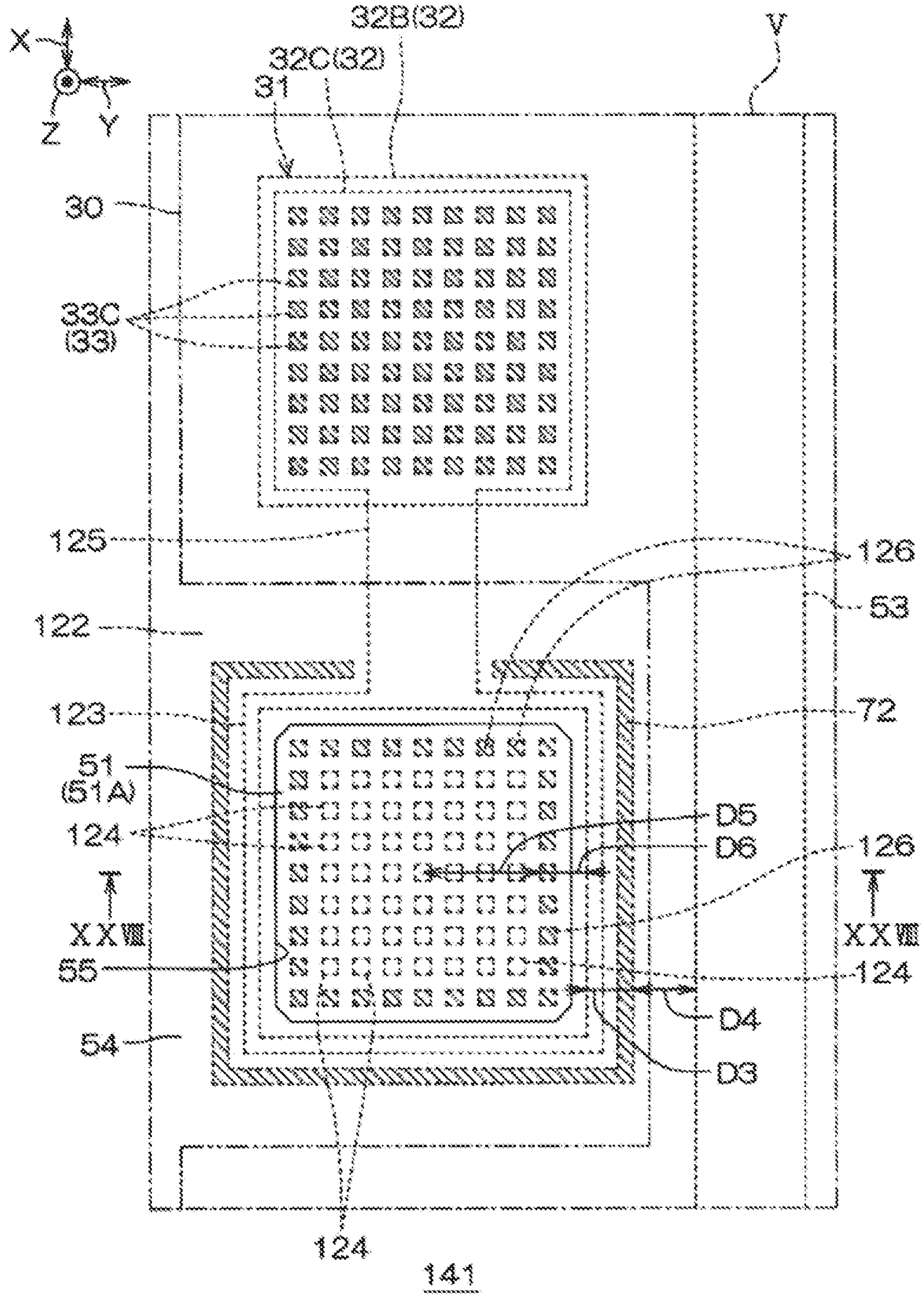
Figure 28:
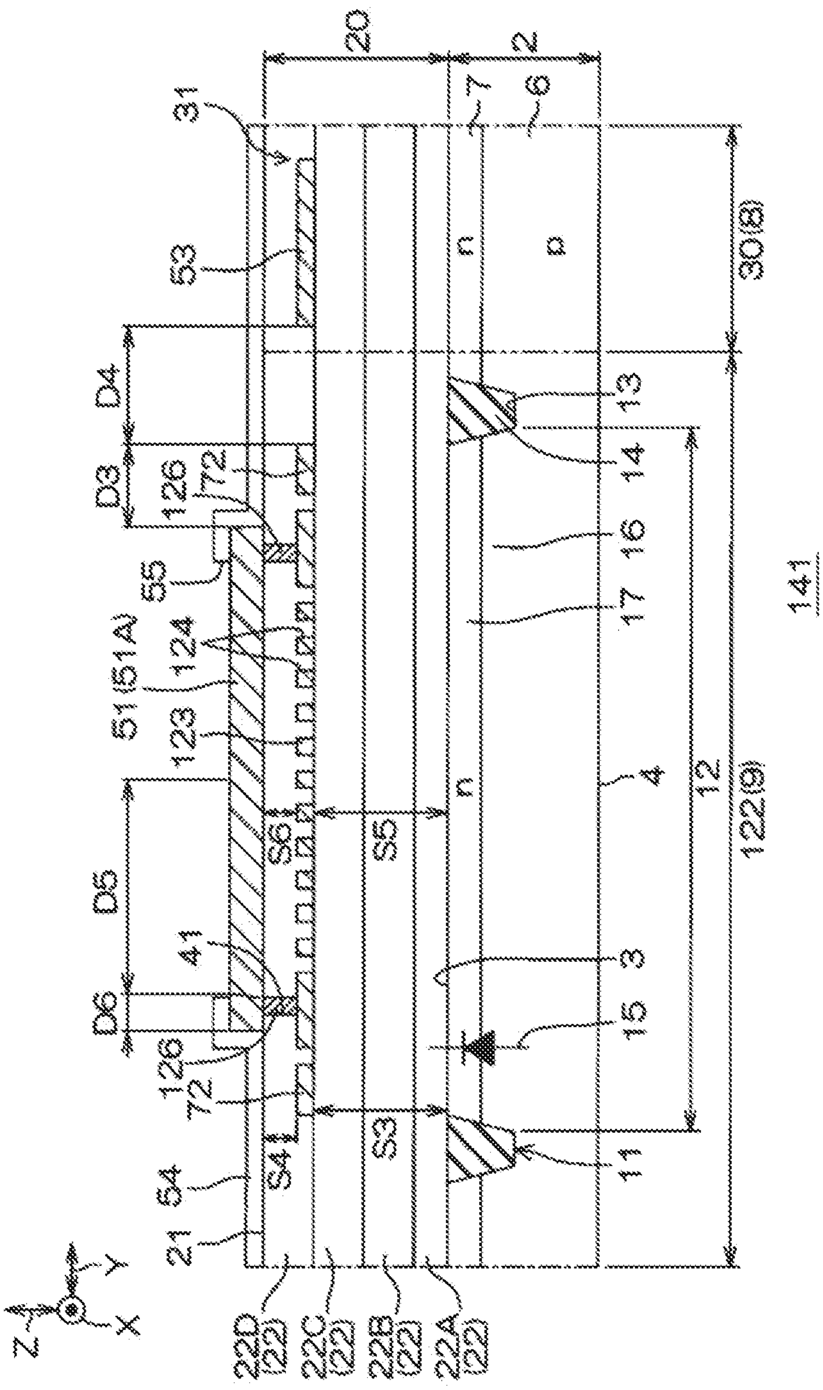
FIG. 28 is a cross-sectional view taken along a line XXVIII-XXVIII shown in FIG. 27.

FIG. 27 corresponds to FIG. 21 and is an enlarged view showing a semiconductor device 141 according to a tenth embodiment of the present disclosure together with an outer dummy wiring 72 according to a first configuration example. FIG. 28 is a cross-sectional view taken along a line XXVIII-XXVIII shown in FIG. 27. Hereinafter, structures corresponding to the strictures described for the semiconductor device 121 and the like according to the eighth embodiment are denoted by the same reference numerals, and explanation thereof will not be repeated. Referring to FIGS. 27 and 28, the semiconductor device 141 includes a plurality of outer dummy wirings 72 (dummy wirings) arranged in a plurality of connection regions 122, respectively, so as to be located in at least a region between the terminal electrode 51 and the multilayer wiring region 30 in a plan view. FIGS. 27 and 28 show a form in which one outer dummy wiring 72 is disposed below one terminal electrode 51 (the first terminal electrode 51A). Further, in FIG. 27, the outer dummy wiring 72 is shown by hatching. Hereinafter, one outer dummy wiring 72 will be described as an example.

The outer dummy wiring 72 is disposed apart from the connection wiring 123, the terminal electrode 51, and the multilayer wiring region 30 (the plurality of wirings 32) in the plan view and is electrically independent from the connection wiring 123, the multilayer wiring 31 (the plurality of wirings 32), and the terminal electrode 51. That is, the outer dummy wiring 72 is also electrically independent from the plurality of device regions 8. Specifically, the outer dummy wiring 72 is formed in an electrical floating state.

The outer dummy wiring 72 may be disposed in a region close to the terminal electrode 51 with respect to the multilayer wiring 31. That is, the outer dummy wiring 72 may be disposed at a third distance D3 from the terminal electrode 51 on the side of the multilayer wiring 31 in the plan view and may be disposed at a fourth distance D4, which exceeds the third distance D3 (D3<D4), from the multilayer wiring 31 on the side of the terminal electrode 51. The third distance D3 and the fourth distance D4 are based on the outer edge of the outer dummy wiring 72 on the side of the multilayer wiring region 30.

The outer dummy wiring 72 may be disposed in the connection region 122 in a region close to the terminal electrode 51 with respect to the semiconductor chip 2. That is, the outer dummy wiring 72 may be disposed with a third space S3 from the semiconductor chip 2 in the thickness direction of the insulating layer 20 and may be disposed with a fourth space S4, which is less than the third space S3 (S4<S3), from the terminal electrode 51 in the thickness direction of the insulating layer 20. In this embodiment, the outer dummy wiring 72 is formed in the form of a film on the third interlayer insulating film 22C located directly below the top interlayer insulating film 22 (the fourth interlayer insulating film 22D). That is, the outer dummy wiring 72 is disposed in the same layer as the connection wiring 123.

The outer dummy wiring 72 faces a region (the outer region 9) outside the plurality of device regions 8 in the plan view. In this embodiment, the outer dummy wiring 72 faces a region (the isolation region 12) surrounded by the plurality of isolation structures 11 in the plan view. That is, the outer dummy wiring 72 faces the outer diode 15 in the plan view. The outer dummy wiring 72 may face the isolation region 12 spaced inward from the isolation structure 11 in the plan view.

In this embodiment, the outer dummy wiring 72 may face the semiconductor chip 2 (the outer diode 15) with only a portion of the insulating layer 20 interposed therebetween. That is, a portion of the multilayer wiring 31 may not be formed in a region directly below the outer dummy wiring 72 in the connection region 122, in the region directly below the outer dummy wiring 72, a current path connecting the outer dummy wiring 72 and the semiconductor chip 2 in the thickness direction of the insulating layer 20 is shielded by a portion of the insulating layer 20 and the outer diode 15, A portion of the multilayer wiring 31 may be formed in the region directly below the outer dummy wiring 72 in the connection region 122, in this case, the bottom wiring 32 (the first wiring 32A) of the multilayer wiring 31 may not be formed directly above the outer diode 15.

The outer dummy wiring 72 is formed in a line shape extending along the connection wiring 123 in the plan view. The outer dummy wiring 72 may be formed in at least a portion along the multilayer wiring region 30 (the different potential wiring 53) in the plan view. The outer dummy wiring 72 faces the plurality of through-holes 124 along the plane direction of the insulating main surface 21 in the plan view. The outer dummy wiring 72 may face the connection wiring 123 from a plurality of directions in the plan view.

Figure 29A:
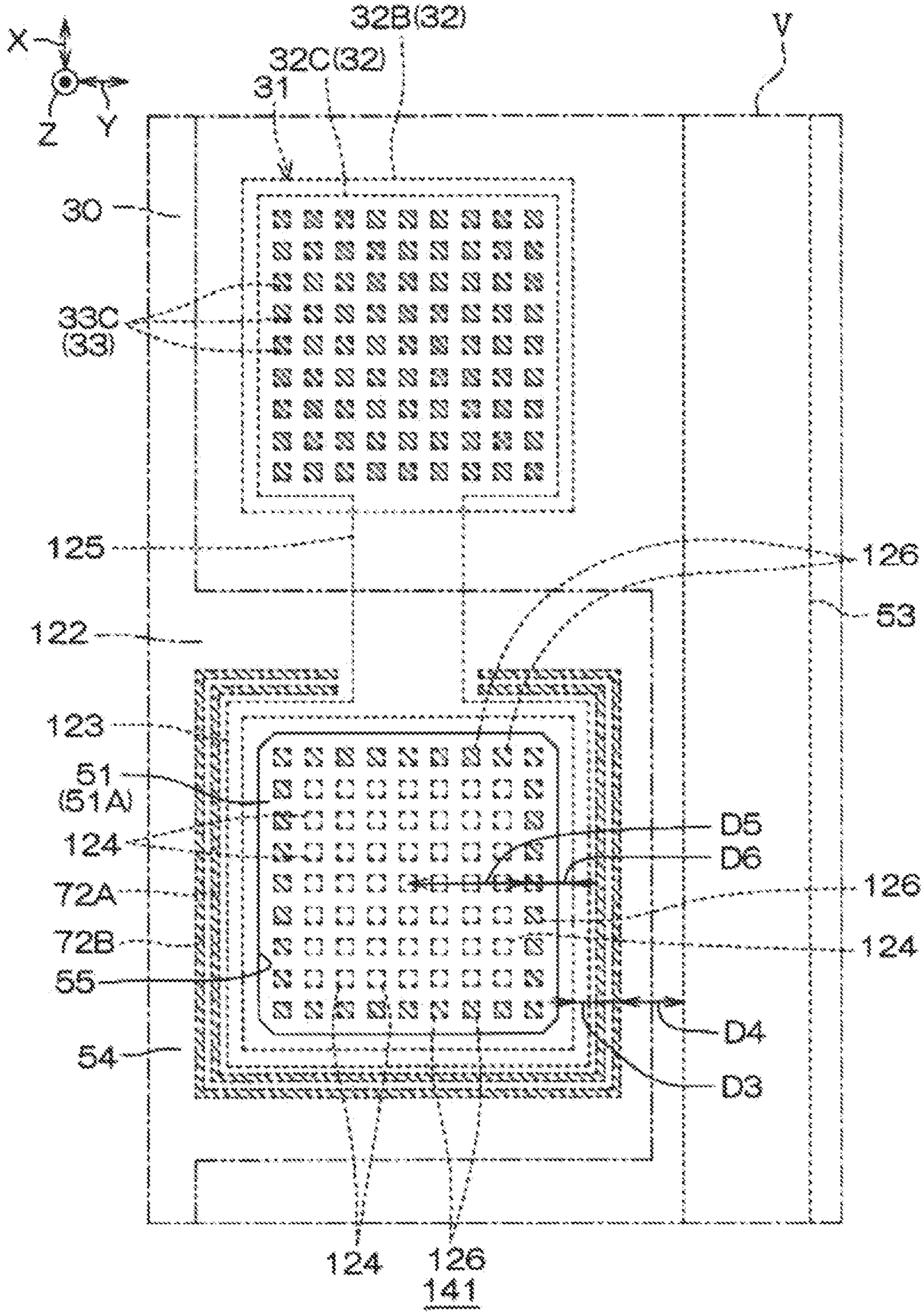
FIG. 29A is an enlarged view showing the semiconductor device shown in FIG. 28 together with an outer dummy wiring according to a second configuration example.

In this embodiment, the outer dummy wiring 72 extends along the connection wiring 123 so as to surround the connection wiring 123 at an interval from the lead-out wiring 125 in the plan view. Like the plurality of wirings 32, the outer dummy wiring 72 includes a first barrier film 34, a main wiring film 35, and a second barrier film 36 laminated in this order from the side of the first main surface 3. The outer dummy wiring 72 may take various forms shown in FIGS. 29A to 29D. FIG. 29A is an enlarged view showing the semiconductor device 141 shown in FIG. 28 together with an outer dummy wiring 72 according to a second configuration example. Referring to FIG. 29A, in the second configuration example, a plurality of outer dummy wirings (in this embodiment, two outer dummy wirings) 72 are formed. The plurality of outer dummy wirings 72 include a first outer dummy wiring 72A and a second outer dummy wiring 72B.

Each of the first and second outer dummy wirings 72A and 72B is disposed in the plurality of connection regions 122 so as to be located in at least a region between the terminal electrode 51 and the multilayer wiring region 30 in a plan view. The first and second outer dummy wirings 72A and 72B are arranged in this order from the terminal electrode 51 toward the side of the multilayer wiring region 30 in the plan view. In this embodiment, the first outer dummy wiring 72A is formed in a line shape extending along the terminal electrode 51 in the plan view. Specifically, the first outer dummy wiring 72A extends so as to surround the connection wiring 123 at an interval from the lead-out wiring 125 in the plan view. In this embodiment, the second outer dummy wiring 72B is formed in a line shape extending along the terminal electrode 51. Specifically, the second outer dummy wiring 72B extends so as to surround the first outer dummy wiring 72A at an interval from the lead-out wiring 125 in the plan view.

The first and second outer dummy wirings 72A and 72B may be arranged in a region close to the terminal electrode 51 with respect to the multilayer wiring 31. That is, the second outer dummy wiring 72B may be disposed at a third distance D3 from the terminal electrode 51 on the side of the multilayer wiring 31 and may be disposed at a fourth distance D4, which exceeds the third distance D3 (D3<D4), from the multilayer wiring 31 on the side of the terminal electrode 51. The third distance D3 and the fourth distance D4 are based on the outer edge of the second outer dummy wiring 72B on the side of the multilayer wiring region 30.

In this embodiment, an example in which the first and second outer dummy wirings 72A and 72B are arranged over the same layer (the third interlayer insulating film 22C) has been described. However, the first and second outer dummy wirings 72A and 72B may be arranged in different layers. For example, the first outer dummy wiring 72A may be disposed over the third interlayer insulating film 22C, while the second outer dummy wiring 72B may be disposed over the second interlayer insulating film 22B. In this case, the second outer dummy wiring 72B may be formed in an annular shape surrounding the terminal electrode 51 (the connection wiring 123) in the plan view.

Further, the first outer dummy wiring 72A may be disposed over the second interlayer insulating film 22B, while the second outer dummy wiring 72B may be disposed over the third interlayer insulating film 22C. Even in these cases, the first and second outer dummy wirings 72A and 72B may be arranged so as to be close to the terminal electrode 51 with respect to the semiconductor chip 2. In this case, the first outer dummy, wiring 72A may be formed in an annular shape surrounding the terminal electrode 51 (the connection wiring 123) in the plan view.

Figure 29B:
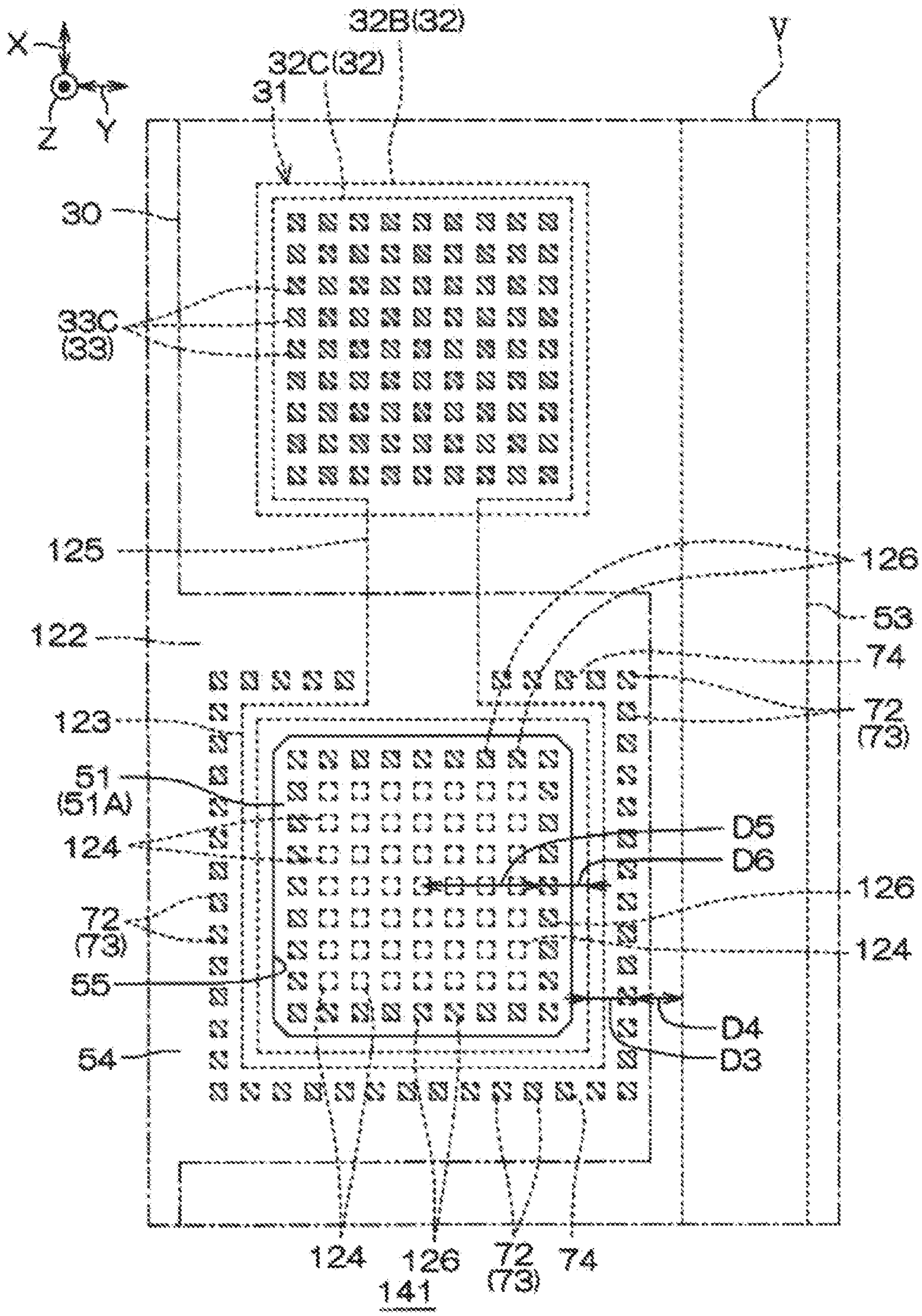
FIG. 29B is an enlarged view showing the semiconductor device shown in FIG. 28 together with an outer dummy wiring according to a third configuration example.

FIG. 29B is an enlarged view showing the semiconductor device 141 shown in FIG. 28 together with an outer dummy wiring 72 according to a thud configuration example. Referring to FIG. 29B, the outer dummy wiring 72 according to the third configuration example includes a plurality of segment portions 73 arranged in a dot shape at intervals along the terminal electrode 51 in a plan view. It can be considered that the outer dummy wiring 72 according to the third configuration example has a form in which the outer dummy wiring 72 according to the first configuration example is divided into a plurality of segment portions 73 by a plurality of removal portions 74. The plurality of segment portions 73 are arranged side by side in a row along the terminal electrode 51. Each segment portion 73 is formed in a square shape in the plan view. Each segment portion 73 has an optional planar shape and may be formed in a circular shape or a polygonal shape.

Figure 29C:
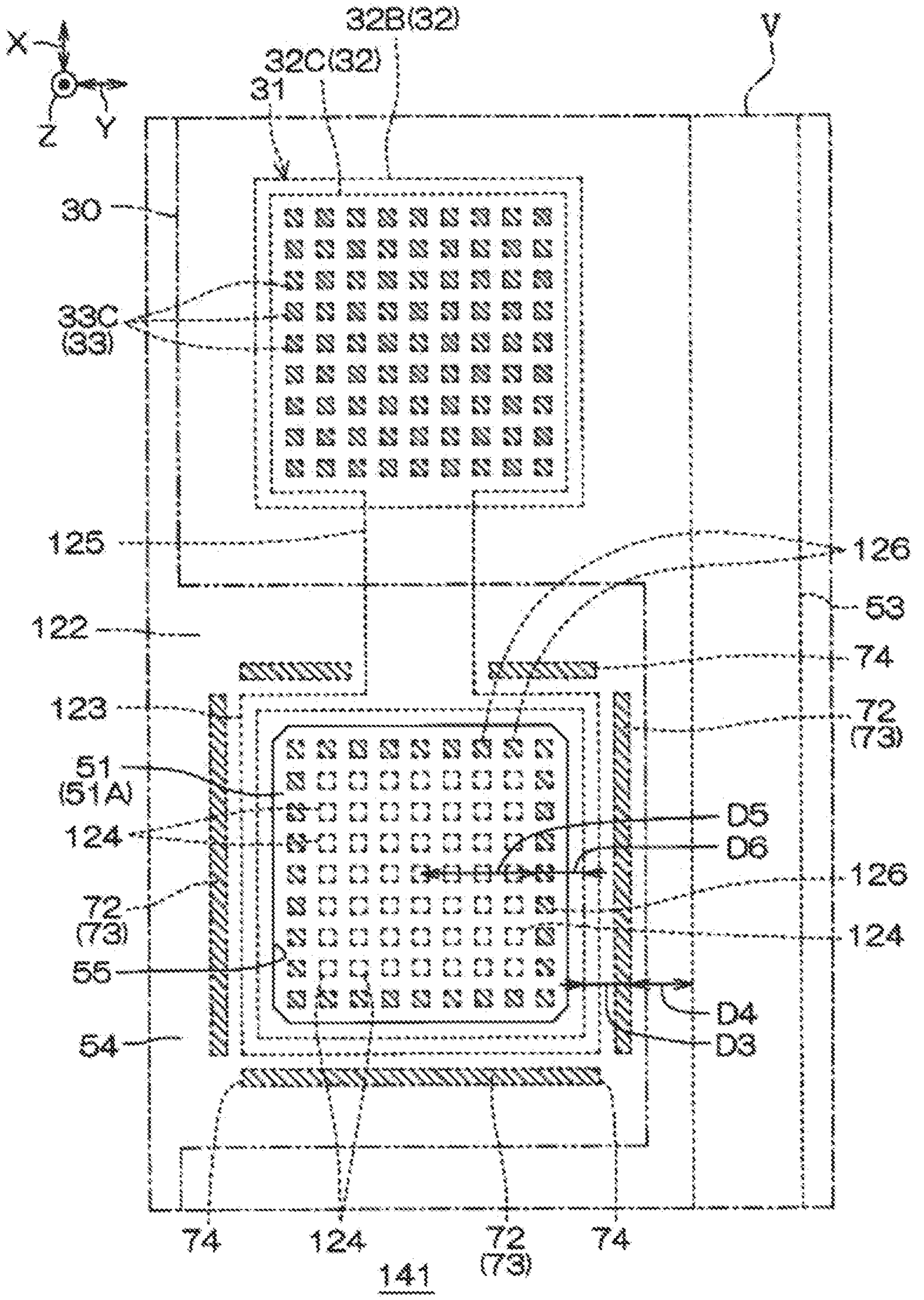
FIG. 29C is an enlarged view showing the semiconductor device shown in FIG. 28 together with an outer dummy wiring according to a fourth configuration example.

FIG. 29C is an enlarged view showing the semiconductor device 141 shown in FIG. 28 together with an outer dummy wiring 72 according to a fourth configuration example. Referring to FIG. 29C, the outer dummy wiring 72 according to the fourth configuration example includes a plurality of segment portions (in this embodiment, five segment portions) 73 arranged in a line shape at intervals along the peripheral edge of the terminal electrode 51. It can be considered that the outer dummy wiring 72 according to the fourth configuration example has a form in which the outer dummy wiring 72 according to the first configuration example is divided into a plurality of segment portions 73 by a plurality of removal portions 74. In this embodiment, the plurality of removal portions 74 are formed at the corners (specifically, four corners) of the outer dummy wiring 72, and each segment portion 73 is formed in a line shape extending along each side of the terminal electrode 51.

Figure 29D:
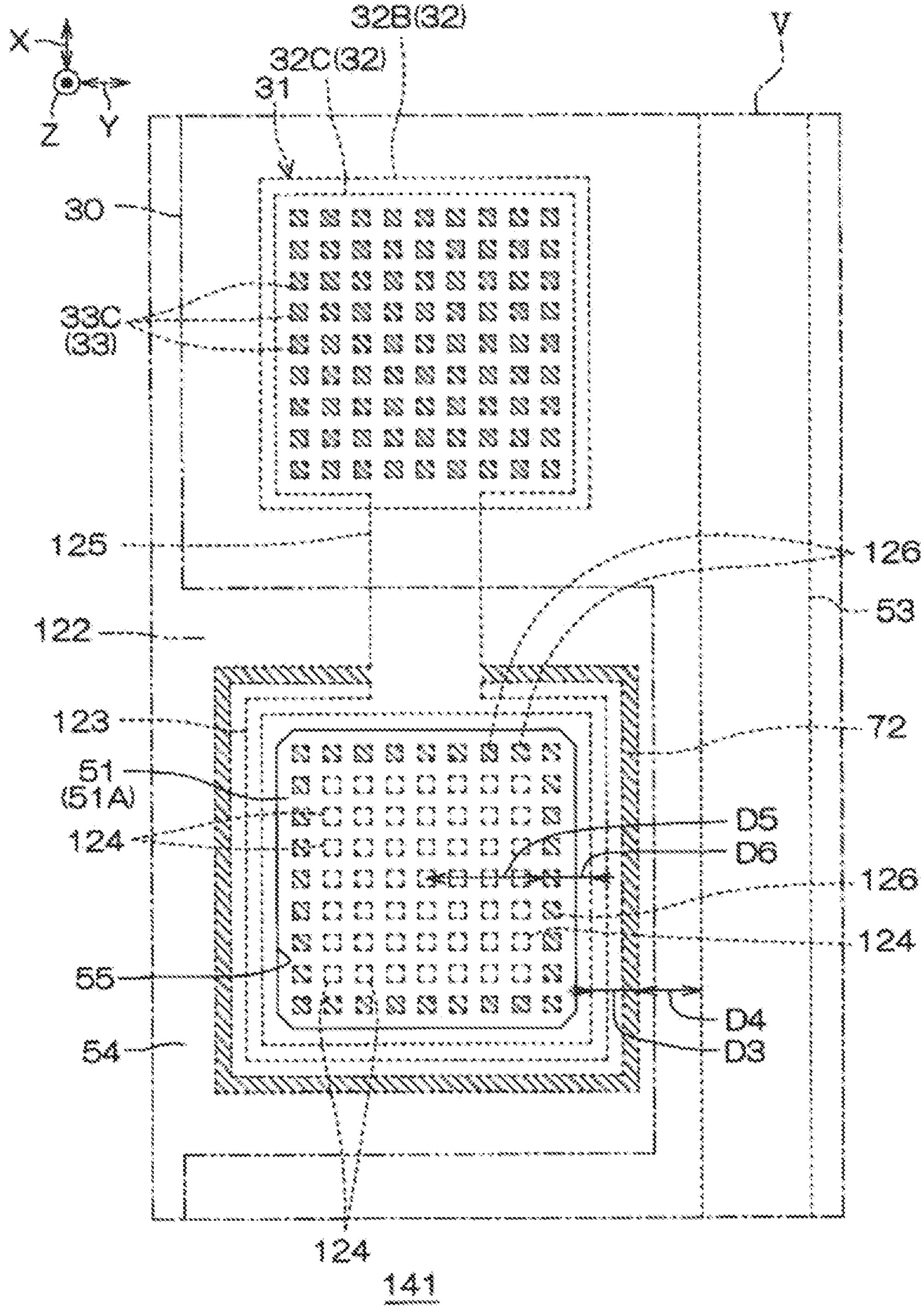
FIG. 29D is an enlarged view showing the semiconductor device shown in FIG. 28 together with an outer dummy wiring according to a fifth configuration example, FIG. 30 corresponds to FIG. 21 and is an enlarged view showing a semiconductor device according to an eleventh embodiment of the present disclosure together with a seal via electrode according to a first configuration example and an outer dummy wiring according to the first configuration example.

FIG. 29D is an enlarged view showing the semiconductor device 141 shown in FIG. 28 together with an outer dummy wiring 72 according to a fifth configuration example. Referring to FIG. 29D, the outer dummy wiring 72 according to the fifth configuration example is lead out from one or both of the connection wiring 123 and the lead-out wiring 125 (in this embodiment, the lead-out wiring 125) so as to surround the connection wiring 123 in a plan view. In this embodiment, the outer dummy wiring 72 is electrically connected to the connection wiring 123, the terminal electrode 51, and the multilayer wiring region 30. In this embodiment, the outer dummy wiring 72 is formed in an annular shape surrounding the connection wiring 123 in the plan view.

An outer dummy wiring 72 having a form in which the features of at least two of the outer dummy wirings 72 according to the first to fifth configuration examples are combined may be adopted. As described above, the semiconductor device 141 can also exhibit the same effects as those described for the semiconductor device 121 according to the eighth embodiment. Further, the semiconductor device 141 includes the outer dummy wiring 72 (dummy wiring). The outer dummy wiring 72 is disposed in the connection region 122 so as to be located in at least a region between the terminal electrode 51 and the multilayer wiring region 30 in the plan view.

Figure 30:
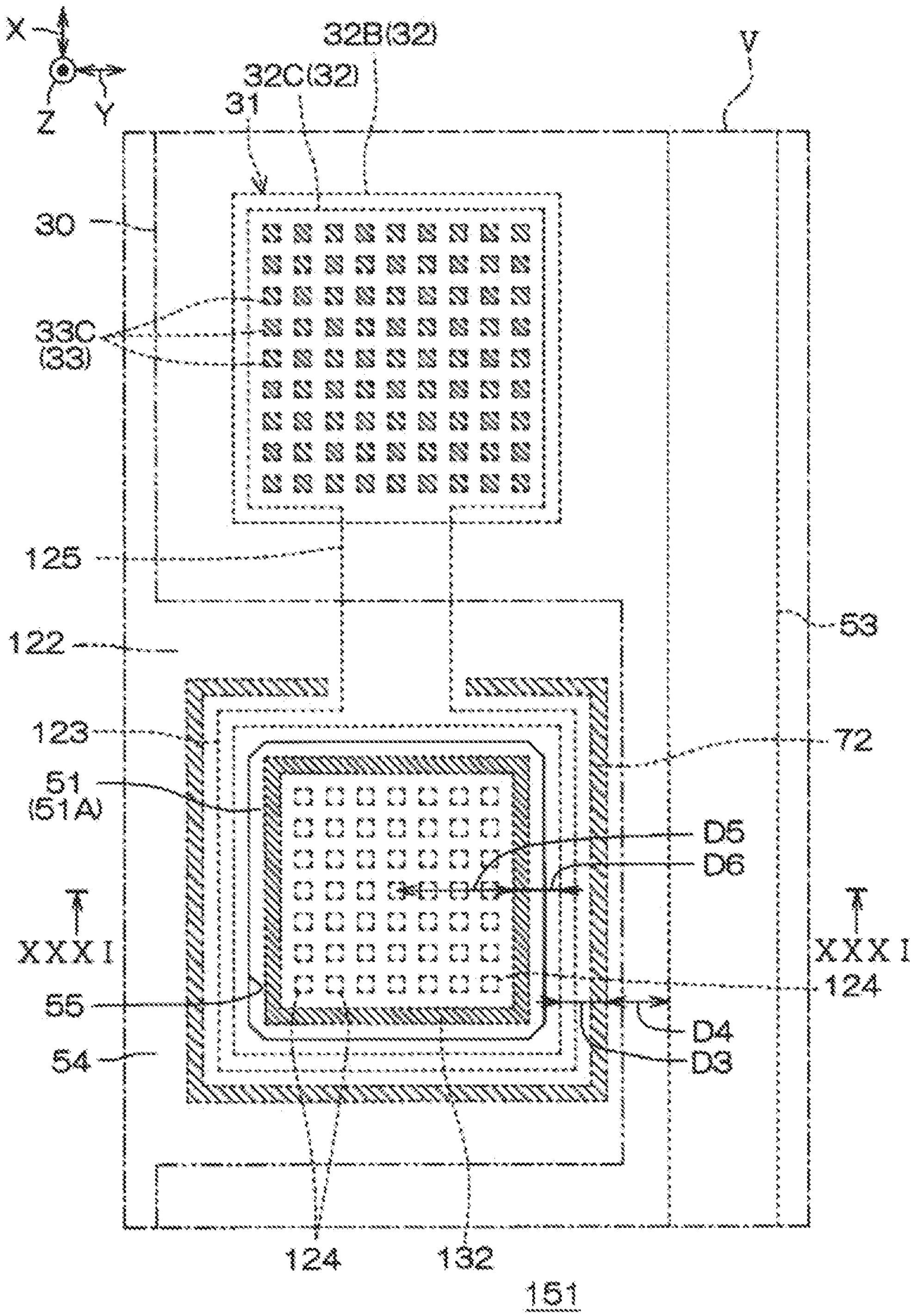
Figure 31:
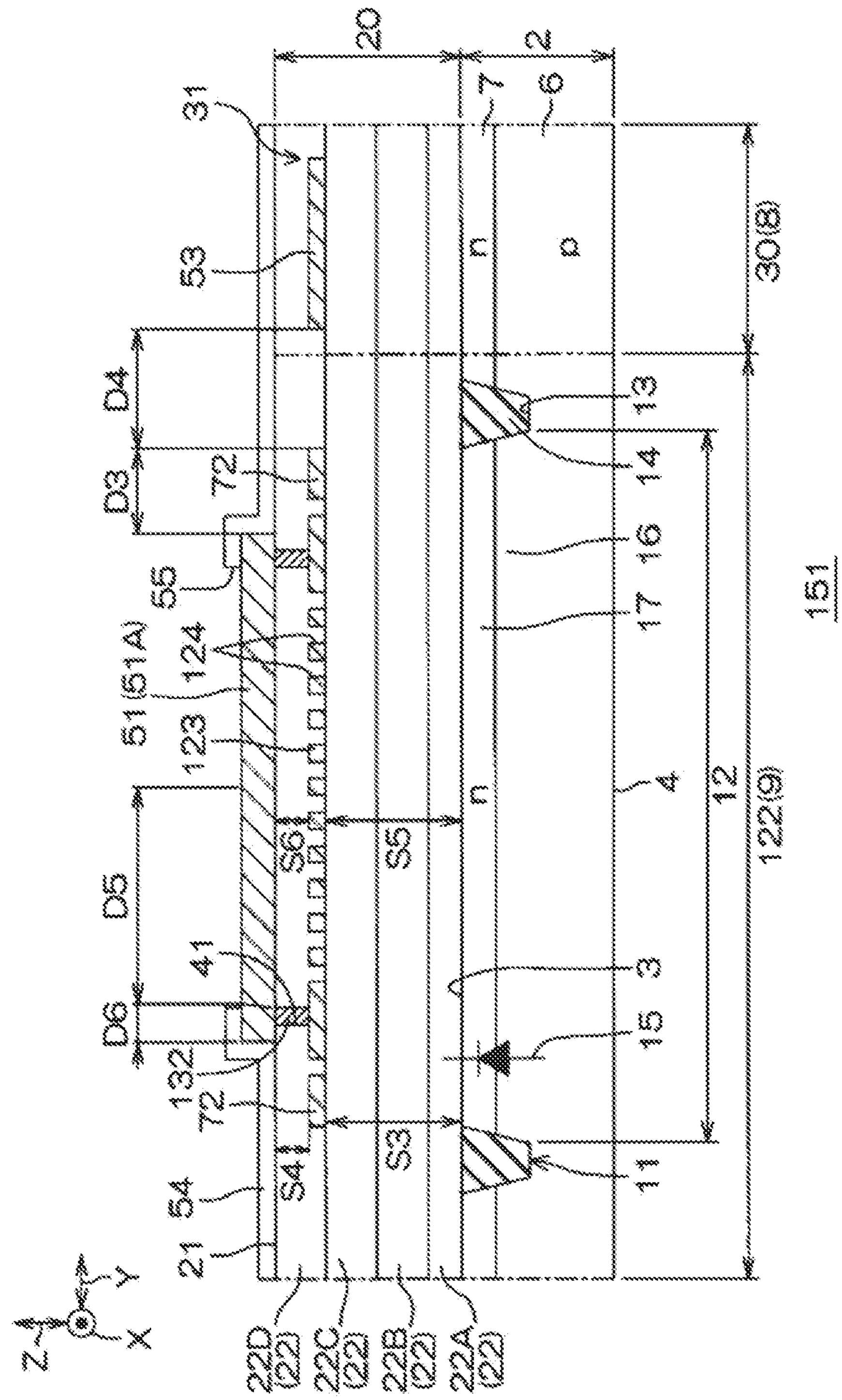
FIG. 31 is a cross-sectional view taken along a line XXXI-XXXI shown in FIG. 30.

According to this structure, even in the case where cracks occur starting from the terminal electrode 51, the cracks can be terminated by the outer dummy wiring 72. As a result, it is possible to suppress the expansion of cracks to the outside of the connection region 122 in the plan view. That is, the expansion of cracks from the connection region 122 to the multilayer wiring region 30 can be suppressed by the outer dummy wiring 72. FIG. 30 corresponds to FIG. 21 and is an enlarged view showing a semiconductor device 151 according to an eleventh embodiment of the present disclosure together with a seal via electrode 132 according to a first configuration example and an outer dummy wiring 72 according to the first configuration example. FIG. 31 is a cross-sectional view taken along a line XXXI-XXXI shown in FIG. 30. Hereinafter, structures corresponding to the structures described for the semiconductor device 121 and the like according to the eighth embodiment are denoted by the same reference numerals, and explanation thereof will not be repeated.

Referring to FIGS. 30 and 31, the semiconductor device 151 includes the seal via electrode 132 according to the ninth embodiment (see FIG. 25) and the outer dummy wiring 72 according to the tenth embodiment (see FIG. 27). In this embodiment, the semiconductor device 151 includes the seal via electrode 132 according to the first configuration example and the outer dummy wiring 72 according to the first configuration example. The semiconductor device 151 may include any one of the seal via electrodes 132 (see FIGS. 26A to 26B) according to the second and third configuration examples, instead of the seal via electrode 132 according to the first configuration example. Further, the semiconductor device 151 may include a seal via electrode 132 having a form in which the features of at least two of the seal via electrodes 132 according to the first to third configuration examples are combined, instead of the seal via electrode 132 according to the first configuration example.

Further, the semiconductor device 151 may include any one of the outer dummy wirings 72 (see FIGS. 29A to 29D) according to the second to fifth configuration examples, instead of the outer dummy wirings 72 according to the first configuration example. Further, the semiconductor device 151 may include an outer dummy wiring 72 having a form in which the features of at least two of the outer dummy wirings 72 according to the first to fifth configuration examples are combined, instead of the outer dummy wiring 72 according to the first configuration example.

Figure 32:
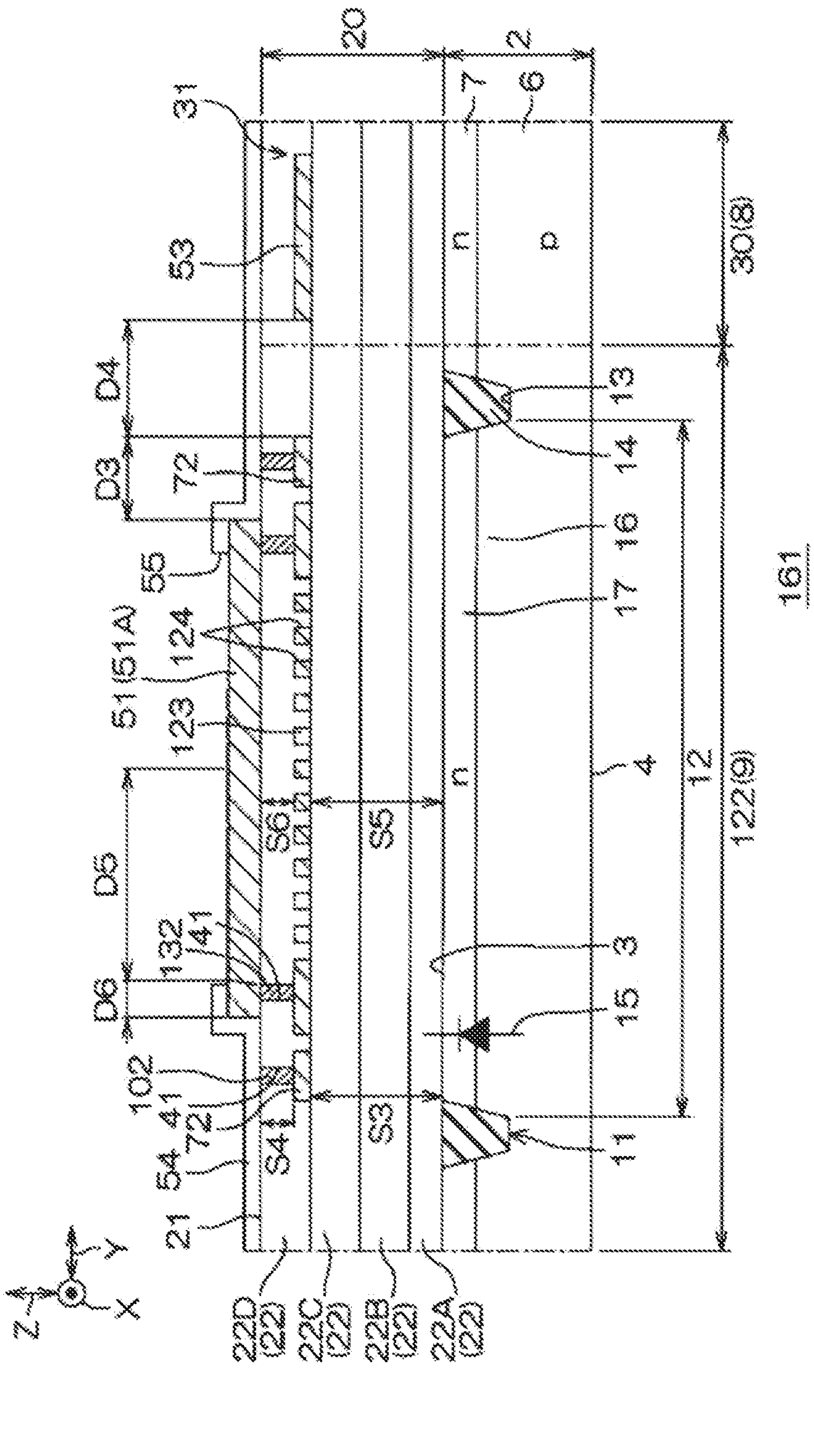
FIG. 32 corresponds to FIG. 23 and is a cross-sectional view showing a semiconductor device according to a twelfth embodiment of the present disclosure together with an outer dummy wiring according to a first configuration example, FIG. 33 corresponds to FIG. 22 and is a cross-sectional view showing a semiconductor device according to a thirteenth embodiment of the present disclosure together with a porous region according to a first configuration example.

As described above, according to the semiconductor device 151, the same effects as those described for the semiconductor device 131 according to the ninth embodiment and those described for the semiconductor device 141 according to the tenth embodiment can be obtained. FIG. 32 corresponds to FIG. 23 and is a cross-sectional view showing a semiconductor device 161 according to a twelfth embodiment of the present disclosure together with an outer dummy wiring 72 according to a first configuration example. Hereinafter, structures corresponding to the structures described for the semiconductor device 121 and the like are denoted by the same reference numerals, and explanation thereof will not be repeated.

The semiconductor device 161 includes an outer via electrode 102 disposed in the connection region 122, in addition to the outer dummy wiring 72 according to the first configuration example. The outer via electrode 102 is buried in the via opening 41 formed in the connection region 122. The outer via electrode 102 is buried at a thickness position between the terminal electrode 51 and the outer dummy wiring 72 so as to be connected to the outer dummy wiring 72 in the connection region 122. The outer via electrode 102 is not connected to the terminal electrode 51.

The outer via electrode 102 may be formed in an electrical floating state, That is, the outer via electrode 102 may fix the outer dummy wiring 72 in an electrical floating state. In this embodiment, the outer via electrode 102 is formed in a line shape extending along the outer dummy wiring 72 at an interval from the lead-out wiring 125 in the plan view. The outer dummy wiring 72 may be formed in at least a portion along the multilayer wiring region 30 (the different potential wiring 53) in the plan view. The outer via electrode 102 extends so as to surround the terminal electrode 51 at an interval from the lead-out wiring 125 in the plan view.

Although not shown in detail, the outer via electrode 102 may have a plurality of segment portions separated and arranged in a dot shape at intervals along the outer dummy wiring 72. Further, the outer via electrode 102 may have a plurality of segment portions separated and arranged in a line shape at intervals along the outer dummy wiring 72. Like the wiring via electrode 33, the outer via electrode 102 includes a via barrier film 42 and a via main electrode 43 laminated in this order from the inner wall side of the via opening 41. In this embodiment, the outer via electrode 102 is formed of a tungsten plug electrode, like the wiring via, electrode 33. In this embodiment, the top insulating film 54 covers the entire region of the outer via electrode 102 on the insulating layer 20.

In this embodiment, an example in which the semiconductor device 161 includes the outer dummy wiring 72 according to the first configuration example has been described. However, the semiconductor device 161 may include any one of the outer dummy wirings 72 (see FIGS. 29A to 29D) according to the second to fifth configuration examples, instead of the outer dummy wirings 72 according to the first configuration example. In these cases, the outer via electrode 102 may be formed in a line shape, an annular shape, or a dot shape along the outer dummy wiring 72.

Further, the semiconductor device 161 may include an outer dummy wiring 72 having a form in which the features of at least two of the outer dummy wirings 72 according to the first to fifth configuration examples are combined, instead of the outer dummy wirings 72 according to the first configuration example. In this case, the outer via electrode 102 may be formed in a line shape, an annular shape, or a dot shape along the outer dummy wiring 72.

As described above, the semiconductor device 161 can also exhibit the same effects as those described for the semiconductor device 141 according to the tenth embodiment. Further, the semiconductor device 101 includes the outer via electrode 102 disposed in the connection region 122, in addition to the outer dummy wiring 72. The outer via electrode 102 is buried at a thickness position between the terminal electrode 51 and the outer dummy wiring 72 so as to be connected to the outer dummy wiring 72 in the connection region 122. According to this structure, even in the case where cracks occur starting from the terminal electrode 51, the cracks can be terminated by the outer via electrode 102. The outer via electrode 102 can also be applied to the semiconductor device 151 according to the eleventh embodiment.

Figure 33:
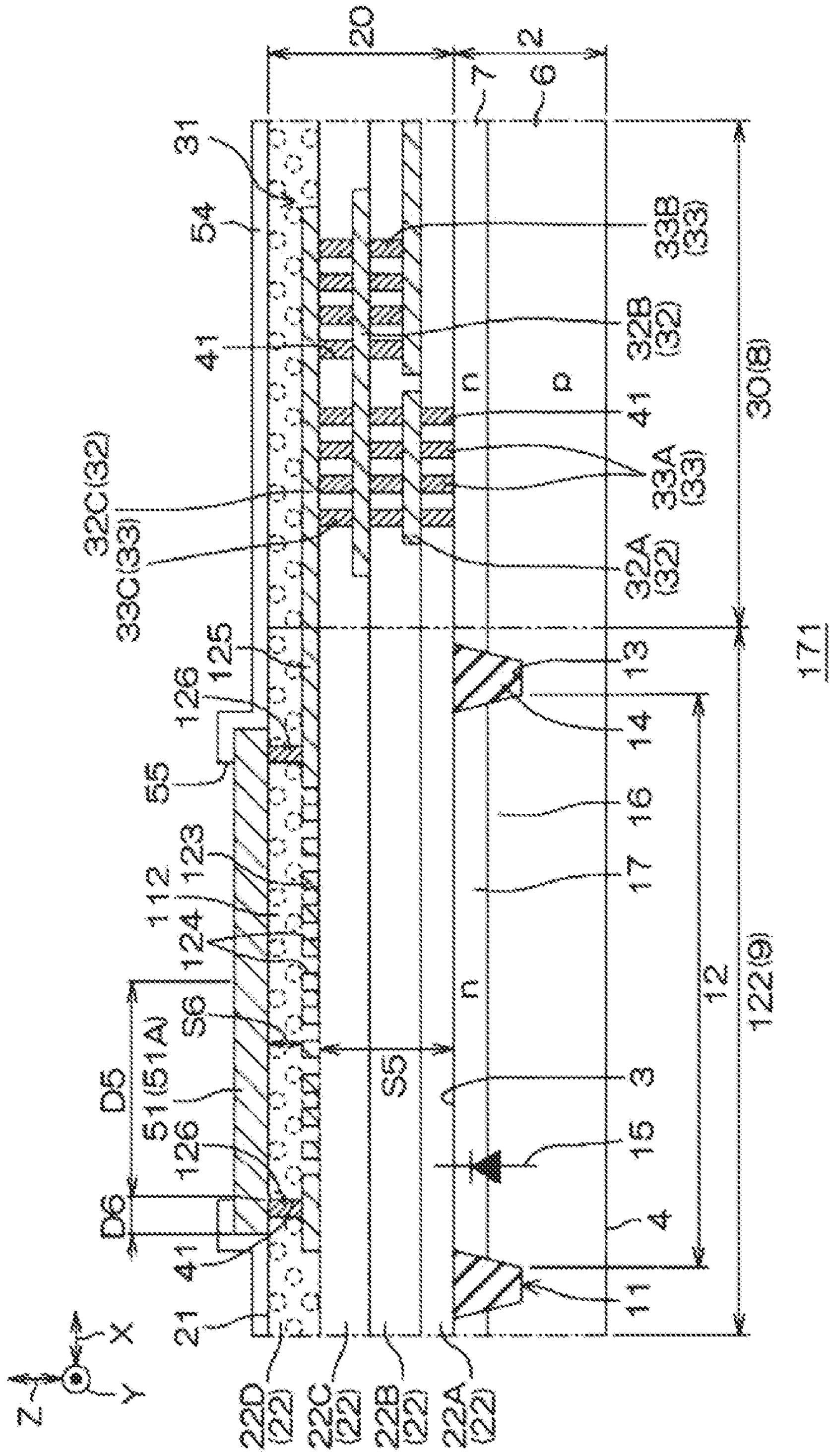

FIG. 33 corresponds to FIG. 22 and is a cross-sectional view showing a semiconductor device 171 according to a thirteenth embodiment of the present disclosure together with a porous region 112 according to a first configuration example. Hereinafter, structures corresponding to the structures described for the semiconductor device 121 and the like according to the eighth embodiment are denoted by the same reference numerals, and explanation thereof will not be repeated. As in the case of the seventh embodiment described above, the semiconductor device 171 includes the porous region 112 formed in the surface layer portion of the insulating layer 20. The porous region 112 is formed of a region in which a plurality of pores are introduced in the insulating layer 20 and, in this embodiment, is formed by using the top interlayer insulating film 22 (the fourth interlayer insulating film 22D). That is, the porous region 112 is formed in the surface layer portion of the multilayer wiring region 30 and the surface layer portion of the connection region 122.

The plurality of pores are formed in the surface layer portion of the insulating layer 20 at intervals in the thickness direction and the surface direction of the insulating layer 20. That is, the plurality of pores are formed in the top interlayer insulating film 22 (the fourth interlayer insulating film 22D) at intervals in the thickness direction and the width direction of the top interlayer insulating film 22. The plurality of pores have uneven sizes in a range of 1 nm or more and 500 nm or less. The porous region 112 has a plurality of pores that fall within a range of 1 nm or more and 100 nm or less. The porous region 112 may have a plurality of pores that fall within a range of 1 nm or more and 10 nm or less.

The connection wiring 123 is disposed in the connection region 122 so as to be in contact with the porous region 112. In this embodiment, the connection wiring 123 is disposed over the third interlayer insulating film 22C and is covered with the porous region 112. The plurality of through-holes 124 are filled with the porous region 112. That is, a plurality of pores are formed in a portion of the insulating layer 20 filled in the plurality of through-holes 124.

The terminal electrode 51 is disposed over a portion of the connection region 122 where the porous region 112 is formed. In this embodiment, the terminal electrode 51 faces the connection wiring 123 with the porous region 112 interposed therebetween in the connection region 122. That is, the terminal electrode 51 faces the semiconductor chip 2 with the porous region 112 and the connection region 122 interposed therebetween. The terminal electrode 51 may have a thickness less than the thickness of the porous region 112.

Figure 34:
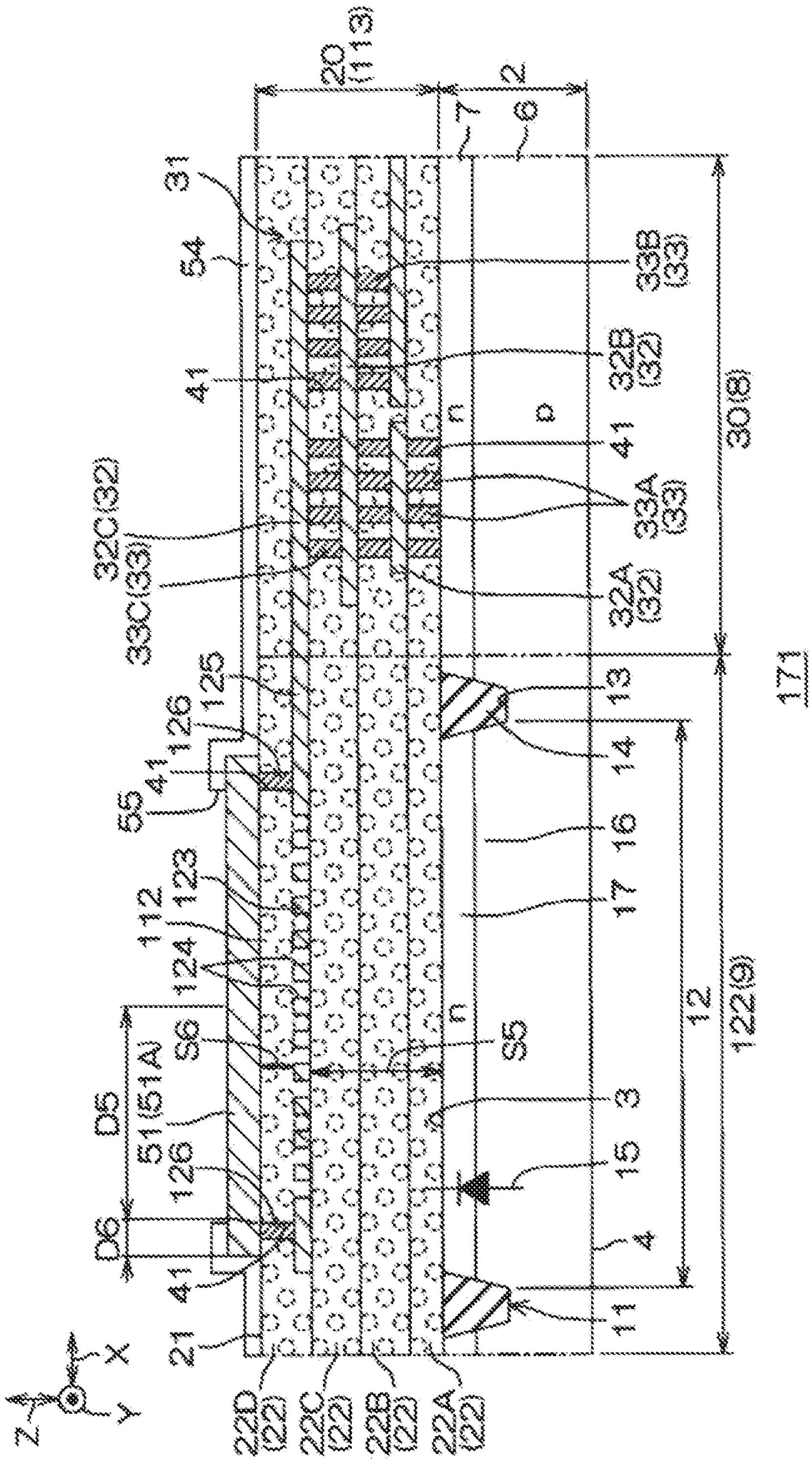
FIG. 34 is a cross-sectional view showing the semiconductor device shown in FIG. 33 together with a porous region according to a second configuration example.

The porous region 112 may take a form shown in FIG. 34. FIG. 34 is a cross-sectional view showing the semiconductor device 171 shown in FIG. 33 together with a porous region 112 according to a second configuration example. The porous region 112 according to the second configuration example is formed in the entire region of the insulating layer 20 in the thickness direction thereof. That is, the insulating layer 20 is formed of a porous insulating layer 113. Further, the multilayer wiring 31 is formed in the porous insulating layer 113, and the connection wiring 123 is formed in the porous insulating layer 113. The connection wiring 123 faces the semiconductor chip 2 with a portion of the porous insulating layer 113 interposed therebetween, and the terminal electrode 51 faces the connection wiring 123 with a portion of the porous insulating layer 113 interposed therebetween.

As described above, the semiconductor device 171 can also exhibit the same effects as those described for the semiconductor device 121 according to the eighth embodiment. Further, the semiconductor device 171 includes the porous region 112 formed in at least the surface layer portion of the insulating layer 20. The porous region 112 is formed of the region in which a plurality of pores are introduced in the insulating layer 20. According to this structure, an elastic modulus in the surface layer portion of the insulating layer 20 can be reduced by the porous region 112.

As a result, the stress at the time of connecting the conducting wires 312 to the terminal electrode 51 can be relaxed by the porous region 112. Further, even in the case where cracks occur starting from the terminal electrode 51, an impact caused by the cracks can be released (relaxed) by the plurality of pores to terminate the cracks. As a result, the expansion of cracks can be suppressed. The porous region 112 according to the thirteenth embodiment can be applied not only to the eighth embodiment but also to the ninth to twelfth embodiments.

Figure 35:
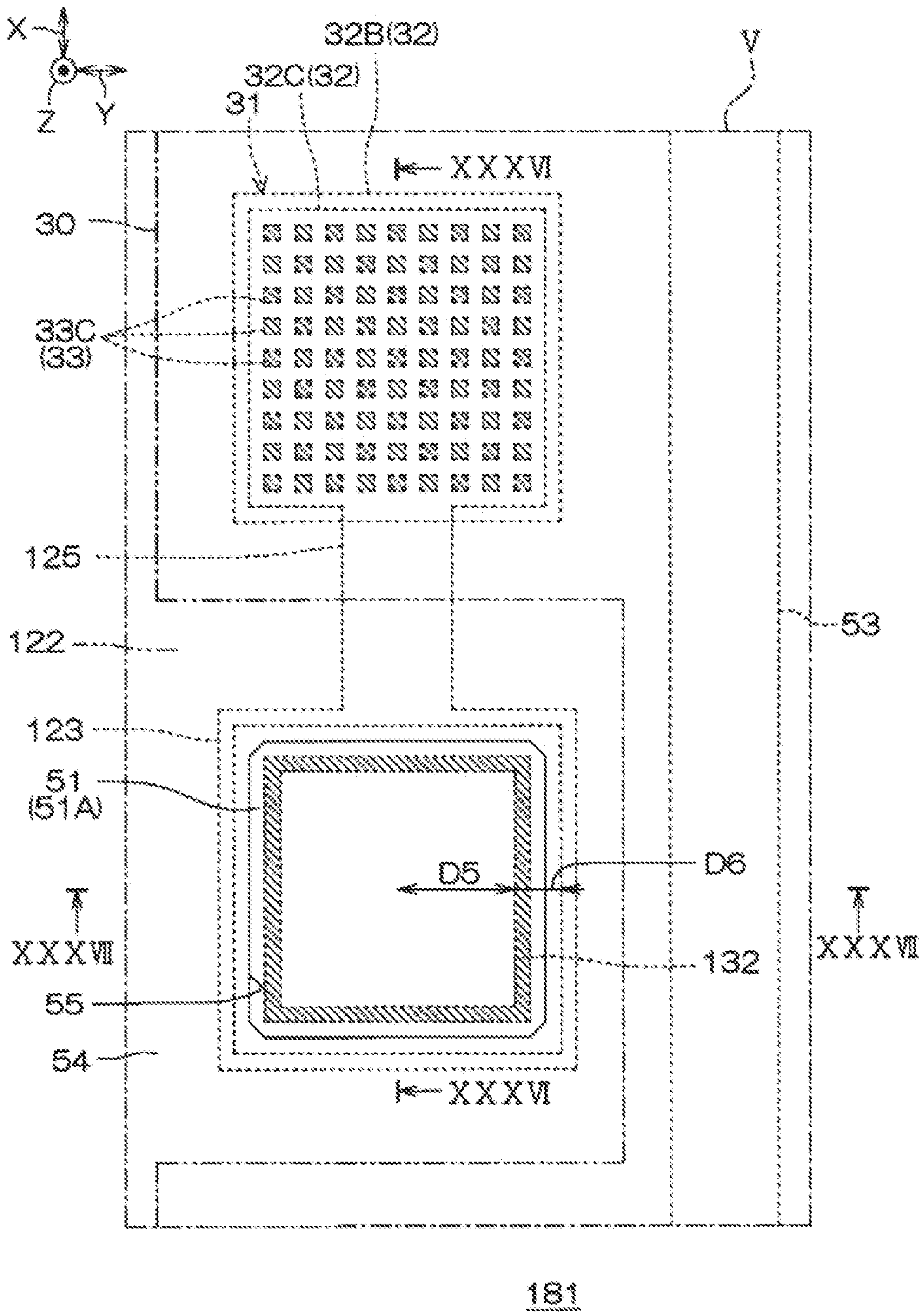
FIG. 35 corresponds to FIG. 5 and is an enlarged view showing a semiconductor device according to a fourteenth embodiment of the present disclosure together with a seal via electrode according to a first configuration example.
Figure 36:
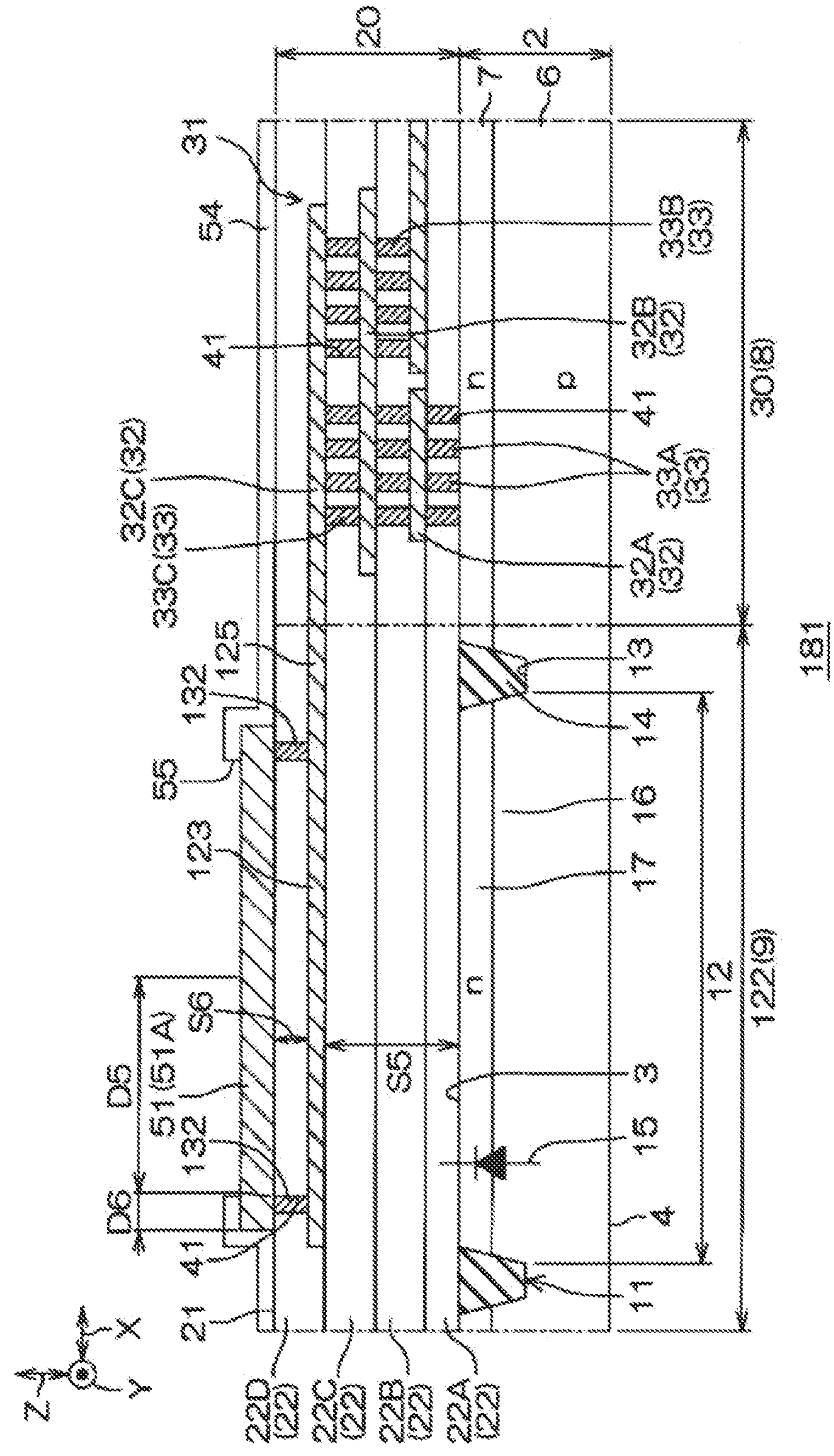
FIG. 36 is a cross-sectional view taken along a line XXXVI-XXXVI shown in FIG. 35.
Figure 37:
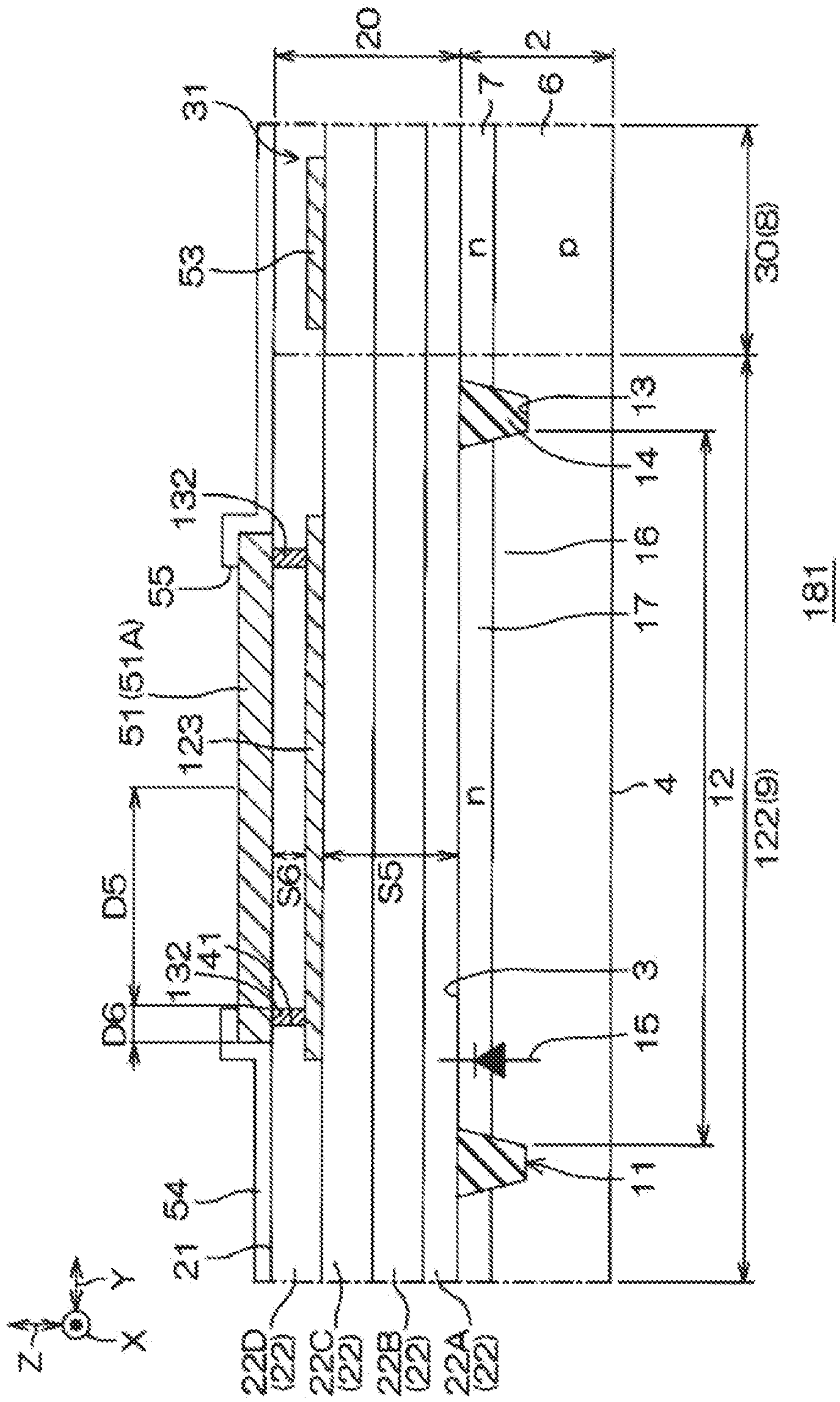
FIG. 37 is a cross-sectional view taken along a line XXXVII-XXXVII shown in FIG. 35.

FIG. 35 corresponds to FIG. 5 and is an enlarged view showing a semiconductor device 181 according to a fourteenth embodiment of the present disclosure together with a seal via electrode 132 according to a first configuration example. FIG. 36 is a cross-sectional view taken along a line XXXVI-XXXVI shown in FIG. 35. FIG. 37 is a cross-sectional view taken along a line XXXVII-XXXVII shown in FIG. 35. Hereinafter, structures corresponding to the structures described for the semiconductor device 1 and the like are denoted by the same reference numerals, and explanation thereof will not be repeated.

The semiconductor device 181 includes a connection region 122, a connection wiring 123, a lead-out wiring 125, and a terminal electrode 51 formed in the same manner as the semiconductor device 121 and the like according to the eighth embodiment. Unlike the semiconductor device 121 and the like according to the eighth embodiment, the semiconductor device 181 does not have a plurality of through-holes 124 in the connection wiring 123. The description of the connection region 122, the connection wiring 123, the lead-out wiring 125, and the terminal electrode 51 will be omitted.

The semiconductor device 181 includes the seal via electrode 132 interposed between the connection wiring 123 and the peripheral edge of the terminal electrode 51 in the insulating layer 20 so as to be connected to the connection wiring 123 and the terminal electrode 51. The seal via electrode 132 is formed in a stripe shape extending along the peripheral edge of the terminal electrode 51 in a plan view. The seal via electrode 132 may be formed in at least a portion along the multilayer wiring region 30 (the different potential wiring 53) in the plan view. The seal via electrode 132 is buried in the via opening 41 formed in the insulating layer 20 and is formed of a single connection member connecting the connection wiring 123 and the terminal electrode 51.

The seal via electrode 132 is disposed at an interval from the inner portion to the side of the peripheral edge of the terminal electrode 51 so as to face the peripheral edge of the terminal electrode 51 in the plan view. In this embodiment, the seal via electrode 132 is interposed between the peripheral edge of the connection wiring 123 and the peripheral edge of the terminal electrode 51 in the plan view. The seal via electrode 132 extends in parallel along the side of the terminal electrode 51 in the plan view.

In this embodiment, the seal via electrode 132 is formed in an annular shape (in this embodiment, a square annular shape) that surrounds the inner portion of the terminal electrode 51 in the plan view. As a result, the seal via electrode 132 partitions a closed space in which only a portion of the insulating layer 20 is disposed in a region between the connection wiring 123 and the terminal electrode 51 in the insulating layer 20. The seal via electrode 132 may be disposed in a region close to the peripheral edge of the terminal electrode 51 with respect to the center of the terminal electrode 51. That is, the seal via electrode 132 may be disposed at a fifth distance D5 from the center of the terminal electrode 51 to the peripheral edge of the terminal electrode 51 and may be disposed at a sixth distance D6, which is less than the fifth distance D5 (D6<D5), from the peripheral edge of the terminal electrode 51 to the center of the terminal electrode 51. The fifth distance D5 and the sixth distance D6 are based on the inner edge of the seal via electrode 132 on the side of the terminal electrode 51.

Figure 38A:
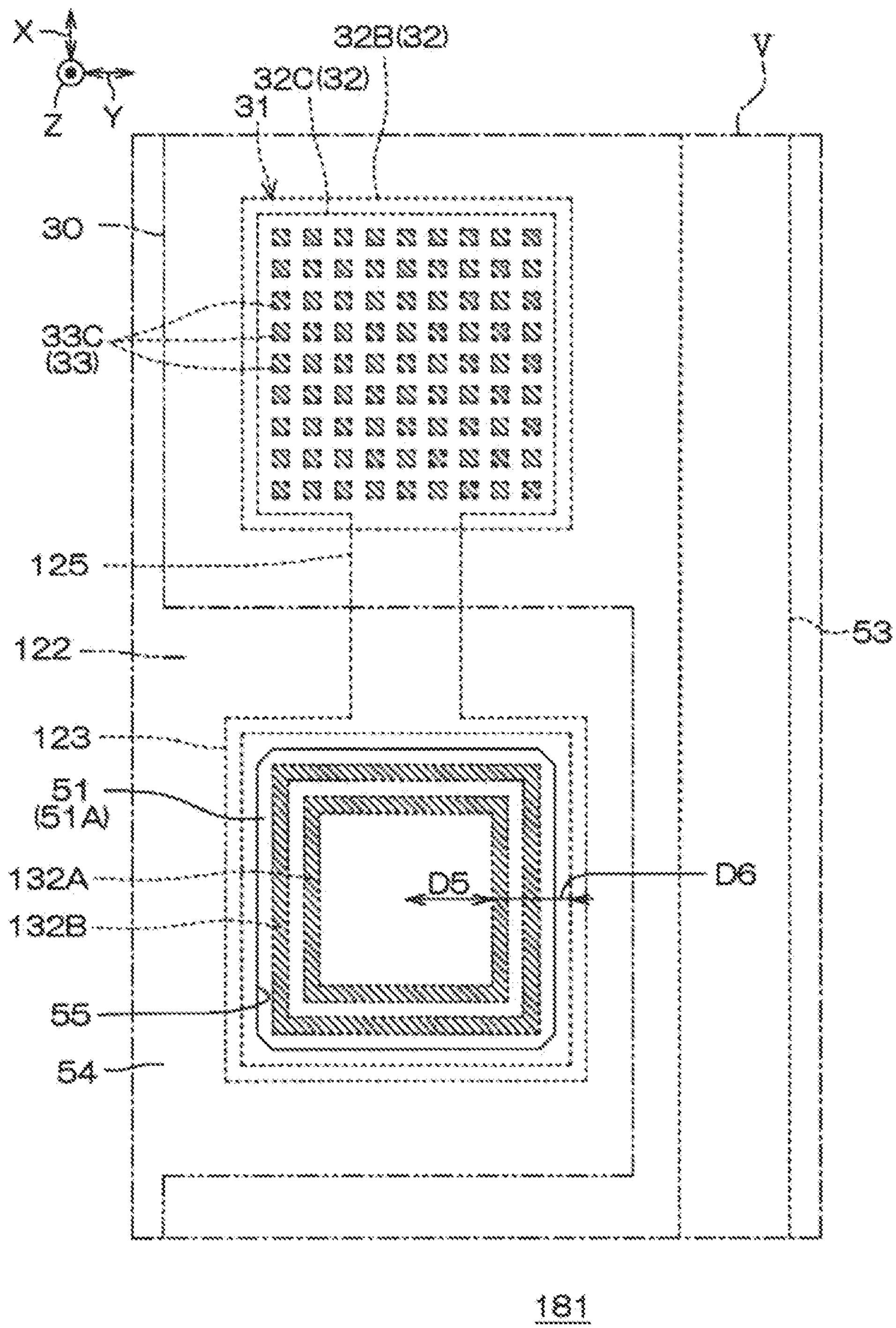
FIG. 38A is an enlarged view showing the semiconductor device shown in FIG. 35 together with a seal via electrode according to a second configuration example.

Like the wiring via electrode 33, the seal via electrode 132 includes a via barrier film 42 and a via main electrode 43 laminated in this order from the inner wall side of the via opening 41. In this embodiment, the seal via electrode 132 is formed of a tungsten plug electrode, like the wiring via electrode 33. The seal via electrode 132 can take various forms shown in FIGS. 38A and 38B. FIG. 38A is an enlarged view showing the semiconductor device 181 shown in FIG. 35 together with a seal via electrode 132 according to a second configuration example. Referring to FIG. 38A, in the second configuration example, a plurality of seal via electrodes (in this embodiment, two seal via electrodes) 132 are formed. The plurality of seal via electrodes 132 include a first seal via electrode 132A and a second seal via electrode 132B.

The first and second seal via electrodes 132A and 132B are arranged in this order with an interval from the inner portion to the side of the peripheral edge of the terminal electrode 51 so as to face the peripheral edge of the terminal electrode 51 in a plan view. Specifically, the first seal via electrode 132A is formed in an annular shape (in this embodiment, a square annular shape) that surrounds the inner portion of the terminal electrode 51 in the plan view.

The second seal via electrode 132B is interposed between the peripheral edge of the terminal electrode 51 and the first seal via electrode 132A in the plan view and is formed in a line shape extending along the peripheral edge of the terminal electrode 51. Specifically, the second seal via electrode 132B is formed in an annular shape (in this embodiment, a square annular shape) that surrounds the first seal via electrode 132A in the plan view. The first and second seal via electrodes 132A and 132B may be arranged in a region close to the peripheral edge of the terminal electrode 51 with respect to the center of the terminal electrode 51. The first seal via electrode 132A may be disposed at a fifth distance D5 from the center of the terminal electrode 51 to the peripheral edge of the terminal electrode 51 and may be disposed at a sixth distance D6, which is less than the fifth distance D5 (D6<D5), from the peripheral edge of the terminal electrode 51 to the center of the terminal electrode 51. The fifth distance D5 and the sixth distance D6 are based on the inner edge of the first seal via electrode 132A on the side of the inner portion of the terminal electrode 51.

Figure 38B:
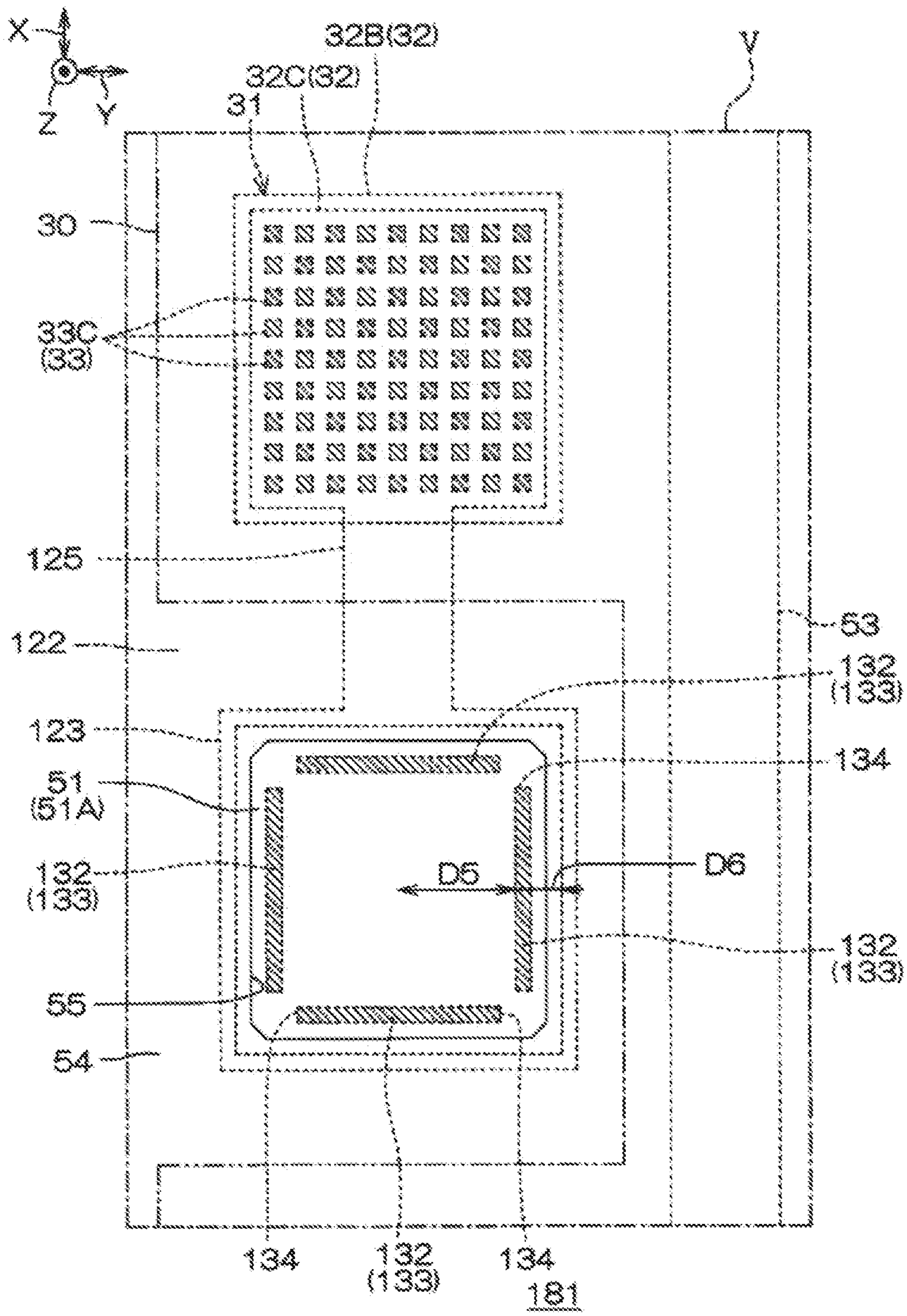
FIG. 38B is an enlarged view showing the semiconductor device shown in FIG. 35 together with a seal via electrode according to a third configuration example.

FIG. 38B is an enlarged view showing the semiconductor device 181 shown in FIG. 35 together with a seal via electrode 132 according to a third configuration example. Referring to FIG. 38B, in this embodiment, the seal via electrode 132 according to the third configuration example includes a plurality of segment portions (in this embodiment, four segment portions) 133 arranged in a line shape at intervals along the peripheral edge of the terminal electrode 51. It can be considered that the seal via electrode 132 according to the third configuration example has a form in which the seal via electrode 132 according to the first configuration example is divided into a plurality of segment portions 133 by a plurality of removal portions 134. In this embodiment, the plurality of removal portions 134 are formed at the corners (specifically, four corners) of the seal via electrode 132, and each segment portion 133 is formed in a line shape extending along each side of the terminal electrode 51.

A seal via electrode 132 having a form in which the features of at least two of the seal via electrodes 132 according to the first to third configuration examples are combined may be adopted. As described above, the semiconductor device 181 includes the semiconductor chip 2, the insulating layer 20, the connection wiring 123, the terminal electrode 51, and the seal via electrode 132. The insulating layer 20 is formed over the semiconductor chip 2. The connection wiring 123 is disposed in the insulating layer 20. The terminal electrode 51 is disposed over the insulating layer 20 so as to face the connection wiring 123. The seal via electrode 132 is interposed between the connection wiring 123 and the peripheral edge of the terminal electrode 51 in the insulating layer 20 so as to be connected to the connection wiring 123 and the terminal electrode 51 and is formed in a stripe shape extending along the peripheral edge of the terminal electrode 51 in a plan view.

According to this structure, even in the case where cracks occur starting from the terminal electrode 51, the cracks can be terminated by the seal via electrode 132. As a result, the expansion of cracks to the outside of the terminal electrode 51 in the plan view can be suppressed. The seal via electrode 132 may be formed in an annular shape surrounding the inner portion of the terminal electrode 51 in the plan view. According to this structure, the expansion of cracks can be suppressed over the entire circumference of the terminal electrode 51.

The seal via electrode 132 may partition a closed space in which only the insulating layer 20 is disposed in a region between the connection wiring 123 and the terminal electrode 51 in the insulating layer 20. The seal via electrode 132 may be formed of a single connection member connecting the connection wiring 123 and the terminal electrode 51. That is, the seal via electrode 132 may form a single current path connecting the connection wiring 123 and the terminal electrode 51.

The seal via electrode 132 may be interposed between the peripheral edge of the connection wiring 123 and the peripheral edge of the terminal electrode 51. The seal via electrode 132 may extend in parallel along the side of the terminal electrode 51. The connection wiring 123 may be disposed in the insulation layer 20 with a fifth space S5 from the semiconductor chip 2 in the thickness direction of the insulation layer 20 and the terminal electrode 51 may be disposed with a sixth space S6, which is less than the fifth space S5 (S6<S5), from the connection wiring 123 in the thickness direction of the insulation layer 20.

The semiconductor device 181 may include the circuit device 10 and the multilayer wiring 31. The circuit device 10 is formed in the semiconductor chip 2. The multilayer wiring 31 includes a plurality of wirings 32 laminated and arranged in the thickness direction of the insulating layer 20 so as to be electrically connected to the circuit device 10. In this case, the connection wiring 123 may be electrically connected to at least one of the plurality of wirings 32.

According to this structure, the terminal electrode 51 can be electrically connected to the multilayer wiring 31 while suppressing the expansion of cracks starting from the terminal electrode 51. Further, according to this structure, since the expansion of cracks can be suppressed by the seal via electrode 132, it is possible to prevent the terminal electrode 51 and the connection wiring 123 from being short-circuited with the multilayer wiring 31 due to the cracks. In this case, the connection wiring 123 may be disposed in the insulating layer 20 at an interval from the plurality of wirings 32 in the plan view, and the terminal electrode 51 may be disposed over the connection wiring 123 at an interval from the plurality of wirings 32 in the plan view. The connection wiring 123 may face the semiconductor chip 2 with only the insulating layer 20 interposed therebetween.

The multilayer wiring 31 may be formed in a portion of the insulating layer 20 that covers the circuit device 10. The connection wiring 123 may be formed in a portion of the insulating layer 20 that covers the outside of the circuit device 10. In this structure, the connection wiring 123 and the terminal electrode 51 may face a region outside the circuit device 10 in the semiconductor chip 2. According to this structure, the circuit device 10 can be protected from the stress at the time of connecting the conducting wires 312. Further, even in the case where cracks occur in the terminal electrode 51, it is possible to suppress the physical influence and the electrical influence caused by the cracks from occurring in the circuit device 10.

The semiconductor device 181 may include an outer diode 15 (rectifier/floating rectifier). The outer diode 15 includes an anode region 16 formed in a region outside the circuit device 10 on the surface layer portion of the semiconductor chip 2 and a cathode region 17 formed in the surface layer portion of the anode region 16. In this case, the connection wiring 123 may be formed in a portion of the insulating layer 20 that covers the outer diode 15.

According to this structure, the outer diode 15 is connected in reverse bias to the semiconductor chip 2 (the device region 8). That is, the outer diode 15 shields a current path from the outer region 9 to the device region 8. According to this structure, even when an unintended current path is formed between the terminal electrode 51 and the semiconductor chip 2 in the insulating layer 20, the current path can be shielded by the outer diode 15.

The unintended current path may include an undesired current path due to cracks. In this structure, the cathode region 17 may be formed in an electrical floating state. That is, the outer diode 15 may be formed as a floating diode. According to this structure, the shielding effect of the current path can be appropriately enhanced. The semiconductor device 181 may include the different potential wiring 53. The different potential wiring 53 is formed of a portion of the multilayer wiring 31 routed in the vicinity of the connection wiring 123 in the insulating layer 20, and a potential different from that of the adjacent terminal electrode 51 is applied to the different potential wiring 53. According to this structure, the different potential wiring 53 can be protected from the stress at the time of connecting the conducting wires 312, Further, even in the case where cracks occur starting from the terminal electrode 51, it is possible to suppress the physical influence and the electrical influence caused by the cracks from occurring between the terminal electrode 51 and the different potential wiring 53. As an example, it is possible to prevent the terminal electrode 51 from being short-circuited with the different potential wiring 53 due to the cracks.

Figure 39:
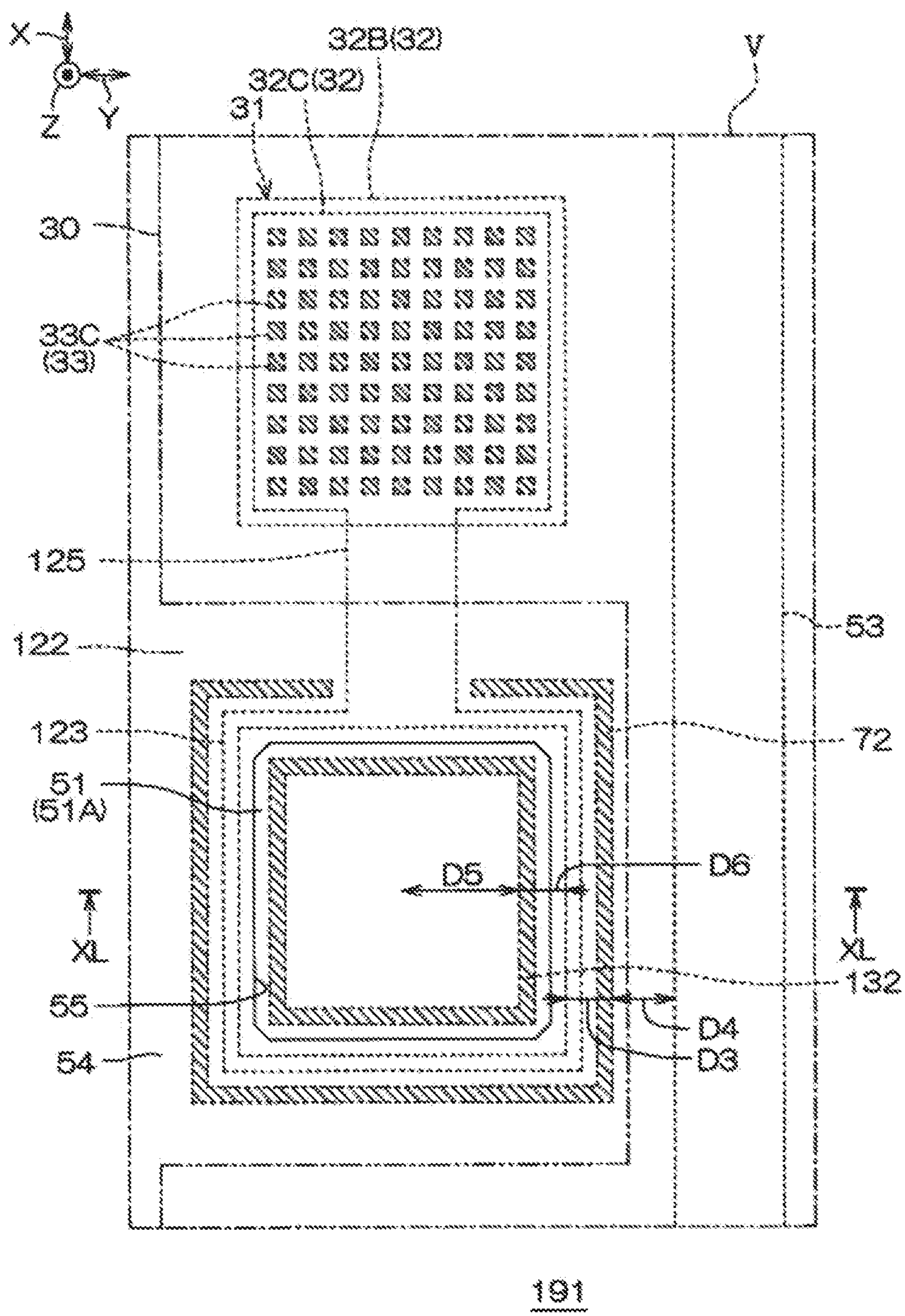
FIG. 39 corresponds to FIG. 5 and is an enlarged view showing a semiconductor device according to a fifteenth embodiment of the present disclosure together with an outer dummy, wiring according to a first configuration example.
Figure 40:
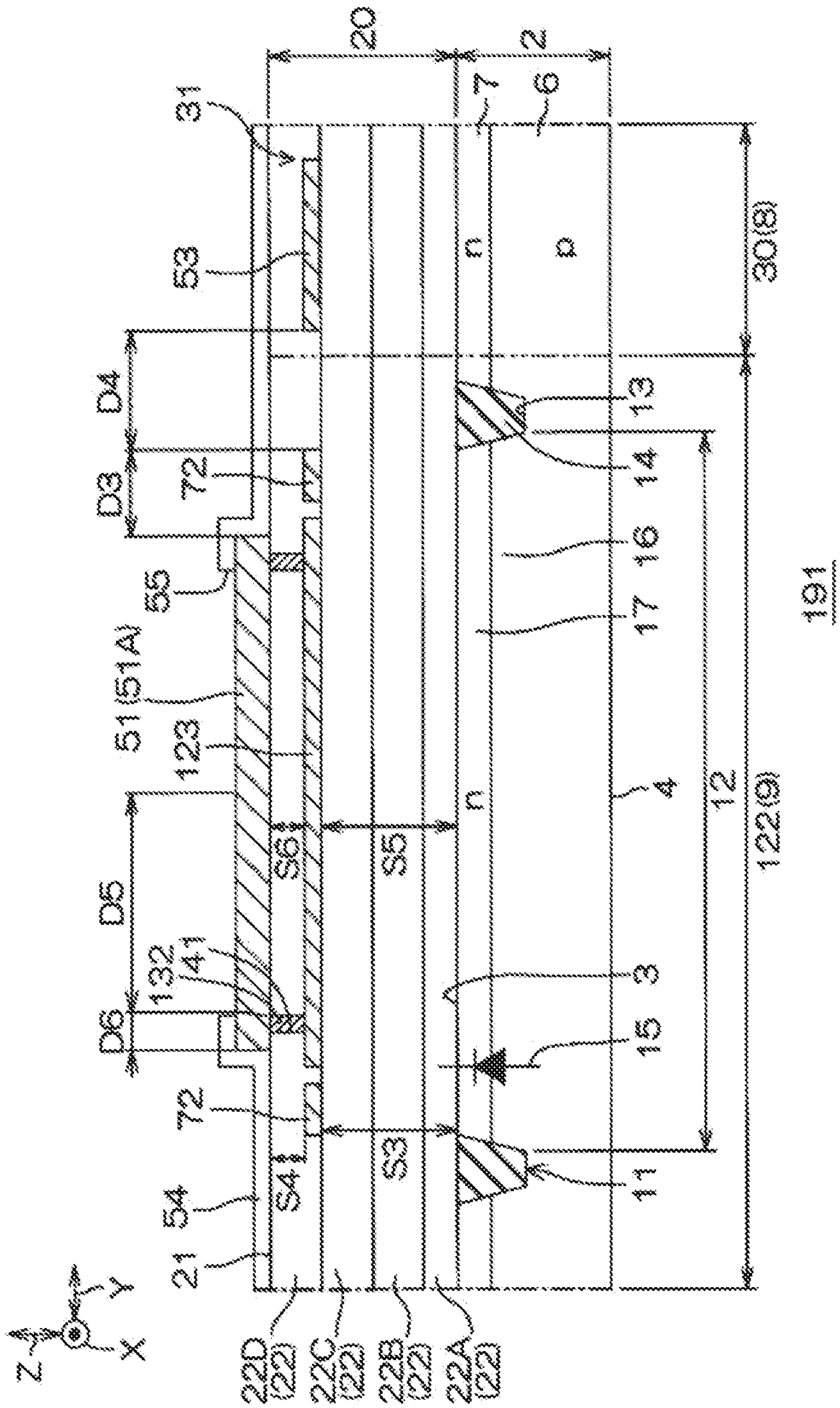
FIG. 40 is a cross-sectional view taken along a line XL-XL shown in FIG. 39.

FIG. 39 corresponds to FIG. 5 and is an enlarged view showing a semiconductor device 191 according to a fifteenth embodiment of the present disclosure together with an outer dummy wiring 72 according to a first configuration example. FIG. 40 is a cross-sectional view taken along a line XL-XL shown in FIG. 39. Hereinafter, structures corresponding to the structures described for the semiconductor device 181 and the like according to the fourteenth embodiment are denoted by the same reference numerals, and explanation thereof will not be repeated. Referring to FIGS. 39 and 40, the semiconductor device 191 includes the seal via electrode 132 according to the first configuration example. The semiconductor device 191 may include any one of the seal via electrodes 132 (see FIGS. 38A and 38B) according to the second to third configuration examples, instead of the seal via electrode 132 according to the first configuration example. Further, the semiconductor device 191 may include a seal via electrode 132 having a form in which the features of at least two of the seal via electrodes 132 according to the first to third configuration examples are combined, instead of the seal via electrode 132 according to the first configuration example.

The semiconductor device 191 includes a plurality of outer dummy wirings 72 (dummy wirings) arranged in the plurality of connection regions 122, respectively, so as to be located in at least a region between the terminal electrode 51 and the multilayer wiring region 30 in a plan view. FIGS. 39 and 40 show a form in which one outer dummy wiring 72 is disposed below one terminal electrode 51 (the first terminal electrode 51A). Further, in FIG. 39, the outer dummy wiring 72 is shown by hatching. Hereinafter, one outer dummy wiring 72 will be described as an example.

The outer dummy wiring 72 is disposed apart from the connection wiring 123, the terminal electrode 51, and the multilayer wiring region 30 (the plurality of wirings 32) in the plan view and is electrically independent from the connection wiring 123, the multilayer wiring 31 (the plurality of wirings 32), and the terminal electrode 51. That is, the outer dummy wiring 72 is also electrically independent from the plurality of device regions 8. Specifically, the outer dummy wiring 72 is formed in an electrical floating state.

The outer dummy wiring 72 may be disposed in a region close to the terminal electrode 51 with respect to the multilayer wiring 31. That is, the outer dummy wiring 72 may be disposed at a third distance D3 from the terminal electrode 51 to the side of the multilayer wiring 31 in a plan view and may be disposed at a fourth distance D4, which exceeds the third distance D3 (D3<D4), from the multilayer wiring 31 to the side of the terminal electrode 51. The third distance D3 and the fourth distance D4 are based on the outer edge of the outer dummy wiring 72 on the side of the multilayer wiring region 30.

The outer dummy wiring 72 may be disposed in the connection region 122 in a region close to the terminal electrode 51 with respect to the semiconductor chip 2. That is, the outer dummy wiring 72 may be disposed with a third space S3 from the semiconductor chip 2 in the thickness direction of the insulating layer 20 and may be disposed with a fourth space 54, which is less than the third space S3 (S4<S3), from the terminal electrode 51 in the thickness direction of the insulating layer 20. In this embodiment, the outer dummy wiring 72 is formed in the form of a film on the third interlayer insulating film 22C located directly below the top interlayer insulating film 22 (the fourth interlayer insulating film 22D). That is, the outer dummy wiring 72 is disposed in the same layer as the connection wiring 123.

The outer dummy wiring 72 faces a region (the outer region 9) outside the plurality of device regions 8 in the plan view. In this embodiment, the outer dummy wiring 72 faces a region (the isolation region 12) surrounded by the plurality of isolation structures 11 in the plan view. That is, the outer dummy wiring 72 faces the outer diode 15 in the plan view. The outer dummy wiring 72 may face the isolation region 12 spaced inward from the isolation structure 11 in the plan view.

In this embodiment, the outer dummy wiring 72 may face the semiconductor chip 2 (the outer diode 15) with only a portion of the insulating layer 20 interposed therebetween. That is, a portion of the multilayer wiring 31 is not formed its a region directly below the outer dummy wiring 72 in the connection region 122. In the region directly below the outer dummy wiring 72, a current path connecting the outer dummy wiring 72 and the semiconductor chip 2 in the thickness direction of the insulating layer 20 is shielded by a portion of the insulating layer 20 and the outer diode 15. A portion of the multilayer wiring 31 may be formed in the region directly below the outer dummy wiring 72 in the connection region 122. In this case, the bottom wiring 32 (the first wiring 32A) of the multilayer wiring 31 may not formed directly above the outer diode 15.

The outer dummy wiring 72 is formed in a line shape extending along the connection wiring 123 in the plan view. The outer dummy wiring 72 may be formed in al least a portion along the multilayer g region 30 (the different potential wiring 53) in the plan view. In the plan view, it faces the seal via electrode 132 along the plane direction of the insulating main surface 21. The outer dummy wiring 72 may face the seal via electrode 132 from a plurality of directions in the plan view. The outer dummy wiring 72 may face the connection wiring 123 from a plurality of directions in the plan view.

Figure 41A:
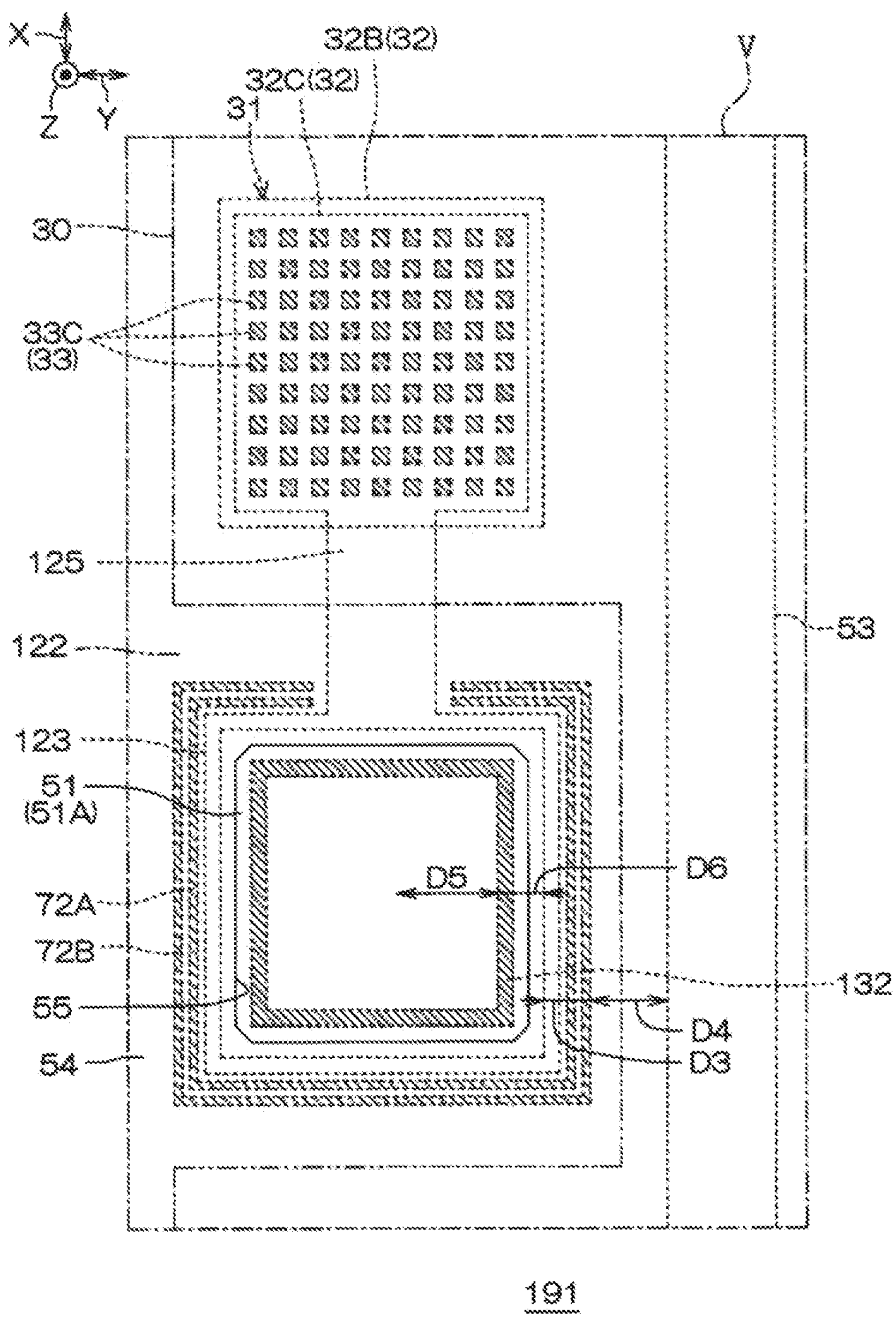
FIG. 41A is an enlarged view showing the semiconductor device shown in FIG. 39 together with an outer dummy wiring according to a second configuration example.

In this embodiment, the outer dummy wiring 72 extends along the connection wiring 123 so as to surround the connection wiring 123 at an interval from the lead-out wiring 125 in the plan view. Like the plurality of wirings 32, the outer dummy wiring 72 includes a first harrier film 34, a main wiring film 35, and a second barrier film 36 laminated in this order from the side of the first main surface 3. The outer dummy wiring 72 may take various forms shown in FIGS. 41A to 41D. FIG. 41A is an enlarged view showing the semiconductor device 191 shown in FIG. 39 together with an outer dummy wiring 72 according to a second configuration example. Referring to FIG. 41A, in the second configuration example, a plurality of outer dummy wirings (in this embodiment, two outer dummy wirings) 72 are formed. The plurality of outer dummy wirings 72 include a first outer dummy wiring 72A and a second outer dummy wiring 72B.

The first and second outer dummy wirings 72A and 72B are arranged in a plurality of connection regions 122, respectively, so as to be located in at least a region between the terminal electrode 51 and the multilayer wiring region 30 in a plan view. The first and second outer dummy wirings 72A and 72B are arranged in this order from the terminal electrode 51 toward the multilayer wiring region 30 side in the plan view. In this embodiment, the first outer dummy wiring 72A is formed in a line shape extending along the terminal electrode 51 in the plan view. Specifically, the first outer dummy wiring 72A extends so as to surround the connection wiring 123 at an interval from the lead-out wiring 125 in the plan view. In this embodiment, the second outer dummy wiring 72B is formed in a line shape extending along the terminal electrode 51. Specifically, the second outer dummy wiring 72B extends so as to surround the first outer dummy wiring 72A at an interval from the lead-out wiring 125 in the plan view.

The first and second outer dummy wirings 72A and 72B may be arranged in a region close to the terminal electrode 51 with respect to the multilayer wiring 31. That is, the second outer dummy wiring 72B may be disposed at a third distance D3 from the terminal electrode 51 to the side of the multilayer wiring 31 and may be disposed at a fourth distance D4, which exceeds the third distance D3 (D3<D4), from the multilayer wiring 31 to the side of the terminal electrode 51. The third distance D3 and the fourth distance D4 are based on the outer edge of the second outer dummy wiring 72B on the side of the multilayer wiring region 30*n*.

In this embodiment, an example in which the first and second outer dummy wirings 72A and 72B are arranged over the same layer (the third interlayer insulating film 22C) has been described. However, the first and second outer dummy wirings 72A and 72B may be arranged in different layers. For example, the first outer dummy wiring 72A may be disposed over the third interlayer insulating film 22C, while the second outer dummy wiring 72B may be disposed over the second interlayer insulating film 22B. In this case, the second outer dummy wiring 72B may be formed in an annular shape surrounding the terminal electrode 51 (the connection wiring 123) in the plan view.

Further, the first outer dummy wiring 72A may be disposed over the second interlayer insulating film 22B, while the second outer dummy wiring 72B may be disposed over the third interlayer insulating film 22C. Even in these cases, the first and second outer dummy wirings 72A and 72B may be arranged so as to be close to the terminal electrode 51 with respect to the semiconductor chip 2. In this case, the first outer dummy wiring 72A may be formed in an annular shape surrounding the terminal electrode 51 (the connection wiring 123) in the plan view.

Figure 41B:
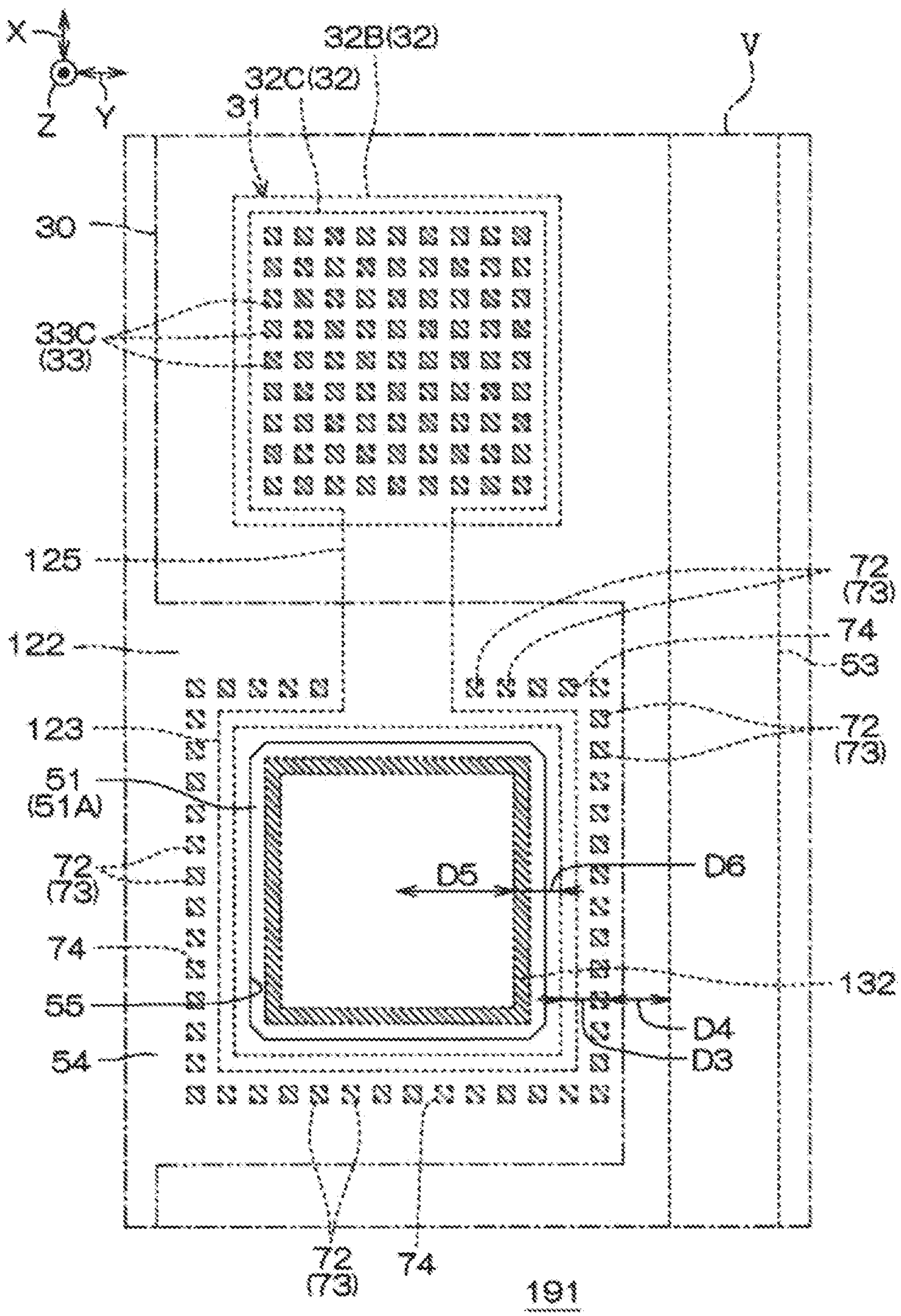
FIG. 41B is an enlarged view showing the semiconductor device shown in FIG. 39 together with an outer dummy wiring according to a third configuration example.

FIG. 41B is an enlarged view showing the semiconductor device 191 shown in FIG. 39 together with an outer dummy wiring 72 according to a third configuration example. Referring to FIG. 41B, the outer dummy wiring 72 according to the third configuration example includes a plurality of segment portions 73 arranged in a dot shape at an interval along the terminal electrode 51 in a plan view. It can be considered that the outer dummy wiring 72 according to the third configuration example has a form in which the outer dummy wiring 72 according to the first configuration example is divided into a plurality of segment portions 73 by a plurality of removal portions 74. The plurality of segment portions 73 are arranged side by side in a row along the terminal electrode 51. Each segment portion 73 is formed in a square shape in the plan view. Each segment portion 73 has an optional planar shape and may be formed in a circular shape or a polygonal shape.

Figure 41C:
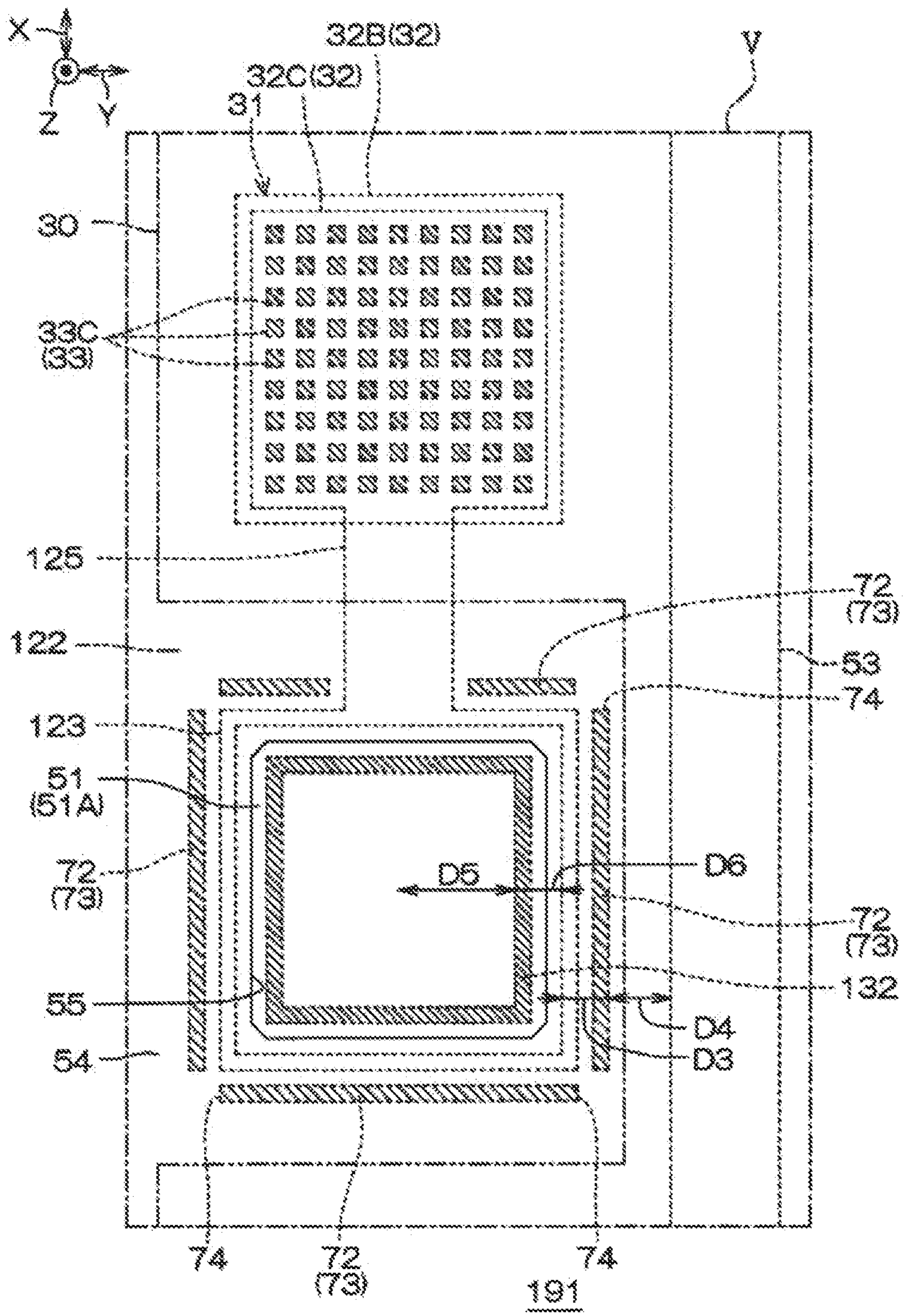
FIG. 41C is an enlarged view showing the semiconductor device shown in FIG. 39 together with an outer dummy wiring according to a fourth configuration example.

FIG. 41C is an enlarged view showing the semiconductor device 191 shown in FIG. 39 together with an outer dummy wiring 72 according to a fourth configuration example. Referring to FIG. 41C, the outer dummy wiring 72 according to the fourth configuration example includes a plurality of segment portions (in this embodiment, five segment portions) 73 arranged in a line shape at intervals along the peripheral edge of the terminal electrode 51. It can be considered that the outer dummy wiring 72 according to the fourth configuration example has a form in which the outer dummy wiring 72 according to the first configuration example is divided into a plurality of segment portions 73 by a plurality of removal portions 74. In this embodiment, the plurality of removal portions 74 are formed at the corners (specifically, four corners) of the outer dummy wiring 72, and each segment portion 73 is formed in a line shape extending along each side of the terminal electrode 51.

Figure 41D:
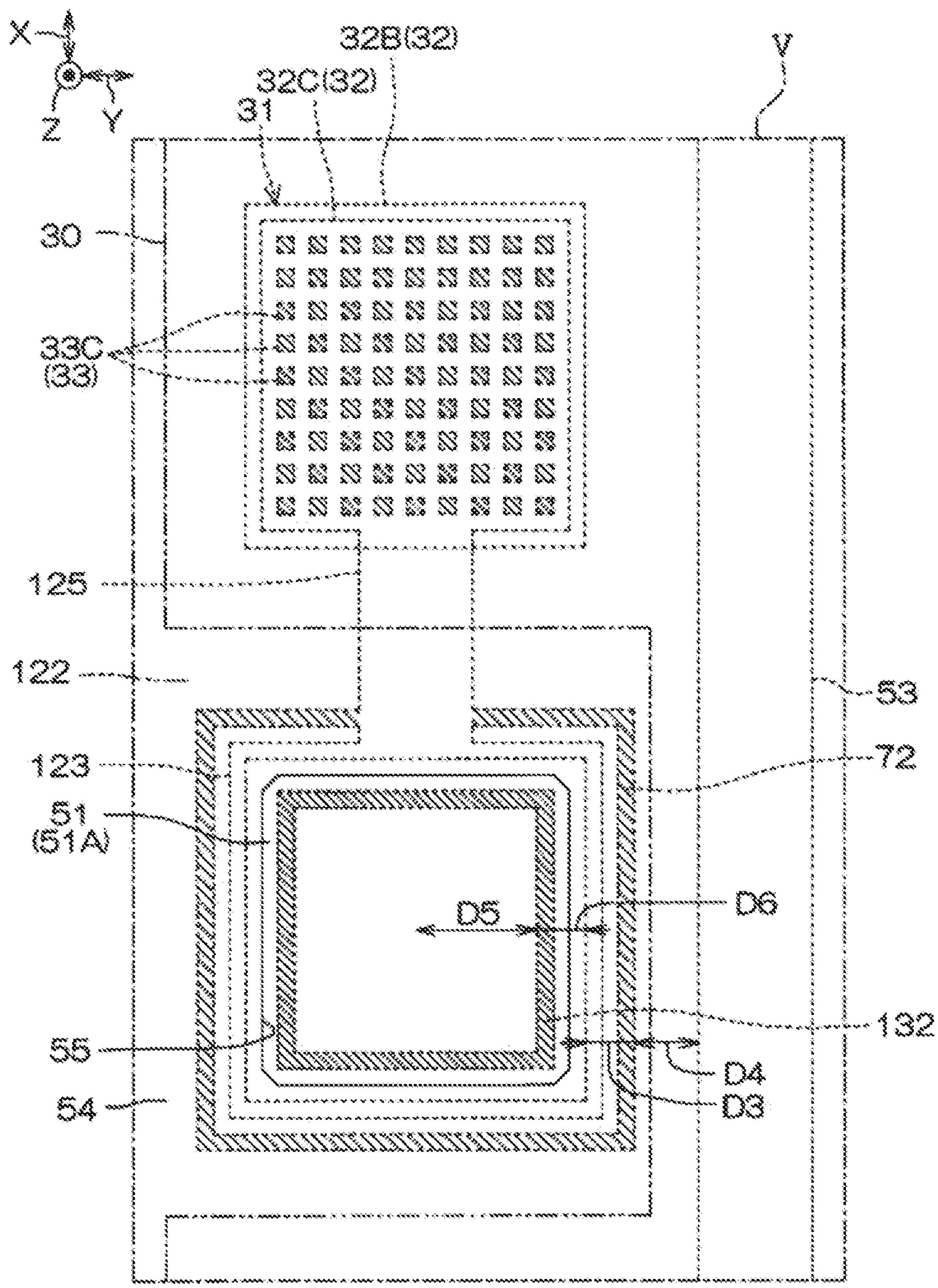
FIG. 41D is an enlarged view showing the semiconductor device shown in FIG. 39 together with an outer dummy wiring according to a fifth configuration example.

FIG. 41D is an enlarged view showing the semiconductor device 191 shown in FIG. 39 together with an outer dummy wiring 72 according to a fifth configuration example. Referring to FIG. 41D, the outer dummy wiring 72 according to the fifth configuration example is led out from one or both of the connection wiring 123 and the lead-out wiring 125 (in this embodiment, the lead-out wiring 125) so as to surround the connection wiring 123 in a plan view. In this embodiment, the outer dummy wiring 72 is electrically connected to the connection wiring 123, the terminal electrode 51, and the multilayer wiring region 30. In this embodiment, the outer dummy wiring 72 is formed in an annular shape surrounding the connection wiring 123 in the plan view.

An outer dummy wiring 72 having a form in which the features of at least two of the outer dummy wirings 72 according to the first to fifth configuration examples are combined may be adopted. As described above, the semiconductor device 191 can also exhibit the same effects as the effects described for the semiconductor device 181 according to the fourteenth embodiment. Further, the semiconductor device 191 includes the outer dummy wiring 72 (dummy wiring). The outer dummy wiring 72 is disposed in the connection region 122 so as to be located in at least the region between the terminal electrode 51 and the multilayer wiring region 30 in the plan view.

Figure 42:
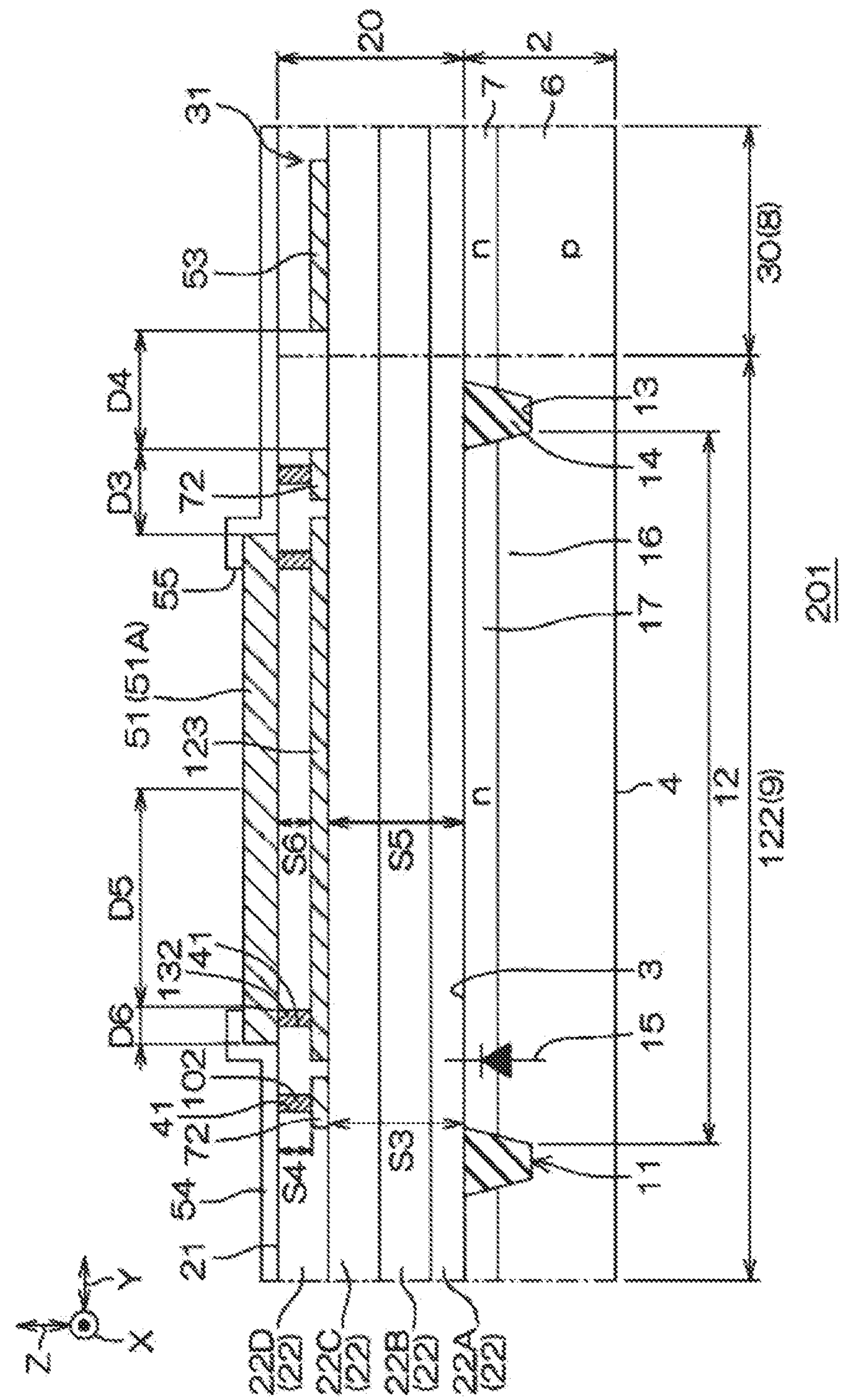
FIG. 42 corresponds to FIG. 37 and is a cross-sectional view showing a semiconductor device according to a sixteenth embodiment of the present disclosure together with a seal via electrode according to a first configuration example and an outer dummy wiring according to the first configuration example, FIG. 43 corresponds to FIG. 36 and is a cross-sectional view showing a semiconductor device according to a seventeenth embodiment of the present disclosure together with a porous region according to a first configuration example.

According to this structure, even in the case where cracks occur starting from the terminal electrode 51, the cracks can be terminated by the outer dummy wiring 72. As a result, it is possible to suppress the expansion of cracks to the outside of the connection region 122 in the plan view. That is, the expansion of cracks from the connection region 122 to the multilayer wiring region 30 can be suppressed by the outer dummy wiring 72. FIG. 42 corresponds to FIG. 37 and is a cross-sectional view showing a semiconductor device 201 according to a sixteenth embodiment of the present disclosure together with a seal via electrode 132 according to a first configuration example and an outer dummy wiring 72 according to the first configuration example. Hereinafter, structures corresponding to the structures described for the semiconductor device 181 and the like according to the fourteenth embodiment are denoted by the same reference numerals, and explanation thereof will not be repeated.

Referring to FIG. 42, the semiconductor device 201 includes the seal via electrode 132 according to the fourteenth embodiment (see FIG. 35) and the outer dummy wiring 72 according to the fifteenth embodiment (see FIG. 39). In this embodiment, the semiconductor device 201 includes the seal via electrode 132 according to the first configuration example and the outer dummy wiring 72 according to the first configuration example. The semiconductor device 201 includes an outer via electrode 102 disposed in the connection region 122. The outer via electrode 102 is buried in the via opening 41 formed in the connection region 122. The outer via electrode 102 is buried at a thickness position between the terminal electrode 51 and the outer dummy wiring 72 so as to be connected to the outer dummy wiring 72 in the connection region 122. The outer via electrode 102 is not connected to the terminal electrode 51.

The outer via electrode 102 may be formed in an electrical floating state. That is, the outer via electrode 102 may fix the outer dummy wiring 72 in an electrical floating state. In this embodiment, the outer via electrode 102 is formed in a line shape extending along the outer dummy wiring 72 at an interval from the lead-out wiring 125 in a plan view. The outer dummy wiring 72 may be formed in at least a portion along the multilayer wiring region 30 (the different potential wiring 53) in the plan view. The outer via electrode 102 extends so as to surround the terminal electrode 51 at an interval from the lead-out wiring 125 in the plan view.

Although not shown in detail, the outer via electrode 102 may have a plurality of segment portions separated and arranged in a dot shape at an interval along the outer dummy wiring 72. Further, the outer via electrode 102 may have a plurality of segment portions separated and arranged in a line shape at intervals along the outer dummy wiring 72. Like the wiring via electrode 33, the outer via electrode 102 includes a via barrier film 42 and a via main electrode 43 laminated in this order from the inner wall side of the via opening 41. In this embodiment, the outer via electrode 102 is formed of a tungsten plug electrode, like the wiring via electrode 33. In this embodiment, the top insulating film 54 covers the entire region of the outer via electrode 102 on the insulating layer 20.

In this embodiment, an example in which the semiconductor device 201 includes the seal via electrode 132 according to the first configuration example has been described. However, the semiconductor device 201 may include any one of the seal via electrodes 132 (see FIGS. 38A and 38B) according to the second and third configuration examples, instead of the seal via electrode 132 according to the first configuration example. Further, the semiconductor device 201 may include a seal via electrode 132 having a form in which the features of at least two of the seal via electrodes 132 according to the first to third configuration examples are combined, instead of the seal via electrode 132 according to the first configuration example.

Further, the semiconductor device 201 may include any one of the outer dummy wirings 72 (see FIGS. 41A to 41D) according to the second to fifth configuration examples, instead of the outer dummy wiring 72 according to the first configuration example. Further, the semiconductor device 201 may include an outer dummy wiring 72 having a form in which the features of at least two of the outer dummy wirings 72 according to the first to fifth configuration examples are combined, instead of the outer dummy wiring 72 according to the first configuration example. In these cases, the outer via electrode 102 may be formed in a line shape, an annular shape, or a dot shape along the outer dummy wiring 72.

As described above, the semiconductor device 201 can also exhibit the same effects as the effects described for the semiconductor device 191 according to the fifteenth embodiment. Further, the semiconductor device 201 includes the outer via electrode 102 disposed in the connection region 122, in addition to the outer dummy wiring 72. The outer via electrode 102 is buried at a thickness position between the terminal electrode 51 and the outer dummy wiring 72 so as to be connected to the outer dummy wiring 72 in the connection region 122. According to this structure, even in the case where cracks occur starting from the terminal electrode 51, the cracks can be terminated by the outer via electrode 102.

Figure 43:
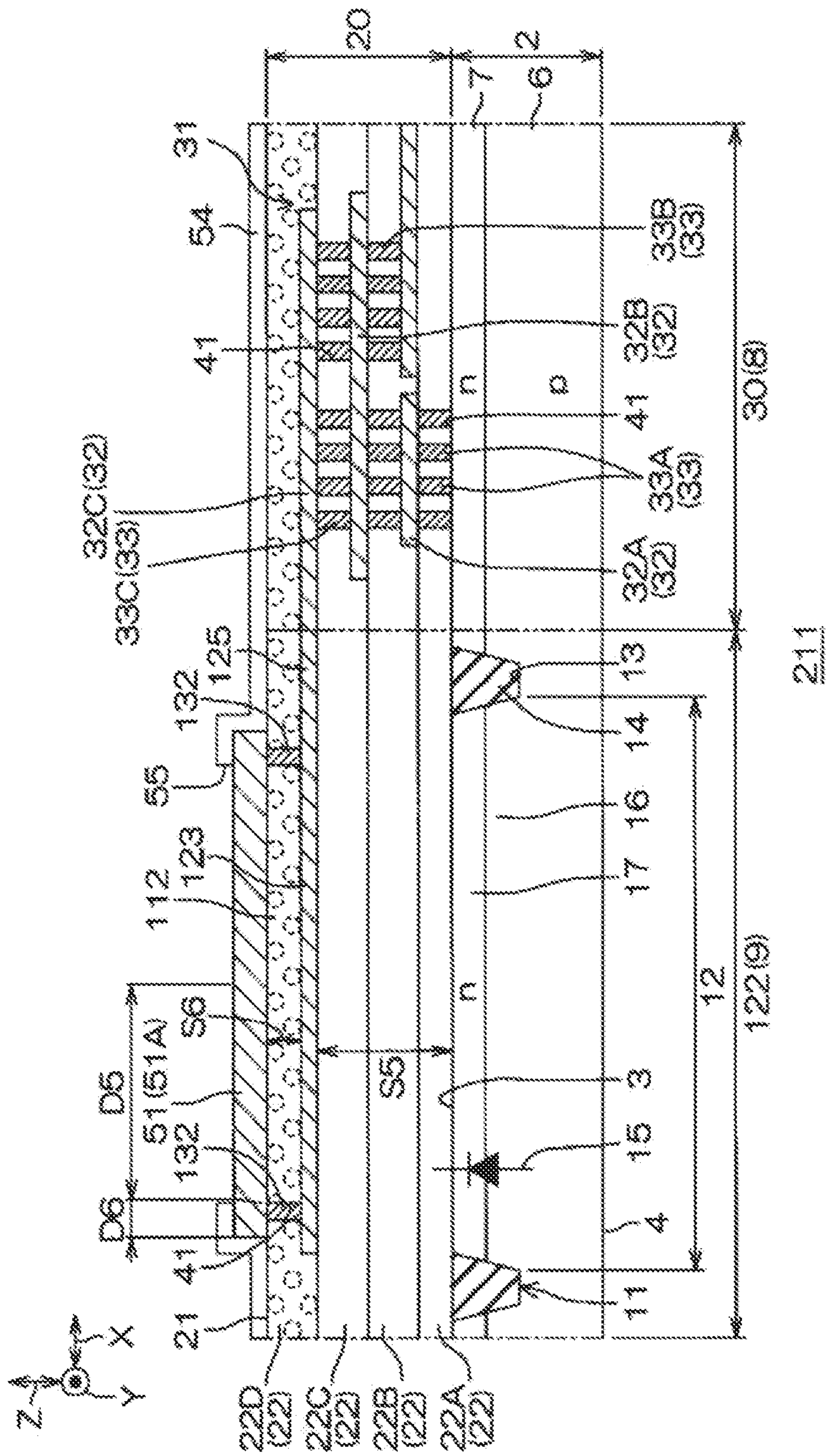

FIG. 43 corresponds to FIG. 36 and is a cross-sectional view showing a semiconductor device 211 according to a seventeenth embodiment of the present disclosure together with a porous region 112 according to a first configuration example. Hereinafter, structures corresponding to the structures described for the semiconductor device 181 and the like are denoted by the same reference numerals, and explanation thereof will not be repeated. The semiconductor device 211 includes the porous region 112 formed in the surface layer portion of the insulating layer 20, as in the case of the seventh embodiment described above. The porous region 112 is formed of a region in which a plurality of pores are introduced in the insulating layer 20 and, in this embodiment, is formed by using the top interlayer insulating film 22 (the fourth interlayer insulating film 22D). That is, the porous region 112 is formed in the surface layer portion of the multilayer wiring region 30 and the surface layer portion of the connection region 122.

The plurality of pores are formed in the surface layer portion of the insulating layer 20 at intervals in the thickness direction and the surface direction of the insulating layer 20. That is, the plurality of pores are formed in the top interlayer insulating film 22 (the fourth interlayer insulating film 22D) at intervals in the thickness direction and the width direction of the top interlayer insulating film 22. The plurality of pores have uneven sizes in a range of 1 nm or more and 500 nm or less. The porous region 112 may have a plurality of pores that fall within a range of 1 nm or more and 100 nm or less. The porous region 112 may have a plurality of pores that fall within a range of 1 nm or more and 10 nm or less.

The connection wiring 123 is disposed in the connection region 22 so as to be in contact with the porous region 112. In this embodiment, the connection wiring 123 is disposed over the third interlayer insulating film 22C and is covered with the porous region 112. The terminal electrode 51 is disposed over a portion of the connection region 122 where the porous region 112 is formed. In this embodiment, the terminal electrode 51 faces the connection wiring 123 with the porous region 112 interposed therebetween in the connection region 122.

That is, the terminal electrode 51 faces the semiconductor chip 2 with the porous region 112 and the connection region 122 interposed therebetween. The terminal electrode 51 may have a thickness less than the thickness of the porous region 112. The seal via electrode 132 is connected to the connection region 122 and the terminal electrode 51 within the porous region 112. In this embodiment, the seal via electrode 132 partitions a closed space in which only the porous region 112 is disposed in a region between the connection wiring 123 and the terminal electrode 51 in the insulating layer 20.

Figure 44:
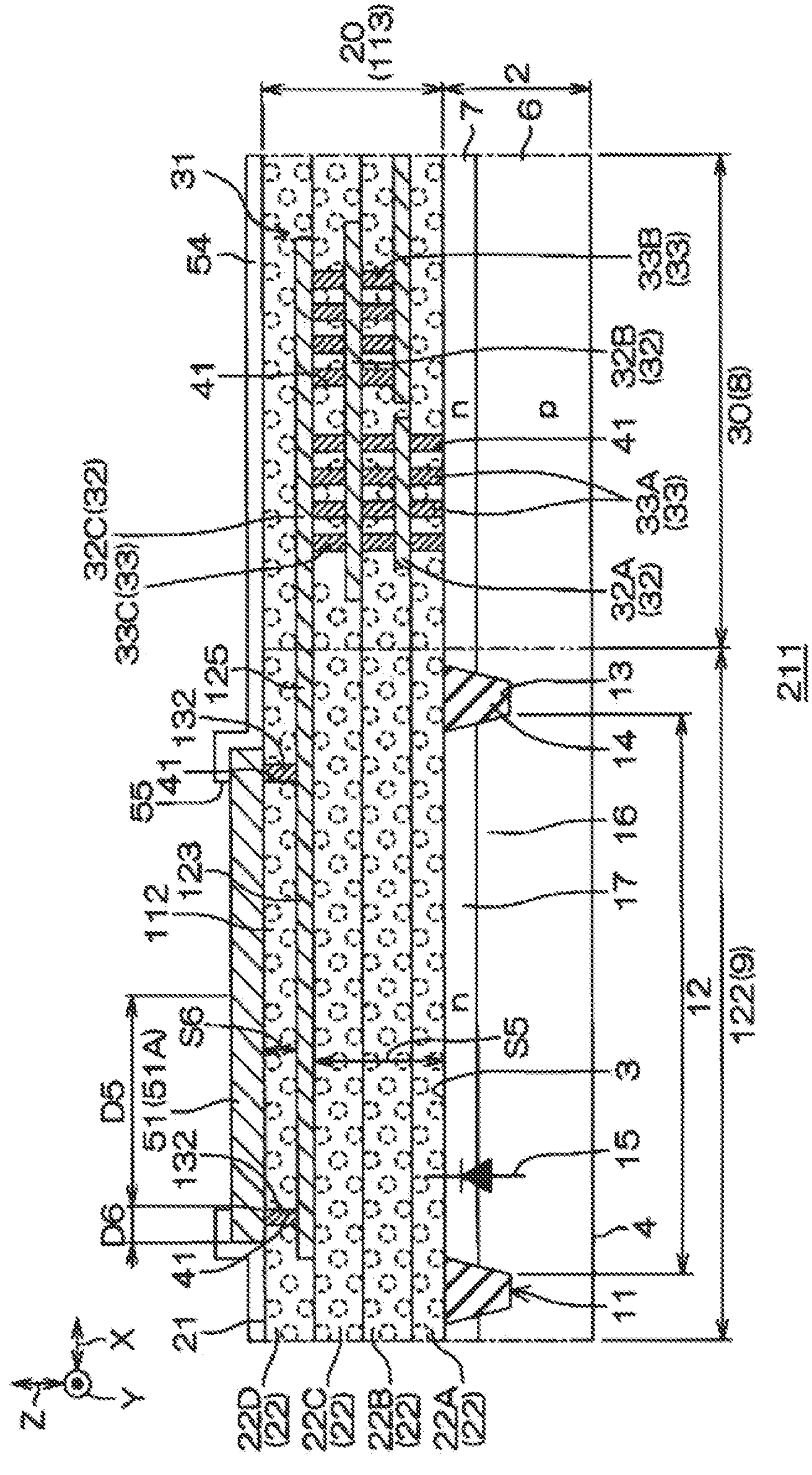
FIG. 44 is a cross-sectional view showing the semiconductor device shown in FIG. 43 together with a porous region according to a second configuration example.

The porous region 112 may take a form shown in FIG. 44. FIG. 44 is a cross-sectional view showing the semiconductor device 211 shown in FIG. 43 together with a porous region 112 according to a second configuration example. The porous region 112 according to the second configuration example is formed in the entire region of the insulating layer 20 in the thickness direction. That is, the insulating layer 20 is formed of a porous insulating layer 113. Further, the multilayer wiring 31 is formed in the porous insulating layer 113, and the connection wiring 123 is firmed in the porous insulating layer 113. The connection region 122 faces the semiconductor chip 2 with a portion of the porous insulating layer 113 interposed therebetween, and the terminal electrode 51 faces the connection region 122 with a portion of the porous insulating layer 113 interposed therebetween.

As described above, the semiconductor device 211 can also exhibit the same effects as the effects described for the semiconductor device 181 according to the fourteenth embodiment. Further, the semiconductor device 211 includes at least the porous region 112 formed in the surface layer portion of the insulating layer 20. The porous region 112 is formed of a region in which a plurality of pores are introduced in the insulating layer 20. According to this structure, an elastic modulus in the surface layer portion of the insulating layer 20 can be reduced by the porous region 112.

As a result, the stress at the time of connecting the conducting wires 312 to the terminal electrode 51 can be relaxed by the porous region 112. Further, even in the case where cracks occur starting from the terminal electrode 51, an impact caused by the cracks can be released (relaxed) by the plurality of pores to terminate the cracks. As a result, the expansion of cracks can be suppressed. The porous region 112 according to the seventeenth embodiment can be applied not only to the fourteenth embodiment but also to the fifteenth and sixteenth embodiments.

Figure 45:
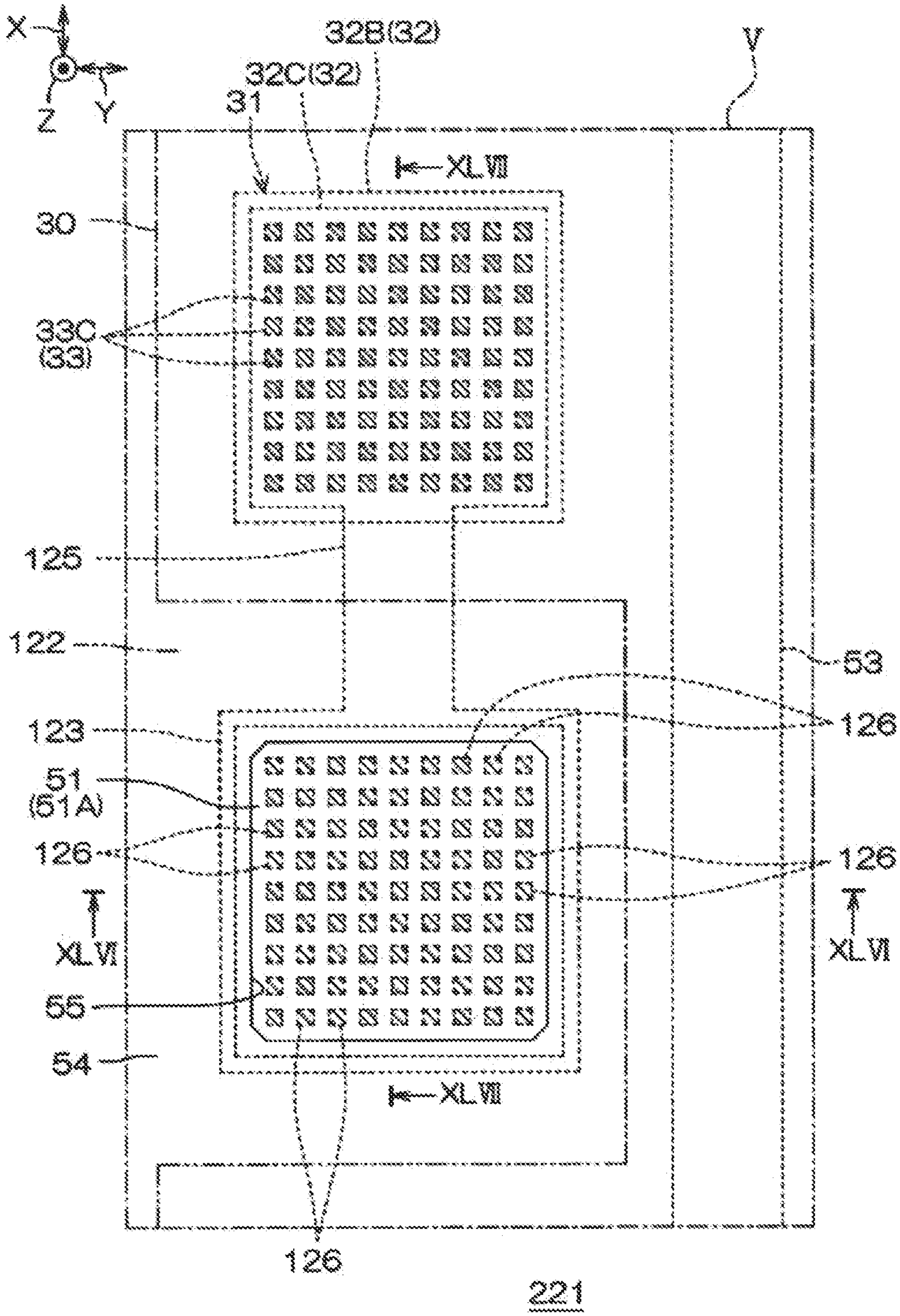
FIG. 45 corresponds to FIG. 5 and is an enlarged view showing a semiconductor device according to an eighteenth embodiment of the present disclosure together with a seal via electrode according to a first configuration example.
Figure 46:
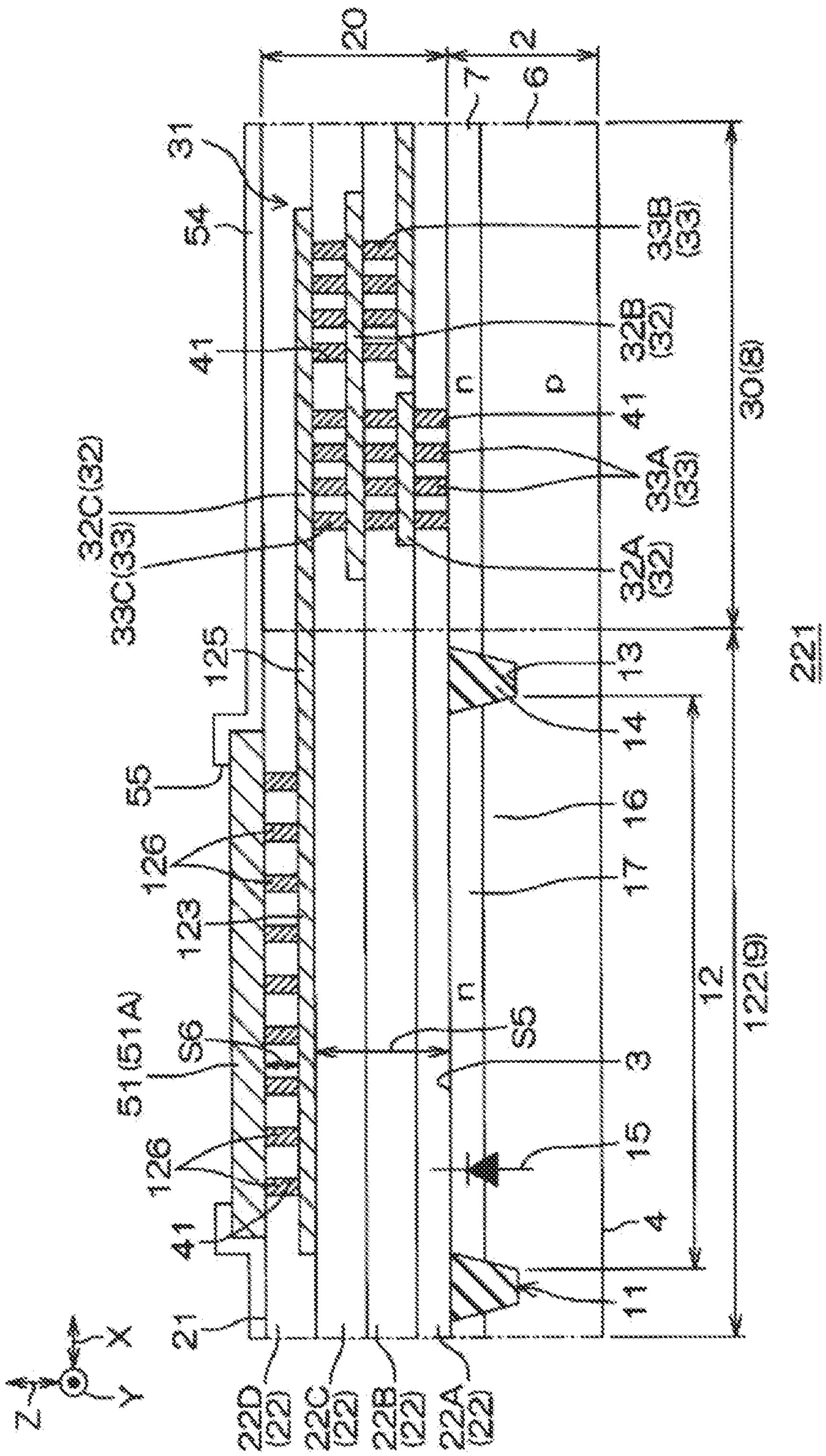
FIG. 46 is a cross-sectional view taken along a line XLVI-XLVI shown in FIG. 45.
Figure 47:
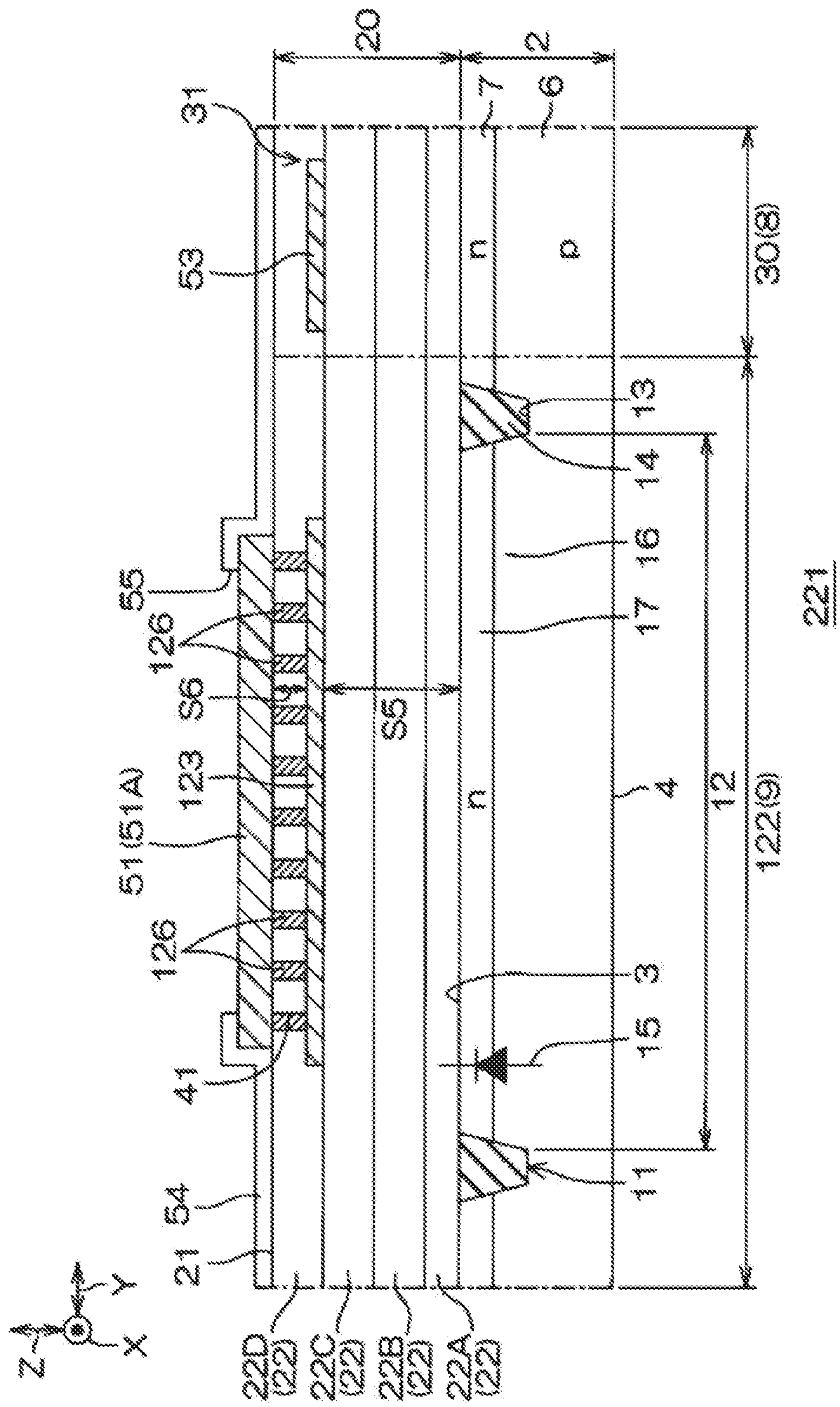
FIG. 47 is a cross-sectional view taken along a line XLVII-XLVII shown in FIG. 45.

FIG. 45 corresponds to FIG. 5 and is an enlarged view showing a semiconductor device 221 according to an eighteenth embodiment of the present disclosure together with an inner via electrode 126 according to a first configuration example. FIG. 46 is a cross-sectional view taken along a line XLVI-XLVI shown in FIG. 45. FIG. 47 is a cross-sectional view taken along a line XLVII-XLVII shown in FIG. 45. Hereinafter, structures corresponding to the structures described for the semiconductor device 1 and the like are denoted by the same reference numerals, and explanation thereof will not be repeated.

The semiconductor device 221 includes a connection region 122, a connection wiring 123, a lead-out wiring 125, and a terminal electrode 51 formed in the same manner as the semiconductor device 121 and the like according to the eighth embodiment. Unlike the semiconductor device 121 and the like according to the eighth embodiment, the semiconductor device 221 does not have a plurality of through-holes 124 in the connection wiring 123. The description of the connection region 122, the connection wiring 123, the lead-out wiring 125, and the terminal electrode 51 will be omitted.

The semiconductor device 221 includes a plurality of inner via electrodes 126 (via electrodes) interposed between the connection wiring 123 and the terminal electrode 51 in the insulating layer 20 so as to electrically connect the connection wiring 123 and the terminal electrode 51. In FIG. 45, the inner via electrodes 126 are shown by hatching. The inner via electrodes 126 are buried in the via opening 41 formed in the insulating layer 20. The plurality of inner via electrodes 126 are arranged at an interval from the inner portion of the terminal electrode 51 toward the entire circumference of the peripheral edge of the terminal electrode 51 in a plan view. Directly below each terminal electrode 51, one connection wiring 123 having the same potential is disposed, and the different potential wiring 53 to which a potential different from that of each terminal electrode 51 is applied is not disposed.

The plurality of inner via electrodes 126 are arranged in a row at intervals along the electrode surface of the connection region 122 in the first direction X and the second direction Y. In this embodiment, the plurality of inner via electrodes 126 are arranged in the form of a matrix so that a plurality of crossroad portions each formed of a portion of the insulating layer 20 are partitioned in a region between the connection wiring 123 and the terminal electrode 51 in the plan view. The plurality of inner via electrodes 126 may be arranged at equal intervals in the first direction X and the second direction Y.

In this embodiment, each of the plurality of inner via electrodes 126 is formed in a square shape in the plan view. Each inner via electrode 126 has an optional planar shape and may be formed in a circular shape or a polygonal shape. Each inner via electrode 126 may have a width of 0.1 μm or more and 5 μm or less in the plan view. The width of each inner via electrode 126 is defined by the narrowest width of the widths of the inner via electrodes 126. The plurality of inner via electrodes 126 may be formed at intervals of 0.1 μm or more and 5 μm or less.

The plurality of inner via electrodes 126 may be arranged so that an occupancy ratio of the plurality of inner via electrodes 126 to the connection wiring 123 is 50% or more and 80% or less. The occupancy ratio is a ratio of a total area of the plurality of inner via electrodes 126 occupying the plane area of the connection wiring 123 to the plane area of the concerning wiring 123 in the plan view. The plane area of the connection wiring 123 is the plane area of a region surrounded by the peripheral edge of the connection wiring 123. The total area of the plurality of inner via electrodes 126 is a total value of the plane areas of the inner via electrodes 126.

The plurality of inner via electrodes 126 may be arranged so that an occupancy ratio of the plurality of inner via electrodes 126 to the terminal electrode 51 is 50% or more and 80% or less. The occupancy ratio is a ratio of a total area of the plurality of inner via electrodes 126 occupying the plane area of the terminal electrode 51 to the plane area of the terminal electrode 51 in the plan view. The plane area of the terminal electrode 51 is the plane area of a region surrounded by the peripheral edge of the terminal electrode 51. The total area of the plurality of inner via electrodes 126 is the total value of the plane areas of the inner via electrodes 126.

Figure 48A:
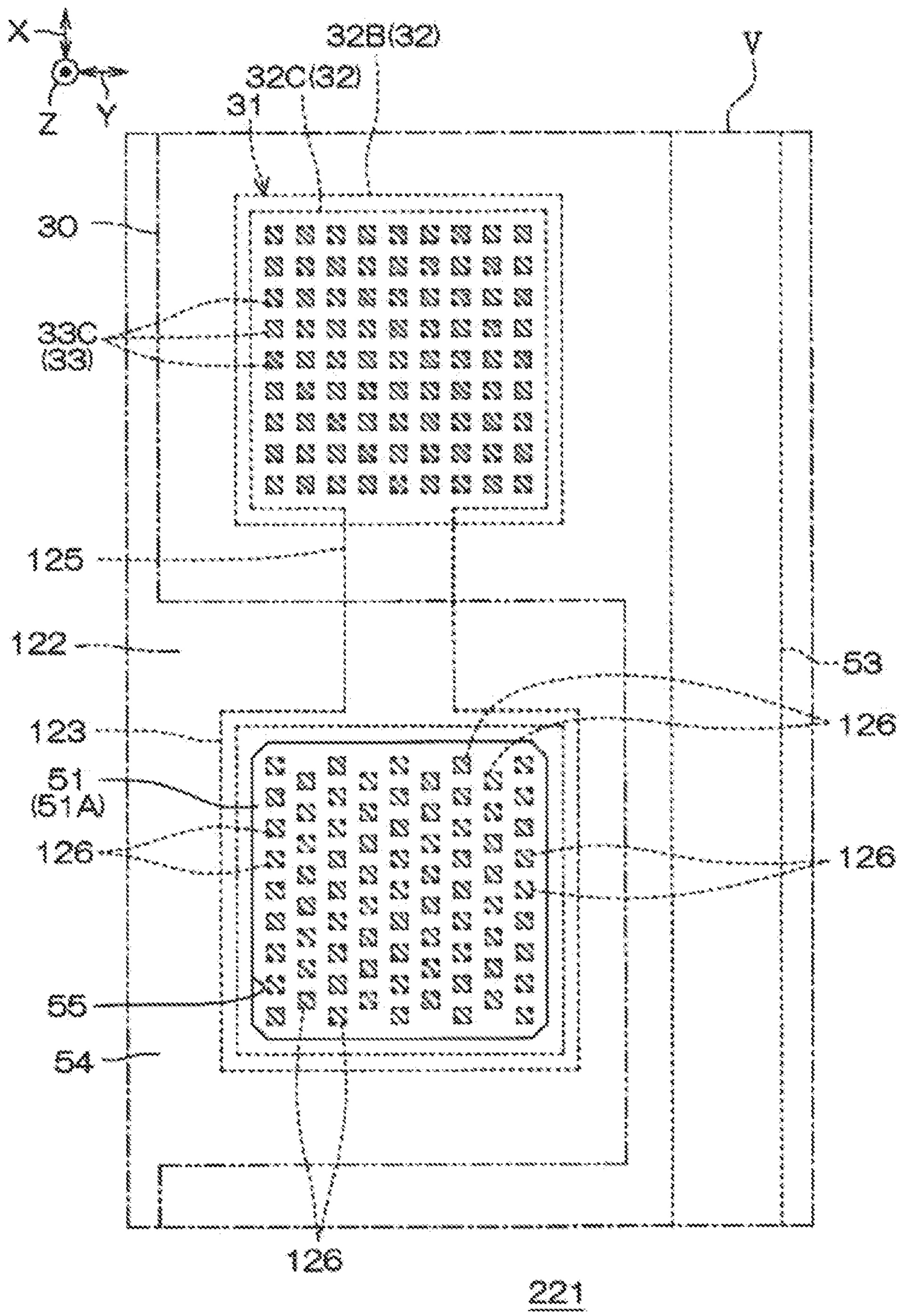
FIG. 48A is an enlarged view showing the semiconductor device shown in FIG. 45 together with an inner via electrode according to a second configuration example.

Like the wiring via electrode 33, the plurality of inner via electrodes 126 include a via barrier film 42 and a via main electrode 43 laminated in this order from the inner wall side of the via opening 41, In this embodiment, each of the plurality of inner via electrodes 126 is formed of a tungsten plug electrode, like the wiring via electrodes 33. The plurality of inner via electrodes 126 may take various forms shown in FIGS. 48A to 48E. FIG. 48A is an enlarged view showing the semiconductor device 221 shown in FIG. 45 together with an inner via electrode 126 according to a second configuration example. Referring to FIG. 48A, in this embodiment, a plurality of inner via electrodes 126 are arranged in a staggered manner in a plan view. The plurality of inner via electrodes 126 partition a plurality of T-shaped road portions each formed of a portion of the insulating layer 20 in a region between the connection wiring 123 and the terminal electrode 51 in the plan view.

The plurality of inner via electrodes 126 may be arranged in a row at equal intervals in the first direction X and the second direction Y. In this embodiment, each of the plurality of inner via electrodes 126 is formed in a square shape in the plan view. The plurality of inner via electrodes 126 have an optional planar shape and may be formed in a circular shape or a polygonal shape. Further, the plurality of inner via electrodes 126 may partition a plurality of Y-shaped road portions in the connection wiring 123 according to the planar shape.

Figure 48B:
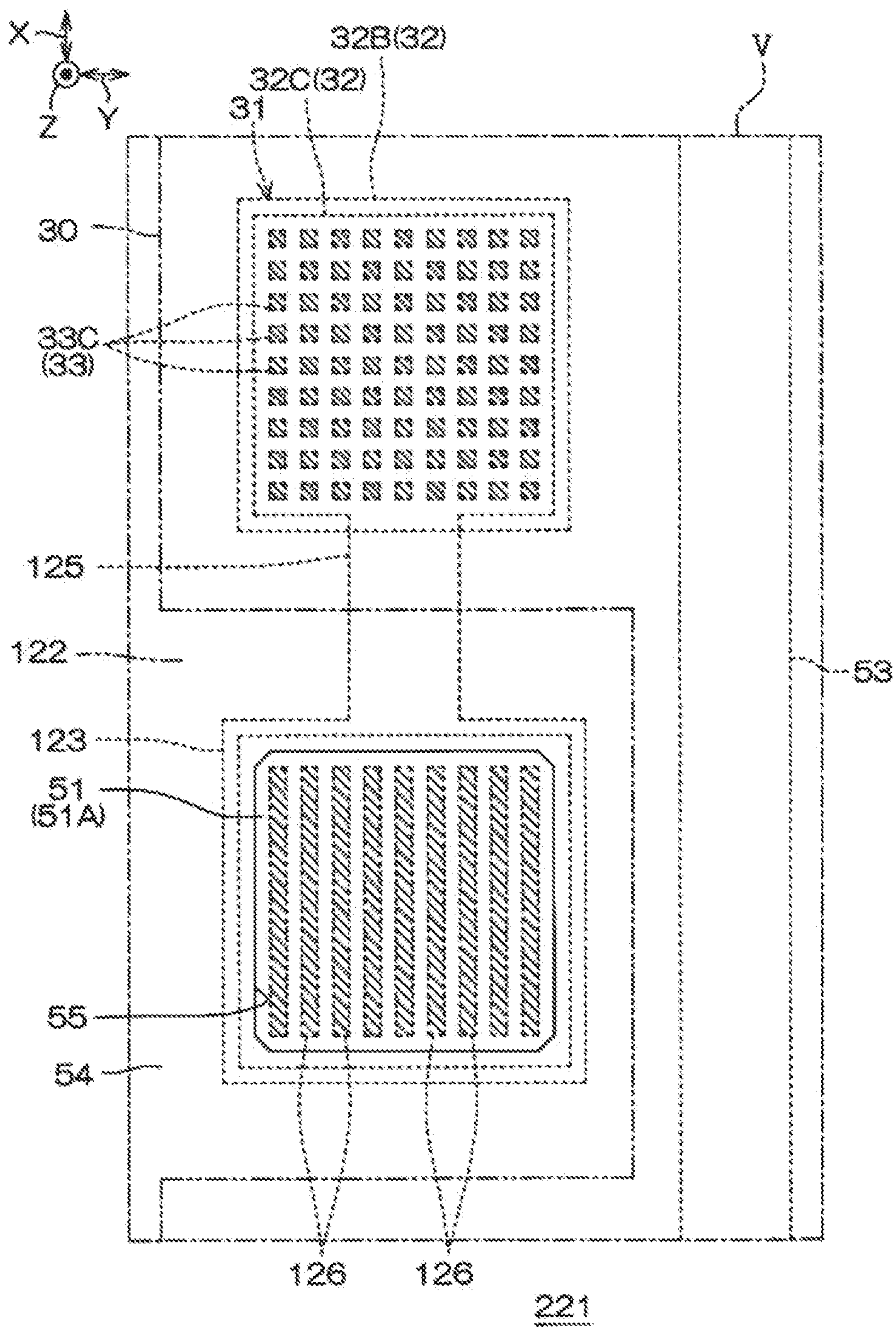
FIG. 48B is an enlarged view showing the semiconductor device shown in FIG. 45 together with an inner via electrode according to a third configuration example.

FIG. 48B is an enlarged view showing the semiconductor device 221 shown in FIG. 45 together with an inner via electrode 126 according to a third configuration example.

Referring to FIG. 48B, in this embodiments, a plurality of inner via electrodes 126 are arranged in a stripe shape extending in one direction in a plan view. The plurality of inner via electrodes 126 partition a stripe portion formed of a portion of the insulating layer 20 in a region between the connection wiring 123 and the terminal electrode 51 in the plan view.

Figure 48C:
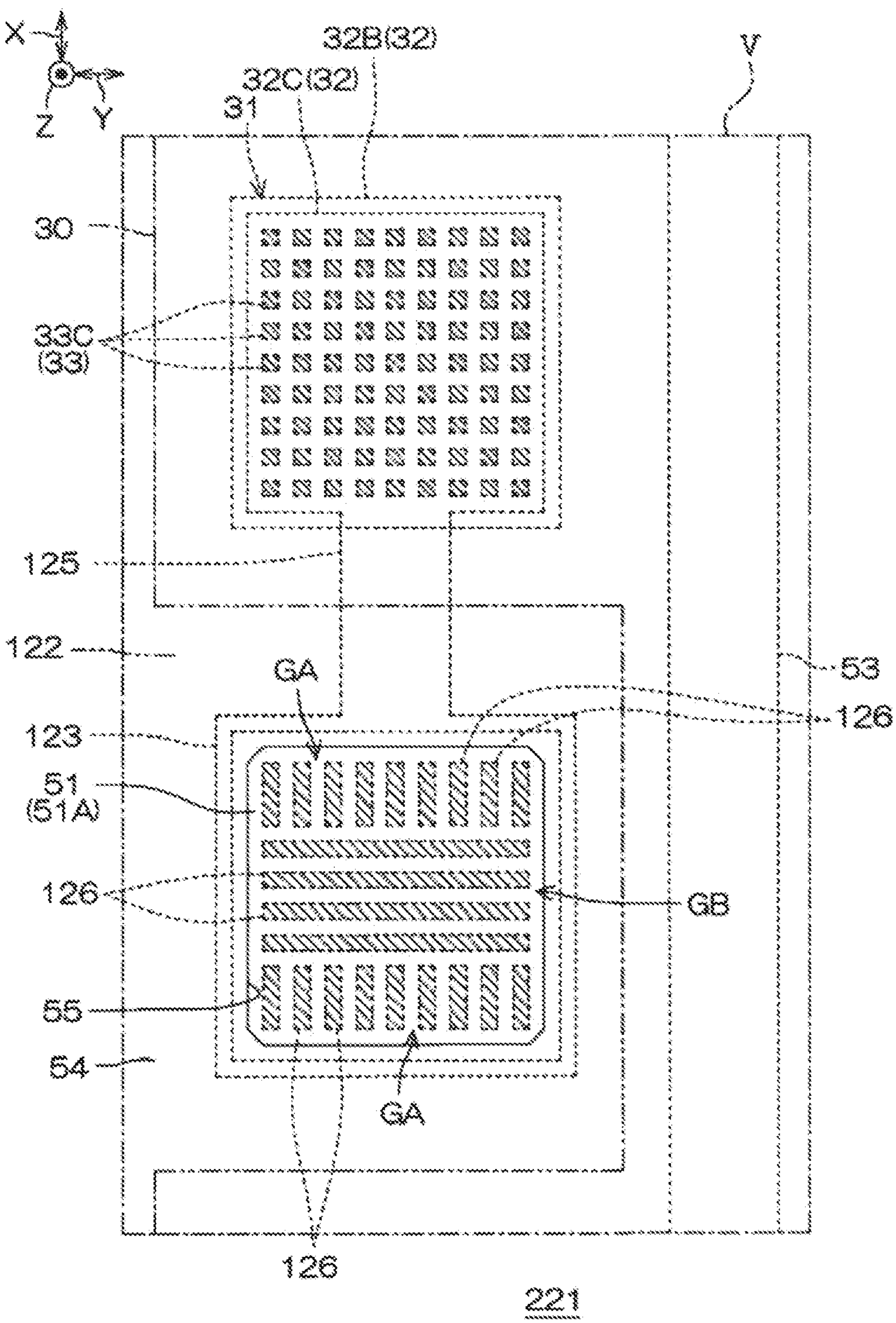
FIG. 48C is an enlarged view showing the semiconductor device shown in FIG. 45 together with an inner via electrode according to a fourth configuration example.

Specifically, the plurality of inner via electrodes 126 are respectively formed in a stripe shape extending in the first direction X in the plan view and are formed at intervals in the second direction Y. The plurality of inner via electrodes 126 may be formed in a stripe shape extending in the second direction Y in the plan view. The plurality of inner via electrodes 126 may be arranged at equal intervals. FIG. 48C is an enlarged view showing the semiconductor device 221 shown in FIG. 45 together with an inner via electrode 126 according to a fourth configuration example, Referring to FIG. 48C, in this embodiment, the plurality of inner via electrodes 126 are arranged in a plurality of stripes extending in different directions in a plan view. The plurality of inner via electrodes 126 partition a plurality of stripe portions each formed of a portion of the insulating layer 20 in a region between the connection wiring 123 and the terminal electrode 51 in the plan view and extending in different directions.

The plurality of inner via electrodes 126 include a first group GA extending in one direction (the first direction X) and a second group GB extending in an intersection direction (the second direction Y) intersecting the one direction at an interval from the first group GA in the plan view. The number and arrangement of first groups GA and second groups GB are optional. The plurality of inner via electrodes 126 may be arranged at equal intervals.

Figure 48D:
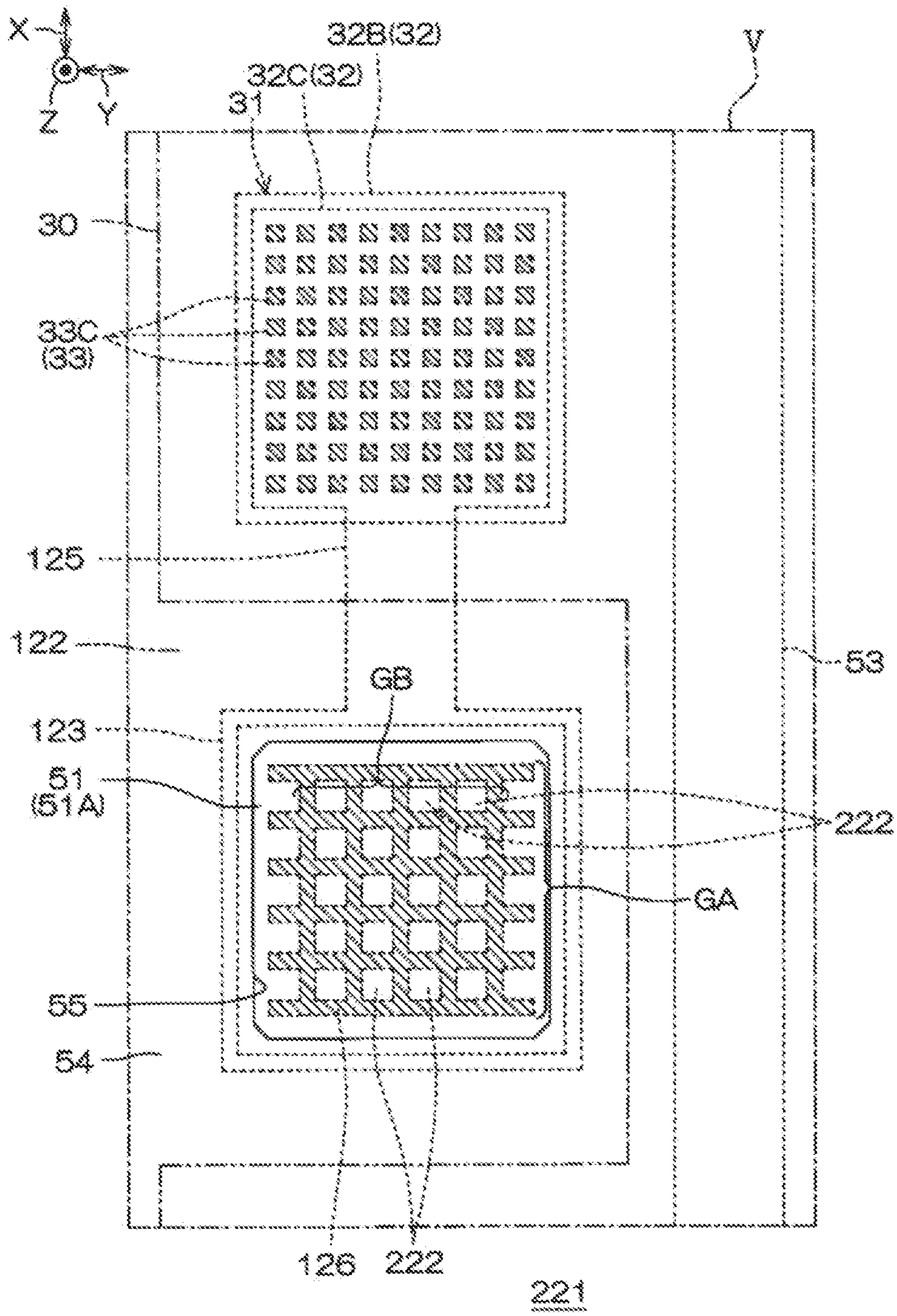
FIG. 48D is an enlarged view showing the semiconductor device shown in FIG. 45 together with an inner via electrode according to a fifth configuration example.

FIG. 48D is an enlarged view showing the semiconductor device 221 shown in FIG. 45 together with an inner via electrode 126 according to a fifth configuration example. Referring to FIG. 48D, in this embodiment, the inner via electrode 126 is formed in a grid pattern in a plan view. The inner via electrode 126 partitions a plurality of segment portions 222 each formed of a portion of the insulating layer 20 in a region between the connection wiring 123 and the terminal electrode 51 in the plan view and arranged in the form of a matrix.

The inner via electrode 126 includes a first group GA extending in one direction (the first direction X) and a second group GB extending in an intersection direction (the second direction Y) intersecting the one direction (the first direction X) to intersect the first group GA in the plan view. The plurality of segment portions 222 are partitioned in the form of a matrix by the first group GA and the second group GB in the plan view. The inner via electrode 126 may be formed in a grid pattern so that the plurality of segment portions 222 are partitioned in a staggered manner in the plan view.

Figure 48E:
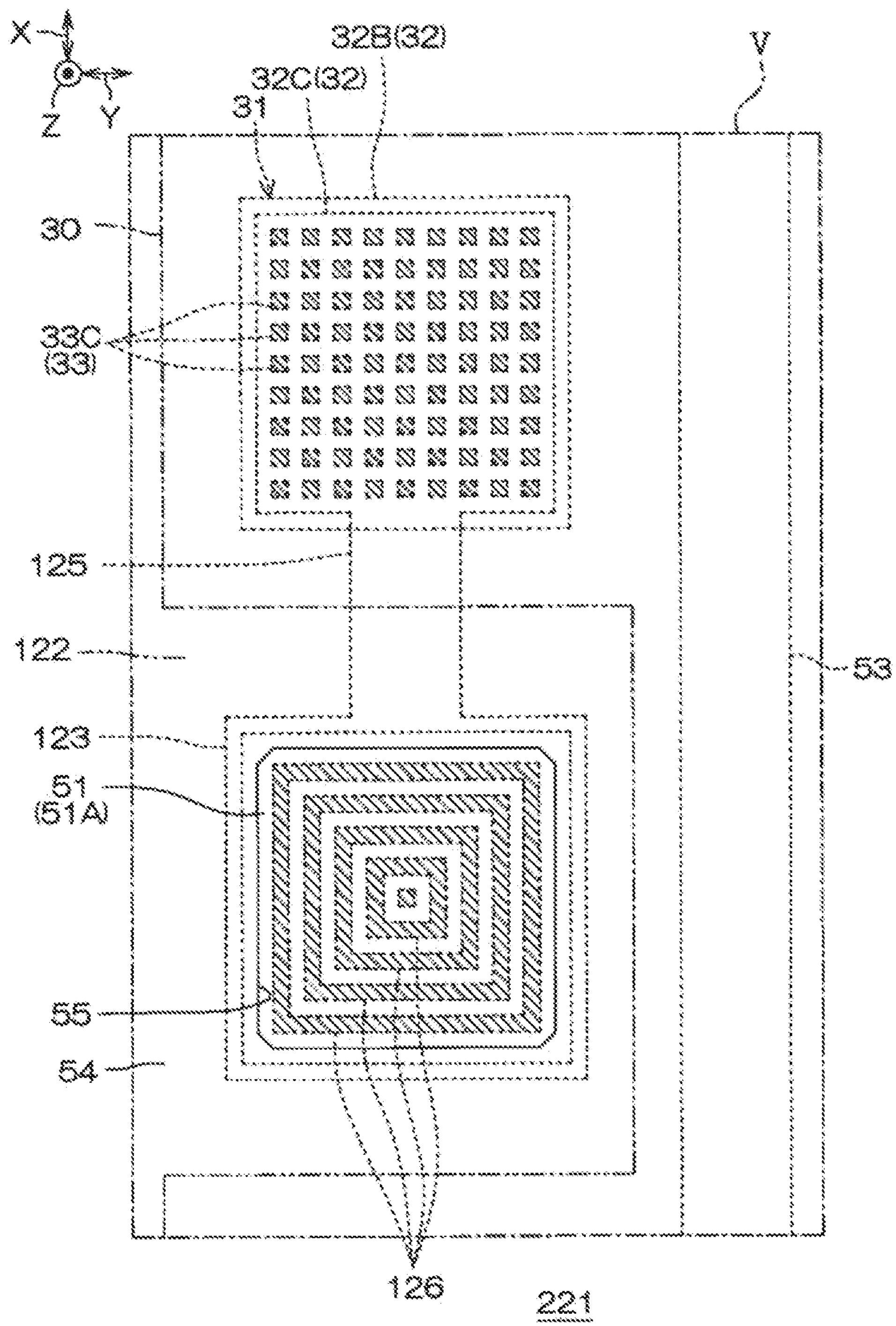
FIG. 48E is an enlarged view showing the semiconductor device shown in FIG. 45 together with an inner via electrode according to a sixth configuration example.

FIG. 48E is an enlarged view showing the semiconductor device 221 shown in FIG. 45 together with an inner via electrode 126 according to a sixth configuration example. Referring to FIG. 48E, in this embodiment, a plurality of inner via electrodes 126 are formed in a plurality of annular shapes at intervals from the inner portion to the peripheral edge of the terminal electrode 51 in a plan view. In this embodiment, each of the plurality of inner via electrodes 126 is firmed in an annular shape (specifically, a square annular shape) surrounding the central portion of the terminal electrode 51 in the plan view. The plurality of inner via electrodes 126 can also be considered to function as seal via electrodes 132.

The plurality of inner via electrodes 126 partition a plurality of annular portions each formed of a portion of the insulating layer 20 in a region between the connection wiring 123 and the terminal electrode 51 in the plan view. One inner via electrode 126 may be formed in a spiral shape in the plan view and may partition a spiral portion formed of a portion of the insulating layer 20 in the region between the connection wiring 123 and the terminal electrode 51. An inner via electrode 126 having a form in which the features of at least two of the inner via electrodes 126 according to the first to sixth configuration examples are combined may be adopted.

As described above, the semiconductor device 221 includes the semiconductor chip 2, the insulating layer 20, the connection wiring 123, the terminal electrode 51, and the plurality of inner via electrodes 126. The insulating layer 20 is formed over the semiconductor chip 2. The connection wiring 123 is disposed in the insulating layer 20. The terminal electrode 51 is disposed over the insulating layer 20 so as to face the connection wiring 123. The plurality of inner via electrodes 126 are interposed between the connection wiring 123 and the terminal electrode 51 in the insulating layer 20 so as to electrically connect the connection wiring 123 and the terminal electrode 51.

The plurality of inner via electrodes 126 are arranged at intervals from the inner portion of the terminal electrode 51 toward the entire circumference of the peripheral edge of the terminal electrode 51 in the plan view. According to this structure, a strength directly below the terminal electrode 51 can be increased by the plurality of inner via electrodes 126. As a result, it is possible to suppress the occurrence of cracks in the terminal electrode 51 due to the stress at the time of connecting the conducting wires 312. Therefore, the reliability of the terminal electrode 51 can be improved.

According to the semiconductor device 221, the reliability of the terminal electrode 51 and its surroundings can be improved. For example, according to this structure, it is possible to prevent cracks starting from the terminal electrode 51 from occurring in the insulating layer 20. Further, according to this structure, since the cracks of the terminal electrode 51 can be suppressed, it is possible to suppress an electric influence caused by the cracks from occurring around the terminal electrode 51. Further, even in the case where cracks occur starting from the terminal electrode 51, the cracks can be terminated by the plurality of inner via electrodes 126. As a result, expansion of cracks to the outside of the terminal electrode 51 in a plan view can be suppressed.

The plurality of inner via electrodes 126 may be arranged so that an occupancy ratio of a total area of the plurality of inner via electrodes 126 occupying a plane area of the connection wiring 123 is 50% or more and 80% or less. The plurality of inner via electrodes 126 are arranged so that the occupancy ratio of the total area of the plurality of inner via electrodes 126 occupying the plane area of the terminal electrode 51 to the plane area of the terminal electrode 51 is 50% or more and 80% or less. The plurality of inner via electrodes 126 may be formed in a pattern of at least one of matrix, stagger, stripe, grid, concentric annular, and spiral in the plan view. The plurality of inner via electrodes 126 may be arranged at intervals in the first direction X along the electrode surface of the terminal electrode 51 and the second direction Y intersecting the first direction X.

The entire region of the terminal electrode 51 may face the connection wiring 123 in the plan view. The terminal electrode 51 may be disposed in a region surrounded by the peripheral edge of the connection wiring 123 in the plan view. The connection wiring 123 may be disposed with a fifth space S5 from the semiconductor chip 2 in the thickness direction of the insulating layer 20 and the terminal electrode 51 may be disposed with a sixth space S6, which is less than the fifth space S5 (S6<S5), from the connection wiring 123 in the thickness direction of the insulation layer 20 (see FIG. 46).

The semiconductor device 221 may include the circuit device 10 and the multilayer wiring 31. The circuit device 10 is formed in the semiconductor chip 2. The multilayer wiring 31 includes a plurality of wirings 32 laminated and arranged in the thickness direction of the insulating layer 20 so as to be electrically connected to the circuit device 10. In this case, the connection wiring 123 may be electrically connected to at least one of the plurality of wirings 32.

According to this structure, the terminal electrode 51 can be electrically connected to the multilayer wiring 31 while suppressing the occurrence of cracks starting from the terminal electrode 51. Further, according to this structure, since the expansion of cracks can be suppressed by the plurality of inner via electrodes 126, the terminal electrode 51 can be prevented from being short-circuited with the multilayer wiring 31 due to the cracks. The terminal electrode 51 may be disposed over the connection wiring 123 at an interval from the multilayer wiring 31 (the plurality of wirings 32) in the plan view. The connection wiring 123 may face the semiconductor chip 2 with only the insulating layer 20 interposed therebetween.

The multilayer wiring 31 may be formed in a portion of the insulating layer 20 that covers the circuit device 10. The connection airing 123 may be formed in a portion of the insulating layer 20 that covers the outside of the circuit device 10. In this structure, the connection wiring 123 and the terminal electrode 51 may face a region outside the circuit device 10 in the semiconductor chip 2. According to this structure, the circuit device 10 can be protected from the stress at the time of connecting the conducting wires 312. Further, even in the case where cracks occur in the terminal electrode 51, it is possible to suppress the physical influence and the electrical influence caused by the cracks from occurring in the circuit device 10.

The semiconductor device 221 may include the outer diode 15 (rectifier/floating rectifier), The outer diode 15 includes an anode region 16 formed in a region outside the circuit device 10 on the surface layer portion of the semiconductor chip 2 and a cathode region 17 formed in the surface layer portion of the anode region 16. In this case, the connection wiring 123 may be formed in a portion of the insulating layer 20 that covers the outer diode 15.

According to this structure, the outer diode 15 is connected in reverse bias to the semiconductor chip 2 (the device region 8). That is, the outer diode 15 shields a current path from the outer region 9 to the device region 8. According to this structure, even when an unintended current path is formed between the terminal electrode 51 and the semiconductor chip 2 in the insulating layer 20, the current path can be shielded by the outer diode 15.

The unintended current path may include an undesired current path due to cracks. In this structure, the cathode region 17 may be formed in an electrical floating state. That is, the outer diode 15 may be formed as a floating diode. According to this structure, the shielding effect of the current path can be appropriately enhanced. The semiconductor device 221 may include the different potential wiring 53. The different potential wiring 53 is formed of a portion of the multilayer wiring 31 routed in the vicinity of the connection wiring 123 in the insulating layer 20 and a potential different from that of the adjacent terminal electrode 51 is applied to the different potential wiring 53. According to this structure, the different potential wiring 53 can be protected from the stress at the time of connecting the conducting wires 312. Further, even in the case where cracks occur starting from the terminal electrode 51, it is possible to suppress the physical influence and the electrical influence caused by the cracks from occurring between the terminal electrode 51 and the different potential wiring 53. As an example, it is possible to prevent the terminal electrode 51 from being short-circuited with the different potential wiring 53 due to the cracks.

Figure 49:
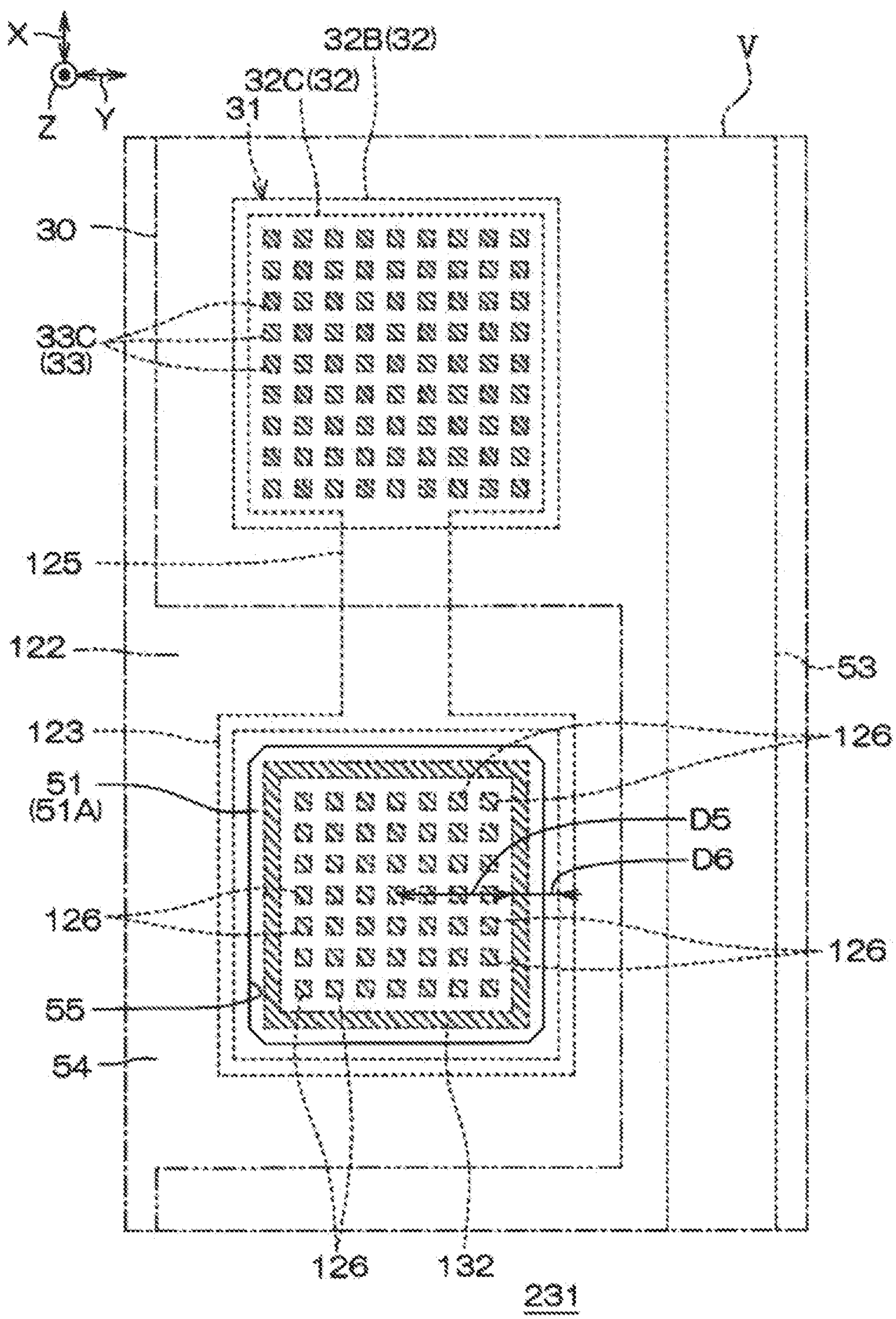
FIG. 49 corresponds to FIG. 45 and is an enlarged view showing a semiconductor device according to a nineteenth embodiment of the present disclosure together with a seal via electrode according to a first configuration example.

FIG. 49 corresponds to FIG. 45 and is an enlarged view showing a semiconductor device 231 according to a nineteenth embodiment of the present disclosure together with a seal via electrode 132 according to a first configuration example. Hereinafter, structures corresponding to the structures described for the semiconductor device 221 and the like according to the eighteenth embodiment are denoted by the same reference numerals, and explanation thereof will not be repeated. Referring to FIG. 49, the semiconductor device 231 includes the inner via electrode 126 according to the first configuration example. The semiconductor device 231 may include any one of the inner via electrodes 126 (see FIGS. 48A to 48E) according to the second to sixth configuration examples, instead of the inner via electrode 126 according to the first configuration example. Further, the semiconductor device 201 may include an inner via electrode 126 having a form in which the features of at least two of the inner via electrodes 126 according to the first to sixth configuration examples are combined, instead of the inner via electrode 126 according to the first configuration example.

The semiconductor device 231 includes a seal via electrode 132 formed in each of a plurality of connection regions 122. A seal via electrode 132 disposed directly below one terminal electrode 51 (the first terminal electrode 51A) is shown in FIG. 49. Further, in FIG. 49, the seal via electrode 132 is shown by hatching. Hereinafter, one seal via electrode 132 will be described as an example.

The seal via electrode 132 is interposed between the connection wiring 123 and the peripheral edge of the terminal electrode 51 in the insulating layer 20 so as to be connected to the connection wiring 123 and the terminal electrode 51 and is formed in a stripe shape extending along the peripheral edge of the terminal electrode 51 in a plan view. That is, in this embodiment, the connection wiring 123 and the terminal electrode 51 are electrically connected by both the plurality of inner via electrodes 126 and the seal via electrode 132. The seal via electrode 132 is buried in the via opening 41 formed in the insulating layer 20.

The seal via electrode 132 is disposed at an interval from the inner portion to the side of the peripheral edge side of the terminal electrode 51 so as to face the peripheral edge of the terminal electrode 51 at an interval from the plurality of inner via electrodes 126 in the plan view. The seal via electrode 132 extends in parallel along the side of the terminal electrode 51 in the plan view. The seal via electrode 132 is interposed between the peripheral edge of the connection wiring 123 and the peripheral edge of the terminal electrode 51 in the plan view. In this embodiment, the seal via electrode 132 is formed in an annular shape (in this embodiment, a square annular shape) surrounding the inner portion of the terminal electrode 51 in the plan view and surrounds a region in which the plurality of inner via electrodes 126 are arranged.

The seal via electrode 132 may be disposed in a region close to the peripheral edge of the terminal electrode 51 with respect to the center of the terminal electrode 51. That is, the seal via electrode 132 may be disposed at a fifth distance D5 from the center of the terminal electrode 51 to the peripheral edge of the terminal electrode 51 and may be disposed at a sixth distance D6, which is less than the fifth distance D5 (D6<D5), from the peripheral edge of the terminal electrode 51 to the center of the terminal electrode 51. The fifth distance D5 and the sixth distance D6 are based on the inner edge of the seal via electrode 132 on the side of the inner portion of the terminal electrode 51.

Figure 50A:
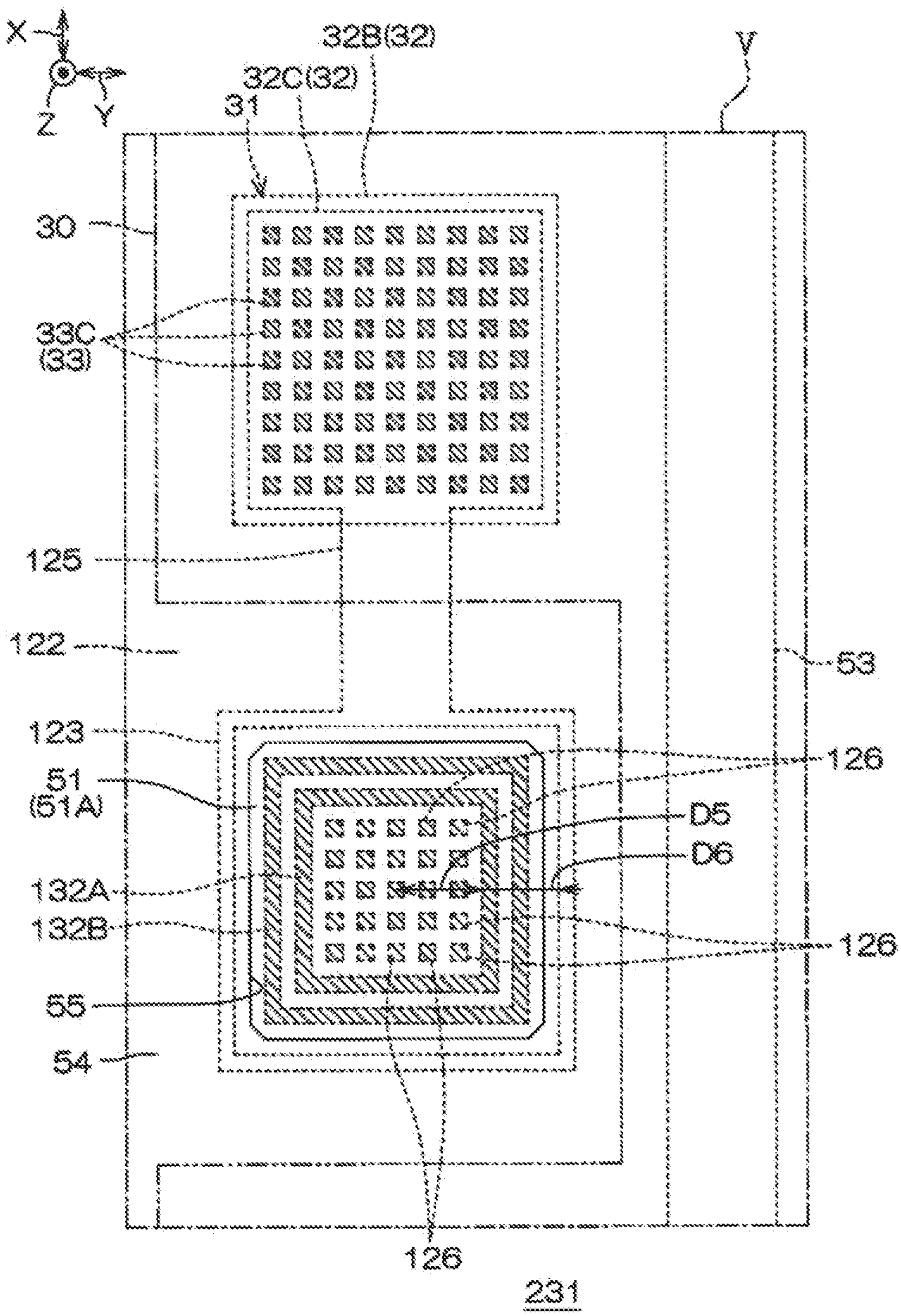
FIG. 50A is an enlarged view showing the semiconductor device shown in FIG. 49 together with a seal via electrode according to a second configuration example.

Like the wiring via electrode 33, the seal via electrode 132 includes a via barrier film 42 and a via main electrode 43 laminated in this order from the inner wall side of the via, opening 41. In this embodiment, the seal via electrode 132 is formed of a tungsten plug electrode, like the wiring via electrode 33. The seal via electrode 132 may take various forms shown in FIGS. 50A to 50B. FIG. 50A is an enlarged view showing the semiconductor device 221 shown in FIG. 49 together with a seal via electrode 132 according to a second configuration example. Referring to FIG. 50A, in the second configuration example, a plurality of seal via electrodes (in this embodiment, two seal via electrodes) 132 are formed. The plurality of seal via electrodes 132 include a first seal via electrode 132A and a second seal via electrode 132B.

The first and second seal via electrodes 132A and 132B are arranged in this order with an interval from the inner portion to the side of the peripheral edge of the terminal electrode 51 so as to face the peripheral edge of the terminal electrode 51 in a plan view. The first seal via electrode 132A is formed in a line shape extending along the peripheral edge of the terminal electrode 51 at an interval from the plurality of inner via electrodes 126 in the plan view. Specifically, the first seal via electrode 132A is formed in an annular shape (in this embodiment, a square annular shape) surrounding the inner portion of the terminal electrode 51 in the plan view and surrounds a region in which the plurality of inner via electrodes 126 are formed in the connection wiring 123.

The second seal via electrode 132B is disposed between the peripheral edge of the terminal electrode 51 and the first seal via electrode 132A in the plan view and is formed in a line shape extending along the peripheral edge of the terminal electrode 51. Specifically, the second seal via electrode 132B is formed in an annular shape (in this embodiment, a square annular shape) surrounding the first seal via electrode 132A in the plan view. The first and second seal via electrodes 132A and 132B may be arranged in a region close to the peripheral edge of the terminal electrode 51 with respect to the center of the terminal electrode 51. The first seal via electrode 132A may be disposed with a fifth distance D5 from the center of the terminal electrode 51 to the peripheral edge of the terminal electrode 51 and may be disposed with a sixth distance D6, which is less than the fifth distance D5 (D6<D5), from the peripheral edge of the terminal electrode 51 to the center of the terminal electrode 51. The fifth distance D5 and the sixth distance D6 are based on the inner edge of the first seal via electrode 132A on the side of the inner portion of the terminal electrode 51.

Figure 50B:
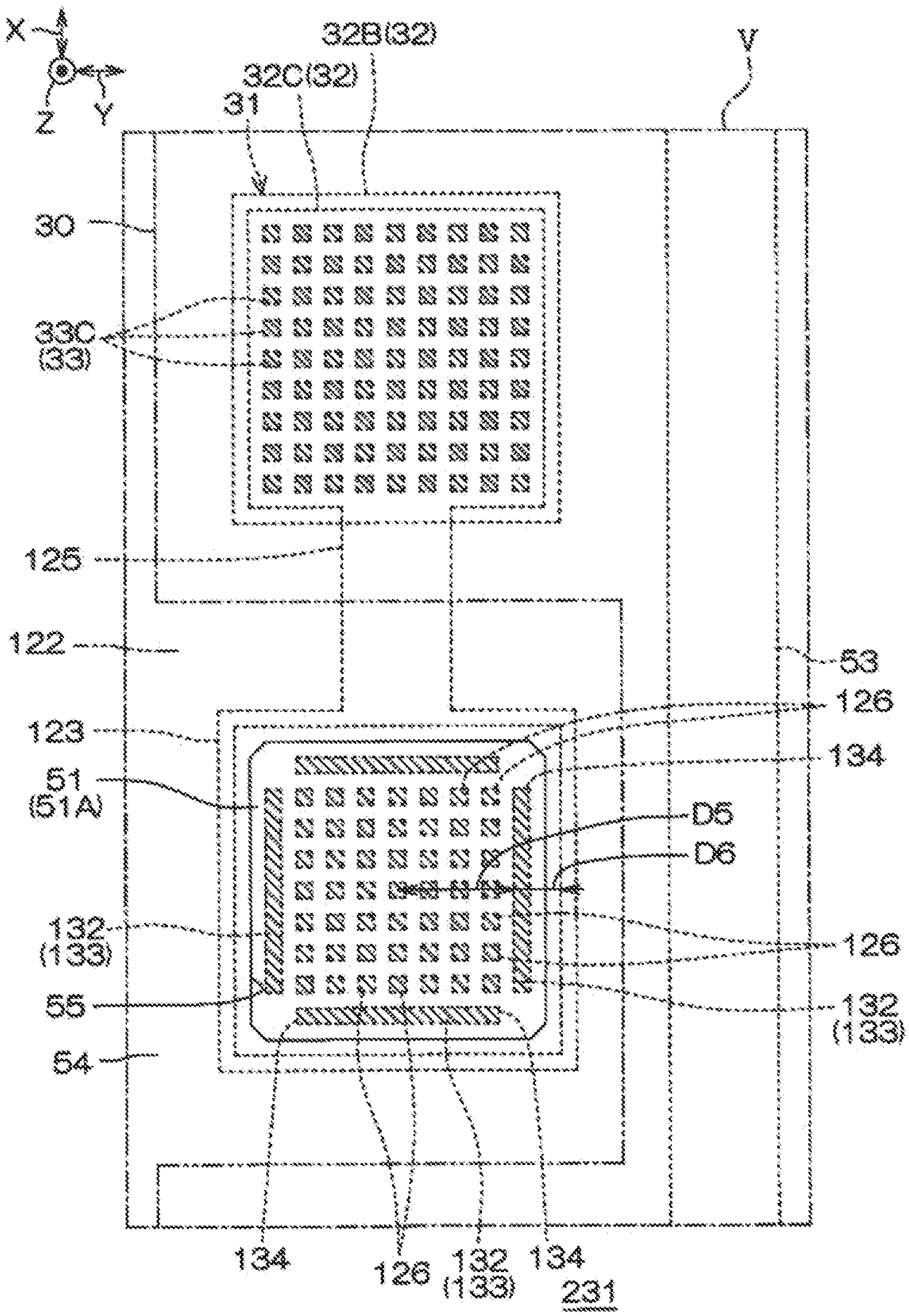
FIG. 50B is an enlarged view showing the semiconductor device shown in FIG. 49 together with a seal via electrode according to a third configuration example.

FIG. 50B is an enlarged view showing the semiconductor device 221 shown in FIG. 49 together with a seal via electrode 132 according to a third configuration example. Referring to FIG. 50B, in this embodiment, the seal via electrode 132 according to the third configuration example includes a plurality of segment portions (in this embodiment, four segment portions) 133 arranged in a line shape at intervals along the peripheral edge of the terminal electrode 51. It can be considered that the seal via electrode 132 according to the third configuration example has a form in which the seal via electrode 132 according to the first configuration example is divided into a plurality of segment portions 133 by a plurality of removal portions 134. In this embodiment, the plurality of removal portions 134 are formed at the corners specifically, four corners) of the seal via electrode 132, and each segment portion 133 is formed in a line shape extending along each side of the terminal electrode 51.

A seal via electrode 132 having a form in which the features of at least two of the seal via electrodes 132 according to the first to third configuration examples are combined may be adopted. As described above, the semiconductor device 231 can also exhibit the same effects as the effects described for the semiconductor device 221 according to the eighteenth embodiment. Further, the semiconductor device 231 includes the seal via electrode 132. The seal via electrode 132 is interposed between the connection wiring 123 and the peripheral edge of the terminal electrode 51 in the insulating layer 20 so as to be connected to the connection wiring 123 and the terminal electrode 51 and is formed in a stripe shape extending along the peripheral edge of the terminal electrode 51 in the plan view.

According to this structure, even in the case where cracks occur starting from the terminal electrode 51, the cracks can be terminated by the seal via electrode 132. As a result, the expansion of cracks to the outside of the terminal electrode 51 in the plan view can be suppressed. The seal via electrode 132 may be formed in an annular shape surrounding the inner portion of the terminal electrode 51 in the plan view. According to this structure, the expansion of cracks can be suppressed over the entire circumference of the terminal electrode 51.

Figure 51:
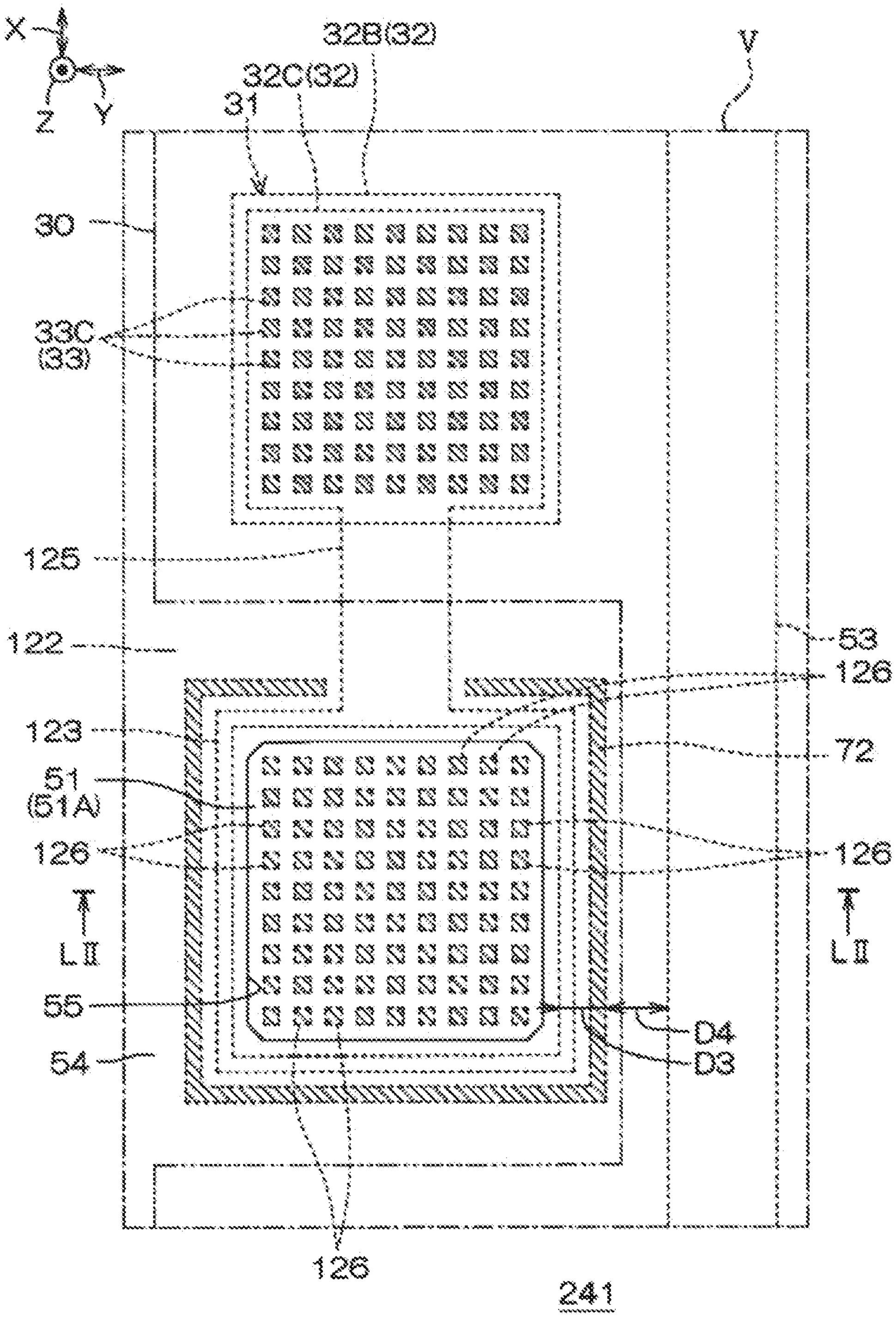
FIG. 51 corresponds to FIG. 45 and is an enlarged view showing a semiconductor device according to a twentieth embodiment of the present disclosure together with an outer dummy wiring according to a first configuration example.
Figure 52:
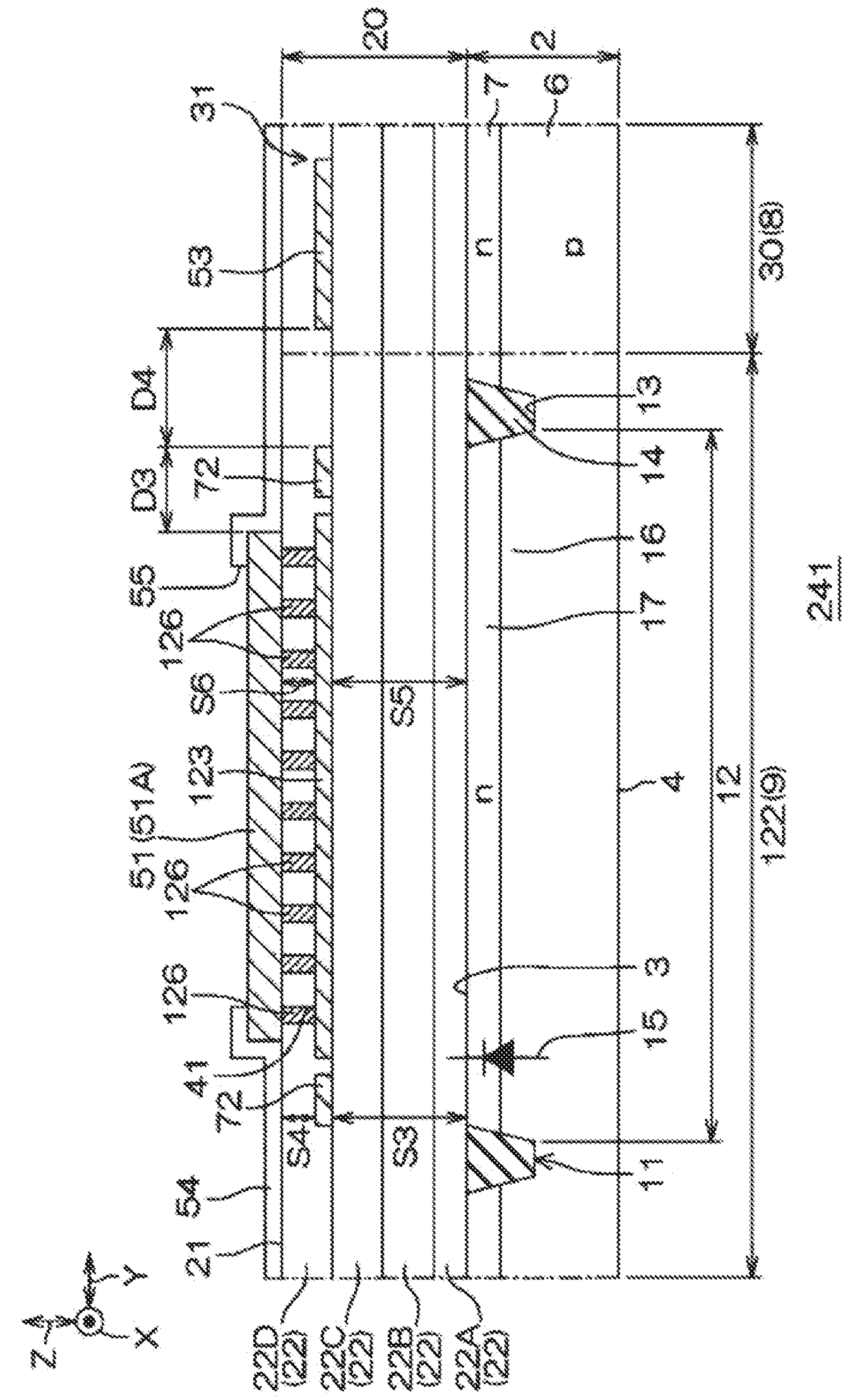
FIG. 52 is a cross-sectional view taken along a line shown in FIG. 51.

FIG. 51 corresponds to FIG. 45 and is an enlarged view showing a semiconductor device 241 according to a twentieth embodiment of the present disclosure together with an outer dummy wiring 72 according to a first configuration example. FIG. 52 is a cross-sectional view taken along a line LII-LII shown in FIG. 51. Hereinafter, structures corresponding to the structures described for the semiconductor device 221 and the like according to the eighteenth embodiment are denoted by the same reference numerals, and explanation thereof will not be repeated. Referring to FIGS. 51 and 52, the semiconductor device 241 includes the inner via electrode 126 according to the first configuration example. The semiconductor device 241 may include any one of the inner via electrodes 126 (see FIGS. 48A to 48E) according to the second to sixth configuration examples, instead of the inner via electrodes 126 according to the first configuration example. Further, the semiconductor device 241 may include an inner via electrode 126 having a form in which the features of at least two of the inner via electrodes 126 according to the first to sixth configuration examples are combined, instead of the inner via electrode 126 according to the first configuration example.

The semiconductor device 241 includes a plurality of outer dummy wirings 72 (dummy wirings) each arranged in the plurality of connection regions 122, respectively, so as to be located in at least a region between the terminal electrode 51 and the multilayer wiring region 30 in a plan view. FIGS. 51 and 52 show a form in which one outer dummy wiring 72 is disposed below one terminal electrode 51 (the first terminal electrode 51A). Further, in FIG. 51, the outer dummy wiring 72 is shown by hatching. Hereinafter, one outer dummy wiring 72 will be described as an example.

The outer dummy wiring 72 is disposed apart from the connection wiring 123, the terminal electrode 51, and the multilayer wiring region 30 (the plurality of wirings 32) in the plan view and is electrically independent from the connection wiring 123, the multilayer wiring 31 (the plurality of wirings 32), and the terminal electrode 51. That is, the outer dummy wiring 72 is also electrically independent from the plurality of device regions 8. Specifically, the outer dummy wiring 72 is formed in an electrical floating state.

The outer dummy wiring 72 may be disposed in a region close to the terminal electrode 51 with respect to the multilayer wiring 31. That is, the outer dummy wiring 72 may be disposed with a third distance D3 from the terminal electrode Silo the side of the multilayer wiring 31 in the plan view and may be disposed with a fourth distance D4, which exceeds the third distance D3 (D3<D4), from the multilayer wiring 31 to the side of the terminal electrode 51. The third distance D3 and the fourth distance D4 are based on the outer edge of the outer dummy wiring 72 on the side of the multilayer wiring region 30.

The outer dummy wiring 72 may be disposed in the connection region 122 in a region close to the terminal electrode 51 with respect to the semiconductor chip 2. That is, the outer dummy wiring 72 may be disposed with a third space S3 from the semiconductor chip 2 in the thickness direction of the insulating layer 20 and may be disposed with a fourth space S4, which is less than the third space S3 (S4<S3), from the terminal electrode 51 in the thickness direction of the insulating layer 20. In this embodiment, the outer dummy wiring 72 is formed in the form of a film on the third interlayer insulating film 22C located directly below the top interlayer insulating film 22 (the fourth interlayer insulating film 22D). That is, the outer dummy wiring 72 is disposed in the same layer as the connection wiring 123.

The outer dummy wiring 72 faces a region (the outer region 9) outside the plurality of device region 8 in the plan view. In this embodiment, the outer dummy wiring 72 faces a region (the isolation region 12) surrounded by the plurality of isolation structures 11 in the plan view. That is, the outer dummy wiring 72 faces the outer diode 15 in the plan view. The outer dummy wiring 72 may face the isolation region 12 spaced inward from the isolation structure 11 in the plan view.

In this embodiment, the outer dummy wiring 72 may face the semiconductor chip 2 (the outer diode 15) with only a portion of the insulating layer 20 interposed therebetween. That is, a portion of the multilayer wiring 31 may not be formed in a region directly below the outer dummy wiring 72 in the connection region 122. In the region directly below the outer dummy wiring 72, a current path connecting the outer dummy wiring 72 and the semiconductor chip 2 in the thickness direction of the insulating layer 20 is shielded by a portion of the insulating layer 20 and the outer diode 15, A portion of the multilayer wiring 31 may be formed in the region directly below the outer dummy wiring 72 in the connection region 122. In this case, the bottom wiring 32 (the first wiring 32A) of the multilayer wiring 31 may not formed directly above the outer diode 15.

The outer dummy wiring 72 is formed in a line shape extending along the connection wiring 123 in the plan view. The outer dummy wiring 72 may be formed in at least a portion along the multilayer wiring region 30 (the different potential wiring 53) in the plan view. The outer dummy wiring 72 faces the plurality of inner via electrodes 126 along the plane direction of the insulating main surface 21 in the plan view. The outer dummy wiring 72 may face the connection wiring 123 from a plurality of directions in the plan view.

Figure 53A:
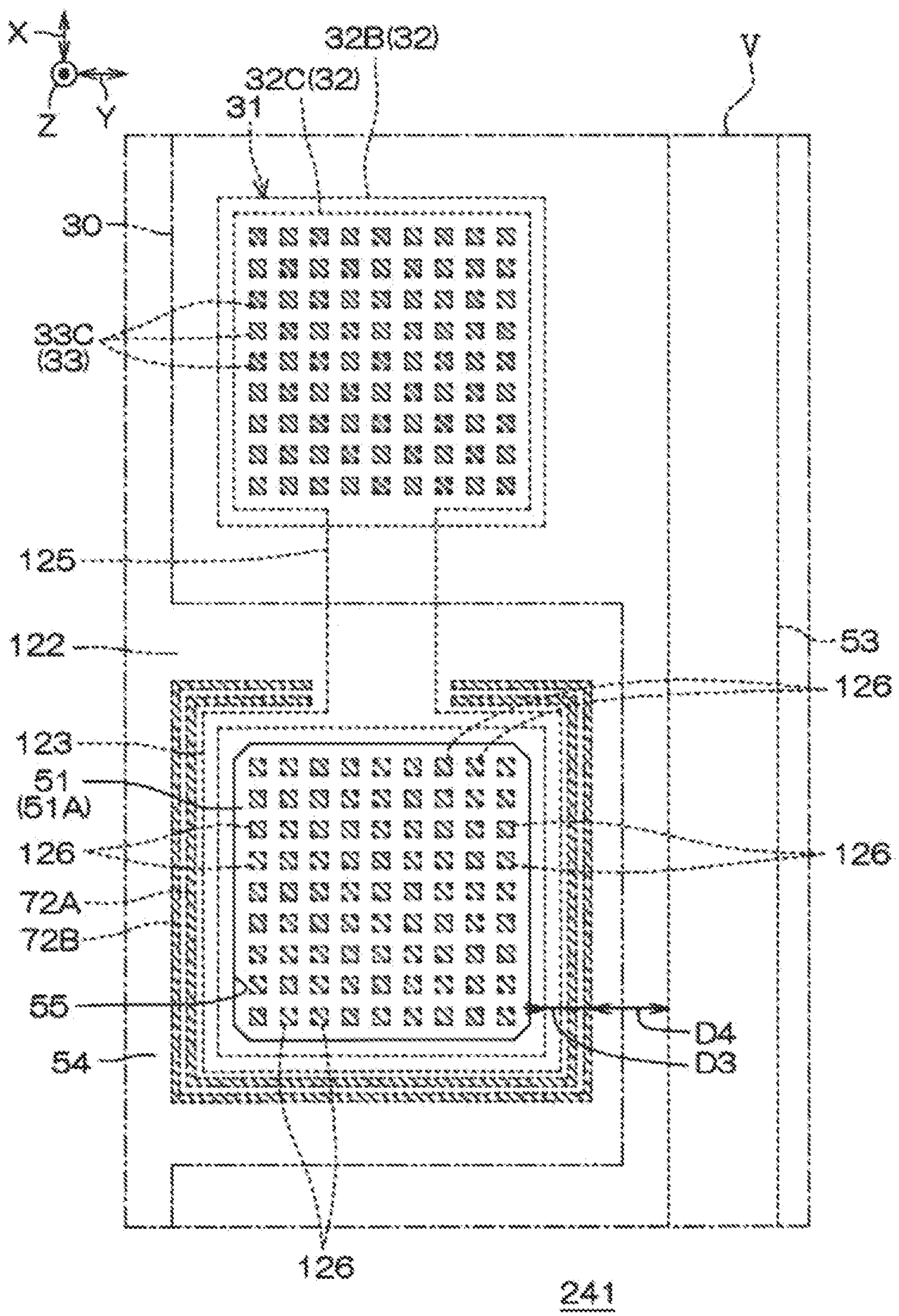
FIG. 53A is an enlarged view showing the semiconductor device shown in FIG. 51 together with an outer dummy wiring according to a second configuration example.

Specifically, the outer dummy wiring 72 extends along the connection wiring 123 so as to surround the connection wiring 123 at an interval from the lead-out wiring 125 in the plan view. Like the plurality of wirings 32, the outer dummy wiring 72 includes a first barrier film 34, a main wiring film 35, and a second barrier film 36 laminated in this order from the side of the first main surface 3. The outer dummy wiring 72 may take various forms shown in FIGS. 53A to 53D. FIG. 53A is an enlarged view showing the semiconductor device 241 shown in FIG. 51 together with an outer dummy wiring 72 according to a second configuration example. Referring to FIG. 53A, in the second configuration example, a plurality of outer dummy wirings (in this embodiment, two outer dummy wirings) 72 are formed. The plurality of outer dummy wirings 72 include a first outer dummy wiring 72A and a second outer dummy wiring 72B.

Each of the first and second outer dummy wirings 72A and 72B is disposed in the plurality of connection regions 122 so as to be located in at least a region between the terminal electrode 51 and the multilayer wiring region 30 in a plan view. The first and second outer dummy wirings 72A and 72B are arranged in this order from the terminal electrode 51 toward the side of the multilayer wiring region 30 in the plan view. In this embodiment, the first outer dummy wiring 72A is formed in a line shape extending along the terminal electrode 51 in the plan view. Specifically, the first outer dummy wiring 72A extends so as to surround the connection wiring 123 at an interval from the lead-out wiring 125 in the plan view. In this embodiment, the second outer dummy wiring 72B is formed in a line shape extending along the terminal electrode 51. Specifically, the second outer dummy wiring 72B extends so as to surround the first outer dummy wiring 72A at an interval from the lead-out wiring 125 in the plan view.

The first and second outer dummy wirings 72A and 72B may be arranged in a region close to the terminal electrode 51 with respect to the multilayer wiring 31. That is, the second outer dummy wiring 72B may be disposed at a third distance D3 from the terminal electrode 51 to the side of the multilayer wiring 31 and may be disposed at a fourth distance D4, which exceeds the third distance D3 (D3<D4), from the multilayer wiring 31 to the side of the terminal electrode 51. The third distance D3 and the fourth distance D4 are based on the outer edge of the second outer dummy wiring 72B on the side of the multilayer wiring region 30.

In this embodiment, an example in which the first and second outer dummy wirings 72A and 72B are arranged over the same layer (the third interlayer insulating film 22C) has been described. However, the first and second outer dummy wirings 72A and 72B may be arranged in different layers. For example, the first outer dummy wiring 72A may be disposed over the third interlayer insulating film 22C, while the second outer dummy wiring 72B may be disposed over the second interlayer insulating film 22B. In this case, the second outer dummy wiring 72B may be formed in an annular shape surrounding the terminal electrode 51 (the connection wiring 123) in the plan view.

Further, the first outer dummy wiring 72A may be disposed over the second interlayer insulating film 22B, while the second outer dummy wiring 72B may be disposed over the third interlayer insulating film 22C. Even in these cases, the first and second outer dummy wirings 72A and 72B may be arranged so as to be close to the terminal electrode 51 with respect to the semiconductor chip 2. In this case, the first outer dummy wiring 72A may be formed in an annular shape surrounding the terminal electrode 51 (the connection wiring 123) in the plan view.

Figure 53B:
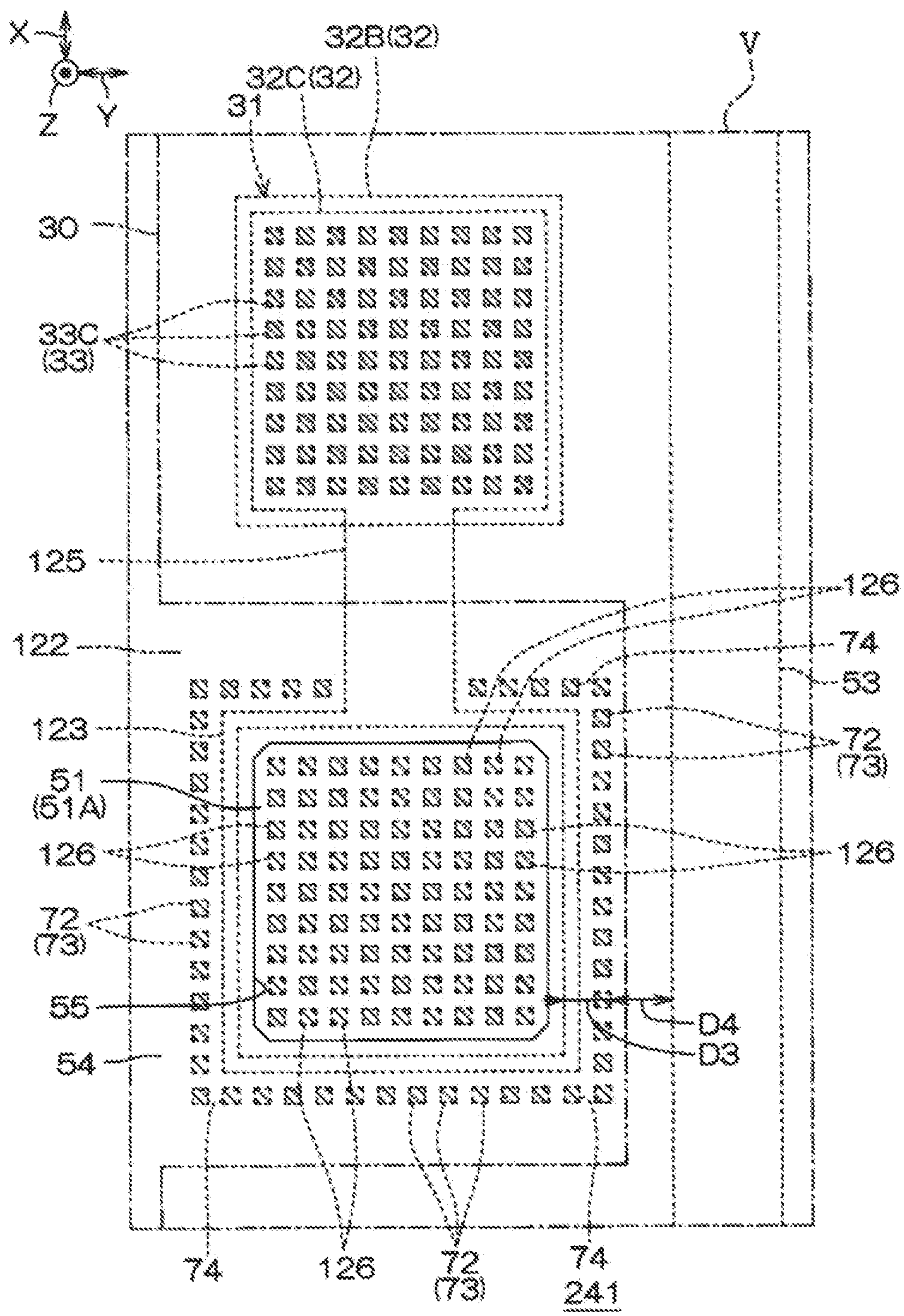
FIG. 53B is an enlarged view showing the semiconductor device shown in FIG. 51 together with an outer dummy wiring according to a third configuration example.

FIG. 53B is an enlarged view showing the semiconductor device 241 shown in FIG. 51 together with an outer dummy wiring 72 according to a third configuration example, Referring to FIG. 53B, the outer dummy wiring 72 according to the third configuration example includes a plurality of segment portions 73 arranged in a dot shape at intervals along the terminal electrodes 51 in a plan view. It can be considered that the outer dummy wiring 72 according to the third configuration example has a form in which the outer dummy wiring 72 according to the first configuration example is divided into a plurality of segment portions 73 by a plurality of removal portions 74. The plurality of segment portions 73 are arranged side by side in a row along the terminal electrode 51, Each segment portion 73 is formed in a square shape in the plan view. Each segment portion 73 has an optional planar shape and may be formed in a circular shape or a polygonal shape.

Figure 53C:
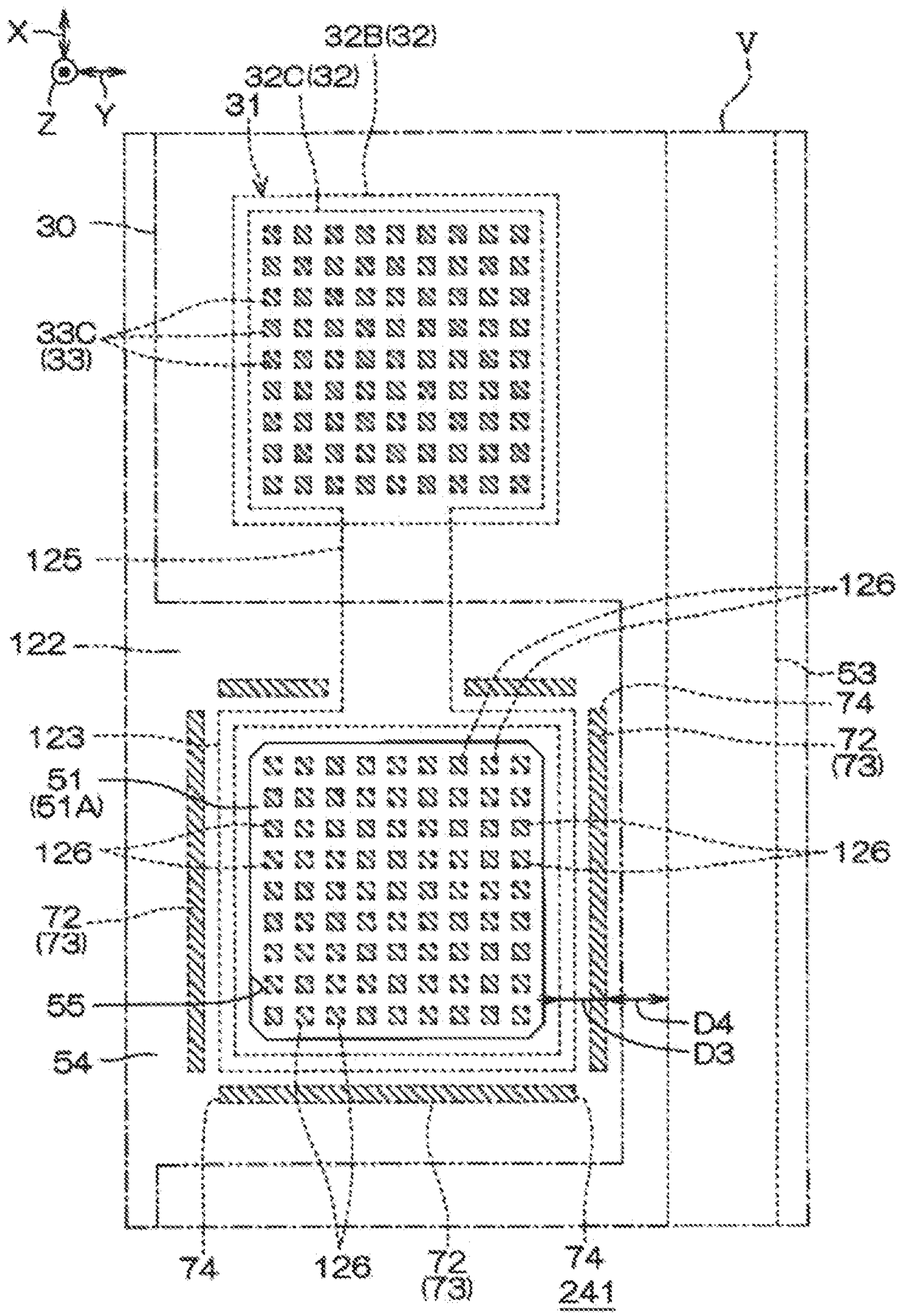
FIG. 53C is an enlarged view showing the semiconductor device shown in FIG. 51 together with an outer dummy wiring according to a fourth configuration example.

FIG. 53C is an enlarged view showing the semiconductor device 241 shown in FIG. 51 together with an outer dummy wiring 72 according to a fourth configuration example, Referring to FIG. 53C, the outer dummy wiring 72 according to the fourth configuration example includes a plurality of segment portions (in this embodiment, five segment portions) 73 arranged in a line shape at intervals along the peripheral edge of the terminal electrode 51. It can be considered that the outer dummy wiring 72 according to the fourth configuration example has a form in which the outer dummy wiring 72 according to the first configuration example is divided into a plurality of segment portions 73 by a plurality of removal portions 74. In this embodiment, the plurality of removal portions 74 are formed at the corners (specifically, four corners) of the outer dummy wiring 72, and each segment portion 73 is formed in a line shape extending along each side of the terminal electrode 51.

Figure 53D:
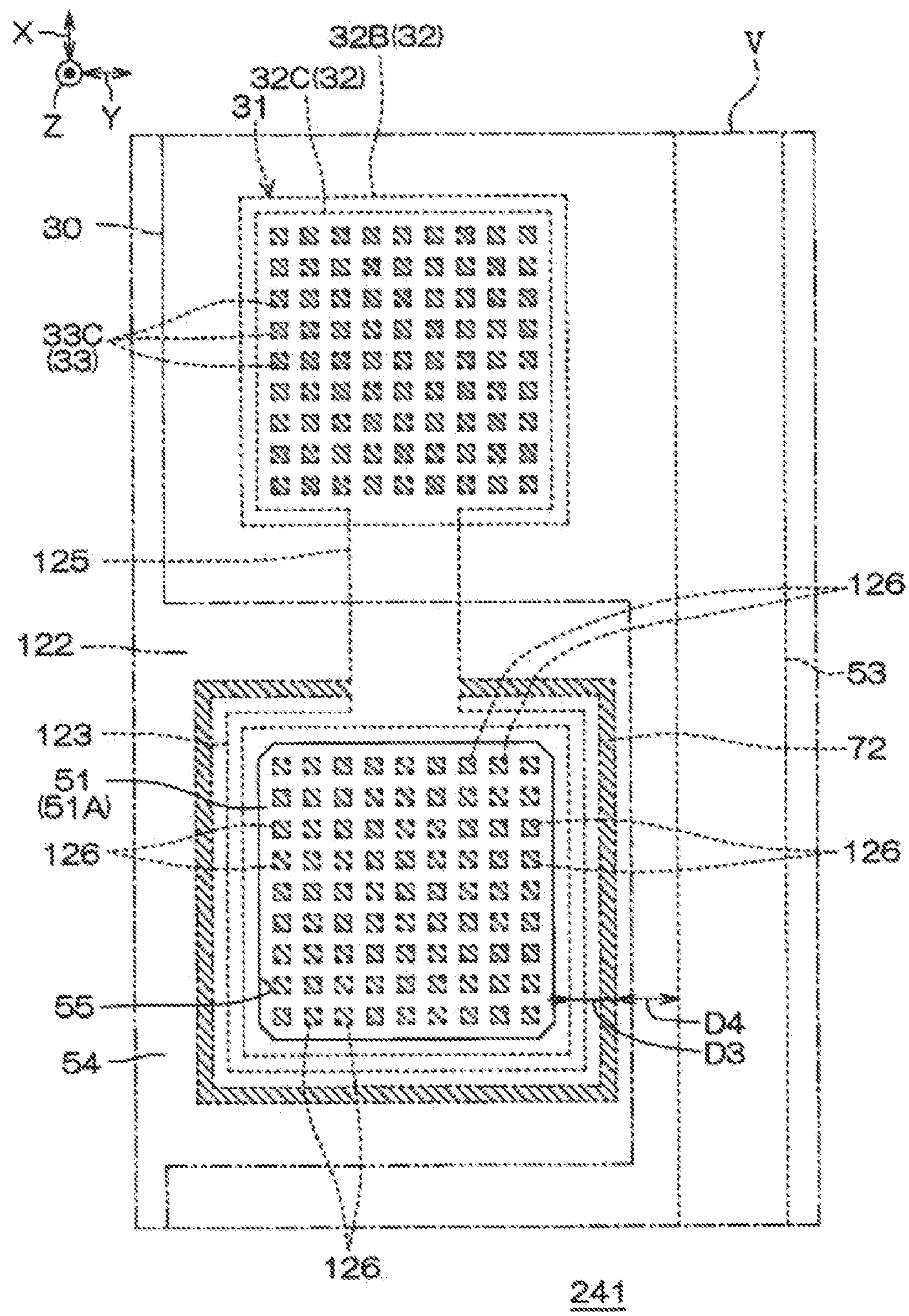
FIG. 53D is an enlarged view showing the semiconductor device shown in FIG. 51 together with an outer dummy wiring according to a fifth configuration example.

FIG. 53D is an enlarged view showing the semiconductor device 241 shown in FIG. 51 together with an outer dummy wiring 72 according to a fifth configuration example. Referring to FIG. 53D, the outer dummy wiring 72 according to the fifth configuration example is led out from one or both of the connection wiring 123 and the lead-out wiring 125 (in this embodiment, the lead-out wiring 125) so as to surround the connection wiring 123 in a plan view. In this embodiment, the outer dummy wiring 72 is electrically connected to the connection wiring 123, the terminal electrode 51, and the multilayer wiring region 30. In this embodiment, the outer dummy wiring 72 is formed in an annular shape surrounding the connection wiring 123 in the plan view.

An outer dummy wiring 72 having a form in which the features of at least two of the outer dummy wirings 72 according to the first to fifth configuration examples are combined may be adopted. As described above, the semiconductor device 241 can also exhibit the same effects as the effects described for the semiconductor device 221 according to the eighteenth embodiment. Further, the semiconductor device 241 includes the outer dummy wiring 72 (dummy wiring). The outer dummy wiring 72 is disposed in the connection region 122 so as to be located in at least a region between the terminal electrode 51 and the multilayer wiring region 30 in the plan view.

Figure 54:
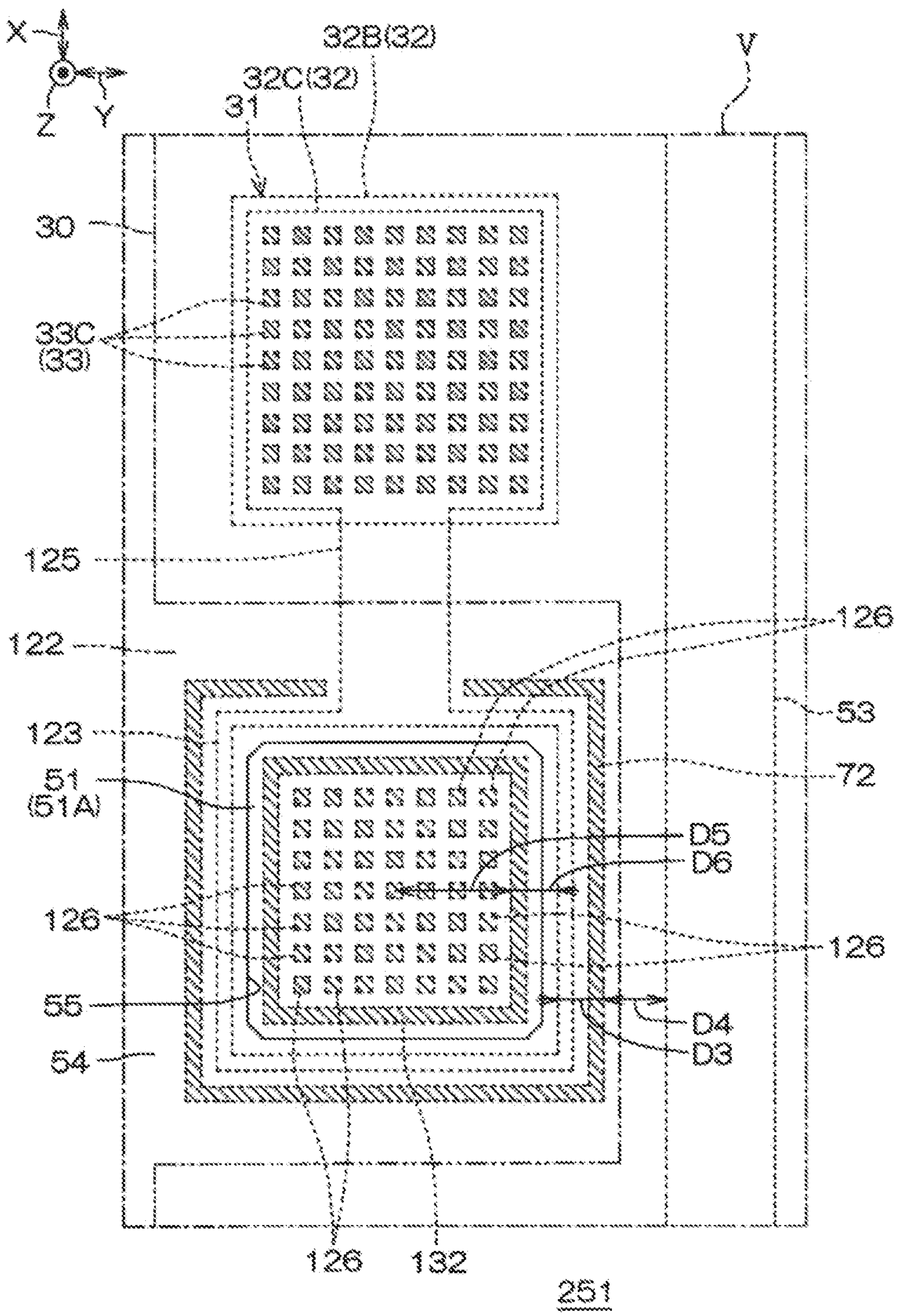
FIG. 54 corresponds to FIG. 45 and is an enlarged view showing a semiconductor device according to a twenty-first embodiment of the present disclosure together with a seal via electrode according to a first configuration example and an outer dummy wiring according to the first configuration example, FIG. 55 corresponds to FIG. 47 and is a cross-sectional view showing a semiconductor device according to a twenty-second embodiment of the present disclosure together with an outer dummy wiring according to a first configuration example.

According to this structure, even in the case where cracks occur starting from the terminal electrode 51, the cracks can be terminated by the outer dummy wiring 72. As a result, it is possible to suppress the expansion of cracks to the outside of the connection region 122 in the plan view. That is, the expansion of cracks from the connection region 122 to the multilayer wiring region 30 can be suppressed by the outer dummy wiring 72. FIG. 54 corresponds to FIG. 45 and is an enlarged view showing a semiconductor device 251 according to a twenty-first embodiment of the present disclosure together a seal via electrode 132 according to a first configuration example and an outer dummy wiring 72 according to the first configuration example. Hereinafter, structures corresponding to the structures described for the semiconductor device 221 and the like according to the eighteenth embodiment are denoted by the same reference numerals, and explanation thereof will not be repeated.

Referring to FIG. 54, the semiconductor device 251 includes the seal via electrode 132 (see FIG. 49) according to the nineteenth embodiment and the outer dummy wiring 72 (see FIG. 51) according to the twentieth embodiment. In this embodiment, the semiconductor device 251 includes the seal via electrode 132 according to the first configuration example and the outer dummy wiring 72 according to the first configuration example. The semiconductor device 251 may include any one of the seal via electrodes 132 (see FIGS. 50A and 50B) according to the second and third configuration examples, instead of the seal via electrode 132 according to the first configuration example. Further, the semiconductor device 251 may include a seal via electrode 132 having a form in which the features of at least two of the seal via electrodes 132 according to the first to third configuration examples are combined, instead of the seal via electrode 132 according to the first configuration example.

Further, the semiconductor device 251 may include any one of the outer dummy wirings 72 (see FIGS. 53A to 53D) according to the second to fifth configuration examples, instead of the outer dummy wirings 72 according to the first configuration example. Further, the semiconductor device 251 may include an outer dummy wiring 72 having a form in which the features of at least two of the outer dummy wirings 72 according to the first to fifth configuration examples are combined, instead of the outer dummy wiring 72 according to the first configuration example.

Figure 55:
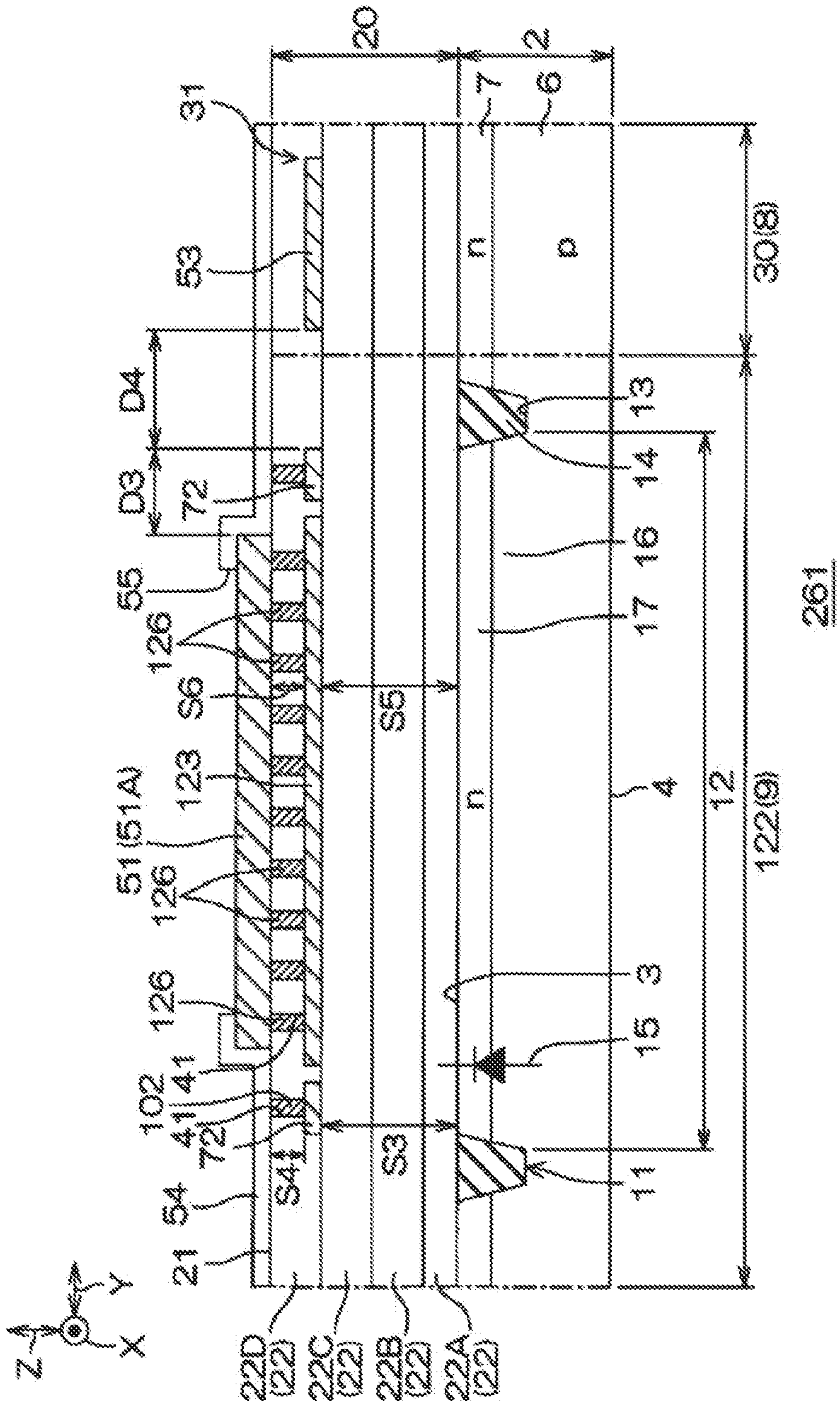

As described above, according to the semiconductor device 251, the same effects as those described for the semiconductor device 231 according to the nineteenth embodiment and those described for the semiconductor device 241 according to the twentieth embodiment can be obtained. FIG. 55 corresponds to FIG. 47 and is a cross-sectional view showing a semiconductor device 261 according to a twenty-second embodiment of the present disclosure together with an outer dummy wiring 72 according to a first configuration example. Hereinafter, structures corresponding to the structures described for the semiconductor device 221 and the like according to the eighteenth embodiment are denoted by the same reference numerals, and explanation thereof will not be repeated.

Referring to FIG. 55, the semiconductor device 261 includes an inner via electrode 126 according to the first configuration example. The semiconductor device 261 may include any one of the inner via electrodes 126 (see FIGS. 48A to 48E) according to the second to sixth configuration examples, instead of the inner via electrode 126 according to the first configuration example. Further, the semiconductor device 261 may include an inner via electrode 126 having a form in which the features of at least two of the inner via electrodes 126 according to the first to sixth configuration examples are combined, instead of the inner via electrode 126 according to the first configuration example.

The semiconductor device 261 includes an outer via electrode 102 disposed in the connection region 122, in addition to the outer dummy wiring 72 according to the first configuration example. The outer via electrode 102 is buried in the via opening 41 formed in the connection region 122. The outer via electrode 102 is buried at a thickness position between the terminal electrode 51 and the outer dummy wiring 72 so as to be connected to the outer dummy wiring 72 in the connection region 122. The outer via electrode 102 is not connected to the terminal electrode 51.

The outer via electrode 102 may be formed in an electrical floating state. That is, the outer via electrode 102 may fix the outer dummy wiring 72 in an electrical floating state. In this embodiment, the outer via electrode 102 is formed in a line shape extending along the outer dummy wiring 72 at an interval from the lead-out wiring 125 in a plan view. The outer dummy wiring 72 may be formed in at least a portion along the multilayer wiring region 30 (the different potential wiring 53) in the plan view. The outer via electrode 102 extends so as to surround the terminal electrode 51 at an interval from the lead-out wiring 125 in the plan view.

Although not shown in detail, the outer via electrode 102 may have a plurality of segment portions separated and arranged in a dot shape at intervals along the outer dummy wiring 72. Further, the outer via electrode 102 may have a plurality of segment portions separated and arranged in a line shape at intervals along the outer dummy wiring 72. Like the wiring via electrode 33, the outer via electrode 102 includes a via barrier film 42 and a via main electrode 43 laminated in this order from the inner wall side of the via opening 41. In this embodiment, the outer via electrode 102 is formed of a tungsten plug electrode, like the wiring via electrode 33. In this embodiment, the top insulating film 54 covers the entire region of the outer via electrode 102 on the insulating layer 20.

In this embodiment, an example in which the semiconductor device 261 includes the outer dummy wiring 72 according to the first configuration example has been described. However, the semiconductor device 261 may include any one of the outer dummy wirings 72 (see FIGS. 53A to 53D) according to the second to fifth configuration examples, instead of the outer dummy wiring 72 according to the first configuration example, in these cases, the outer via electrode 102 may be formed in a line shape, an annular shape, or a dot shape along the outer dummy wiring 72.

Further, the semiconductor device 261 may include an outer dummy wiring 72 having a form in which the features of at least two of the outer dummy wirings 72 according to the first to fifth configuration examples are combined, instead of the outer dummy wiring 72 according to the first configuration example. In this case, the outer via electrode 102 may be formed in a line shape, an annular shape, or a dot shape along the outer dummy wiring 72.

As described above, the semiconductor device 261 can also exhibit the same effects as effects described for the semiconductor device 241 according to the twentieth embodiment. Further, the semiconductor device 261 includes the outer via electrode 102 disposed in the connection region 122, in addition to the outer dummy wiring 72. The outer via electrode 102 is buried at a thickness position between the terminal electrode 51 and the outer dummy wiring 72 so as to be connected to the outer dummy wiring 72 in the connection region 122. According to this structure, even in the case where cracks occur starting from the terminal electrode 51, the cracks can be terminated by the outer via electrode 102. The outer via electrode 102 can also be applied to the semiconductor device 151 according to the eleventh embodiment.

Figure 56:
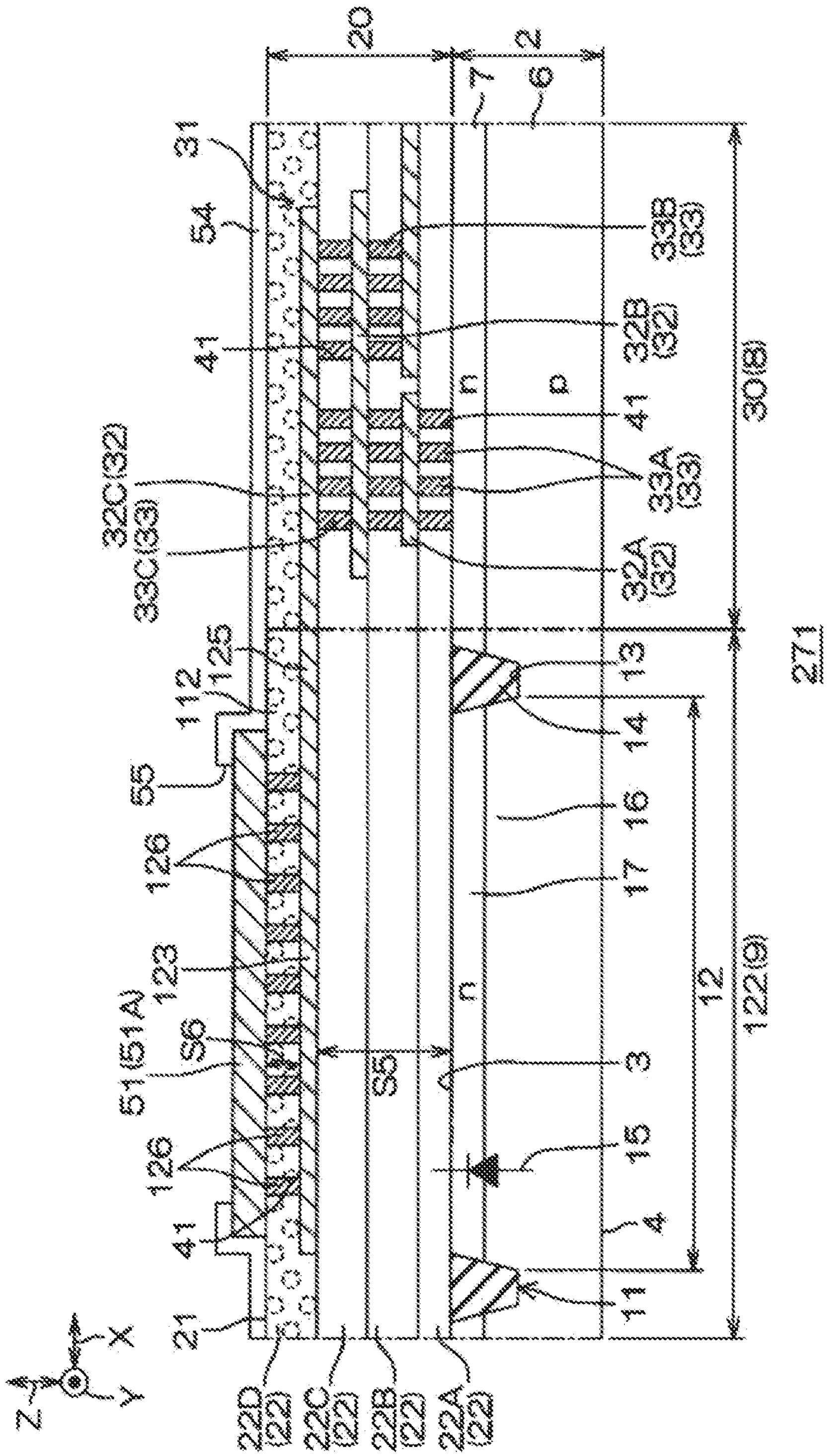
FIG. 56 corresponds to FIG. 46 and is a cross-sectional view showing a semiconductor device according to a twenty-third embodiment of the present disclosure together with a porous region according to a first configuration example.

FIG. 56 corresponds to FIG. 46 and is a cross-sectional view showing a semiconductor device 271 according to a twenty-third embodiment of the present disclosure together with a porous region 112 according to a first configuration example. Hereinafter, structures corresponding to the structures described for the semiconductor device 221 and the like according to the eighteenth embodiment are denoted by the same reference numerals, and explanation thereof will not be repeated. Referring to FIG. 56, the semiconductor device 271 includes an inner via electrode 126 according to the first configuration example. The semiconductor device 271 may include any one of the inner via electrodes 126 (see FIGS. 48A to 48E) according to the second to sixth configuration examples, instead of the inner via electrode 126 according to the first configuration example. Further, the semiconductor device 271 may include an inner via electrode 126 having a form in which the features of at least two of the inner via electrodes 126 according to the first to sixth configuration examples are combined, instead of the inner via electrode 126 according to the first configuration example.

The semiconductor device 271 includes the porous region 112 formed in the surface layer portion of the insulating layer 20, as in the case of the seventh embodiment described above. The porous region 112 is formed of a region in which a plurality of pores are introduced in the insulating layer 20 and, in this embodiment, is formed by utilizing the top interlayer insulating film 22 (the fourth interlayer insulating film 22D). That is, the porous region 112 is formed in the surface layer portion of the multilayer wiring region 30 and the surface layer portion of the connection region 122.

The plurality of pores are formed in the surface layer portion of the insulating layer 20 at intervals in the thickness direction and the surface direction of the insulating layer 20. That is, the plurality of pores are formed in the top interlayer insulating film 22 (the fourth interlayer insulating film 22D) at intervals in the thickness direction and the width direction of the top interlayer insulating film 22. The plurality of pores each have uneven sizes in a range of 1 nm or more and 500 nm or less. The porous region 112 may have a plurality of pores that fall within a range of 1 nm or more and 100 nm or less. The porous region 112 may have a plurality of pores that fall within a range of 1 nm or more and 10 nm or less.

The connection wiring. 123 is disposed in the connection region 122 so as to be in contact with the porous region 112. In this embodiment, the connection wiring 123 is disposed over the third interlayer insulating film 22C and is covered with the porous region 112. The terminal electrode 51 is disposed over a portion of the connection region 122 in which the porous region 112 is formed. In this embodiment, the terminal electrode 51 faces the connection wiring 123 with the porous region 112 interposed therebetween in the connection region 122. That is, the terminal electrode 51 faces the semiconductor chip 2 with the porous region 112 and the connection region 122 interposed therebetween. The terminal electrode 51 may have a thickness less than the thickness of the porous region 112. The plurality of inner via electrodes 126 are connected to the connection region 122 and the terminal electrode 51 within the porous region 112.

Figure 57:
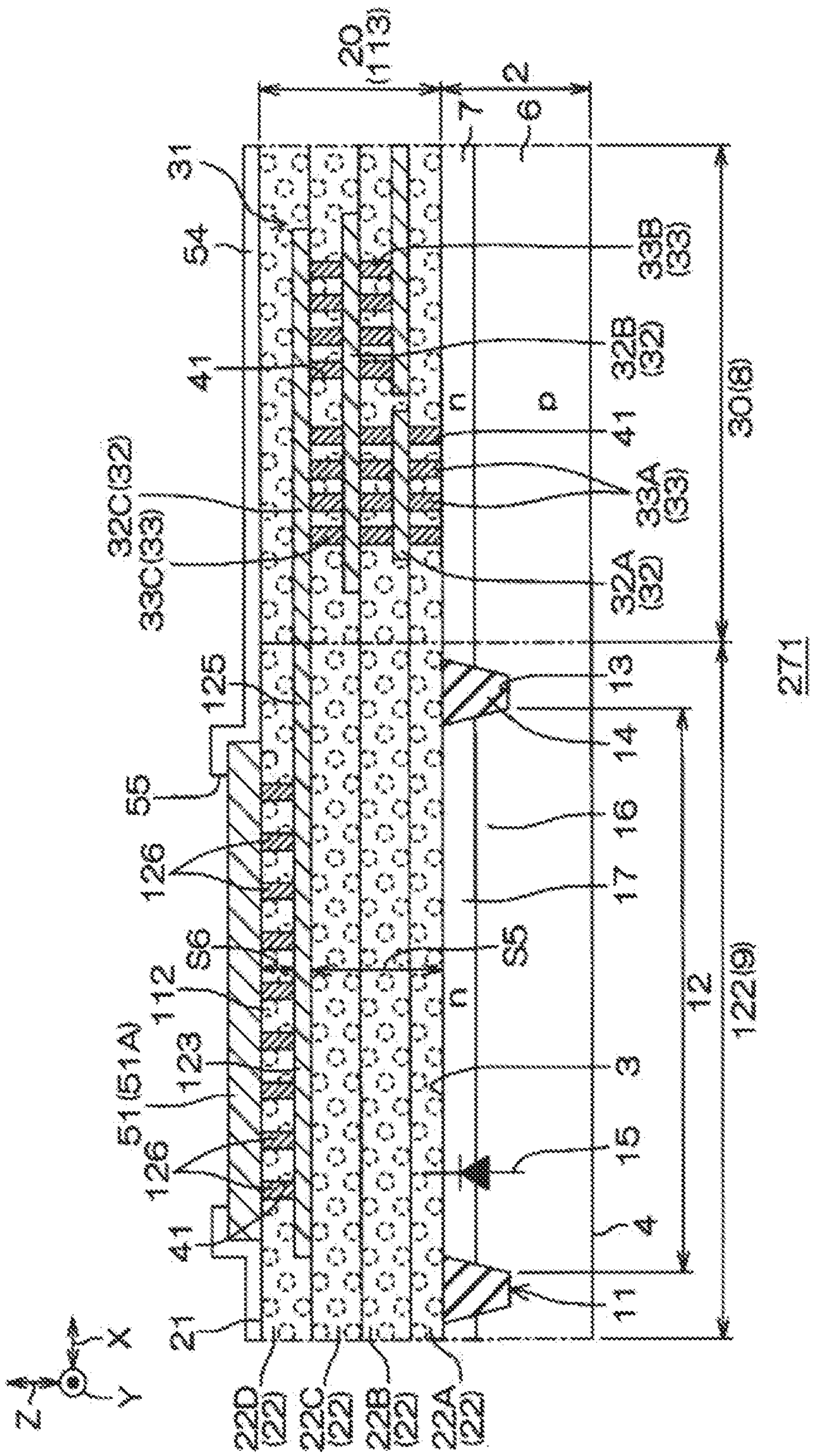
FIG. 57 is a cross-sectional view showing the semiconductor device shown in FIG. 56 together with a porous region according to a second configuration example.

The porous region 112 may take a form shown in FIG. 57. FIG. 57 is a cross-sectional view showing the semiconductor device 271 shown in FIG. 56 together with a porous region 112 according to a second configuration example. The porous region 112 according to the second configuration example is formed in the entire region of the insulating layer 20 in the thickness direction. That is, the insulating layer 20 is formed of a porous insulating layer 113. Further, the multilayer wiring 31 is formed in the porous insulating layer 113, and the connection wiring 123 is formed in the porous insulating layer 113. The connection wiring 123 faces the semiconductor chip 2 with a portion of the porous insulating layer 113 interposed therebetween, and the terminal electrode 51 faces the connection wiring 123 with a portion of the porous insulating layer 113 interposed therebetween.

As described above, the semiconductor device 271 can also exhibit the same effects as the effects described for the semiconductor device 221. Further, the semiconductor device 271 includes at least the porous region 112 formed in the surface layer portion of the insulating layer 20. The porous region 112 is formed of a region in which a plurality of pores are introduced in the insulating layer 20. According to this structure, an elastic modulus in the surface layer portion of the insulating layer 20 can be reduced by the porous region 112.

As a result, the stress at the time of connecting the conducting wires 312 to the terminal electrode 51 can be relaxed by the porous region 112. Further, even in the case where cracks occur starting from the terminal electrode 51, an impact caused by the cracks can be released (relaxed) by the plurality of pores to terminate the cracks. As a result, the expansion of cracks can be suppressed. The porous region 112 according to the seventeenth embodiment can be applied not only to the eighteenth embodiment but also to the nineteenth to twenty-second embodiments.

Figure 58:
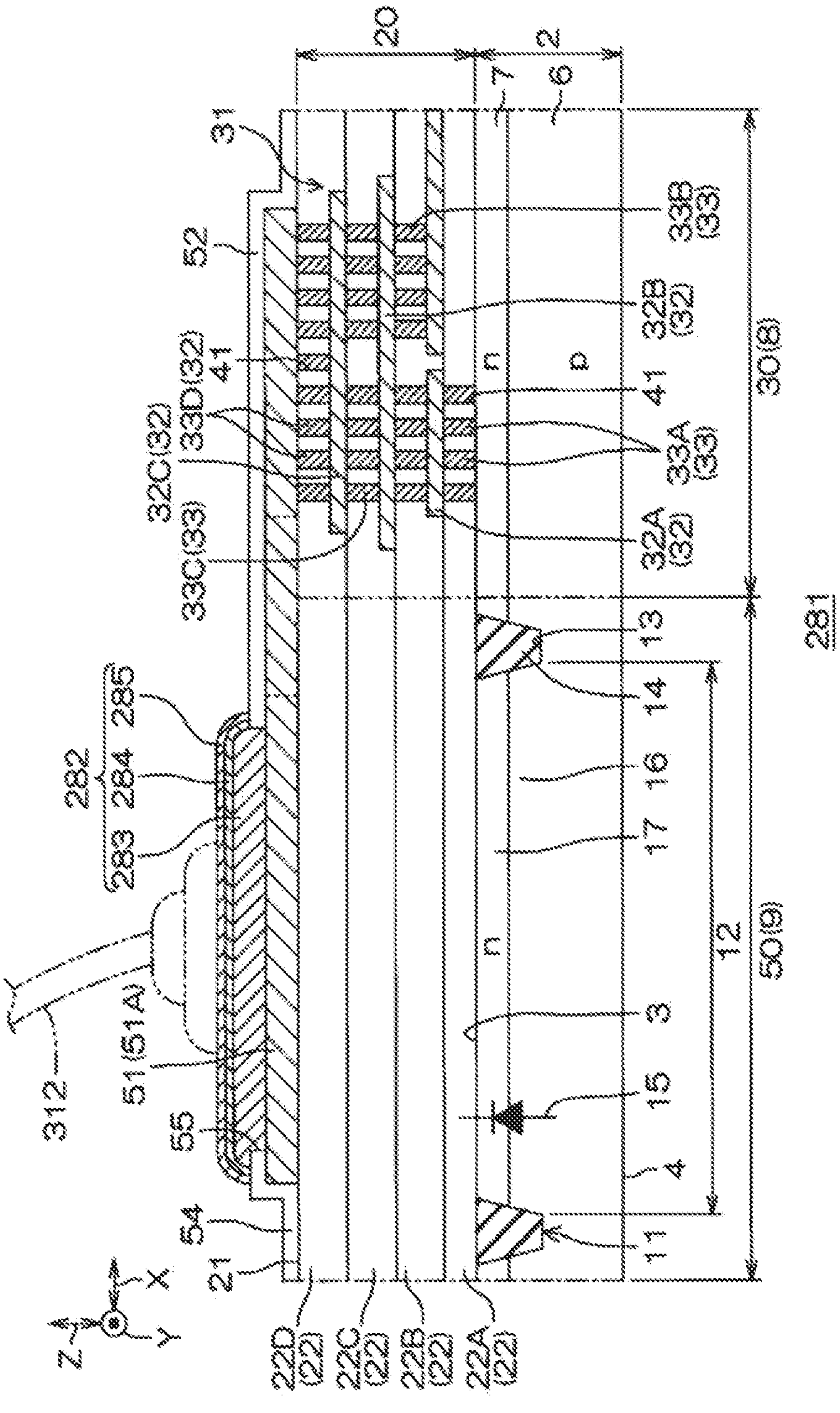
FIG. 58 corresponds to FIG. 6 and is a cross-sectional view showing a semiconductor device according to a twenty-fourth embodiment of the present disclosure.

FIG. 58 corresponds to FIG. 6 and is a cross-sectional view showing a semiconductor device 281 according to a twenty-fourth embodiment of the present disclosure. Hereinafter, structures corresponding to the structures described for the semiconductor device 221 and the like are denoted by the same reference numerals, and explanation thereof will not be repeated. The semiconductor device 281 includes a plurality of pad electrodes 282 formed over the plurality of terminal electrodes 51, respectively. One pad electrode 282 formed over one terminal electrode 51 (the first terminal electrode 51A) is shown in FIG. 58. Hereinafter, one pad electrode 282 will be described as an example. The pad electrode 282 is formed over a portion of the terminal electrode 51 which is exposed from the corresponding pad opening 55.

The pad electrode 282 is connected to the conducting wire 312 to electrically connect the conducting wire 312 and the terminal electrode 51. The pad electrode 282 extends along the surface direction of the terminal electrode 51 and is in contact with the wall portion of the pad opening 55. The pad electrode 282 backfills the pad opening 55 and projects upward from the main surface of the top insulating film 54. In this embodiment, the pad electrode 282 overlaps the main surface of the top insulating film 54.

The pad electrode 282 may be formed of a plating film. Specifically, the pad electrode 282 may be formed of a metal-plating film having a higher affinity for the conducting wire 312 than the terminal electrode 51. Further, the pad electrode 282 may be formed of a noble metal-plating film. In this embodiment, the pad electrode 282 has a laminated structure including a Ni film 283, a Pd film 284, and an Au film 285 laminated in this order from the side of the terminal electrode 51. The Ni film 283, the Pd film 284, and the Au film 285 are each formed of a plating film.

The Ni film 283 extends along the surface direction of the terminal electrode 51 and is in contact with the wall portion of the pad opening 55. The Ni film 283 backfills the pad opening 55 and projects upward from the main surface of the top insulating film 54. In this embodiment, the Ni film 283 overlaps the main surface of the top insulating film 54. The Pd film 284 is formed in the form of a film along the outer surface of the Ni film 283 and overlaps the main surface of the top insulating film 54. The Pd film 284 may have a thickness less than the thickness of the Ni film 283, The Au film 285 is formed in the form of a film along the outer surface of the Pd film 284 and overlaps the main surface of the top insulating film 54. The Au film 285 may have a thickness less than the thickness of the Pd film 284.

The pad electrode 282 may not include all of the Ni film 283, the Pd film 284, and the Au film 285, but may include at least one of the Ni film 283, the Pd film 284, and the Au film 285. As described above, the semiconductor device 281 can also exhibit the same effects as the effects described for the semiconductor device 221. The structure in which the pad electrode 282 is formed can be applied not only to the first embodiment but also to the second to twenty-third embodiments.

The present disclosure may be implemented in other embodiments. In each of the above-described embodiments, an example in which the outer diode 15 is formed has been described. However, in each of the above-described embodiments, a form in which the outer diode 15 is removed may be adopted. According to this structure, although the effects related to the outer diode 15 cannot be obtained, the other effects can be the same as the effects described for each of the above-described embodiments.

In each of the above-described embodiments, an example in which the semiconductor chip 2 is formed of a silicon chip has been described. However, the semiconductor chip 2 may be formed of a semiconductor chip made of a wide band gap semiconductor. The wide band gap semiconductor is a semiconductor having a band gap larger than that of silicon. Examples of the wide band gap semiconductor may include GaN (gallium nitride) and SiC (silicon carbide).

Although the first to twenty-fourth embodiments have been described in the present disclosure, a semiconductor device having a form in which at least two of the features shown in the first to twenty-fourth embodiments are combined may be adopted. Hereinafter, examples of the features extracted from the present disclosure and the drawings will be shown. The following [A1] to [A20], [B1] to [B20], [C1] to [C20], [D1] to [D20], [E1] to [E20], and [F1] to [F20] provide semiconductor devices capable of improving reliability of a terminal electrode.

[A1] A semiconductor device including: a chip 2, a circuit element 10 formed in the chip 2, an insulating layer 20 formed over the chip 2 so as to cover the circuit element 10, a multilayer wiring region 30 formed in the insulating layer 20 and including a plurality of wirings 32 laminated and arranged in a thickness direction of the insulating layer 20 so as to be electrically connected to the circuit element 10, an insulating region 50 which does not include the wirings 32 in an entire region in the thickness direction of the insulating layer 20 and is formed in a region outside the multilayer wiring region 30 in the insulating layer 20, and a terminal electrode 51 disposed over the insulating layer 20 so as to face the chip 2 with the insulating region 50 interposed between the terminal electrode 51 and the chip 2.

[A2] The semiconductor device of A1, wherein the multilayer wiring region 30 is formed in a portion of the insulating layer 20 that covers the circuit element 10, the insulating region 50 is formed in a portion of the insulating layer 20 that covers the outside of the circuit element 10, and the terminal electrode 51 faces a region outside the circuit element 10 in the chip 2.

[A3] The semiconductor device of A1 or A2, further including: a rectifier 15 including an anode region 16 formed in a region outside the circuit element 10 in a surface layer portion of the chip 2 and a cathode region 17 formed in a surface layer portion of the anode region 16, wherein the insulating region 50 is formed in a portion of the insulating layer 20 that covers the rectifier 15, and the terminal electrode 51 faces the rectifier 15.

[A4] The semiconductor device of A3, wherein the cathode region 17 is formed in an electrical floating state.

[A5] The semiconductor device of any one of A1 to A4, further including: a dummy wiring 62 which is disposed in the insulating region 50 so as to partially face the terminal electrode 51 and is electrically independent from the plurality of wirings 32.

[A6] The semiconductor device of A5, wherein the dummy wiring 62 is formed in a dot shape, a line shape, or an annular shape along a peripheral edge of the terminal electrode 51 in a plan view.

[A7] The semiconductor device of A5 or A6, wherein the dummy wiring 62 is formed in an electrical floating state.

[A8] The semiconductor device of any one of A5 to A7, further including: a dummy via electrode 92 which is interposed between the terminal electrode 51 and the dummy wiring 62 in the insulating region 50 and electrically connects the terminal electrode 51 and the dummy wiring 62.

[A9] The semiconductor device of any one of A1 to A8, further including: an outer dummy wiring 72 which is disposed in the insulating layer 20 so as to be located in a region between the terminal electrode 51 and the multilayer wiring region 30 in the plan view and is electrically independent from the plurality of wirings 32.

[A10] The semiconductor device of A9, wherein the outer dummy wiring 72 is formed in a dot shape, a line shape, or an annular shape along the terminal electrode 51 in the plan view.

[A11] The semiconductor device of A9 or A10, wherein the outer dummy wiring 72 is formed in an electrical floating state.

[A12] The semiconductor device of any one of A9 to A11, further including: an outer via electrode 102 buried at a thickness position between the terminal electrode 51 and the outer dummy wiring 72 so as to be connected to the outer dummy wiring 72 in the insulating region 50.

[A13] The semiconductor device of any one of A1 to A12, further including: a lead-out electrode 52 led out from the terminal electrode 51 onto the insulating layer 20 so as to face the wirings 32 with a portion of the insulating layer 20 interposed between the lead-out electrode and the wirings, and a via electrode 33 which is interposed between the lead-out electrode 52 and the wirings 32 in the insulating layer 20 and electrically connects the lead-out electrode 52 and the wirings 32.

[A14] The semiconductor device of any one of A1 to A13, including: a plurality of terminal electrodes 51.

[A15] The semiconductor device of any one of A1 to A14, including: a plurality of insulating regions 50.

[A16] The semiconductor device of any one of A1 to A15, further including: a porous region 112 or 113 which includes a region in which a plurality of pores are introduced in the insulating layer 20 and is formed in at least the surface layer portion of the insulating layer 20, wherein the terminal electrode 51 is disposed over the porous region 112 or 113 of the insulating layer 20.

[A17] The semiconductor device of any one of A1 to A16, further including: a pad electrode 282 formed over the terminal electrode 51.

[A18] A semiconductor device including: a chip 2, an insulating layer 20 which covers the chip 2, a plurality of wirings 32 which forms a multilayer wiring 31 in the insulating layer 20, and a terminal electrode 51 disposed over the insulating layer 20 at a distance from the plurality of wirings 32 in a plan view so as to face the chip 2 with only the insulating layer 20 interposed between the terminal electrode end the chip.

[A19] The semiconductor device of A18, further including: a rectifier 15 including an anode region 16 formed in the surface layer portion of the chip 2 and a cathode region 17 formed in the surface layer portion of the anode region 16, wherein the insulating layer 20 covers the rectifier 15, and the terminal electrode 51 faces the rectifier 15 with only the insulating layer 20 interposed between the terminal electrode 51 and the rectifier 15.

[A20] The semiconductor device of A18 or A19, further including: a lead-out electrode 52 led out from the terminal electrode 51 onto the insulating layer 20 so as to face the wirings 32 with a portion of the insulating layer 20 interposed between the lead-out electrode 52 and the wirings 32, and a via electrode 33 which is interposed between the lead-out electrode 52 and the wirings 32 in the insulating layer 20 and electrically connects the lead-out electrode 52 and the wirings 32.

[B1] A semiconductor device including: a chip 2, an insulating layer 20 formed over the chip 2, a connection wiring 123 disposed in the insulating layer 20, a plurality of through-holes 124 formed in the connection wiring 123, and a terminal electrode 51 disposed over the insulating layer 20 so as to face the connection wiring 123.

[B2] The semiconductor device of B1, wherein the terminal electrode 51 faces all of the plurality of through-holes 124.

[B3] The semiconductor device of B1 or B2, wherein the plurality of through-holes 124 are formed in an inner portion of the connection wiring 123.

[B4] The semiconductor device of any one of B1 to B3, wherein the plurality of through-holes 124 are arranged at intervals from the inner portion of the connection wiring 123 toward the entire circumference of the peripheral edge of the connection wiring 123 in a plan view.

[B5] The semiconductor device of any one of B1 to B4, wherein the plurality of through-holes 124 are arranged at intervals along an electrode surface of the connection wiring 123 in a first direction X and a second direction Y intersecting the first direction X.

[B6] The semiconductor device of any one of B1 to B5, wherein the plurality of through-holes 124 are arranged in the form of a matrix so as to partition a plurality of crossroad portions in the connection wiring 123.

[B7] The semiconductor device of any one of B1 to B6, wherein the plurality of through-holes 124 are arranged in a staggered manner so that a plurality of T-shaped road portions are partitioned on the connection wiring 123.

[B8] The semiconductor device of any one of B1 to B7, wherein the plurality of through-holes 124 are arranged so that a ratio of a total area of the through-holes (124) occupying a plane area of a region surrounded by the peripheral edge of the connection wiring 123 to the plane area is 20% or more and 80% or less.

[B9] The semiconductor device of any one of B1 to B8, further including: a via electrode 126 or 132 which is interposed between the connection wiring 123 and the terminal electrode 51 in the insulating layer 20 so as to electrically connect the connection wiring 123 and the terminal electrode 51.

[B10] The semiconductor device of B9, wherein the via electrode 126 or 132 is formed in the peripheral edge of the terminal electrode 51 at an interval from the plurality of through-holes 124 in the plan view.

[B11] The semiconductor device of B9 or B10, wherein the plurality of via electrodes 126 are arranged side by side in a row along the peripheral edge of the terminal electrode 51 in the plan view.

[B12] The semiconductor device of B9 or B10, wherein the via electrode 132 extends in a stripe shape along the peripheral edge of the terminal electrode 51 in the plan view.

[B13] The semiconductor device of B12, wherein the via electrode 132 is formed in an annular shape surrounding the plurality of through-holes 124 in the plan view.

[B14] The semiconductor device of any one of B1 to B13, further including: a circuit element 10 formed in the chip 2, and a plurality of wirings 32 laminated and arranged in the thickness direction of the insulating layer 20 so as to be electrically connected to the circuit element 10, wherein the connection wiring 123 is electrically connected to at least one of the plurality of wirings 32.

[B15] The semiconductor device of B13 or B14, further including: a dummy wiring 72 disposed in the insulating layer 20 so as to be located between the terminal electrode 51 and the wirings 32 in the plan view.

[B16] The semiconductor device of B 15, wherein the dummy wiring is formed in a stripe shape extending along the terminal electrode in the plan view.

[B17] The semiconductor device of any one of B1 to B16, wherein the connection wiring 123 faces the chip (2) with only the insulating layer 20 interposed between the connection wiring 123 and the chip 2.

[B18] The semiconductor device of any one of B1 to B17, further including: a rectifier 15 including an anode region 16 formed in the surface layer portion of the chip 2 and a cathode region 17 formed in the surface layer portion of the anode region 16, wherein the insulating layer 20 covers the rectifier 15 and the connection wiring 123 faces the rectifier 15 with the insulating layer 20 interposed between the connection wiring 123 and the rectifier 15.

[B19] The semiconductor device of any one of B1 to B18, further including: a porous region 112 or 113 which is formed of a region in which a plurality of pores are introduced in the insulating layer 20 and is formed in at least the surface layer portion of the insulating layer 20, wherein the connection wiring 123 is disposed in the insulating layer 20 so as to be in contact with the porous region 112 or 113, each of the plurality of through-holes 124 is filled with a portion of the porous region 112 or 113, and the terminal electrode 51 covers the porous region 112 or 113.

[B20] The semiconductor device of any one of B1 to B19, further including: a pad electrode 282 formed over the terminal electrode 51.

[C1] A semiconductor device including: a chip 2, an insulating layer 20 formed over the chip 2, a connection wiring 123 disposed in the insulating layer 20, a terminal electrode 51 disposed over the insulating layer 20 so as to face the connection wiring 123, and a seal via electrode (132) which is interposed between the connection wiring 123 and the peripheral edge of the terminal electrode 51 in the insulating layer 20 so as to be connected to the connection wiring 123 and the terminal electrode 51, and is formed in a stripe shape extending along the peripheral edge of the terminal electrode 51 in a plan view.

[C2] The semiconductor device of C1, wherein the seal via electrode 132 is formed in an annular shape surrounding an inner portion of the terminal electrode 51 in the plan view.

[C3] The semiconductor device of C2, wherein the seal via electrode 132 partitions a closed space in which only the insulating layer 20 is disposed, in a region between the connection wiring 123 and the terminal electrode 51 in the insulating layer 20.

[C4] The semiconductor device of C2 or C3, wherein the seal via electrode 132 is formed of a single connection member connecting the connection wiring 123 and the terminal electrode 51.

[C5] The semiconductor device of any one of C2 to C4, wherein the seal via electrode 132 forms a single current path connecting the connection wiring 123 and the terminal electrode 51.

[C6] The semiconductor device of any one of C1 to C5, wherein the seal via electrode 132 is interposed between the peripheral edge of the connection wiring 123 and the peripheral edge of the terminal electrode 51.

[C7] The semiconductor device of any one of C1 to C6, wherein the seal via electrode 132 extends in parallel along the side of the terminal electrode 51.

[C8] The semiconductor device of any one of C1 to C7, wherein the terminal electrode 51 is disposed in a region surrounded by the peripheral edge of the connection wiring 123 in the plan view.

[C9] The semiconductor device of any one of C1 to C8, wherein the entire region of the terminal electrode 51 faces the connection wiring 123.

[C10] The semiconductor device of any one of C1 to C9, wherein the connection wiring 123 is disposed in the insulating layer 20 with a first space S5 from the chip 2 in the thickness direction of the insulating layer 20, and the terminal electrode 51 is disposed over the insulating layer 20 with a second space S6, which is less than the first space S5, from the connection wiring 123 in the thickness direction of the insulating layer 20.

[C11] The semiconductor device of any one of C1 to C10, further including: a circuit element 10 formed in the chip 2, and a plurality of insulating wirings 32 laminated and arranged in the thickness direction of the insulating layer 20 so as to be electrically connected to the circuit element 10, wherein the connection wiring 123 is electrically connected to at least one of the plurality of wirings 32.

[C12] The semiconductor device of C11, wherein the terminal electrode 51 is disposed over the connection wiring 123 at an interval from the plurality of wirings 32 in the plan view.

[C13] The semiconductor device of C11 or C12, further including: a dummy wiring 72 disposed in the insulating layer 20 so as to be located between the terminal electrode 51 and the wirings 32 in the plan view.

[C14] The semiconductor device of C13, wherein the dummy siring is formed in a stripe shape extending along the terminal electrode in the plan view.

[C15] The semiconductor device of any one of C1 to C14, wherein the connection wiring 123 faces the chip 2 with only the insulating layer 20 interposed between the connection wiring 123 and the chip 2.

[C16] The semiconductor device of any one of C1 to C15, further including: a rectifier 15 including an anode region 16 formed in the surface layer portion of the chip 2 and a cathode region 17 formed in the surface layer portion of the anode region 16, wherein the insulating layer 20 covers the rectifier 15, and the connection wiring 123 faces the rectifier 15 with the insulating layer 20 interposed between the connection wiring 123 and the rectifier 15.

[C17] The semiconductor device of any one of C1 to C16, further including: a porous region 112 or 113 which is formed of a region in which a plurality of pores are introduced in the insulating layer 20 and is formed in at least the surface layer portion of the insulating layer 20, wherein the terminal electrode 51 is disposed over the porous region 112 or 113 of the insulating layer 20, and the seal via electrode 132 is formed in the porous region 112 of the insulating layer 20.

[C18] The semiconductor device of any one of C1 to C17, wherein the seal via electrode 132 is made of a metal material different from that of the connection wiring 123.

[C19] The semiconductor device of any one of C1 to C18, wherein the connection wiring 123 includes an Al-based metal layer, the terminal electrode 51 includes an Al-based metal layer, and the seal via electrode 132 includes a W-based metal layer.

[C20] The semiconductor device of any one of C1 to C19, further including: a pad electrode 282 formed over the terminal electrode 51.

[D1] A semiconductor device including: a chip 2, an insulating layer 20 formed over the chip 2, a connection wiring 123 disposed in the insulating layer 20, a terminal electrode 51 disposed over the insulating layer 20 so as to face the connection wiring 123, a first via electrode 126 interposed between the connection wiring 123 and the terminal electrode 51 in the insulating layer 20 so as to electrically connect the connection wiring 123 and the terminal electrode 51, and a second via electrode 102 which is disposed around the terminal electrode 51 in a plan view and is formed in a thickness range between the connection wiring 123 and the terminal electrode 51 in the insulating layer 20.

[D2] The semiconductor device of D1, further including: a different potential wiring 53 which is disposed in the insulating layer 20 so as to be adjacent to the connection wiring 123 in the lateral direction, and applied with a potential different from that of the connection wiring 123, wherein the terminal electrode 51 is disposed at an interval from the different potential wiring 53 in the plan view, and the second via electrode 102 is disposed in a region between the connection wiring 123 and the different potential wiring 53 in the plan view.

[D3] The semiconductor device of D2, wherein the second via electrode 102 is disposed around the connection wiring 123 so as to partition a region in which the connection wiring 123 is disposed from a region in which the different potential wiring 53 is disposed.

[D4] The semiconductor device of any one of D1 to D3, wherein the second via electrode 102 extends in a line shape along the terminal electrode 51 in the plan view.

[D5] The semiconductor device of any one of D1 to D4, wherein the second via electrode 102 is formed in an annular shape surrounding the terminal electrode 51 in the plan view.

[D6] The semiconductor device of any one of D1 to D5, wherein a plurality of first via electrodes 126 are interposed between the connection wiring 123 and the terminal electrode 51.

[D7] The semiconductor device of D6, wherein the plurality of first via electrodes 126 are interposed between the connection wiring 123 and the peripheral edge of the terminal electrode 51 and are formed at intervals along the peripheral edge of the terminal electrode 51 in the plan view.

[D8] The semiconductor device of D6 or D7, wherein the plurality of first via electrodes 126 are formed at intervals from the inner portion of the terminal electrode 51 to the peripheral edge of the terminal electrode 51.

[D9] The semiconductor device of any one of D1 to D8, further including: a plurality of through-holes 124 formed in the connection wiring 123.

[D10] The semiconductor device of D9, wherein the plurality of through-holes 124 are arranged at intervals from the inner portion to the entire circumference of the peripheral edge in the plan view.

[D11] The semiconductor device of any one of D1 to D10, wherein the terminal electrode 51 is disposed in a region surrounded by the peripheral edge of the connection wiring 123 in the plan view.

[D12] The semiconductor device of any one of D1 to D11, wherein the entire region of the terminal electrode 51 faces the connection wiring 123.

[D13] The semiconductor device of any one of D1 to D12, wherein the connection wiring 123 is disposed in the insulating layer 20 with a first space S5 from the chip 2 in the thickness direction of the insulating layer 20, and the terminal electrode 51 is disposed over the insulating layer 20 with a second space S6, which is less than the first space S5, from the connection wiring 123 in the thickness direction of the insulating layer 20.

[D14] The semiconductor device of any one of D1 to D13, wherein the connection wiring 123 faces the chip 2 with only the insulating layer 20 interposed between the connection wiring 123 and the chip 2.

[D15] The semiconductor device of any one of D1 to D14, further including: a rectifier 15 including an anode region 16 formed in the surface layer portion of the chip 2 and a cathode region 17 formed in the surface layer portion of the anode region (16), wherein the insulating layer 20 covers the rectifier 15, and the connection wiring 123 faces the rectifier 15 with the insulating layer 20 interposed between the connection wiring 123 and the rectifier 15.

[D16] The semiconductor device of any one of D1 to D15, further including: a porous region 112 which is formed of a region in which a plurality of pores are introduced in the insulating layer 20, and is formed in at least the surface layer portion of the insulating layer 20, wherein the terminal electrode 51 is disposed over the porous region 112 of the insulating layer 20.

[D17] The semiconductor device of any one of D1 to D16, wherein each of the plurality of first via electrodes 126 is made of a metal material different from that of the connection wiring 123.

[D18] The semiconductor device of any one of D1 to D17, wherein the connection wiring 123 includes an Al-based metal layer, the terminal electrode 51 includes an Al-based metal layer, and each of the plurality of first via electrodes 126 includes a W-based metal layer.

[D19] The semiconductor device of any one of D1 to D18, further including: a pad electrode 282 formed over the terminal electrode 51.

[D20] The semiconductor device of D19, wherein the pad electrode 282 includes a plating film.

[E1] A semiconductor device including: a chip 2, an insulating layer 20 which covers the chip 2, a porous region 112 or 113 which is formed of a region in which a plurality of pores are introduced in the insulating layer 20 and is formed in at least the surface layer portion of the insulating layer 20, and a terminal electrode 51 which is disposed over the insulating layer 20 so as to cover the porous region 112 or 113.

[E2] The semiconductor device of E1, further including: a floating rectifier 15 including an anode region 16 formed in the surface layer portion of the chip 2 and a cathode region 17 formed in an electrical floating state in the surface layer portion of the anode region 16, wherein the insulating layer 20 covers the floating rectifier 15, and the terminal electrode 51 faces the floating rectifier 15 with the insulating layer 20 interposed between the terminal electrode 51 and the floating rectifier 15.

[E3] The semiconductor device of E1 or E2, wherein the terminal electrode 51 has a thickness less than the thickness of the insulating layer 20.

[E4] The semiconductor device of any one of E1 to E3, wherein the terminal electrode 51 has a thickness less than the thickness of the porous region 112 or 113.

[E5] The semiconductor device of any one of E1 to E4, wherein the porous region 112 or 113 is formed in the entire region of the insulating layer 20 in the thickness direction.

[E6] The semiconductor device of any one of E1 to E5, wherein the porous region 112 or 113 is formed of a region in which a plurality of pores having a size of 1 nm or more and 100 nm or less are introduced in the insulating layer 20.

[E7] The semiconductor device of any one of E1 to E6, further including: a circuit element (10) formed in the chip 2, a connection wiring 123 which is disposed in the insulating layer 20 so as to be in contact with the porous region 112 or 113 and is electrically connected to the circuit element 10, a terminal electrode 51 disposed over the insulating layer 20 so as to face the connection wiring 123 with the porous region 112 or 113 interposed therebetween, and a plurality of via electrodes 126 interposed between the connection wiring 123 and the terminal electrode 51 in the porous region 112 or 113 so as to electrically connect the connection wiring 123 and the terminal electrode 51.

[E8] The semiconductor device of E7, wherein the plurality of via electrodes 126 are arranged so that a ratio of a total area of via electrodes 126 occupying a plane area of the terminal electrodes 51 to the plane area of the terminal electrodes 51 is 50% or more and 80% or less.

[E9] The semiconductor device of E7 or E8, wherein the plurality of via electrodes 126 are arranged al intervals from the inner portion of the terminal electrode 51 toward the entire circumference of the peripheral edge of the terminal electrode 51 in a plan view.

[E10] The semiconductor device of any one of E1 to E6, further including: a circuit element 10 formed in the chip 2, a connection wiring 123 which is disposed in the insulating layer 20 so as to be in contact with the porous region 112 or 113 and is electrically connected to the circuit element 10, a terminal electrode 51 which is disposed over the insulating layer 20 so as to face the connection wiring 123 with the porous region 112 or 113 interposed between the terminal electrode 51 and the connection wiring 123, a plurality of through-holes 124 which are formed in the connection wiring 123 and in which a portion of the porous region 112 or 113 is buried, a terminal electrode 51 which is disposed over the insulating layer 20 so as to face the connection wiring 123 with the porous region 112 or 113 interposed between the terminal electrode 51 and the connection wiring 123, and a via electrode 126 interposed between the connection wiring 123 and the terminal electrode 51 in the porous region 112 or 113 so as to electrically connect the connection wiring 123 and the terminal electrode 51.

[E11] The semiconductor device of E10, wherein the plurality of through-holes 124 are formed in the inner portion of the connection wiring 123, and the via electrode 126 is formed in the peripheral edge of the terminal electrode 51 at an interval from the plurality of through-holes 124 in the plan view.

[E12] The semiconductor device of E10 or E11, wherein the plurality of through-holes 124 are arranged at intervals from the inner portion toward the entire circumference of the peripheral edge in the plan view.

[E13] The semiconductor device of any one of E1 to E6, including: a circuit element 10 formed in the chip 2, a connection wiring 123 which is disposed in the insulating layer 20 so as to be in contact with the porous region 112 or 113 and is electrically connected to the circuit element 10, a terminal electrode 51 which is disposed over the insulating layer 20 so as to face the connection wiring 123 with the porous region 112 or 113 interposed between the terminal electrode 51 and the connection wiring 123, and a second via electrode 132 which is interposed between the connection wiring 123 and the peripheral edge of the terminal electrode 51 in the porous region 112 or 113 so as to electrically connect the connection wiring 123 and the terminal electrode 51 and extends in a line shape along the peripheral edge of the terminal electrode (51) in the plan view.

[E14] The semiconductor device of E13, wherein the second via electrode 132 forms a single current path connecting the connection wiring 123 and the terminal electrode 51.

[E15] The semiconductor device of E13 or E14, wherein the second via electrode 132 partitions a closed space in which only the porous region 112 or 113 is disposed in a region between the connection wiring 123 and the terminal electrode 51 in the porous region 112 or 113.

[E16] The semiconductor device of any one of E1 to E6, further including: a circuit element 10 formed in the chip 2, a connection wiring 123 which is disposed in the insulating layer 20 so as to be in contact with the porous region 112 or 113 and is electrically connected to the circuit element 10, a terminal electrode 51 which is disposed over the insulating layer 20 so as to face the connection wiring 123 with the porous region 112 or 113 interposed between the terminal electrode 51 and the connection wiring 123, a via electrode 126 which is interposed between the connection wiring 123 and the terminal electrode 51 in the porous region 112 or 113 so as to electrically connect the connection wiring 123 and the terminal electrode 51, and an outer via electrode 102 which is disposed around the terminal electrode 51 in the plan view and is formed in a thickness range between the connection wiring 123 and the terminal electrode 51 in the porous region 112 or 113.

[E17] The semiconductor device of E16, further including: a different potential wiring 53 which is disposed in the insulating layer 20 so as to be adjacent to the connection wiring 123 in the lateral direction and is applied with a potential different from that of the connection wiring 123, wherein the terminal electrode 51 is disposed at an interval from the different potential wiring 53 in the plan view, and the outer via electrode 102 is disposed in a region between the connection wiring 123 and the different potential wiring 53 in the plan view.

[E18] The semiconductor device of E16 or E17, wherein the outer via electrode 102 extends in a line shape along the terminal electrode 51 in the plan view.

[E19] The semiconductor device of any one of E1 to E6, further including: a circuit element 10 formed in the chip 2, a multilayer wiring region 30 having a plurality of wirings 32 laminated and arranged in the thickness direction of the insulating layers 20 so as to be electrically connected to the circuit element 10 and formed in the insulating layer 20, and an insulating region 50 which does not have the wirings 32 in the entire region of the insulating layer 20 in the thickness direction, is formed in a region outside the multilayer wiring region 30 in the insulating layer 20, and has the porous region 112 or 113 in at least the surface layer portion, wherein the terminal electrode 51 is disposed over the porous region 112 or 113 at a distance from the multilayer wiring region 30 in the plan view so as to face the chip 2 with the insulating region 50 interposed between the terminal electrode 51 and the chip 2.

[E20] The semiconductor device of E19, further including: a dummy wiring 62 which is disposed in the insulating region 50 so as to partially face the terminal electrode 51 and is electrically independent from the plurality of wirings 32.

[F1] A semiconductor device including: a chip 2, an insulating layer 20 formed over the chip 2, a connection wiring 123 disposed in the insulating layer 20, a terminal electrode 51 disposed over the insulating layer 20 so as to face the connection wiring 123, and a plurality of via electrodes 126 which are interposed between the connection wiring 123 and the terminal electrode 51 in the insulating layer 2 so as to electrically connect the connection wiring 123 and the terminal electrode 51 and are arranged at intervals from the inner portion of the terminal electrode 51 toward the entire circumference of the peripheral edge of the terminal electrode 51 in a plan view.

[F2] The semiconductor device of F1, wherein the plurality of via electrodes 126 are arranged so that a ratio of a total area of via electrodes (126) occupying a plane area of the terminal electrode 51 is 50% or more and 80% or less.

[F3] The semiconductor device of F1 or F2, wherein the plurality of via electrodes 126 are arranged at intervals along an electrode surface of the terminal electrode 51 in a first direction X and a second direction Y intersecting the first direction X.

[F4] The semiconductor device of any one of F1 to F3, wherein the plurality of via electrodes 12 is arranged in the form of a matrix so as to partition a plurality of crossroad portions each formed of a portion of the insulating layer 20 between the connection wiring 123 and the terminal electrode 51.

[F5] The semiconductor device of any one of F1 to F4, wherein the plurality of via electrodes 126 are arranged in a staggered manner so as to partition a plurality of T-shaped road portions each formed of a portion of the insulating layer 20 between the connection wiring 123 and the terminal electrode 51.

[F6] The semiconductor device of any one of F1 to F5, wherein the entire region of the terminal electrode 51 faces the connection wiring 123.

[F7] The semiconductor device of any one of F1 to F6, wherein the terminal electrode 51 is disposed in a region surrounded by the peripheral edge of the connection wiring 123 in the plan view.

[F8] The semiconductor device of any one of F1 to F7, wherein the connection wiring 123 is disposed in the insulating layer 20 with a first space S5 from the chip 2 in the thickness direction of the insulating layer 20, and the terminal electrode 51 is disposed over the insulating layer 20 with a second space S6, which is less than the first space S5, from the connection wiring 123 in the thickness direction of the insulating layer 20.

[F9] The semiconductor device of any one of F1 to F8, further including: a circuit element 10 formed in the chip 2, and a plurality of wirings 32 laminated and arranged in the thickness direction of the insulating layers 20 so as to be electrically connected to the circuit element 10, wherein the connection wiring 123 is electrically connected to at least one of the plurality of wirings 32.

[F10] The semiconductor device of F9, wherein the terminal electrode 51 is disposed over the connection wiring 123 at an interval from the plurality of wirings 32 in the plan view.

[F11] The semiconductor device of any one of F1 to F10, wherein the connection wiring 123 faces the chip 2 with only the insulating layer 20 interposed between the connection wiring 123 and the chip 2.

[F12] The semiconductor device of any one of F1 to F11, further including: a seal via electrode 132 which is interposed between the connection wiring 123 and the terminal electrode 51 in the insulating layer 20 so as to electrically connect the connection wiring 123 and the terminal electrode 51, and is formed in a line shape extending along the peripheral edge of the terminal electrode 51 in the plan view.

[F13] The semiconductor device of F12, wherein the seal via electrode 132 is formed in an annular shape surrounding a region in which the plurality of via electrodes 126 are formed in the plan view.

[F14] The semiconductor device of any one of F1 to F13, further including: an outer seal via electrode 102 which is formed in the insulating layer 20 in a thickness range between the connection wiring 123 and the terminal electrode 51 and is formed in a line shape extending along the terminal electrode (51) in the plan view.

[F15] The semiconductor device of F14, wherein the outer seal via electrode 102 is formed in an annular shape surrounding the terminal electrode 51 in the plan view.

[F16] The semiconductor device of any one of F1 to F15, further including: a rectifier 15 including an anode region 16 formed in the surface layer portion of the chip 2 and a cathode region 17 formed in the surface layer portion of the anode region 16, wherein the insulating layer 20 covers the rectifier 15, and the connection wiring 123 faces the rectifier 15 with the insulating layer 20 interposed between the connection wiring 123 and the rectifier.

[F17] The semiconductor device of any one of F1 to F16, further including: a porous region 112 or 113 which is formed of a region in which a plurality of pores are introduced in the insulating layer 20 and is formed in at least the surface layer portion of the insulating layer 20, wherein the terminal electrode 51 is disposed over the porous region 112 or 113 of the insulating layer 20, and the plurality of via electrodes 126 are formed in the porous region 112 or 113 of the insulating layer 20.

[F18] The semiconductor device of any one of F1 to F17, wherein each of the plurality of via electrodes 126 is made of a metal material different from that of the connection wiring 123.

[F19] The semiconductor device of any one of F1 to F18, wherein the connection wiring 123 includes an Al-based metal layer, the terminal electrode 51 includes an Al-based metal layer, and the plurality of via electrodes 126 each include a W-based metal layer.

[F20] The semiconductor device of any one of F1 to F19, further including: a pad electrode 282 formed over the terminal electrode 51.

Although the embodiments of the present disclosure have been described in detail, these embodiments are merely specific examples used for clarifying the technical contents of the present disclosure. The present disclosure should not be construed as being limited to these specific examples, and the scope of the present disclosure is limited by the appended claims.

While certain embodiments have been described, these embodiments have been presented by way of example only, and are not intended to limit the scope of the disclosures.

Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:

a chip;

a circuit element formed in the chip;

an insulating layer formed over the chip so as to cover the circuit element;

a multilayer wiring region formed in the insulating layer and including a plurality of wirings laminated and arranged in a thickness direction of the insulating layer so as to be electrically connected to the circuit element;

at least one insulating region which does not include the wirings in an entire region in the thickness direction of the insulating layer and is formed in a region outside the multilayer wiring region in the insulating layer;

at least one terminal electrode disposed over the insulating layer so as to face the chip with the at least one insulating region interposed between the at least one terminal electrode and the chip; and a rectifier including an anode region formed in a region outside the circuit element in a surface layer portion of the chip and a cathode region formed in a surface layer portion of the anode region, wherein the at least one insulating region is formed in a portion of the insulating layer that covers the rectifier, and wherein the at least one terminal electrode faces the rectifier.

2. The semiconductor device of claim 1, wherein the multilayer wiring region is formed in a portion of the insulating layer that covers the circuit element, wherein the at least one insulating region is formed in a portion of the insulating layer that covers an outside of the circuit element, and wherein the at least one terminal electrode faces a region outside the circuit element in the chip.

3. The semiconductor device of claim 1, wherein the cathode region is formed in an electrical floating state.

4. The semiconductor device of claim 1, further comprising a dummy wiring which is disposed in the at least one insulating region so as to partially face the at least one terminal electrode and is electrically independent from the plurality of wirings.

5. The semiconductor device of claim 4, wherein the dummy wiring is formed in a dot shape, a line shape, or an annular shape along a peripheral edge of the at least one terminal electrode in a plan view.

6. The semiconductor device of claim 4, wherein the dummy wiring is formed in an electrical floating state.

7. The semiconductor device of claim 4, further comprising a dummy via electrode which is interposed between the at least one terminal electrode and the dummy wiring in the at least one insulating region and electrically connects the at least one terminal electrode and the dummy wiring.

8. The semiconductor device of claim 1, further comprising an outer dummy wiring which is disposed in the insulating layer so as to be located in a region between the at least one terminal electrode and the multilayer wiring region in a plan view and is electrically independent from the plurality of wirings.

9. The semiconductor device of claim 8, wherein the outer dummy wiring is formed in a dot shape, a line shape, or an annular shape along the at least one terminal electrode in the plan view.

10. The semiconductor device of claim 8, wherein the outer dummy wiring is formed in an electrical floating state.

11. The semiconductor device of claim 8, further comprising an outer via electrode buried at a thickness position between the at least one terminal electrode and the outer dummy wiring so as to be connected to the outer dummy wiring in the at least one insulating region.

12. The semiconductor device of claim 1, further comprising:

a lead-out electrode led out from the at least one terminal electrode onto the insulating layer so as to face the wirings with a portion of the insulating layer interposed between the lead-out electrode and the wirings; and a via electrode which is interposed between the lead-out electrode and the wirings in the insulating layer and electrically connects the lead-out electrode and the wirings.

13. The semiconductor device of claim 1, wherein the at least one terminal electrode includes a plurality of terminal electrodes.

14. The semiconductor device of claim 1, wherein the at least one insulating region includes a plurality of insulating regions.

15. The semiconductor device of claim 1, further comprising a porous region which includes a region in which a plurality of pores are introduced in the insulating layer and is formed in at least a surface layer portion of the insulating layer, wherein the at least one terminal electrode is disposed over the porous region of the insulating layer.

16. The semiconductor device of claim 1, further comprising a plating film which covers the at least one terminal electrode.

17. A semiconductor device comprising:

a chip;

an insulating layer which covers the chip;

a multilayer wiring formed in the insulating layer;

a terminal electrode which is disposed over the insulating layer at a distance from the multilayer wiring in a plan view so as to face the chip with only the insulating layer interposed between the terminal electrode and the chip; and a rectifier including an anode region formed in a surface layer portion of the chip and a cathode region formed in a surface layer portion of the anode region, wherein the insulating layer covers the rectifier, and wherein the terminal electrode faces the rectifier with only the insulating layer interposed between the terminal electrode and the rectifier.

18. The semiconductor device of claim 17, further comprising:

a lead-out electrode led out from the terminal electrode onto the insulating layer so as to face a portion of the multilayer wiring with a portion of the insulating layer interposed between the lead-out electrode and the portion of the multilayer wiring; and a via electrode which is interposed between the lead-out electrode and the portion of the multilayer wiring in the insulating layer and electrically connects the lead-out electrode and the multilayer wiring.

* * * * *